US008946786B2

(12) United States Patent
Nakatani

(10) Patent No.: US 8,946,786 B2
(45) Date of Patent: Feb. 3, 2015

(54) SEMICONDUCTOR DEVICE AND METHOD FOR MANUFACTURING SAME

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/807,555

(22) PCT Filed: Jun. 30, 2011

(86) PCT No.: PCT/JP2011/065111
§ 371 (c)(1),
(2), (4) Date: Dec. 28, 2012

(87) PCT Pub. No.: WO2012/002514
PCT Pub. Date: Jan. 5, 2012

(65) Prior Publication Data
US 2013/0099292 A1    Apr. 25, 2013

(30) Foreign Application Priority Data

Jul. 1, 2010  (JP) .................................. 2010-151147
Jul. 7, 2010  (JP) .................................. 2010-155185

(51) Int. Cl.
*H01L 29/84*    (2006.01)
*H01L 25/07*    (2006.01)
*B81C 1/00*     (2006.01)
(Continued)

(52) U.S. Cl.
CPC .......... *H01L 25/071* (2013.01); *B81C 1/00246* (2013.01); *G01P 15/0802* (2013.01); *G01P 15/125* (2013.01); *H01L 27/092* (2013.01); *H01L 21/50* (2013.01); *H01L 27/0617* (2013.01); *G01C 19/5733* (2013.01); *G01C 19/5769* (2013.01); *G01P 2015/0814* (2013.01); *G01P 2015/0831* (2013.01); *G01P 2015/0845* (2013.01); *H01L 29/84* (2013.01);
(Continued)

(58) Field of Classification Search
USPC ................................. 257/254, 253, 415, 417
See application file for complete search history.

(56) References Cited

U.S. PATENT DOCUMENTS 5,563,343 A    10/1996    Shaw et al.
5,610,335 A     3/1997    Shaw et al.
(Continued)

FOREIGN PATENT DOCUMENTS

EP    0591554      4/1994
JP    5-304303    11/1993
(Continued)

*Primary Examiner* — Timor Karimy
(74) *Attorney, Agent, or Firm* — Hamre, Schumann, Mueller & Larson, P.C.

(57) ABSTRACT

A semiconductor substrate of a semiconductor device has a sensor region and an integrated circuit region, and a cavity is formed immediately under a surface layer portion of the sensor region. A capacitive acceleration sensor is formed on the sensor region by working a surface layer portion of the semiconductor substrate opposed to the cavity. The capacitive acceleration sensor includes an interdigital fixed electrode and an interdigital movable electrode. A CMIS transistor is formed on the integrated circuit region. The CMIS transistor includes a P-type well region and an N-type well region formed on the surface layer portion of the semiconductor substrate. A gate electrode is opposed to the respective ones of the P-type well region and the N-type well region through a gate insulating film formed on a surface of the semiconductor substrate.

8 Claims, 103 Drawing Sheets

(51) Int. Cl.
*G01P 15/08* (2006.01)
*G01P 15/125* (2006.01)
*H01L 27/092* (2006.01)
*H01L 21/50* (2006.01)
*H01L 27/06* (2006.01)
*G01C 19/5733* (2012.01)
*G01C 19/5769* (2012.01)

(52) U.S. Cl.
CPC . *B81C2203/0771* (2013.01); *H01L 2924/0002* (2013.01)
USPC ............ 257/254; 257/253; 257/417; 257/415

(56) References Cited

U.S. PATENT DOCUMENTS

| | | | |
|---|---|---|---|
| 6,149,190 | A | 11/2000 | Galvin et al. |
| 6,170,332 | B1 | 1/2001 | MacDonald et al. |
| 6,171,881 | B1 | 1/2001 | Fujii |
| 6,199,874 | B1 | 3/2001 | Galvin et al. |
| 6,227,049 | B1 | 5/2001 | Fujii |
| 6,244,112 | B1 | 6/2001 | Fujii |
| 2001/0032509 | A1 | 10/2001 | Fujii |
| 2004/0256689 | A1 | 12/2004 | Wachtmann et al. |
| 2007/0022827 | A1 | 2/2007 | Ishikawa et al. |
| 2010/0107758 | A1 | 5/2010 | Kandori et al. |
| 2010/0270596 | A1* | 10/2010 | Takagi et al. .................. 257/254 |

FOREIGN PATENT DOCUMENTS

| | | |
|---|---|---|
| JP | 11-248733 | 9/1999 |
| JP | 2002-228678 | 8/2002 |
| JP | 2006-119021 | 5/2006 |
| JP | 2007-033330 | 2/2007 |
| JP | 2007-523755 | 8/2007 |
| JP | 2008-173719 | 7/2008 |
| WO | WO 94/28427 | 12/1994 |

* cited by examiner

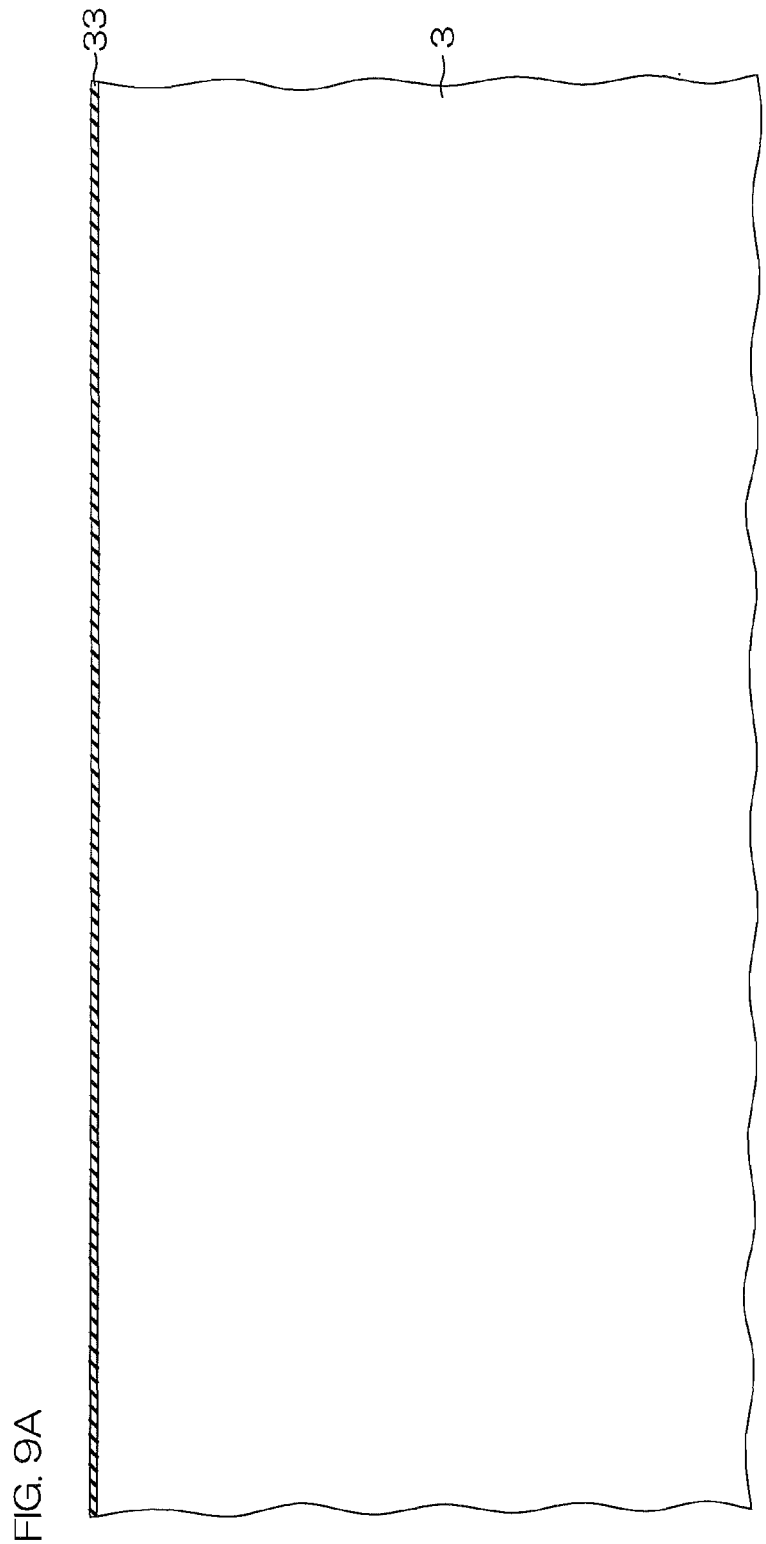

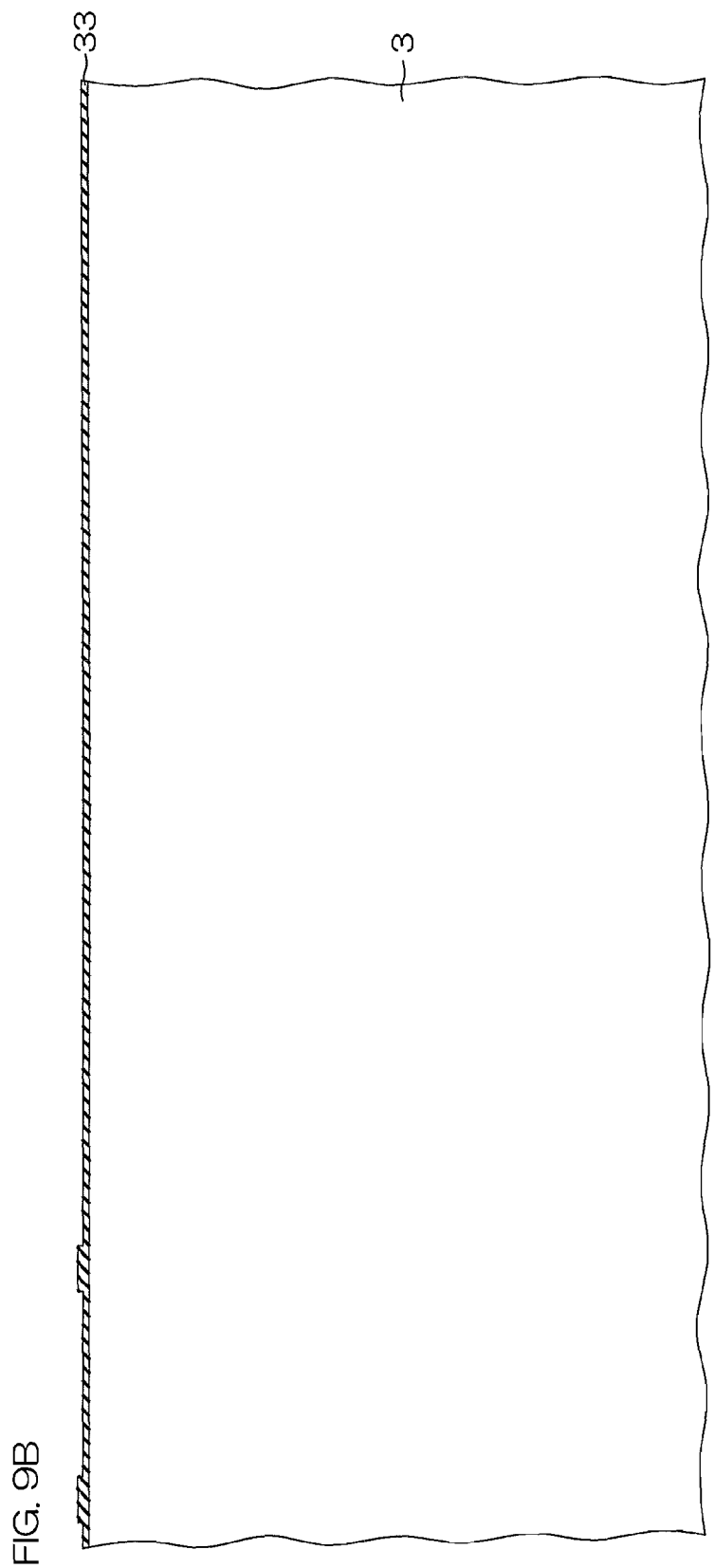

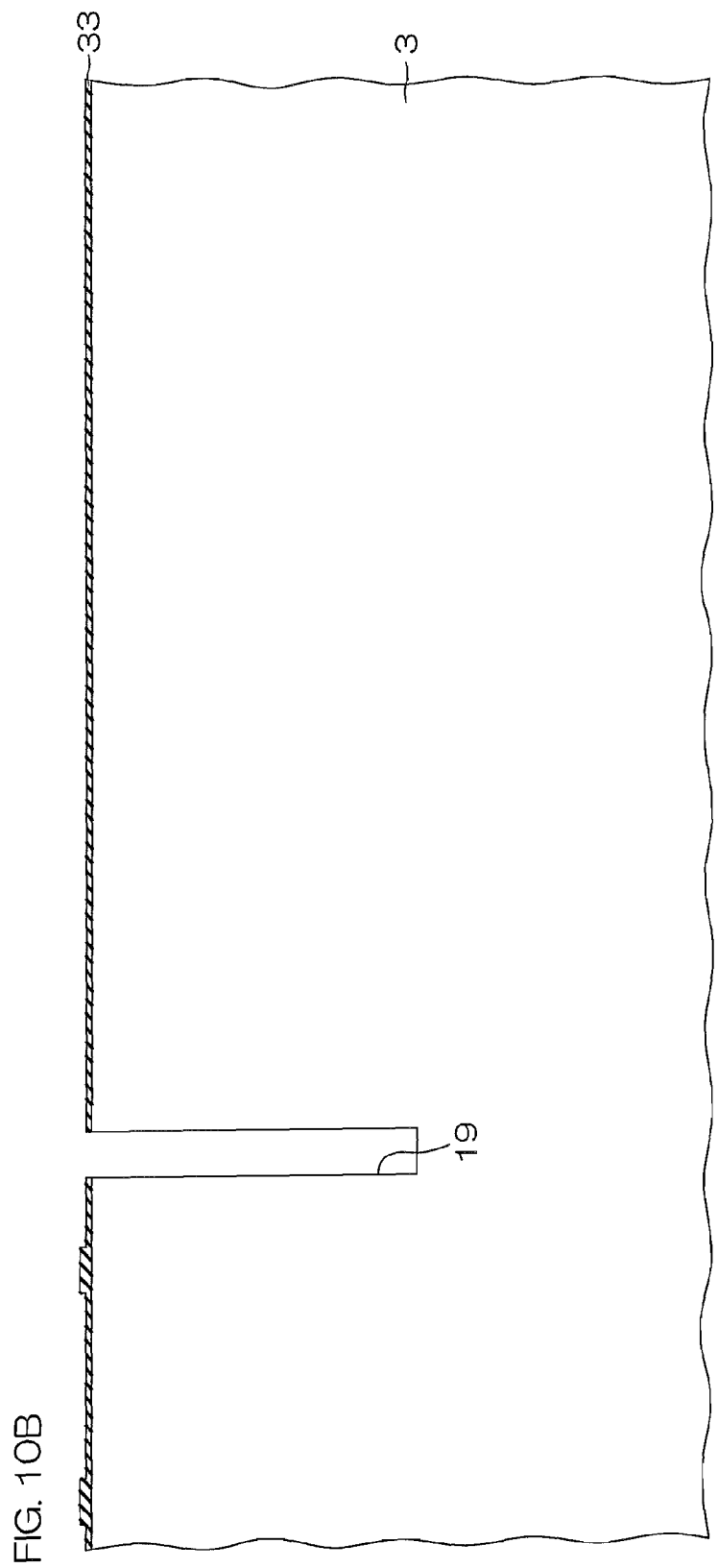

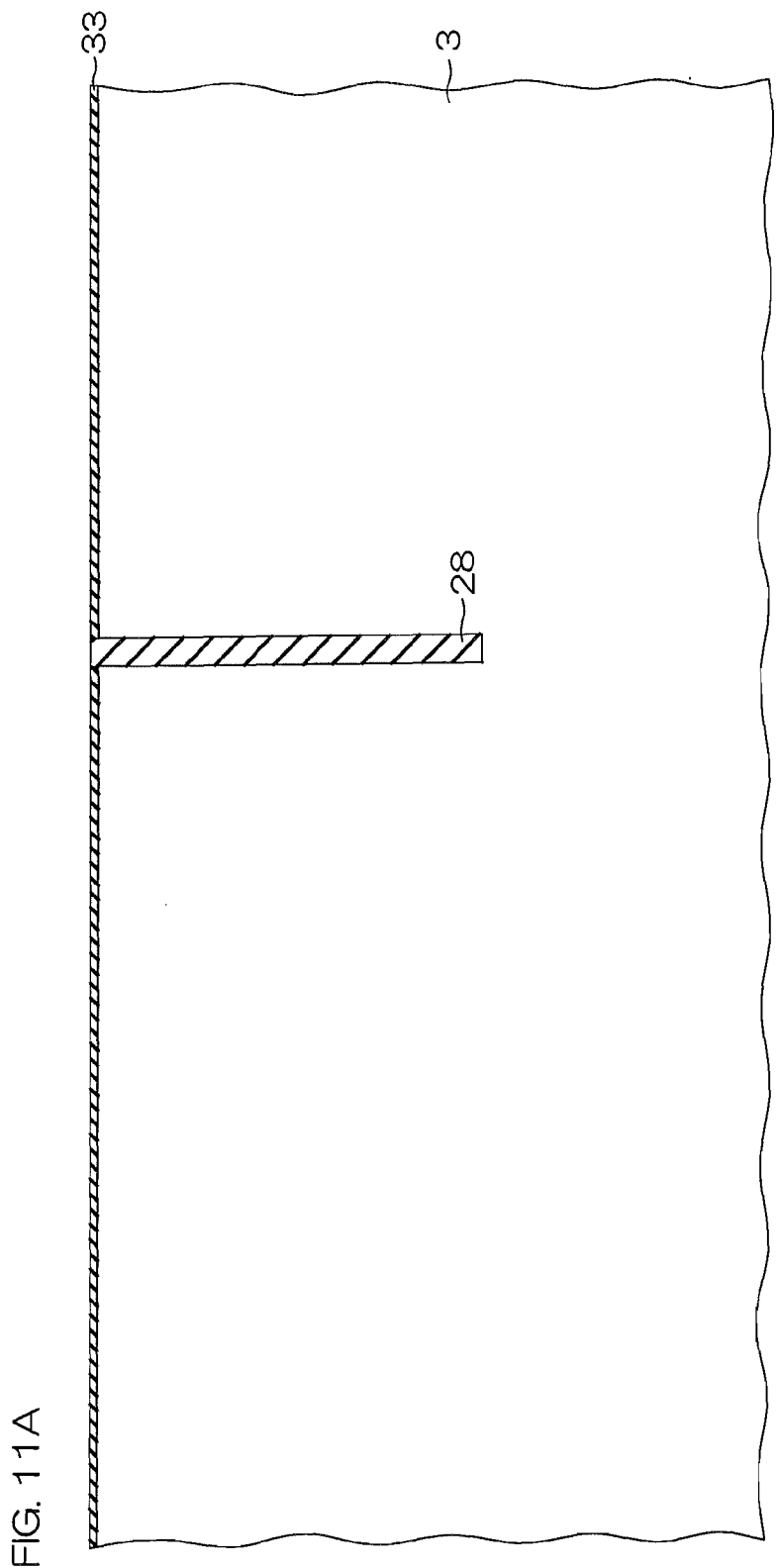

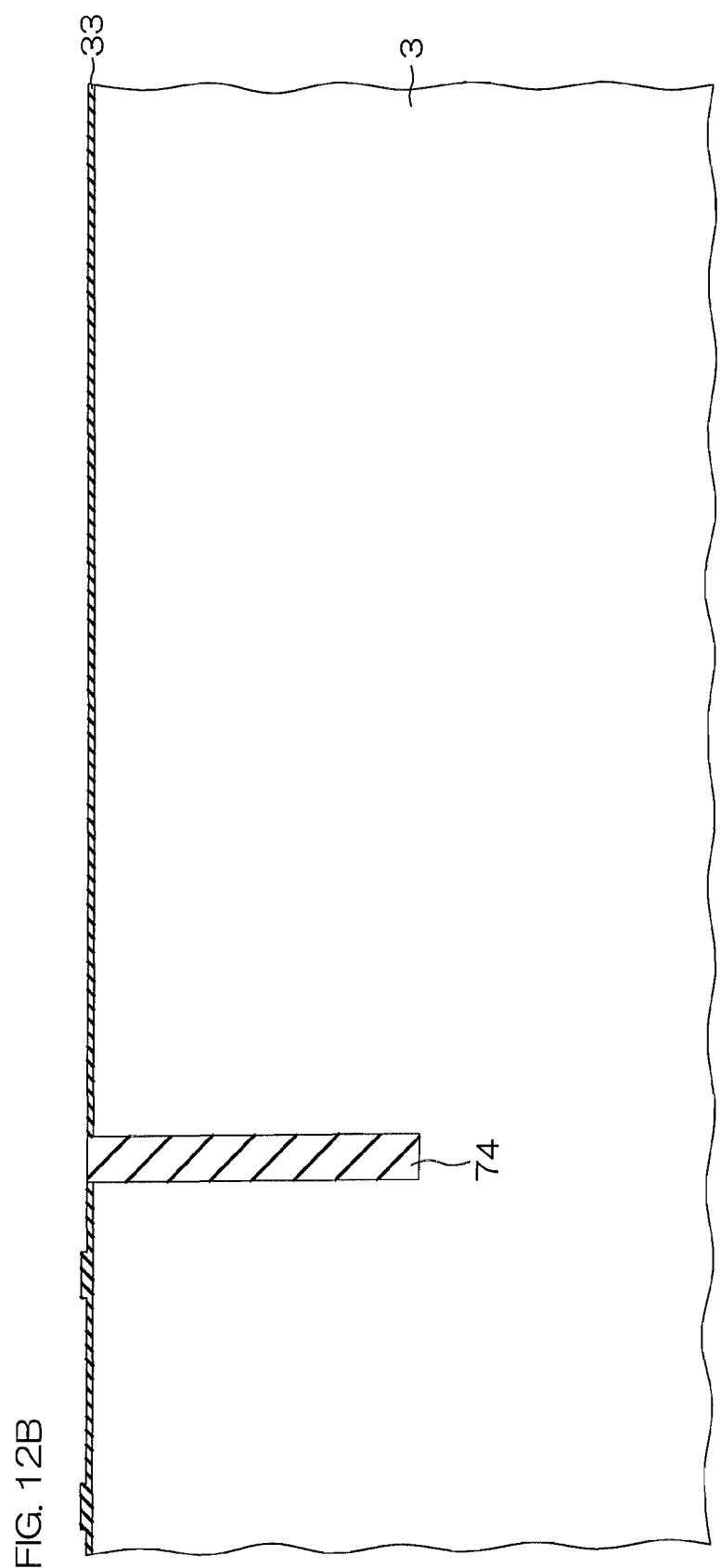

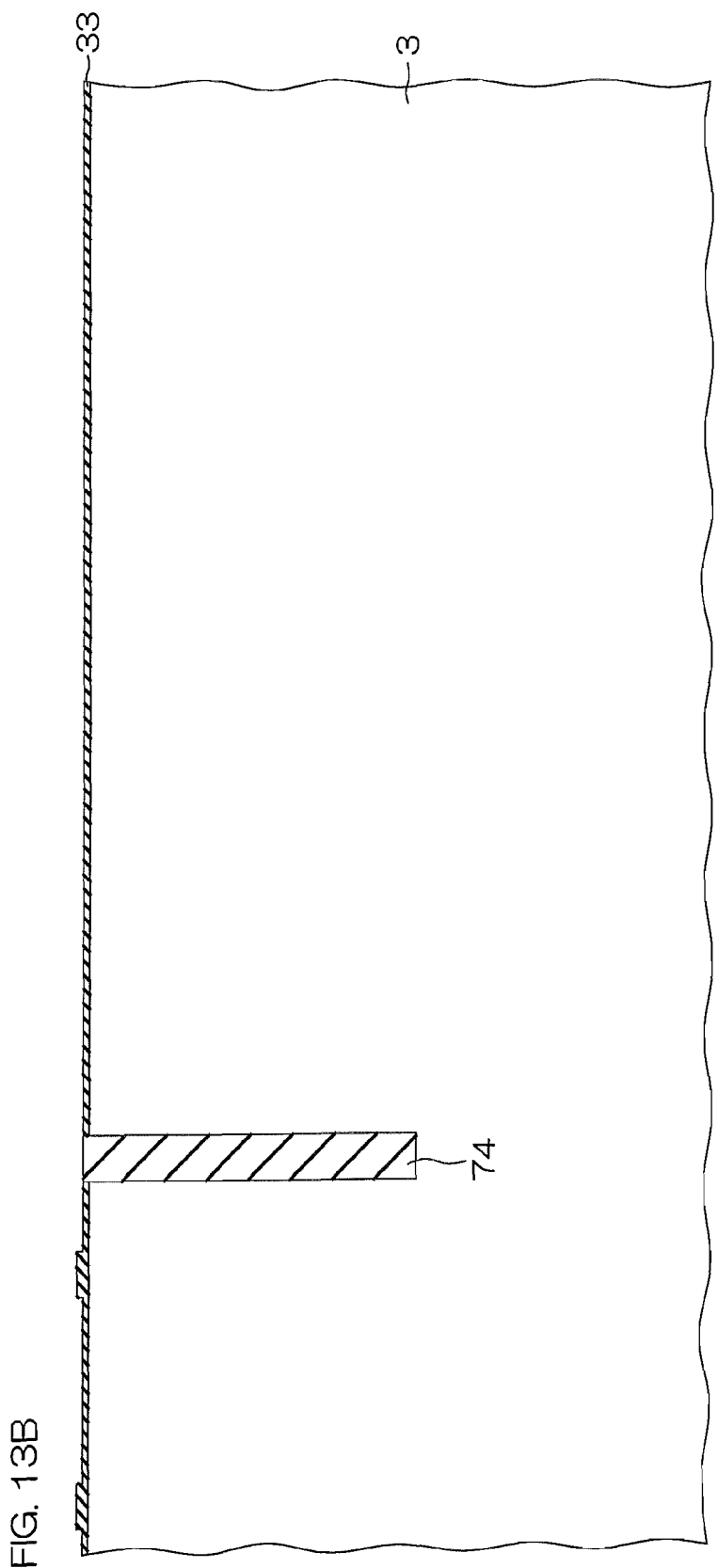

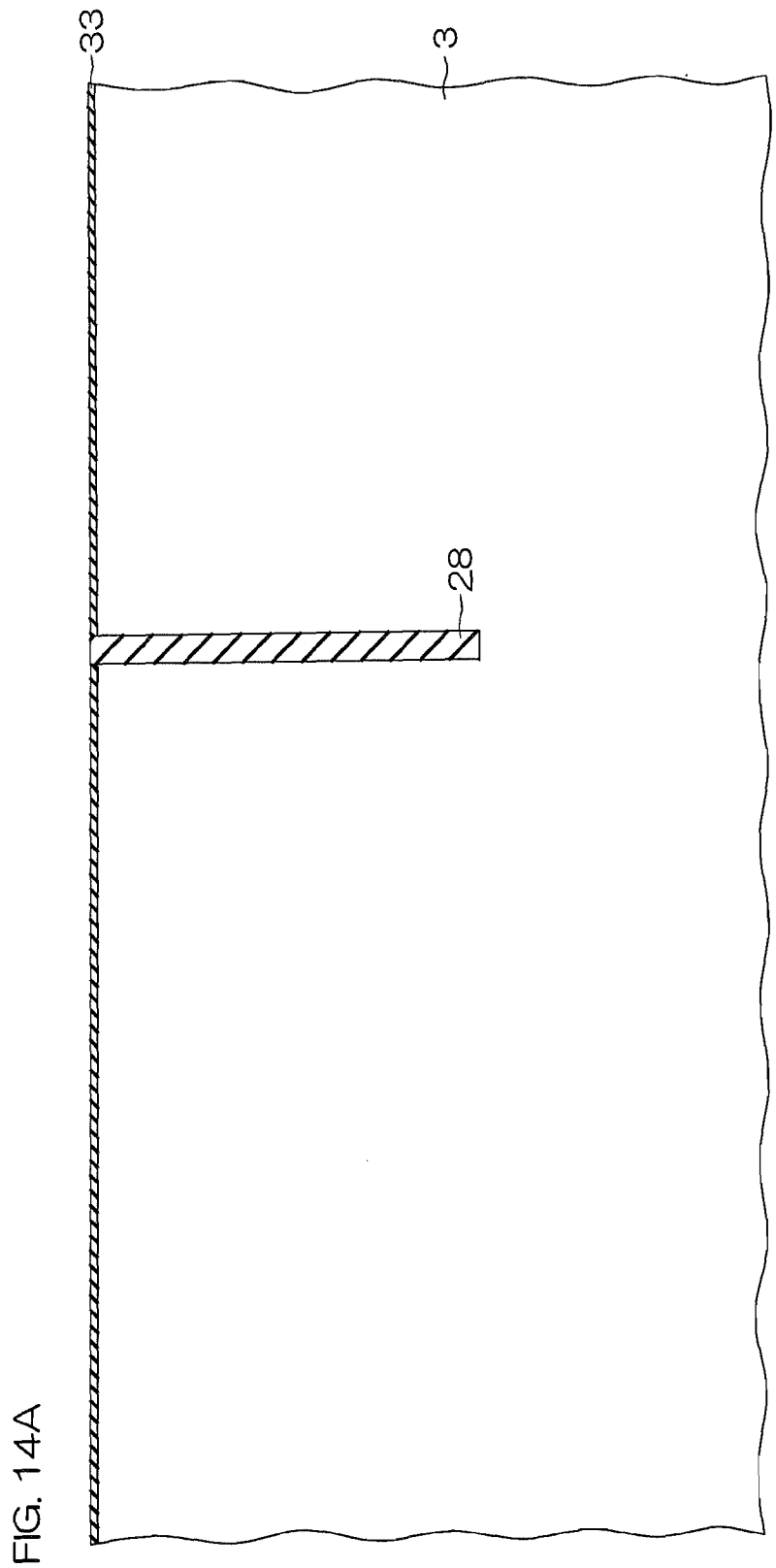

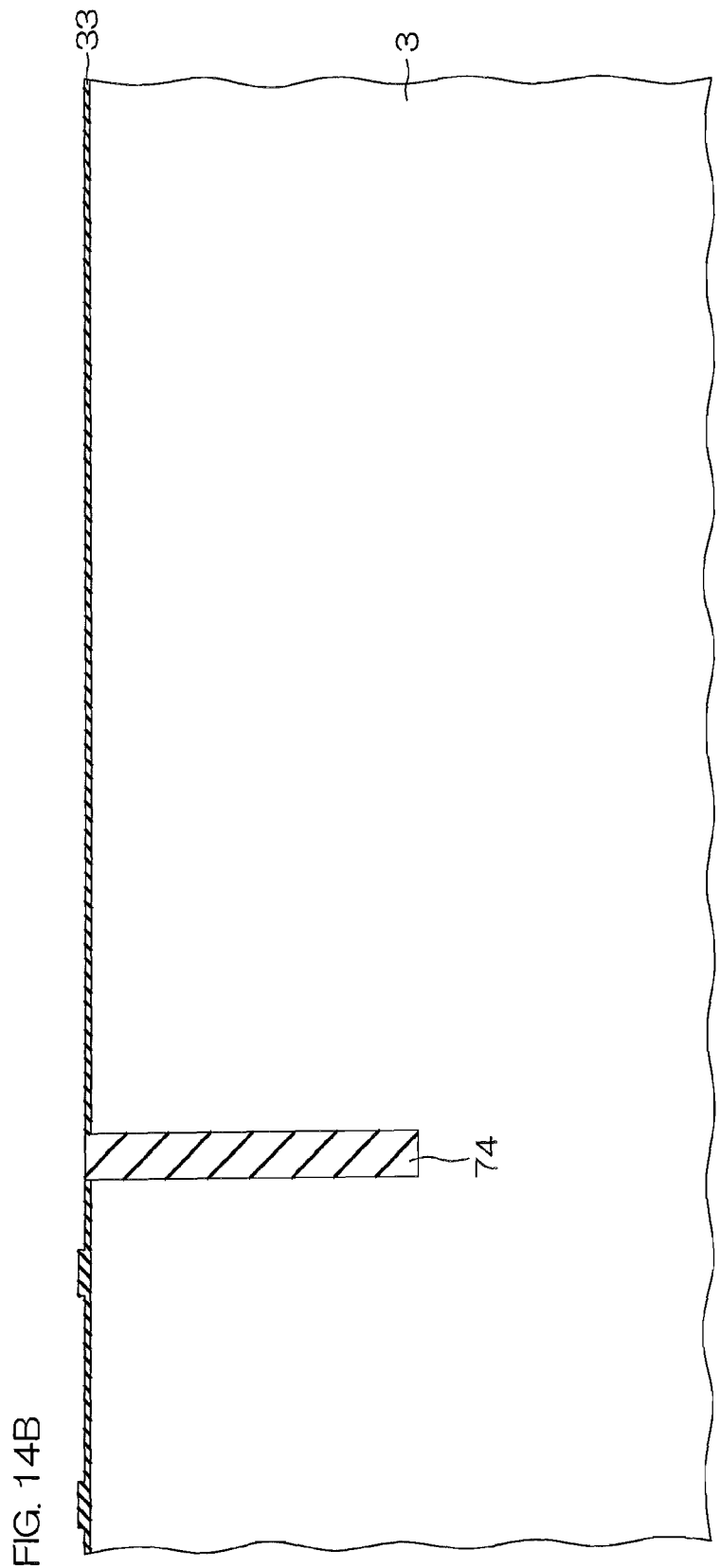

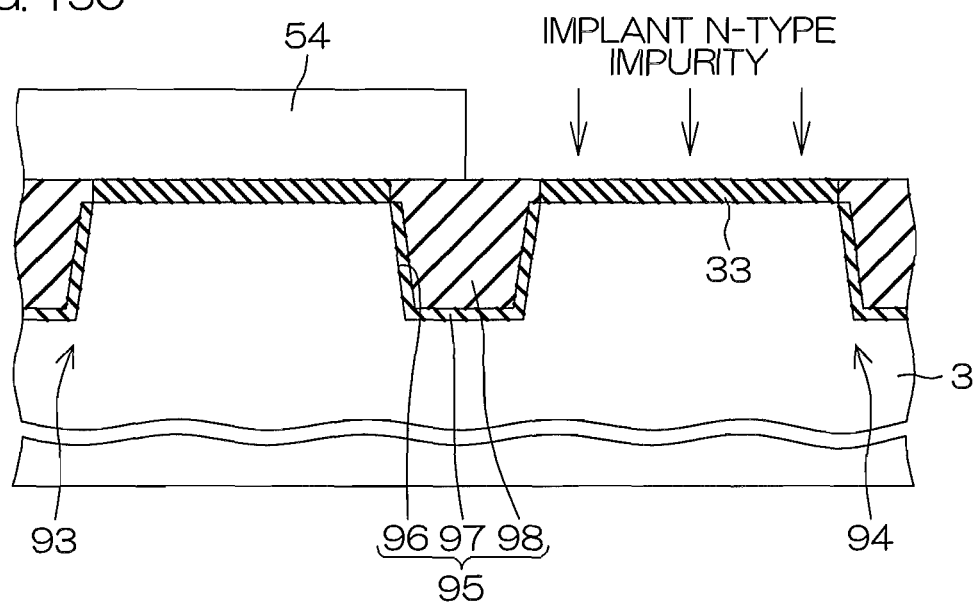

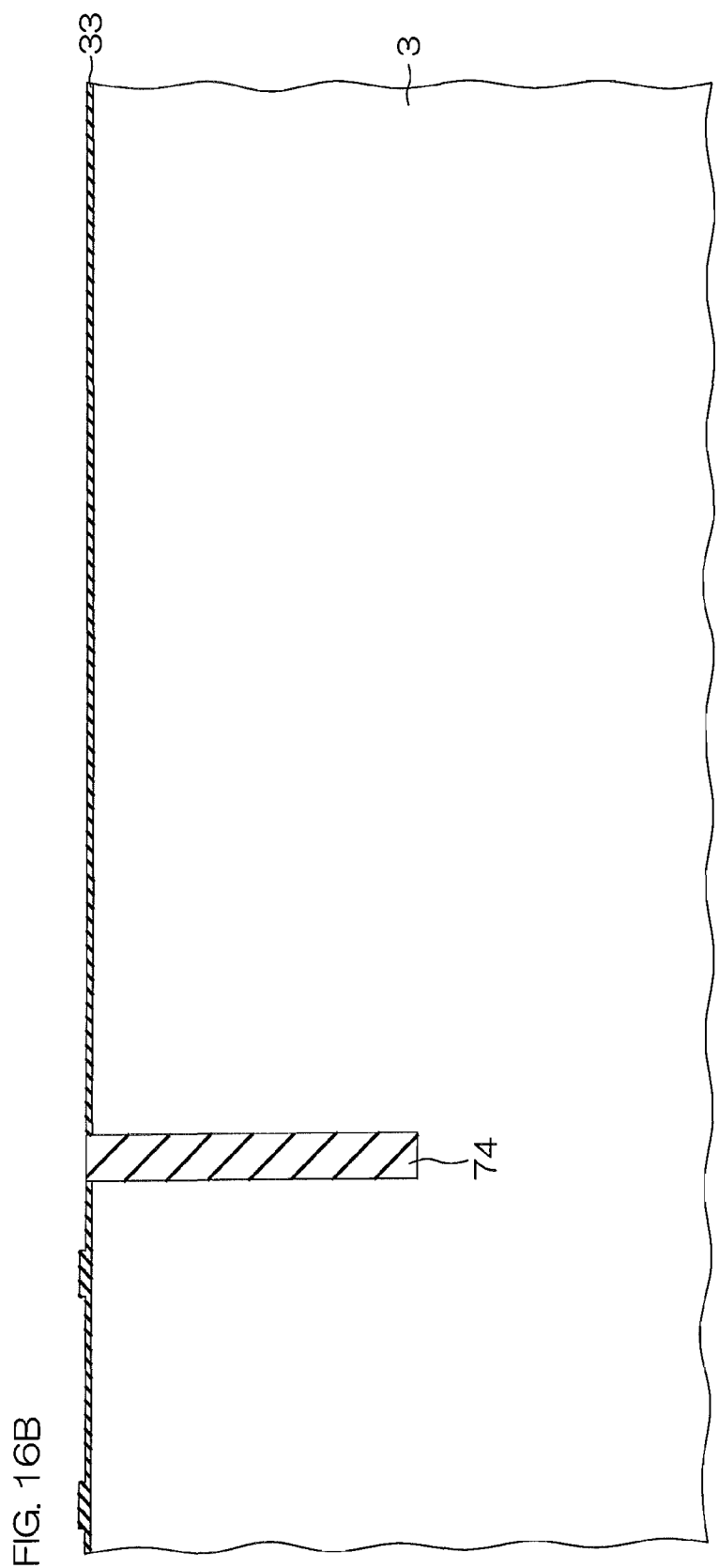

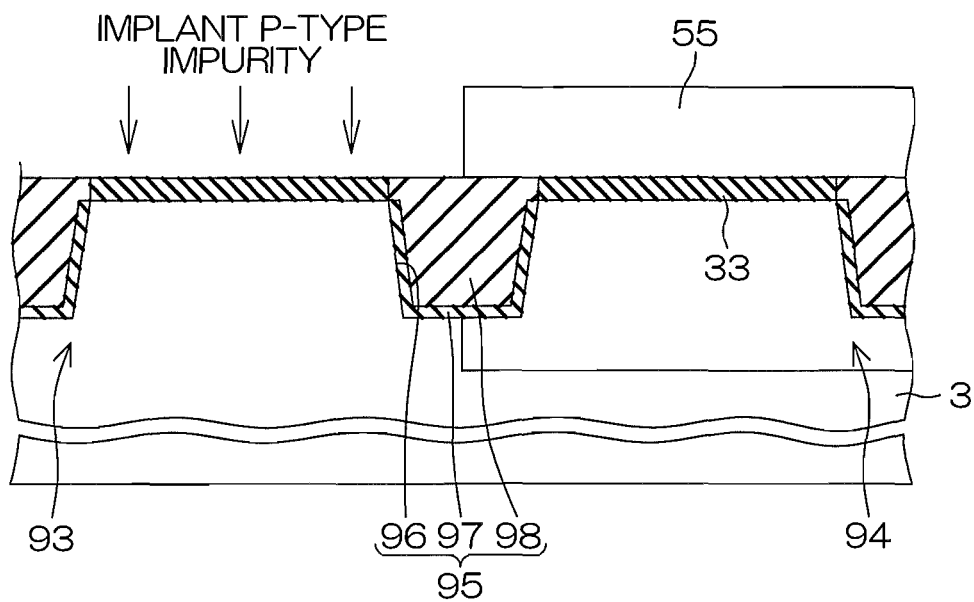

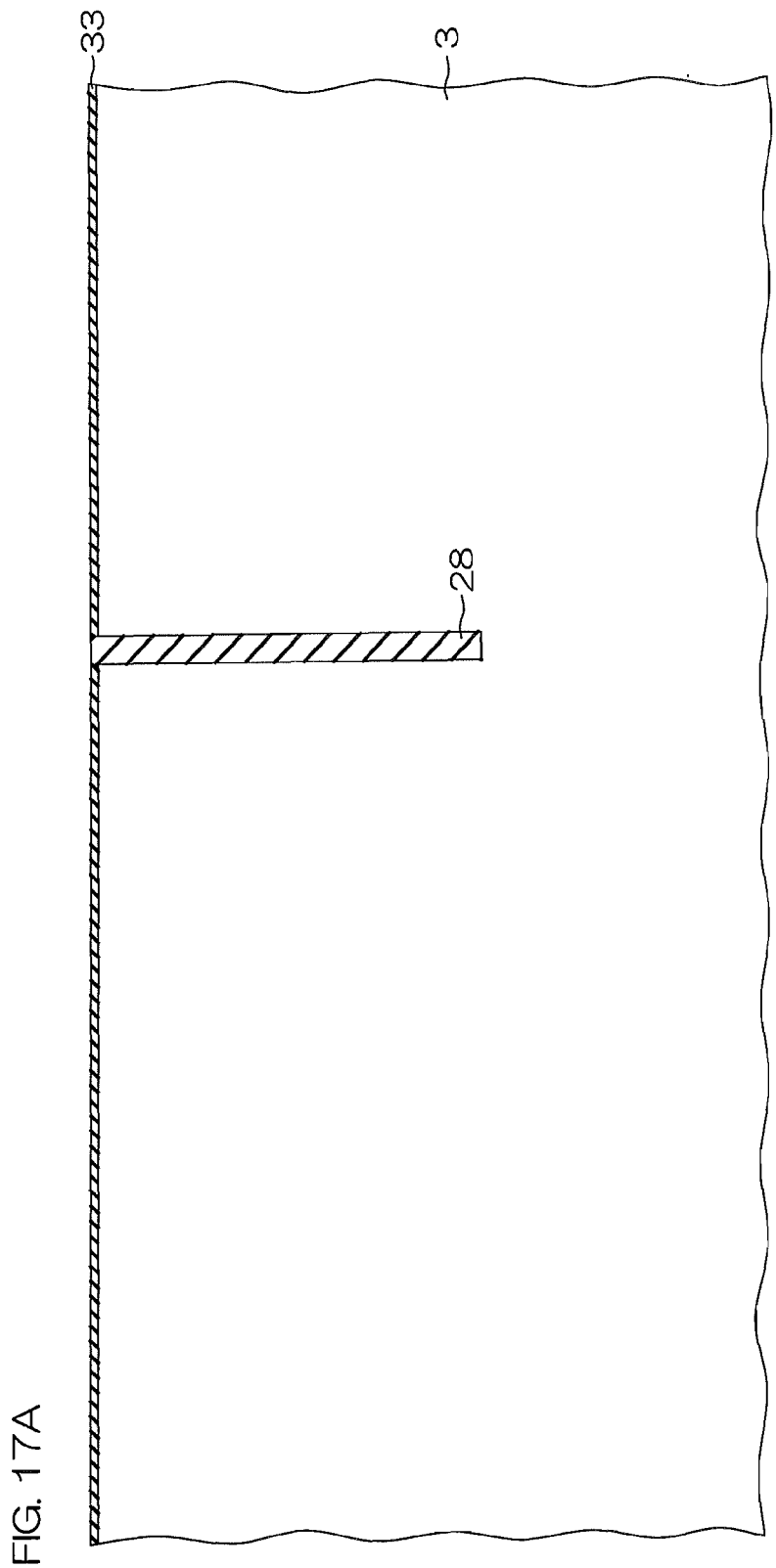

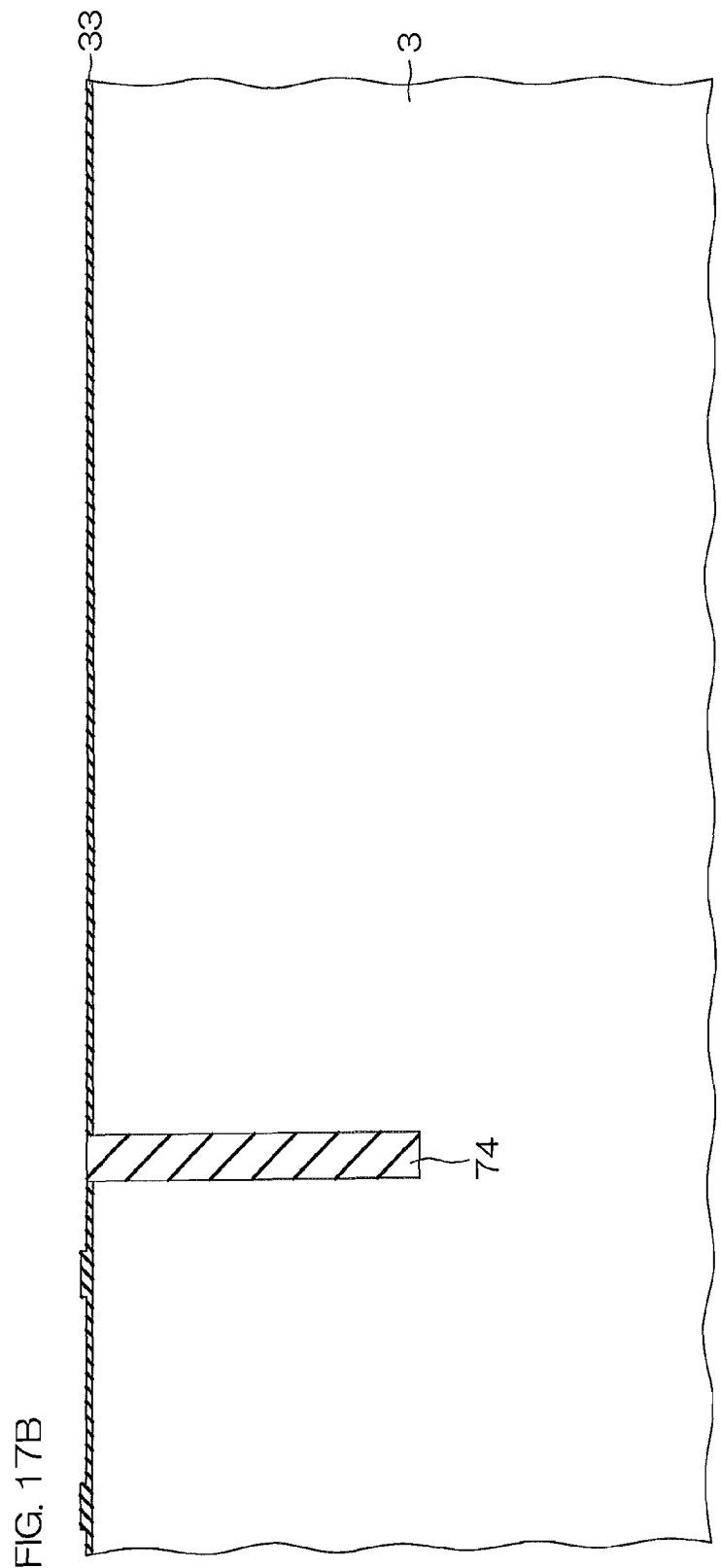

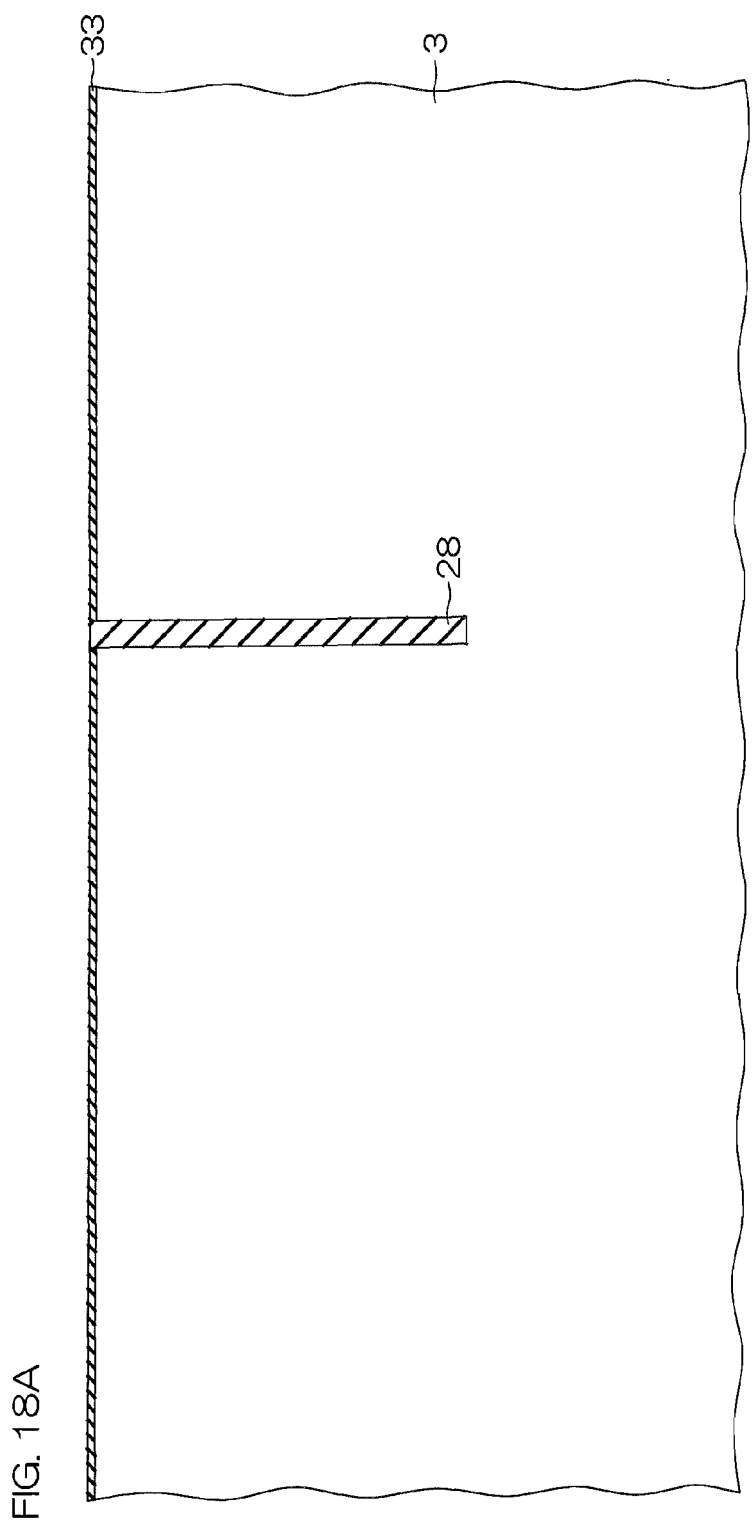

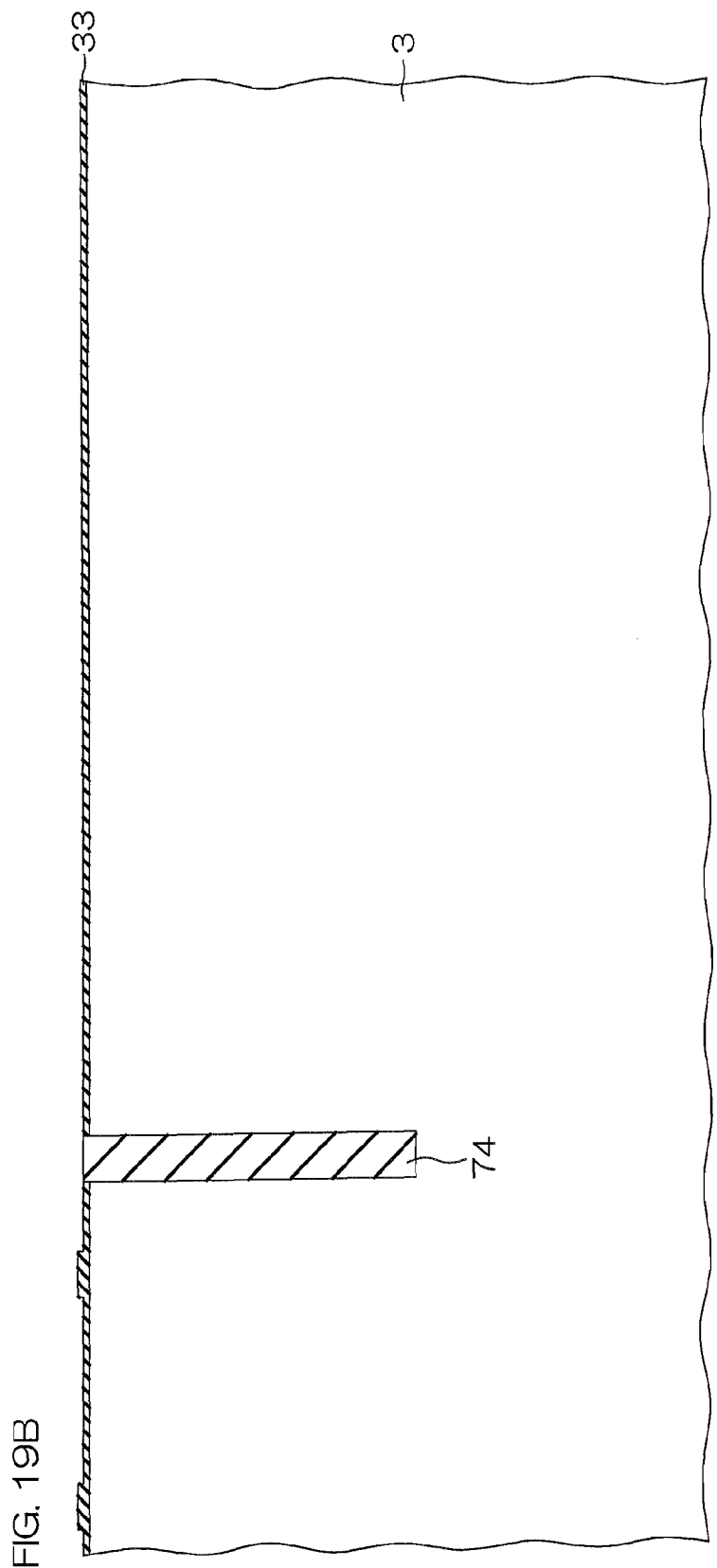

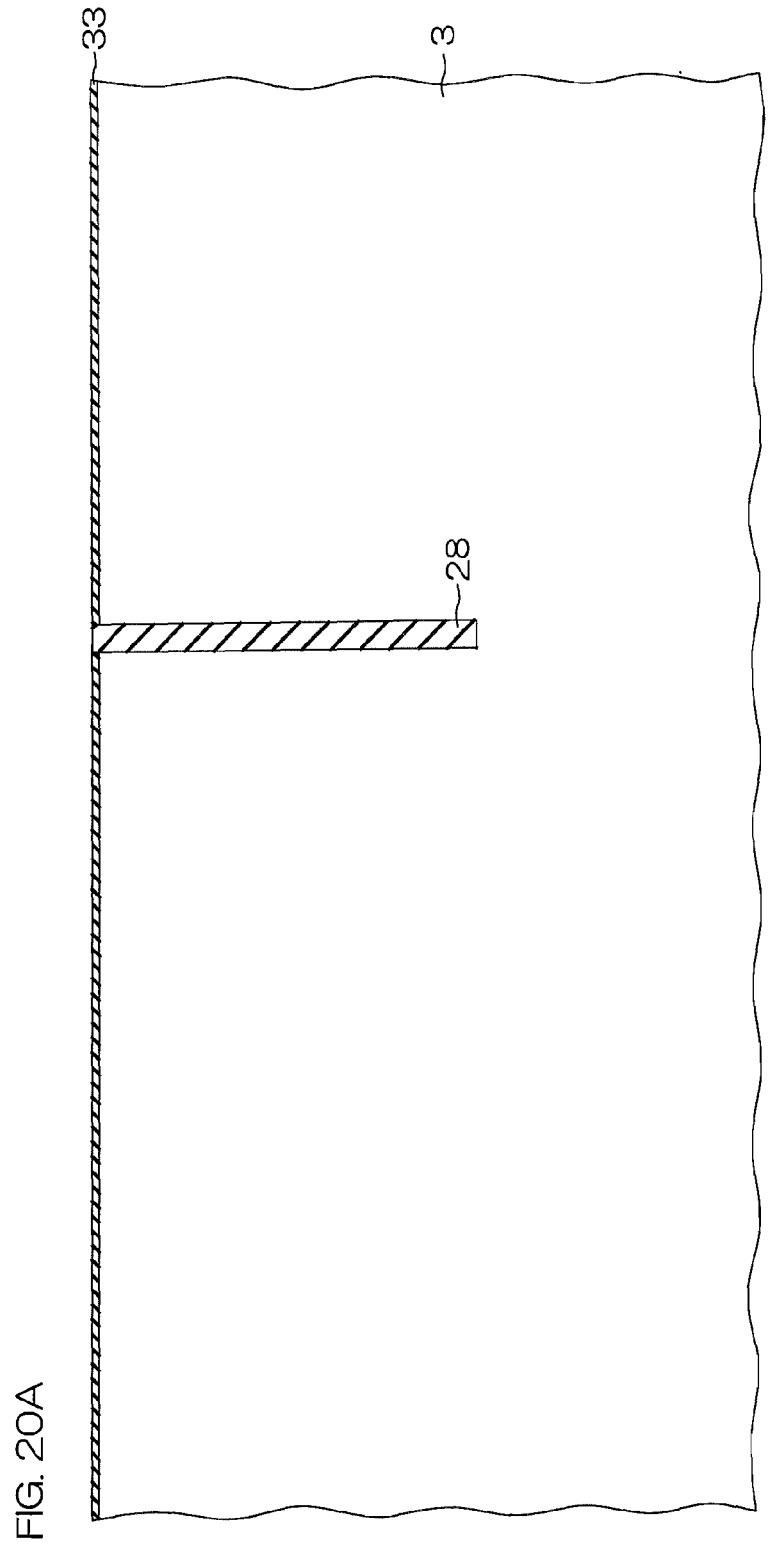

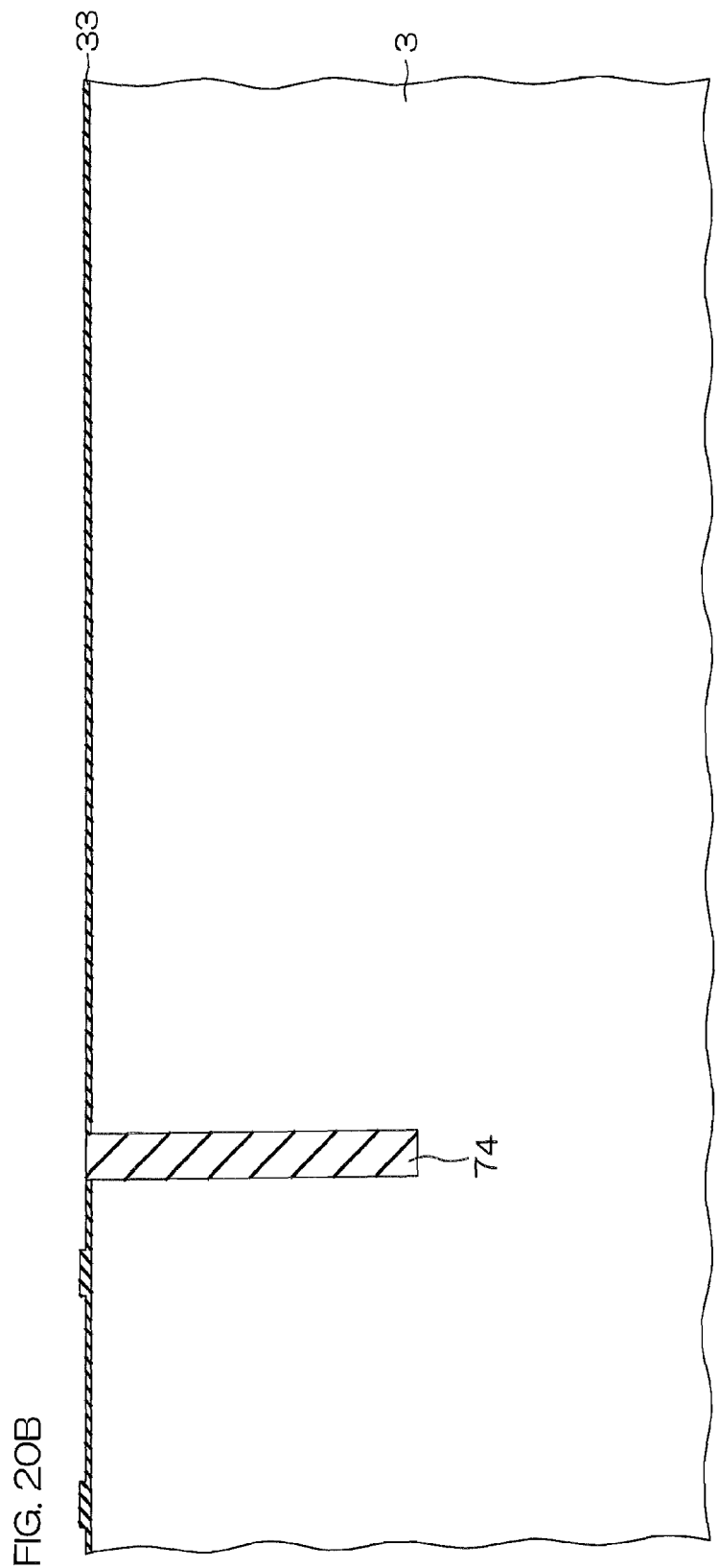

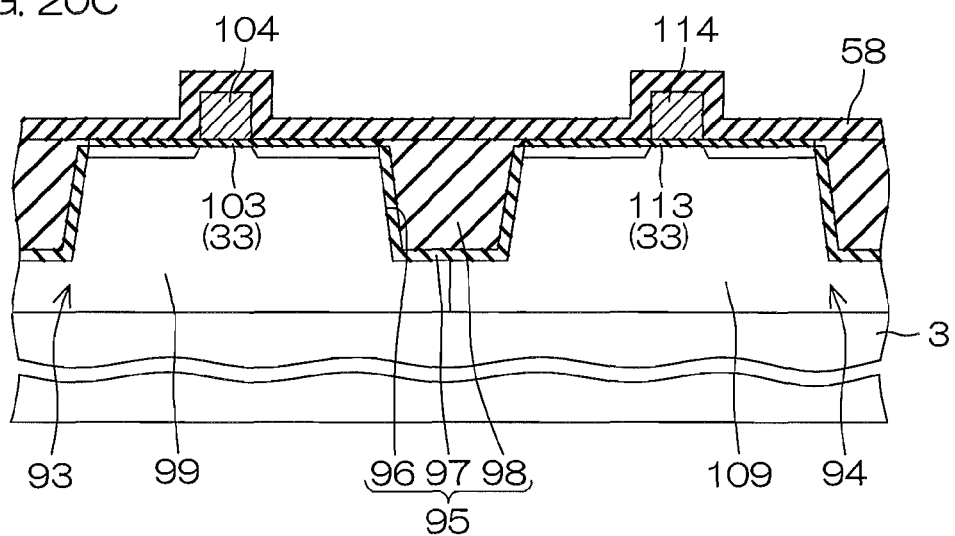

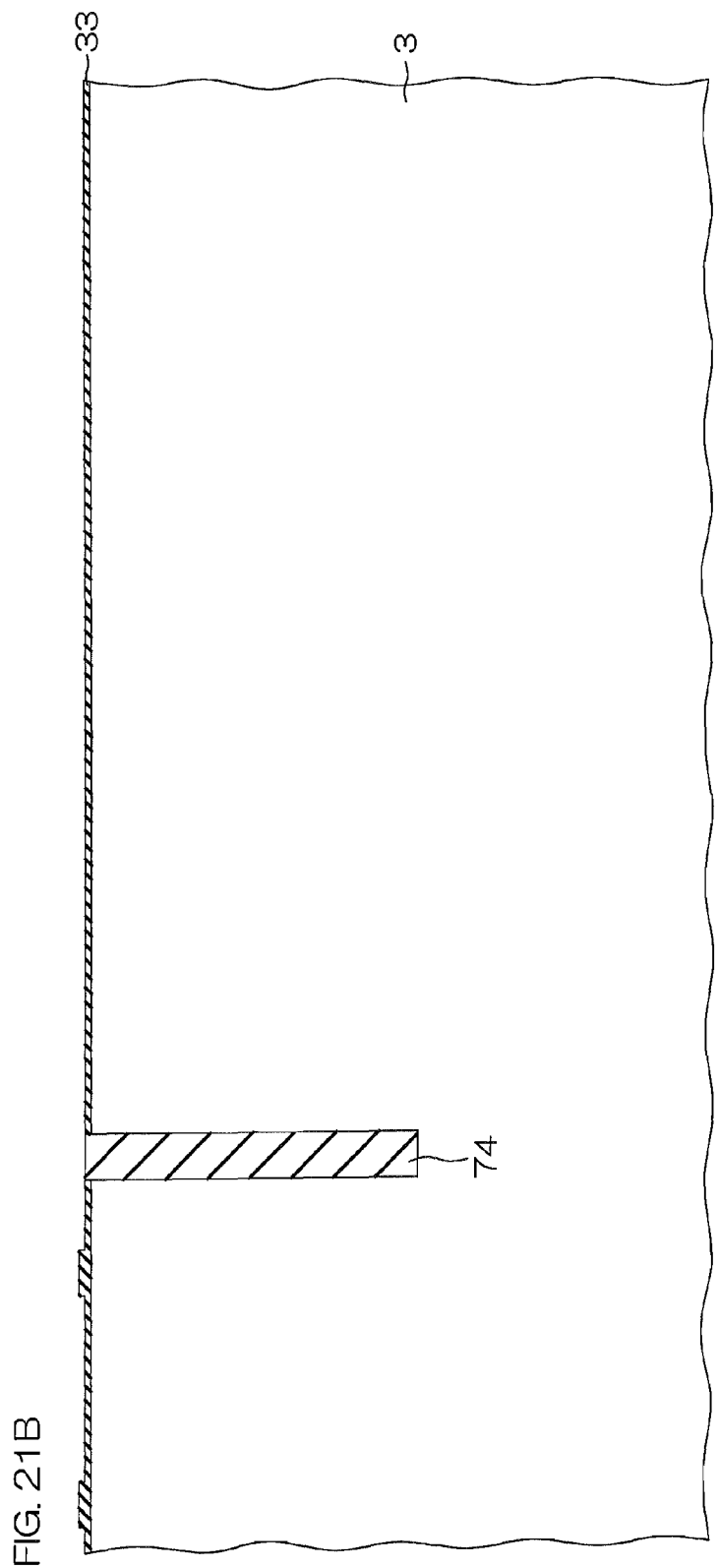

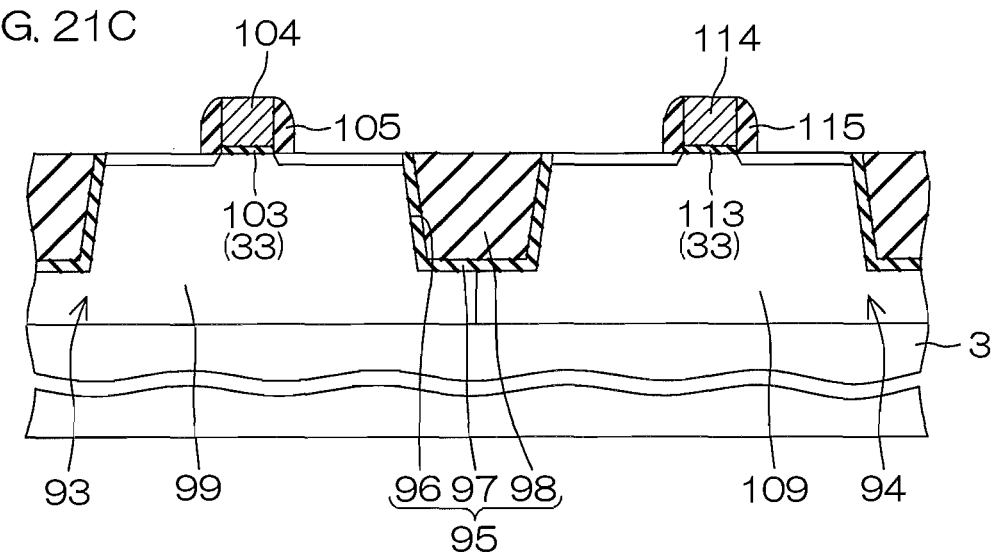

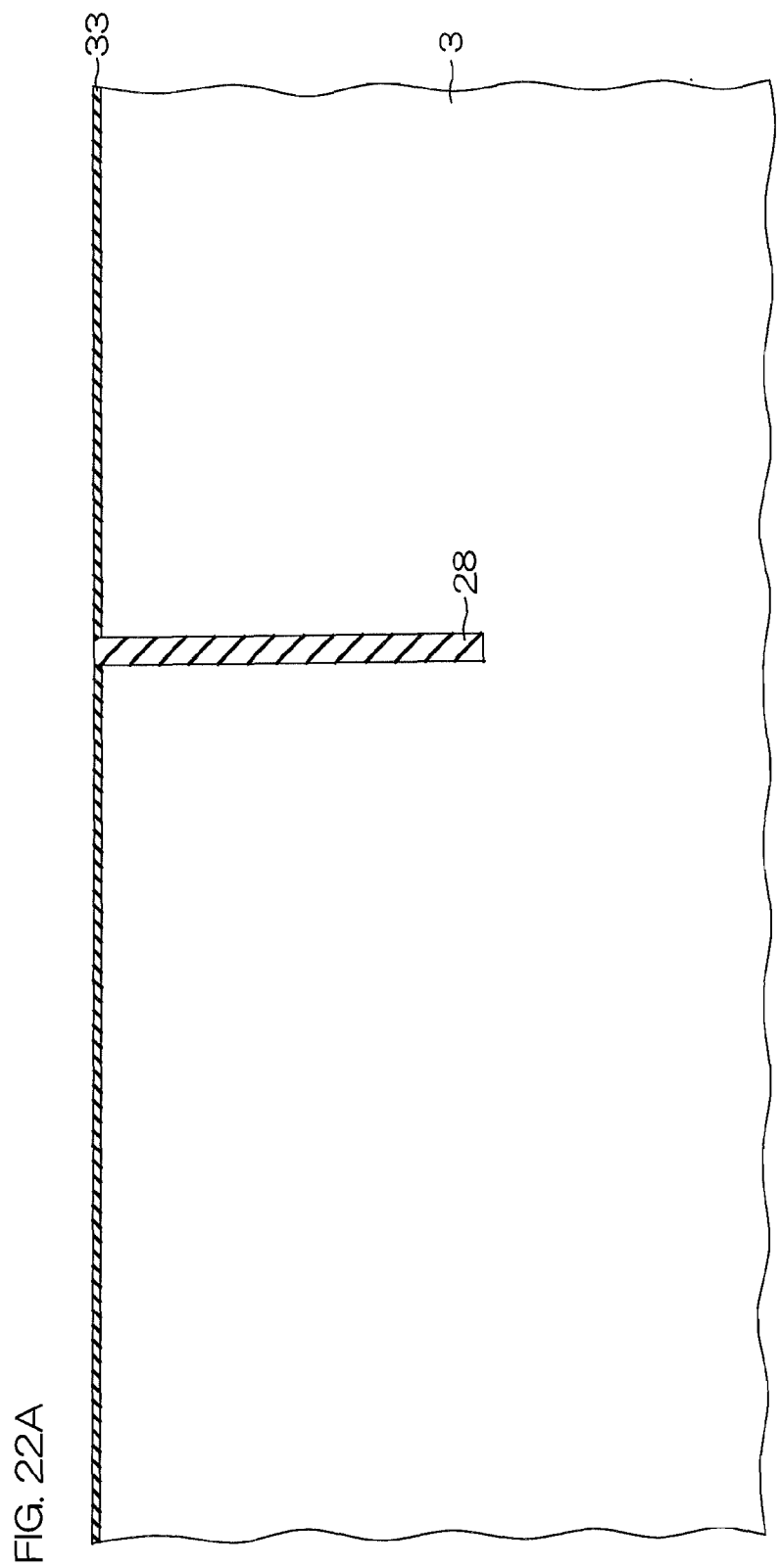

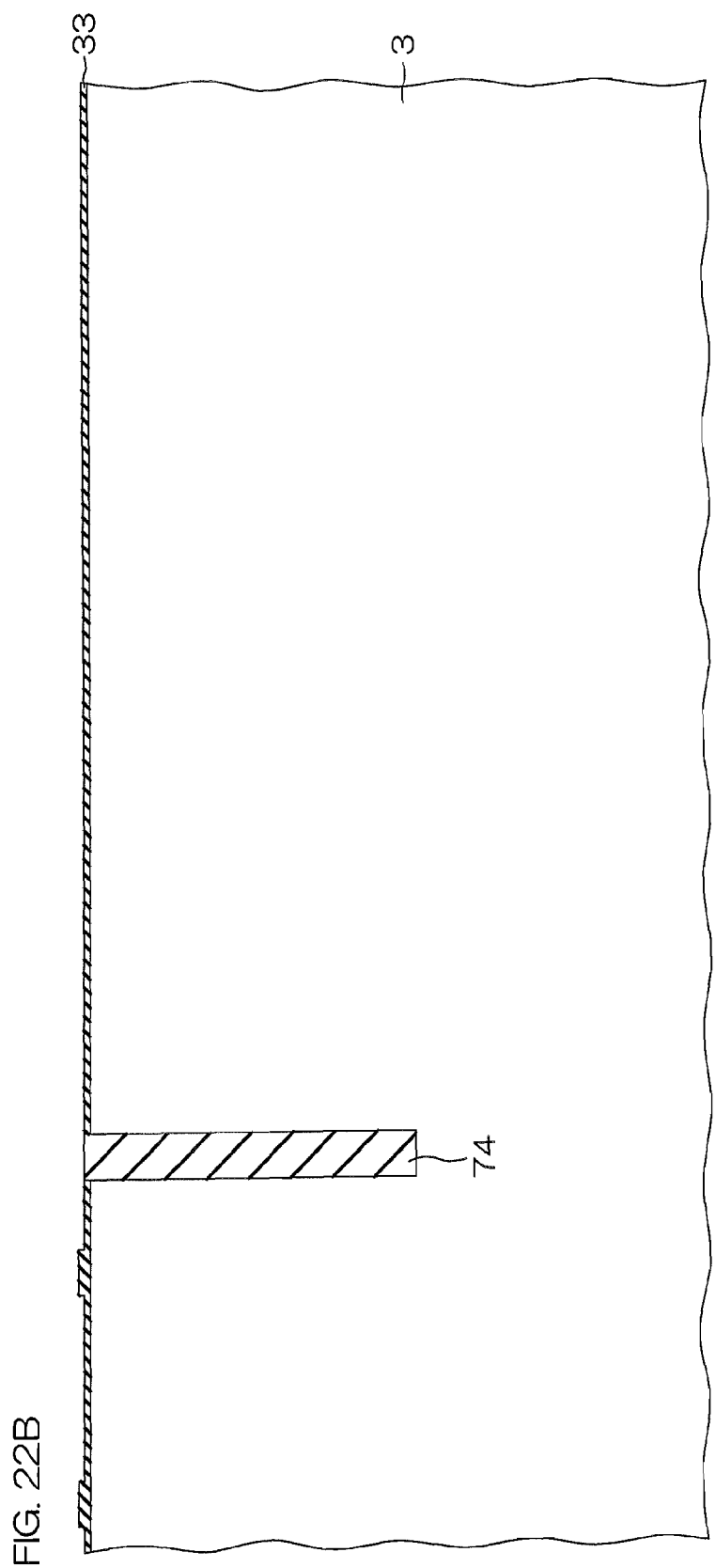

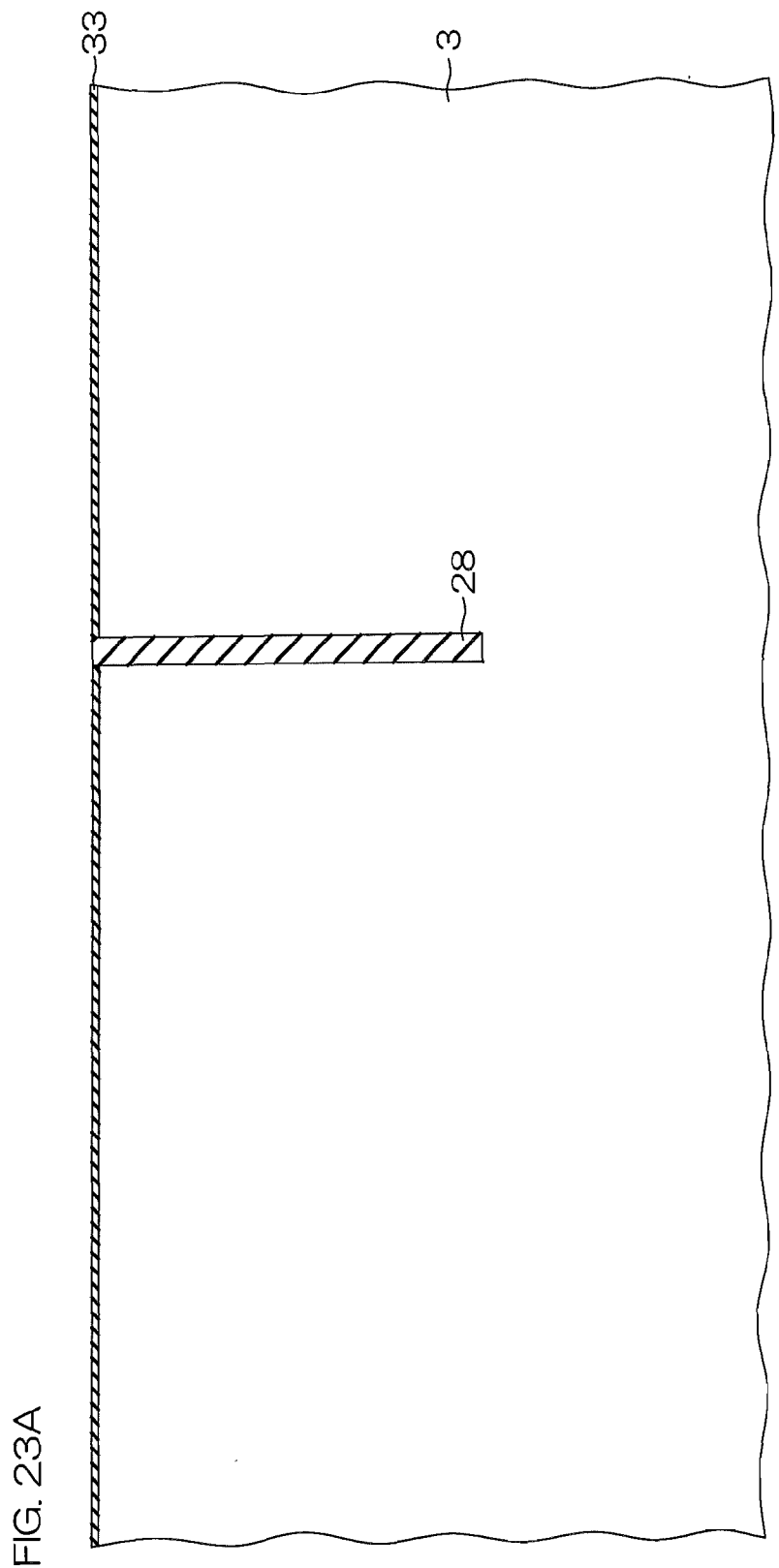

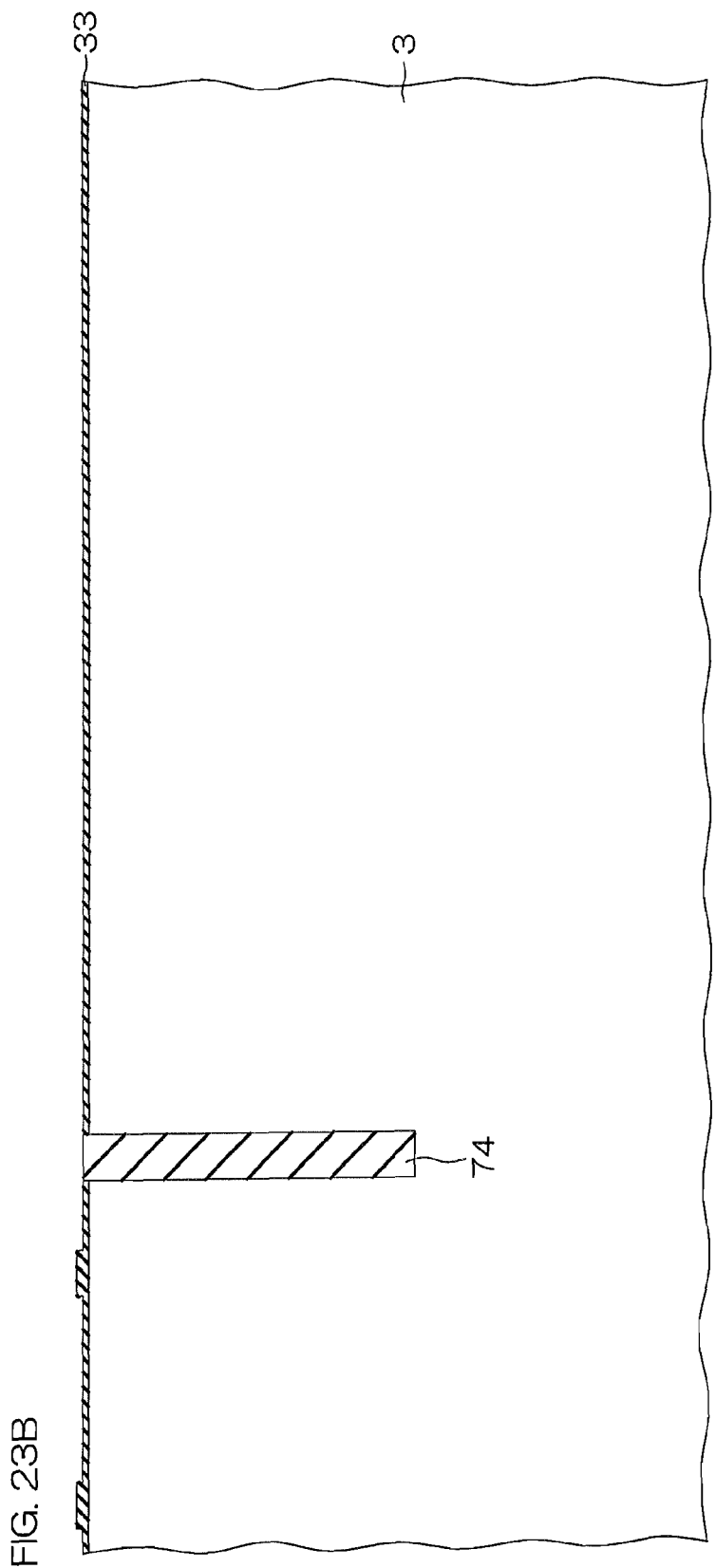

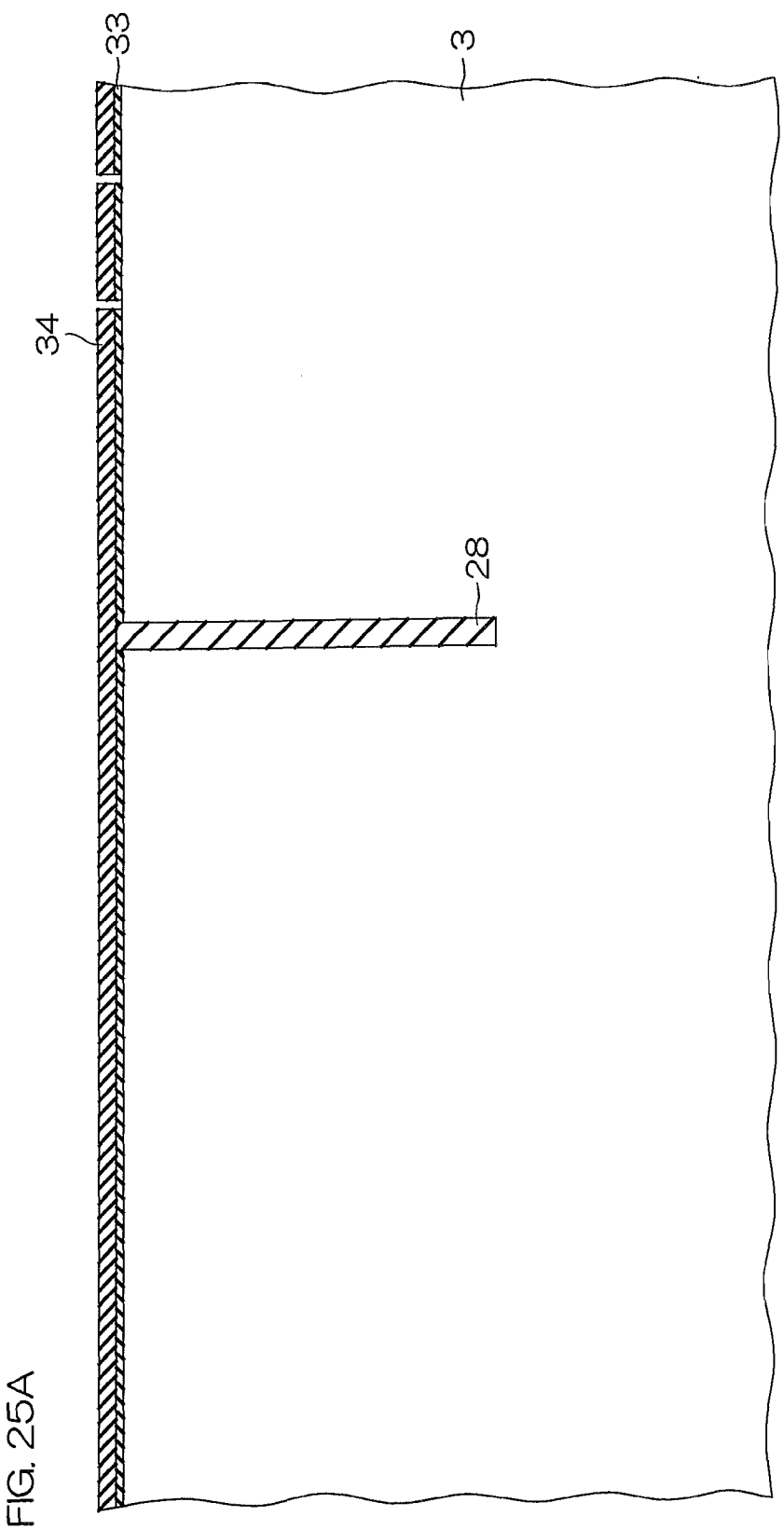

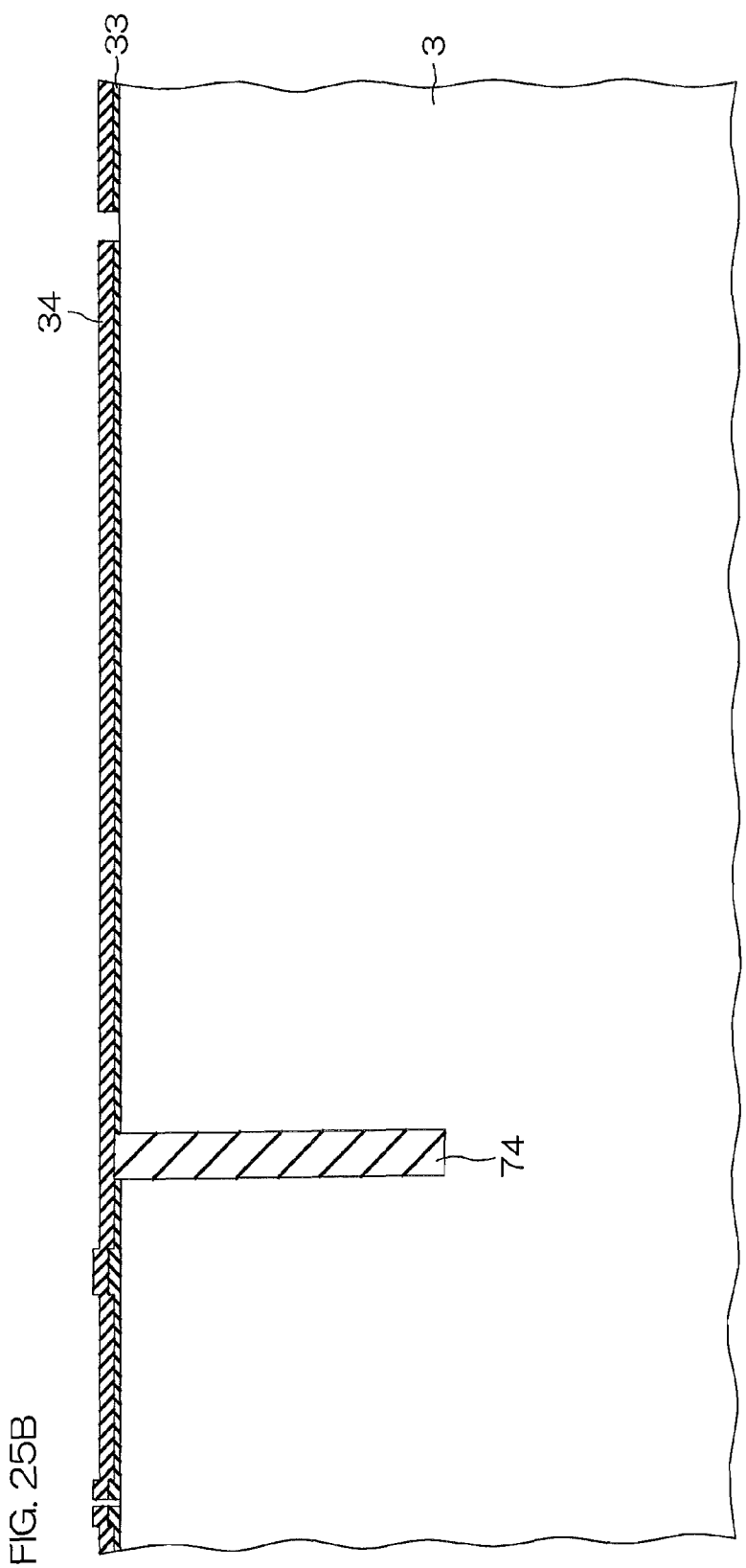

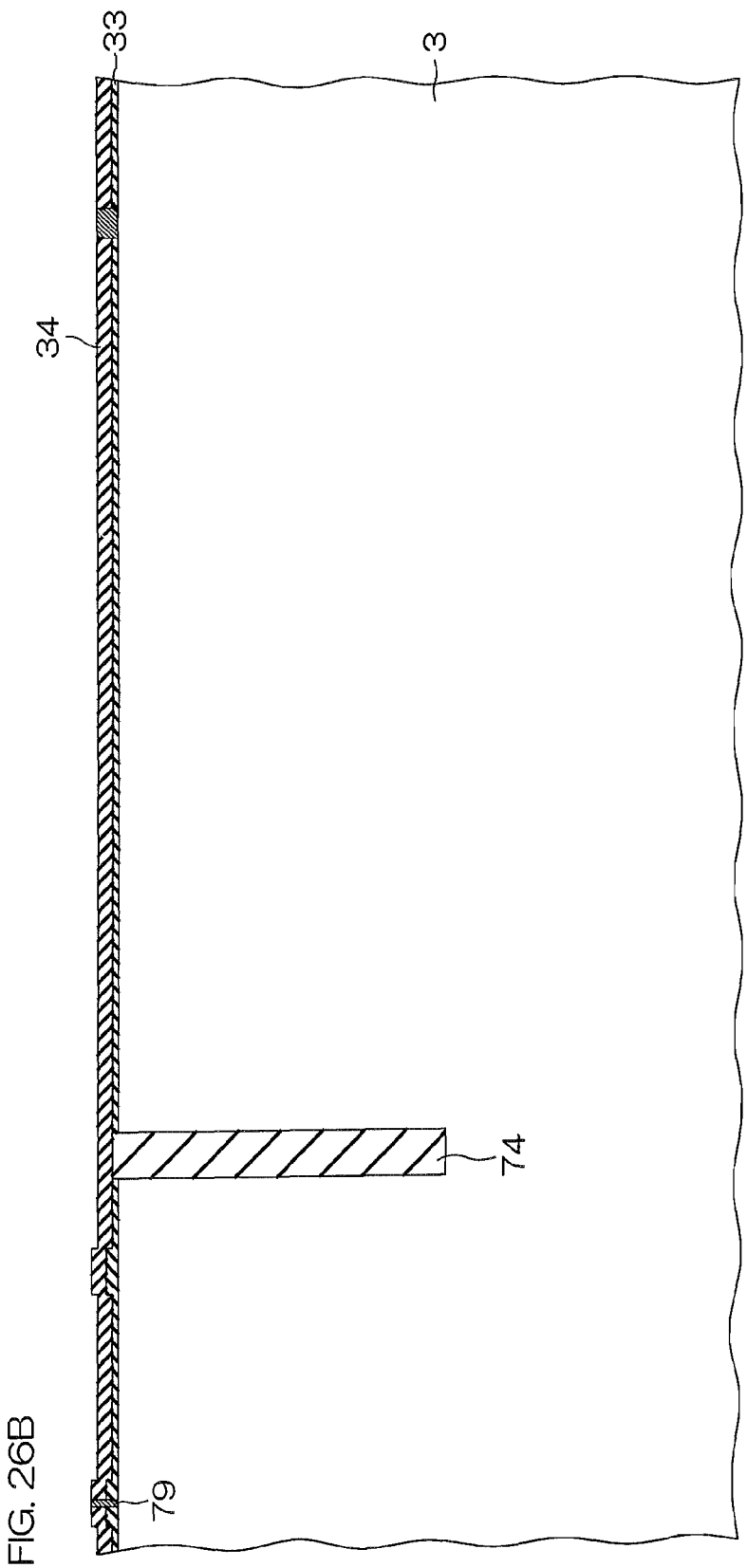

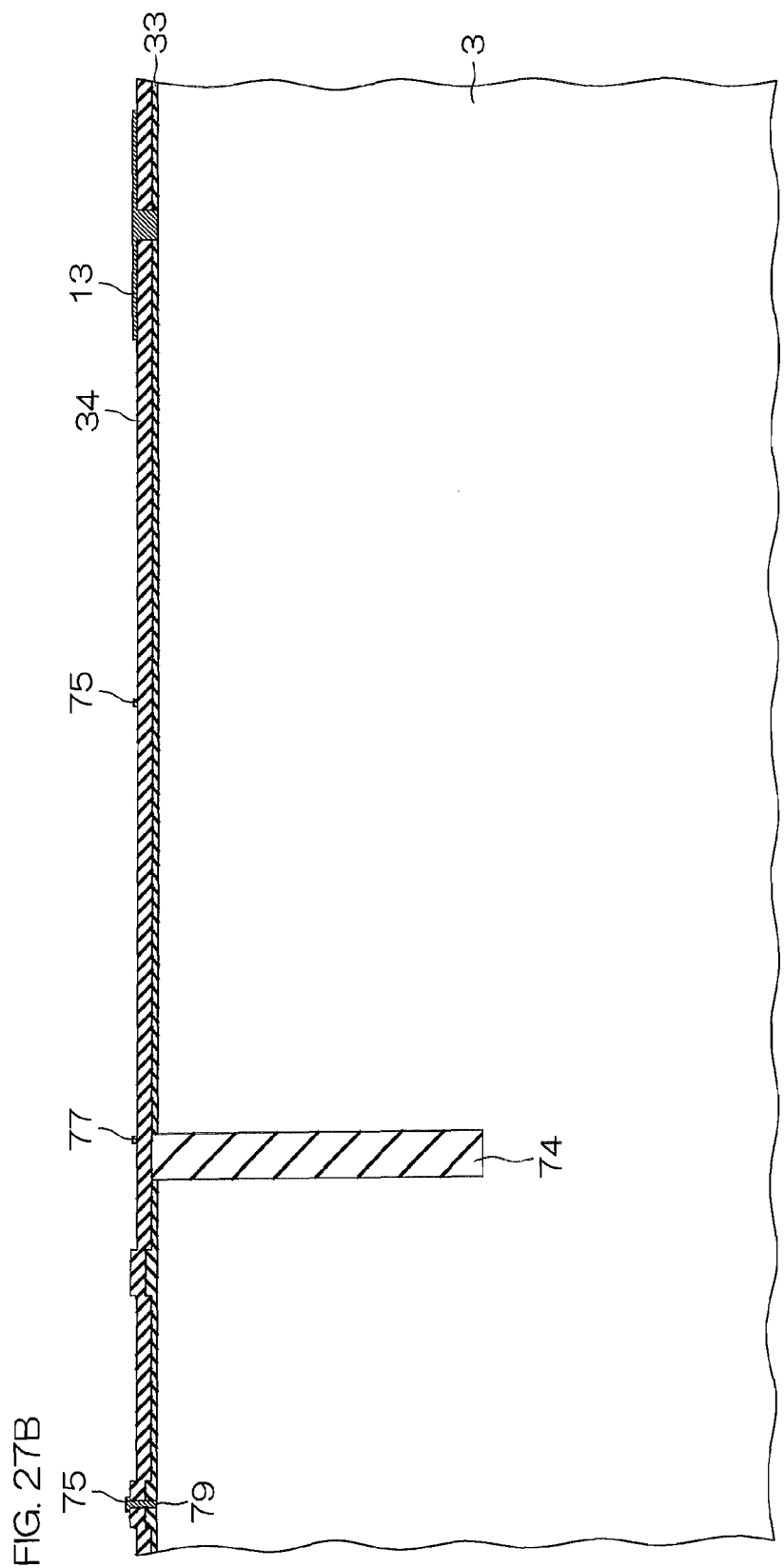

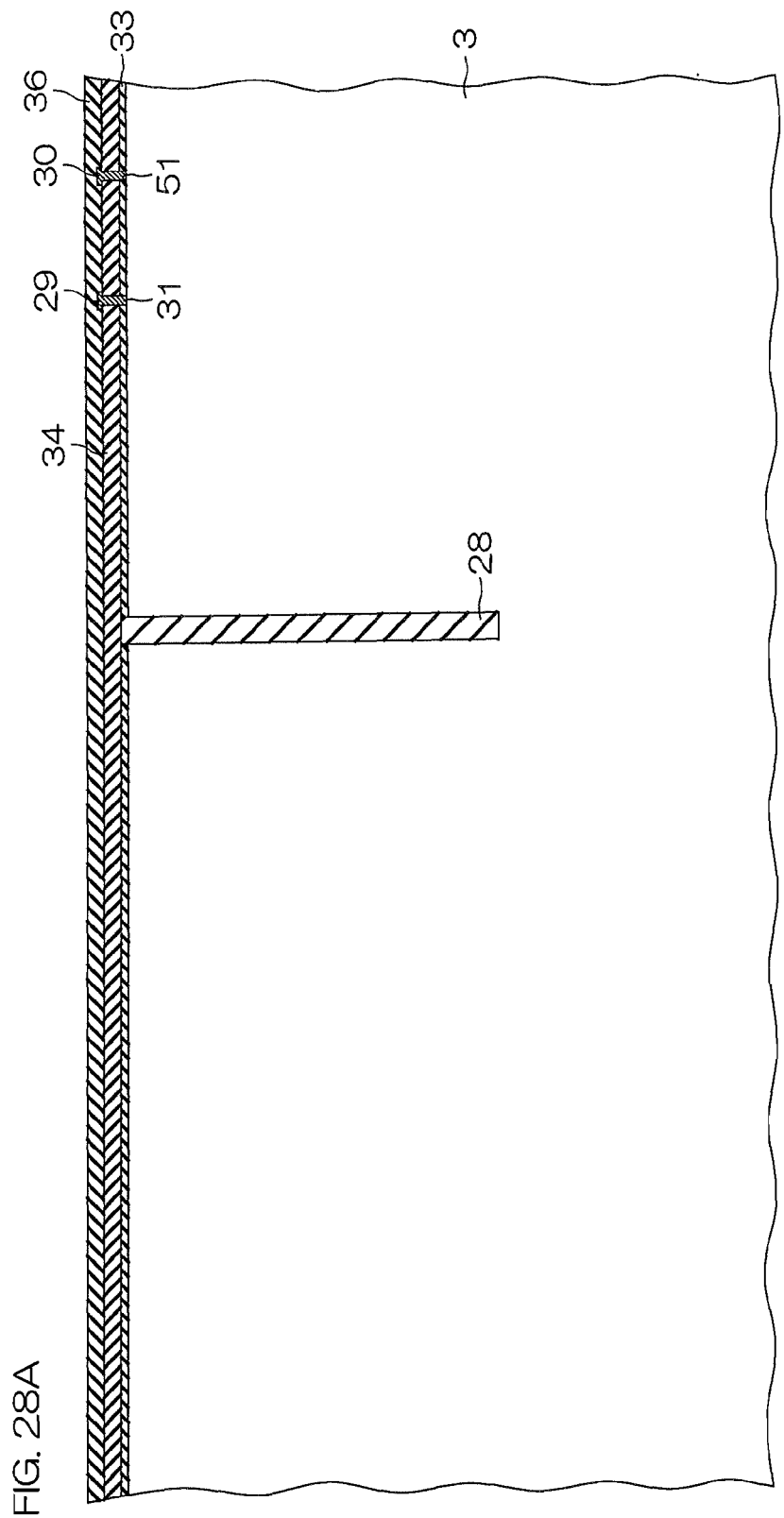

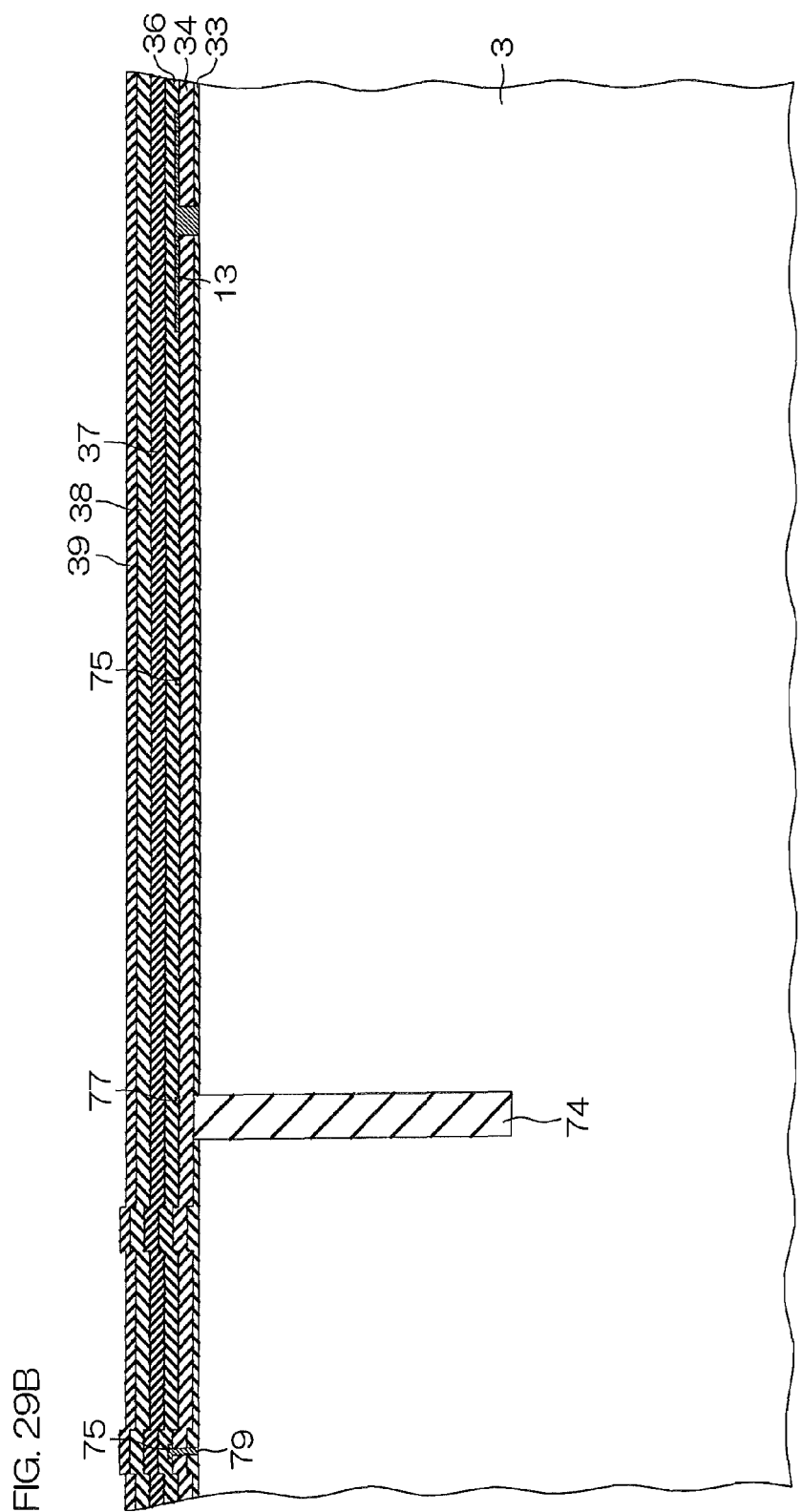

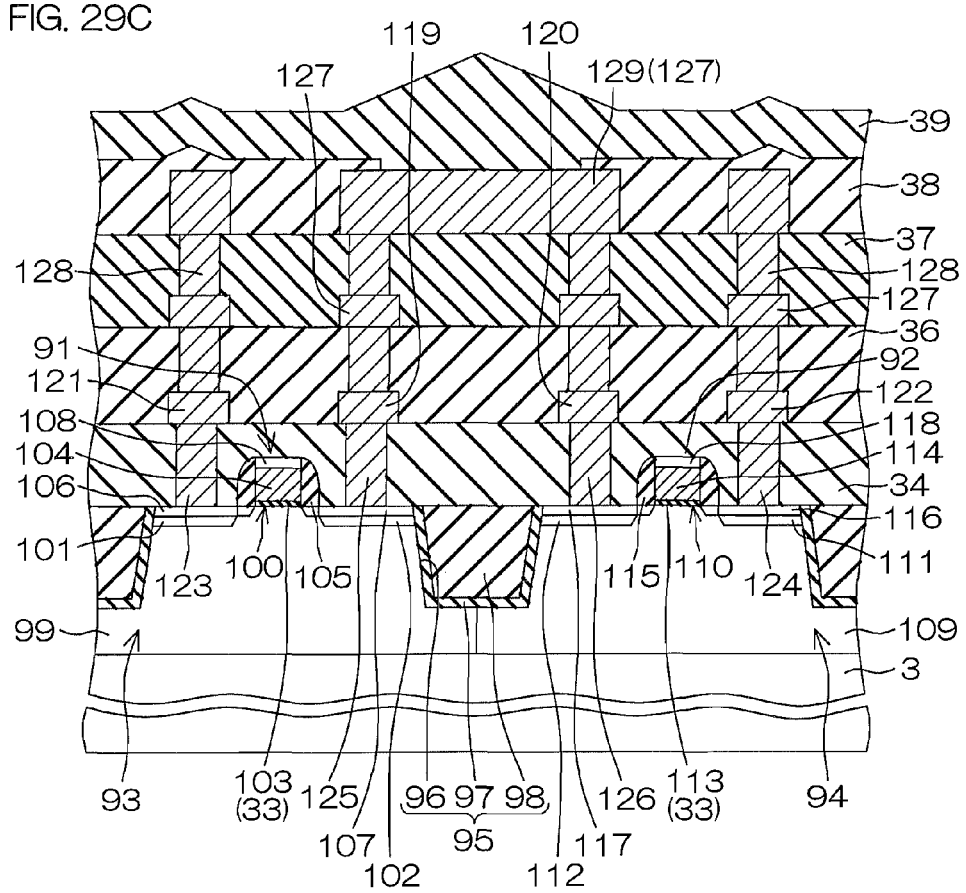

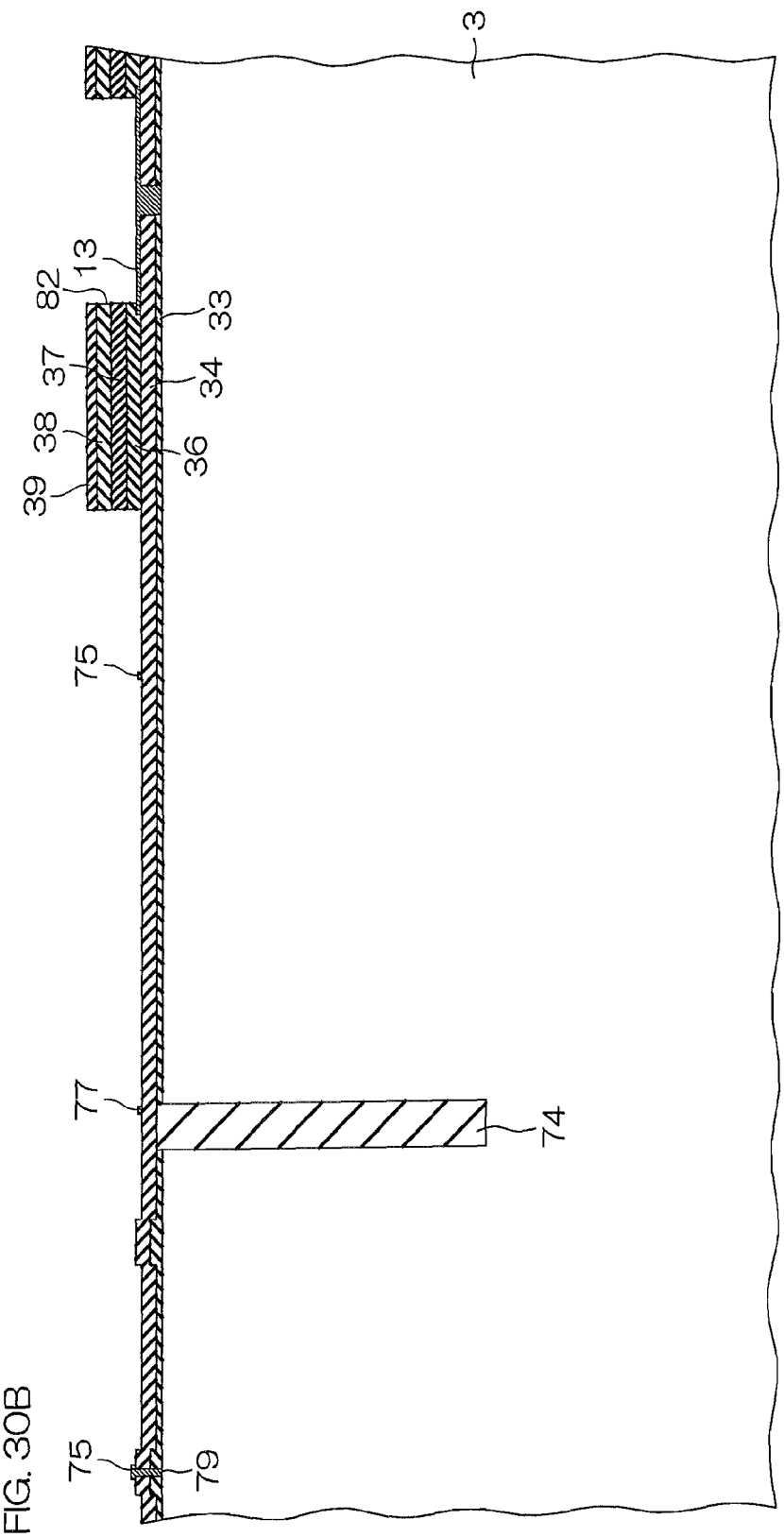

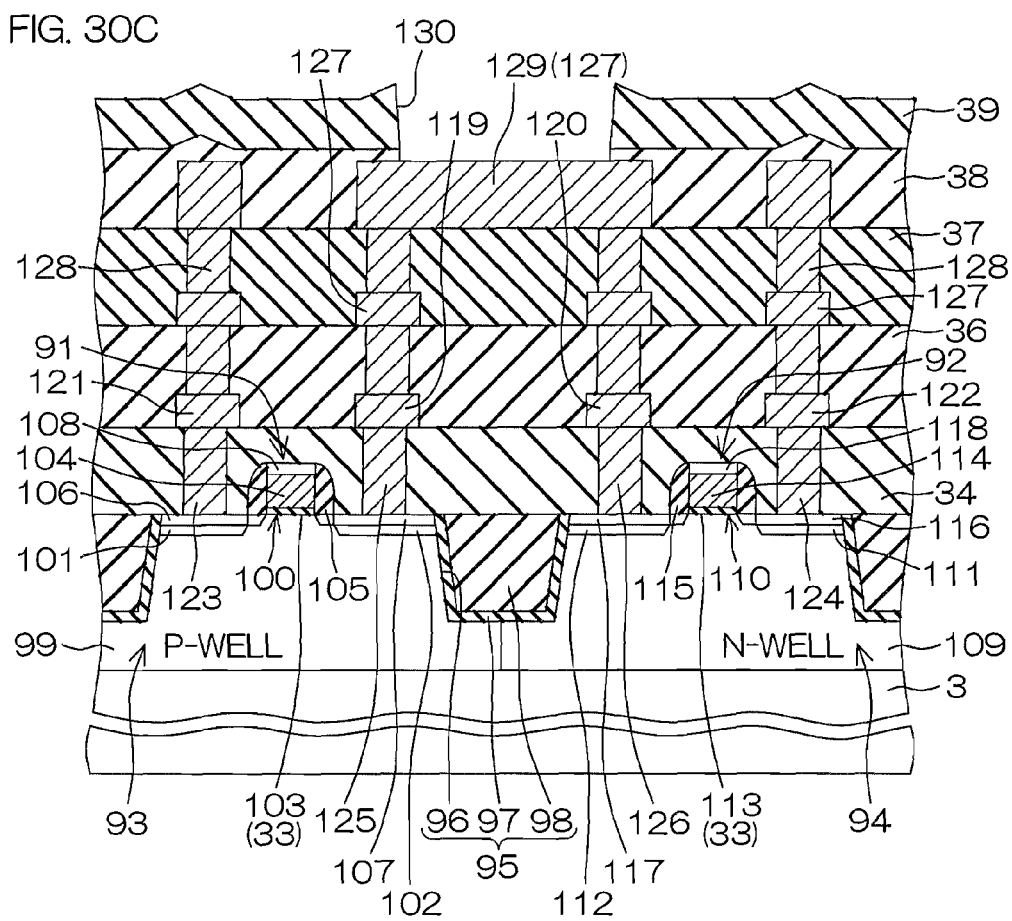

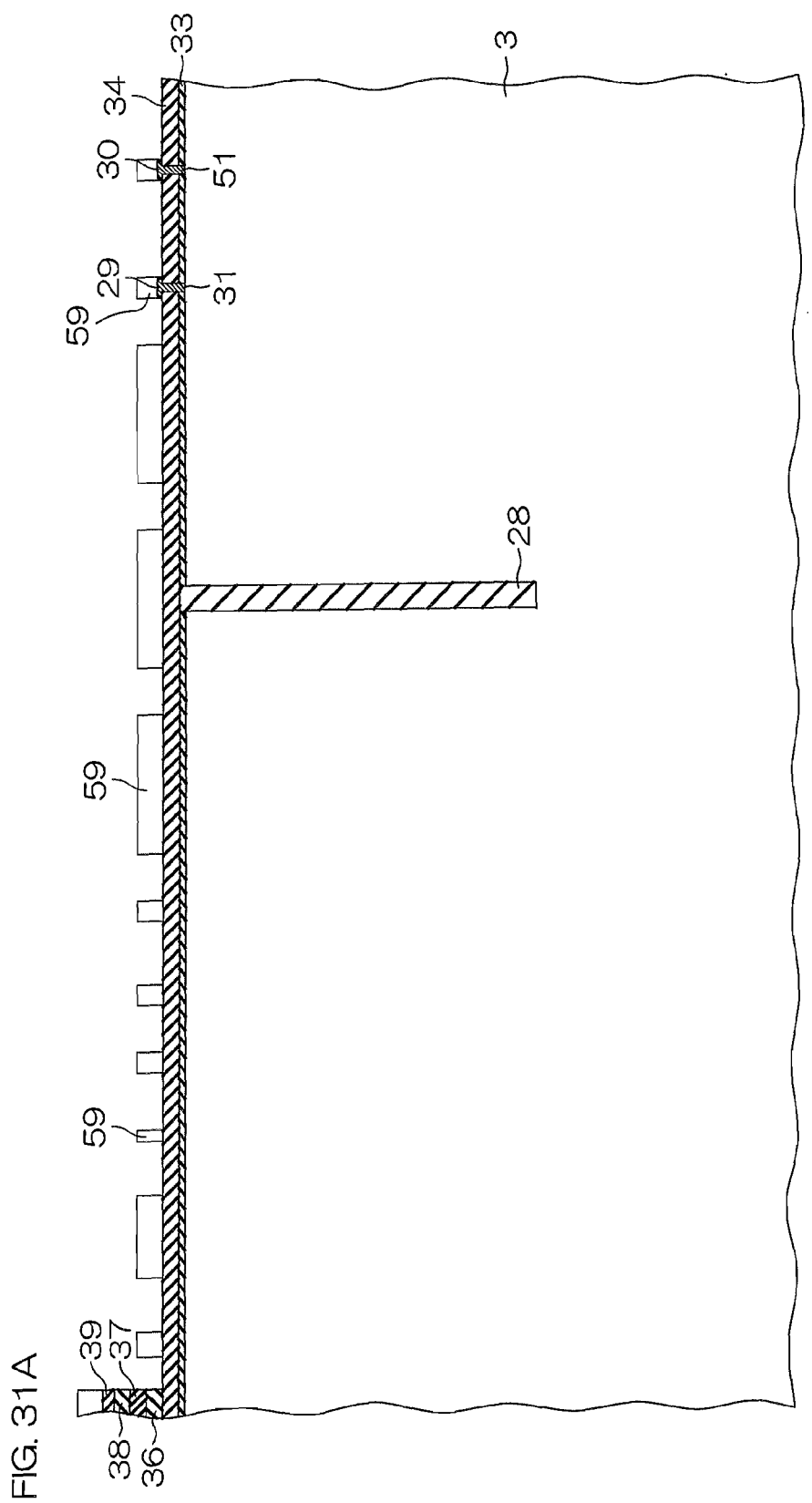

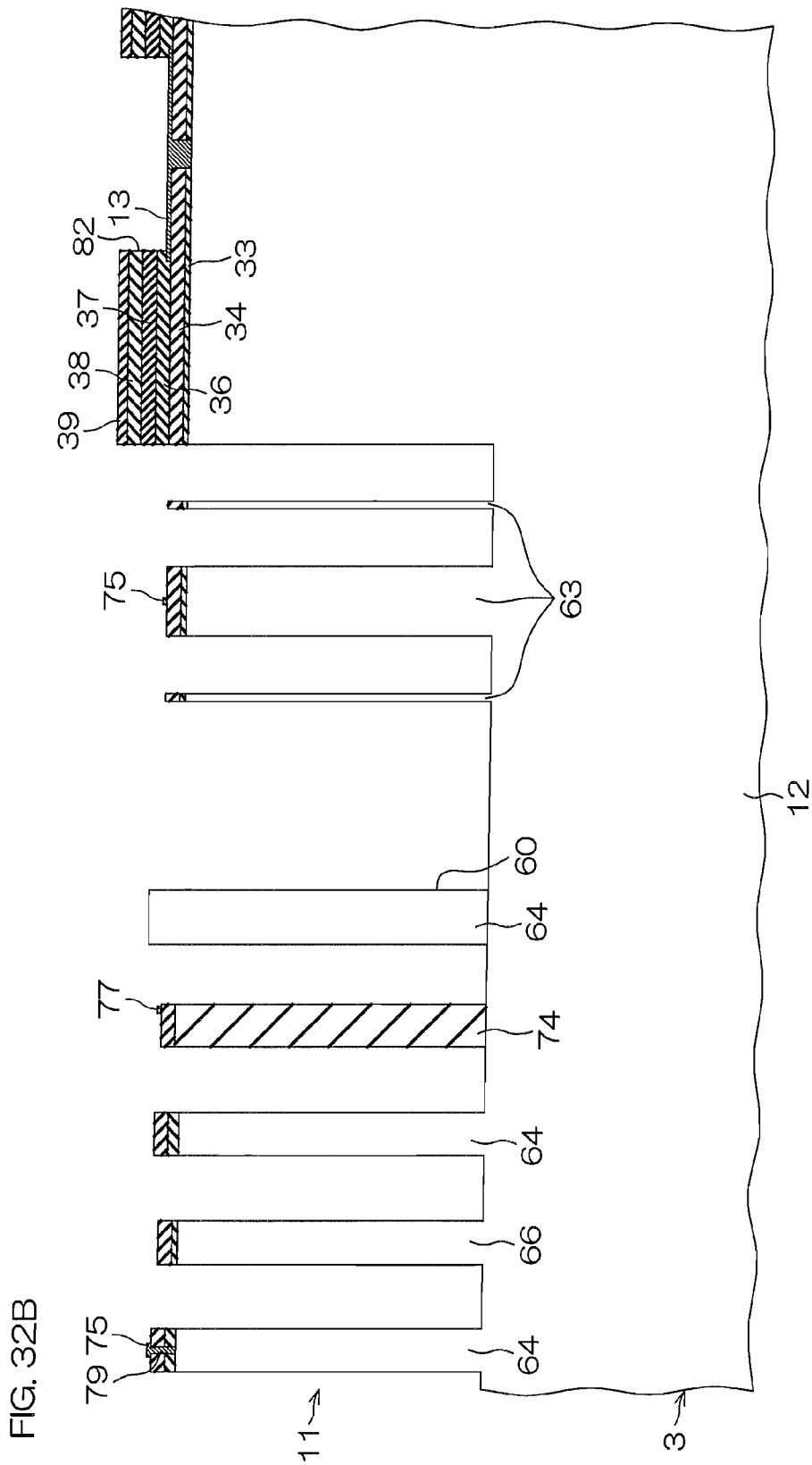

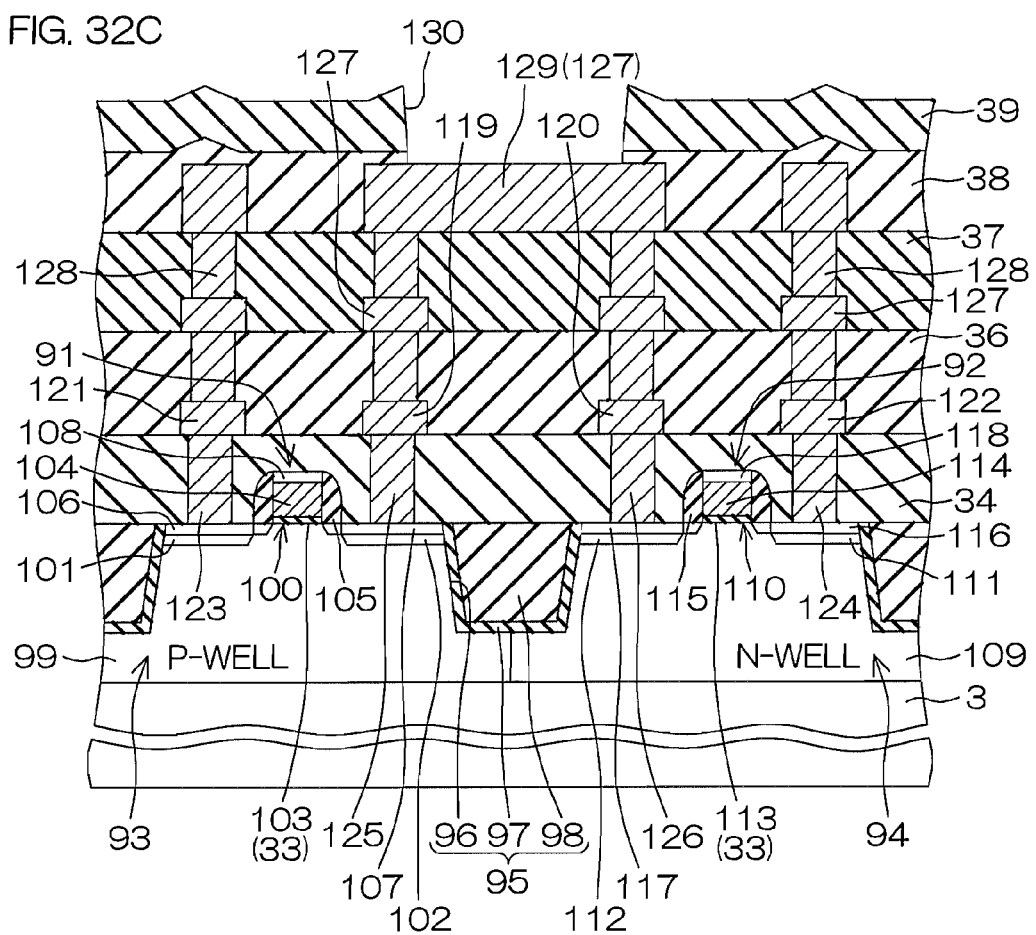

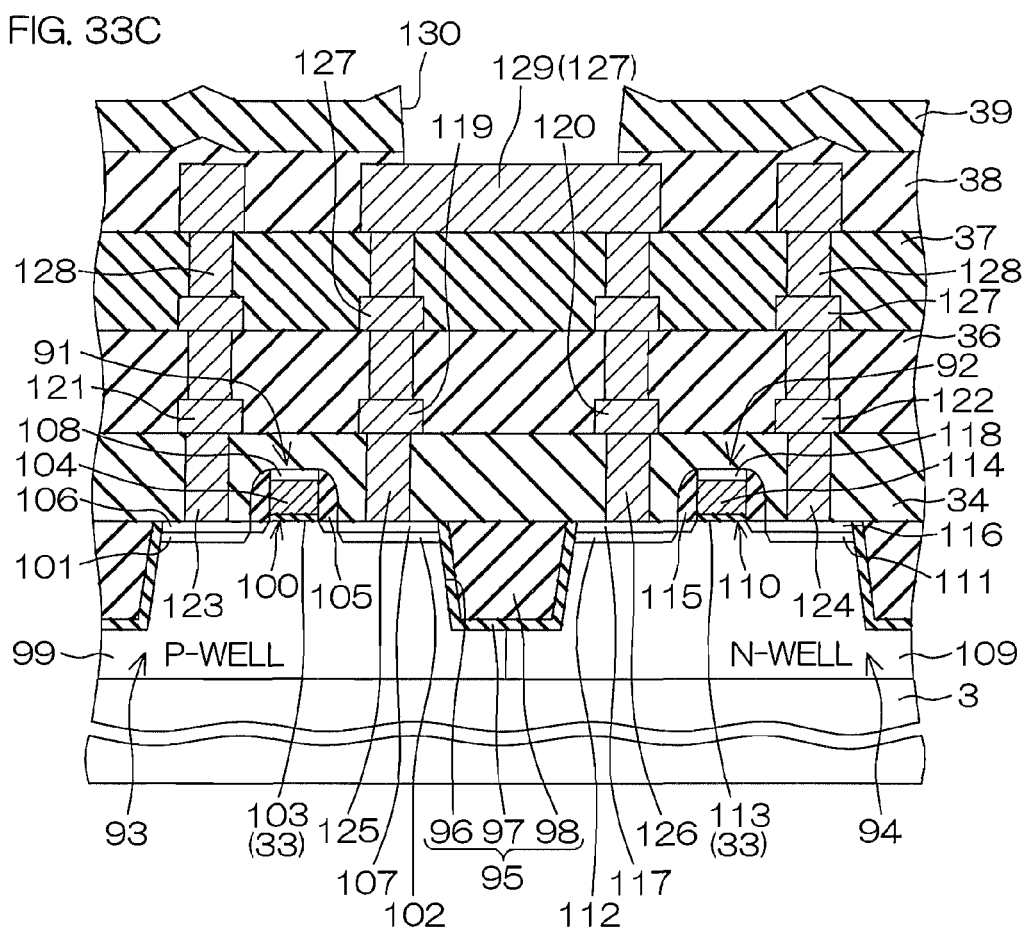

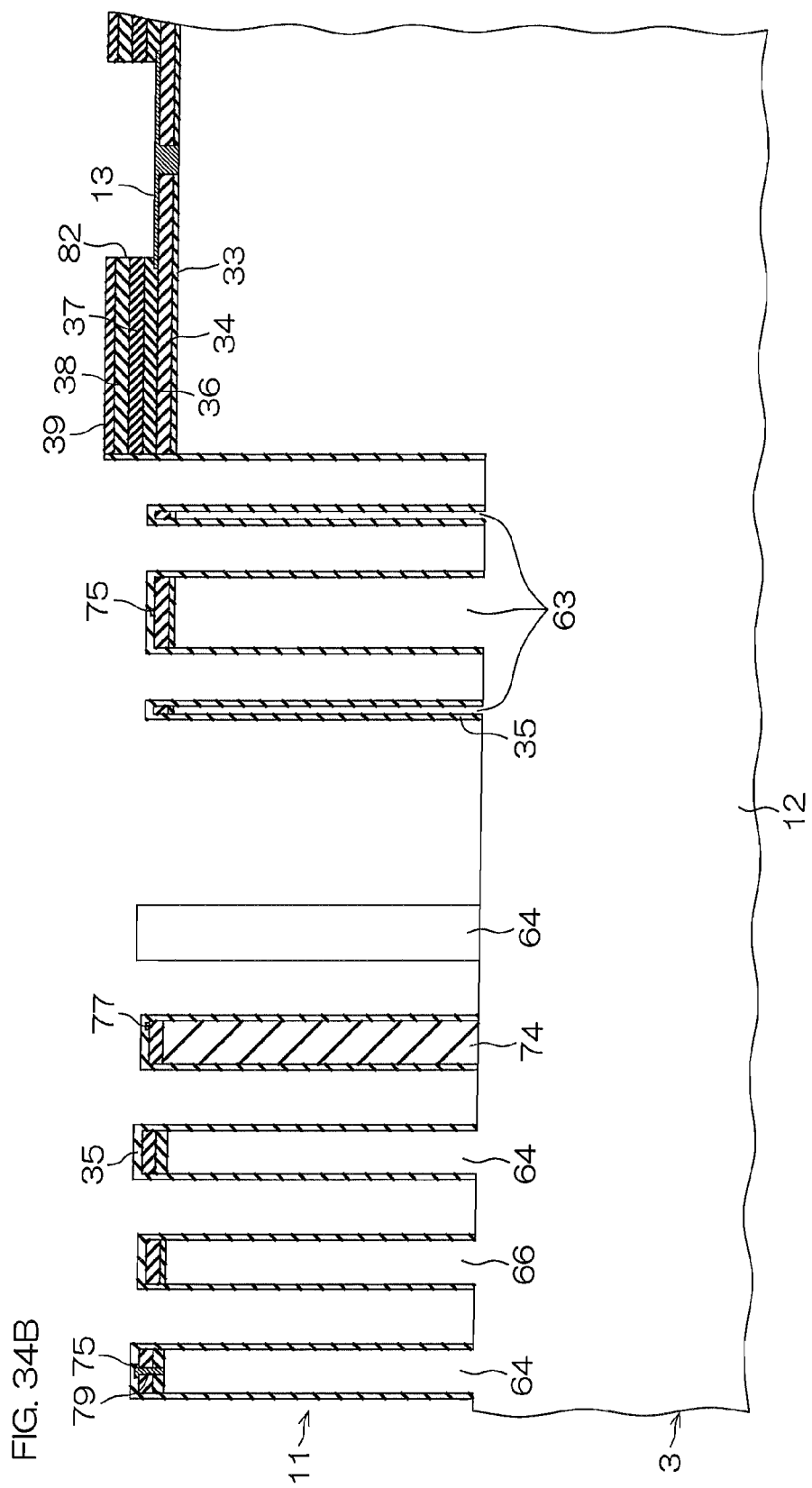

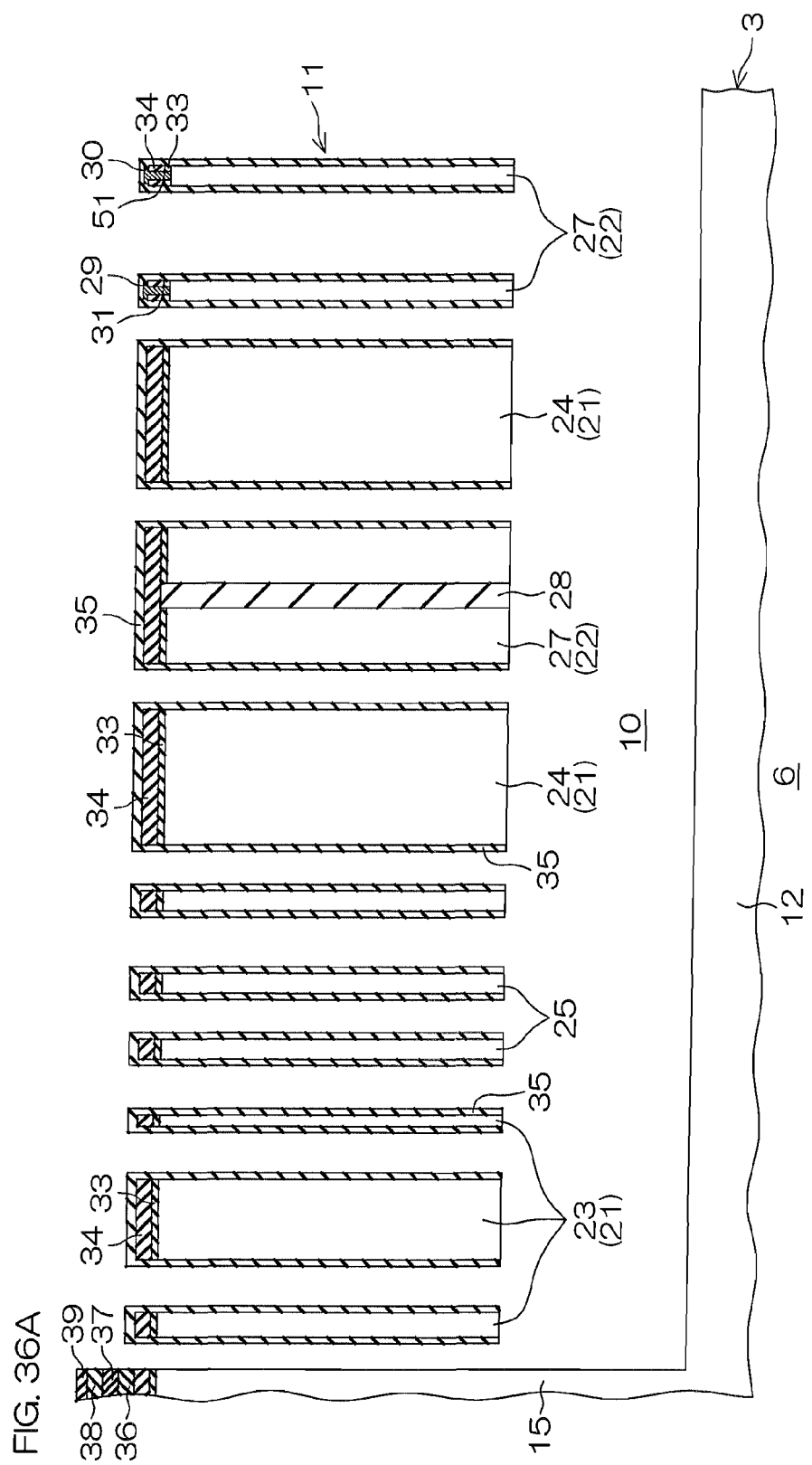

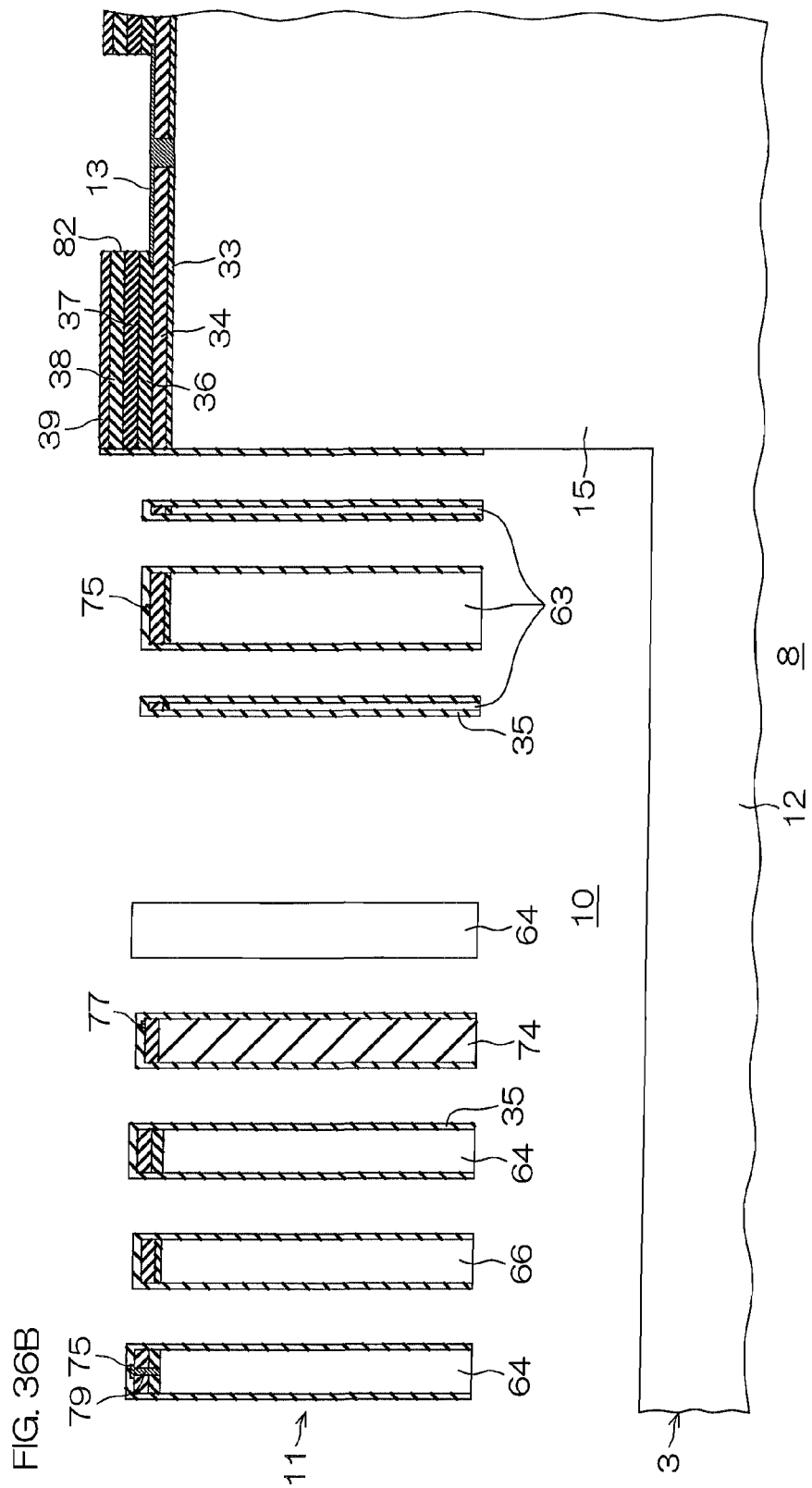

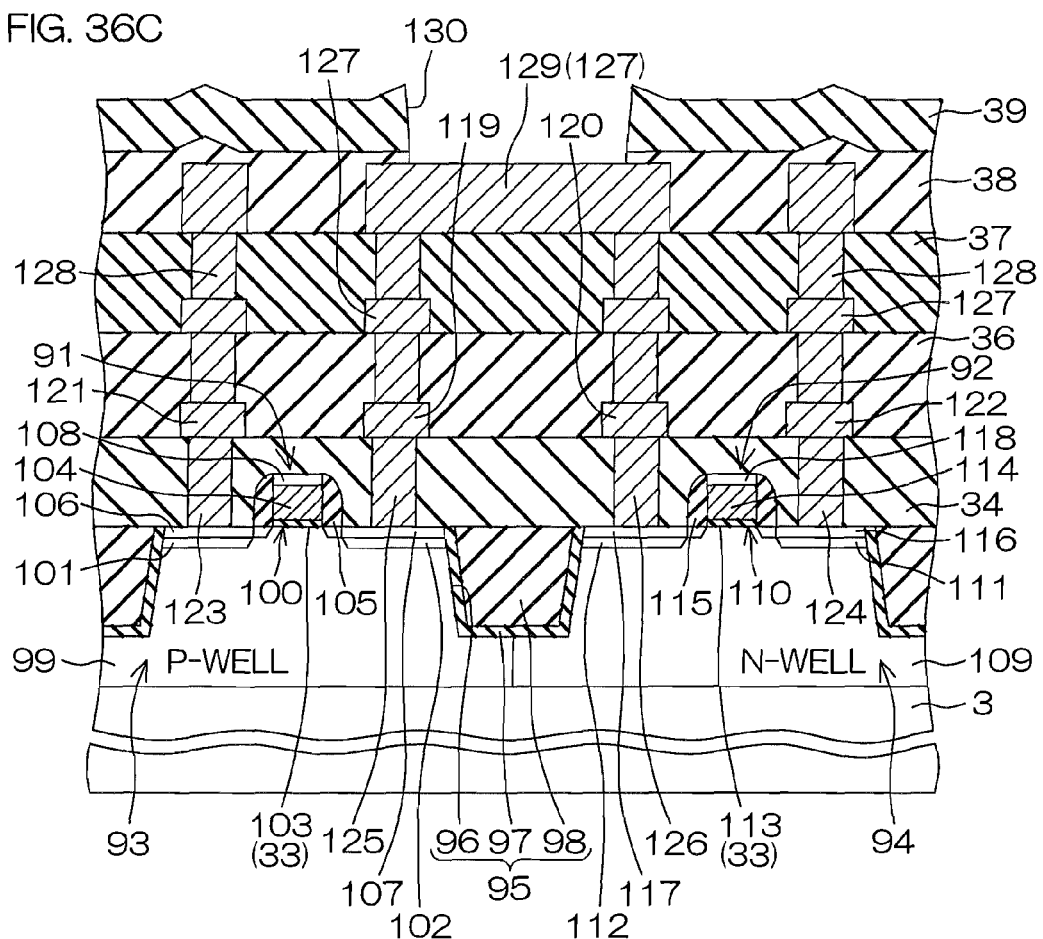

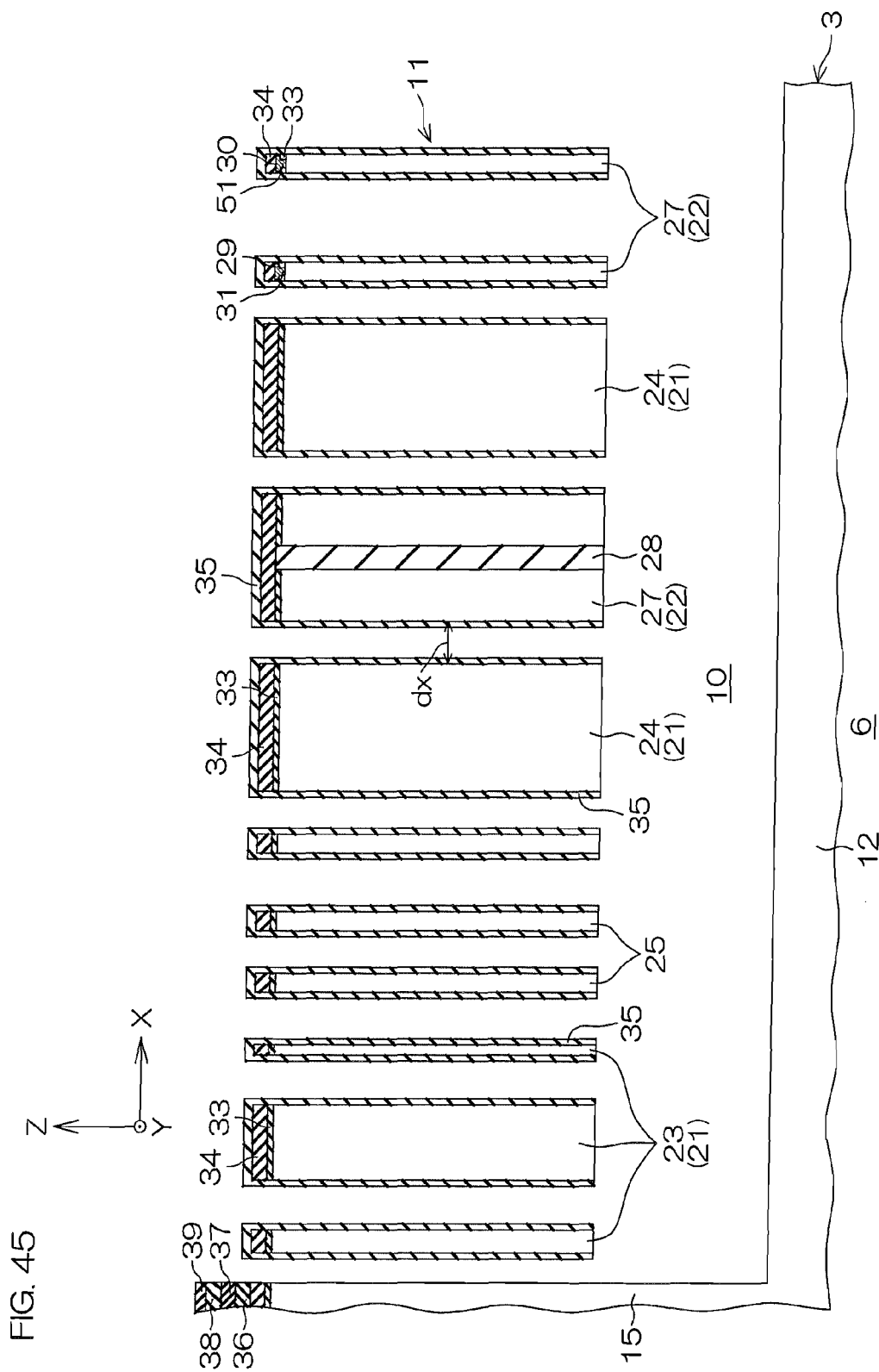

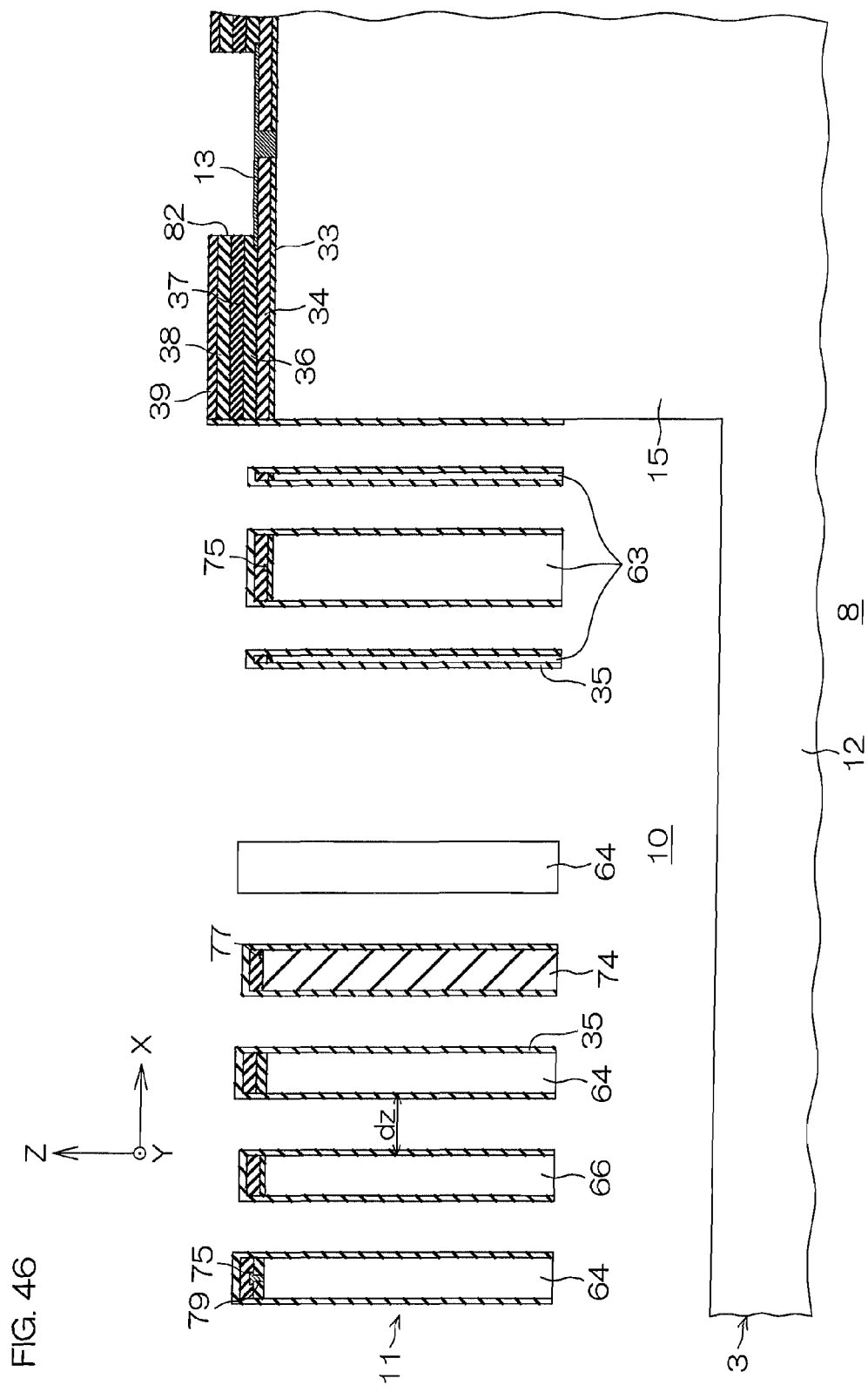

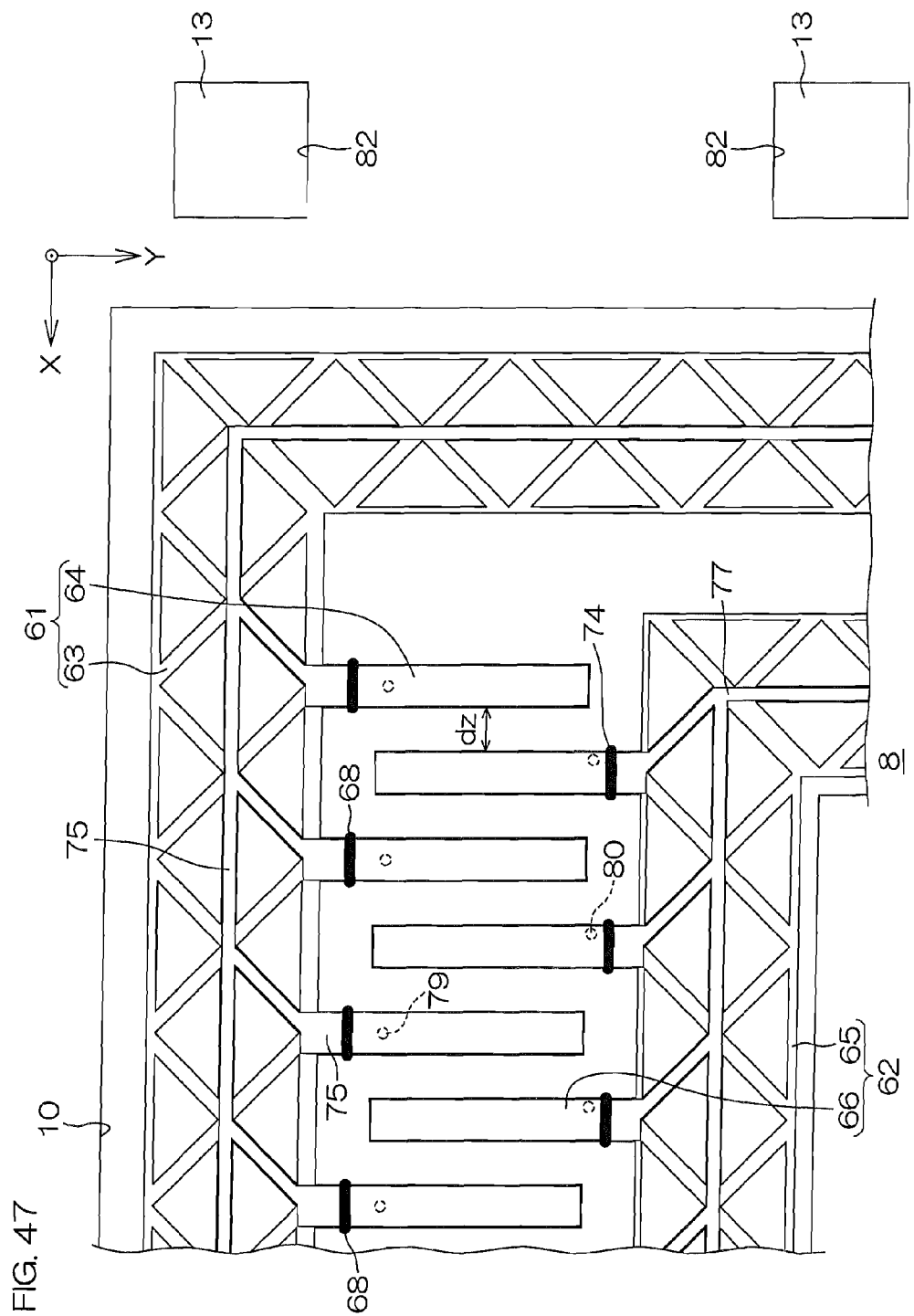

SEMICONDUCTOR DEVICE AND METHOD FOR MANUFACTURING SAME

TECHNICAL FIELD

The present invention relates to a capacitive MEMS sensor, as well as a semiconductor device including the same and a method for manufacturing the same.

BACKGROUND TECHNIQUE

There is known a capacitive acceleration sensor detecting acceleration acting on a substance by detecting change in capacitance between electrodes (between a fixed electrode and a movable electrode) opposed to each other.

A gyro sensor is utilized for applications such as image stabilization in a video camera or a still camera, position detection in a car navigation system, motion detection in a robot or a gaming machine and the like. An example of the gyro sensor has vibrators driven in respective axial directions one by one for three axes (an X-axis, a Y-axis and a Z-axis) orthogonal orthogonal to one another in a three-directional space, for example. The gyro sensor detects angular velocities acting around the respective axes through Coriolis force acting on the respective vibrators when the sensor inclines. There is also known a gyro sensor detecting angular velocities as to three axes with one rotator, dissimilarly thereto.

For example, the so-called seesaw type is known as a structure of a capacitive acceleration sensor. A seesaw acceleration sensor has an oxide film formed on a semiconductor substrate, a fixed electrode formed on the oxide film and movable electrodes separatingly provided above the fixed electrode to be opposed to the fixed electrode, as a structure detecting acceleration acting in a Z-axis direction, for example. When acceleration acts on the acceleration sensor in the Z-axis direction, the pair of movable electrodes vibrate to alternately vertically move in a direction approaching the fixed electrode and a direction separating therefrom along the Z-axis direction, as if the same constitute a seesaw. The acceleration sensor detects the acceleration in the Z-axis direction by detecting change in capacitance between the movable electrodes and the fixed electrode.

The aforementioned seesaw acceleration sensor is prepared by a technique, such as epitaxial growth, CMP (Chemical Mechanical Polishing), sacrificial layer etching or the like, for example, employed in preparation of an MEMS (Micro Electro Mechanical Systems) device.

More specifically, the oxide film and a sacrificial layer are successively formed on the semiconductor substrate, and an opening of the same pattern as the fixed electrode is formed in the sacrificial layer, for example. Further, a polysilicon layer is formed on the sacrificial layer to fill up the opening, and polysilicon other than the polysilicon layer in the opening is removed by CMP. Thus, the polysilicon layer in the opening is formed as the fixed electrode. Thereafter another sacrificial layer is further formed to cover the fixed electrode, and the sacrificial layer is patterned, so that openings for growing the movable electrodes are formed. Then, an epitaxial layer is formed on the sacrificial layer by epitaxially growing polysilicon from the opening. Thereafter a through-hole reaching the sacrificial layers from the surface of the epitaxial layer is formed. Then, all sacrificial layers are etched through the through-hole. Thus, the sacrificial layers between the movable electrodes and the fixed electrode are removed, and the movable electrodes in a state floating above the fixed electrode are formed.

In a method for manufacturing a capacitive gyro sensor, on the other hand, an oxide film and a sacrificial layer are successively formed on a semiconductor substrate, and an opening of the same pattern as a lower electrode is formed in the sacrificial layer, for example. Further, a polysilicon layer is formed on the sacrificial layer to fill up the opening, and polysilicon other than the polysilicon layer in the opening is removed by CMP. Thus, the polysilicon layer in the opening is formed as the lower electrode. Thereafter another sacrificial layer is further formed to cover the lower electrode, and the sacrificial layer is patterned, so that openings for growing a fixed electrode and a movable electrode are formed. Then, an epitaxial layer is formed on the sacrificial layer by epitaxially growing polysilicon from the openings. Thereafter a through-hole reaching the sacrificial layers from the surface of the epitaxial layer is formed, whereby the fixed electrode and the movable electrode isolated from one another are formed. Further, all sacrificial layers are etched through the through-hole. Thus, the sacrificial layers between the movable electrode and the lower electrode are removed, and the movable electrode enters a state floating with respect to the lower electrode.

PRIOR ART

Patent Document

Patent Document 1: National Patent Publication Gazette No. 2007-523755

SUMMARY OF THE INVENTION

Problems to be Solved by the Invention

It is preferable when an acceleration sensor is formed on the same semiconductor substrate as an integrated circuit represented by a CMOS circuit and can be on one chip. This is because a package size can be reduced and reduction of a package cost can be attained when the acceleration sensor is on one chip. Further, the acceleration sensor and the integrated circuit can be connected with each other by employing a wire on the semiconductor substrate, whereby a wire for connecting the sensor and the circuit with each other can be omitted. Thus, generation of wire noise in detection of acceleration can be prevented.

In the conventional manufacturing steps, however, the step of epitaxially growing polysilicon on the sacrificial layer is carried out in order to form the movable electrodes, and hence the semiconductor substrate is set in a high-temperature environment of 700° C. to 1200° C. at this time. Even if a fine device such as a CMOS device is formed on the semiconductor substrate, therefore, it is difficult to hold the structure thereof. Therefore, an integrated circuit device provided on the semiconductor substrate is restricted to a relatively large device such as a bipolar transistor (whose device size is about 2 μm, for example). Consequently, reduction of the package size is limited.

When utilizing an SOI (Silicon On Insulator) substrate, on the other hand, there is such room that the acceleration sensor and the CMOS device can be loaded on the same substrate. According to a technique of forming the CMOS device on an Si lower below an insulating film of the SOI substrate and utilizing another Si layer above the insulating film as a fixed electrode and a movable electrode, for example, execution of the epitaxial growth step may be avoidable. In such configuration, however, it is extremely difficult to form a lower wire to be electrically connected to the CMOS device on the lower Si layer, and the step therefor is complicated even if the same can be formed.

In the aforementioned method for preparing the seesaw gyro sensor, a large number of layers (the polysilicon layer, the epitaxial layer and the like) are piled up on the semiconductor substrate, and hence the bulk of the whole of the prepared sensor enlarges.

Further, treatments such as the patterning of the sacrificial layers, deposition of the layer materials (polysilicon and the like), CMP of the material layers and the like must be repeatedly performed, and hence the manufacturing steps are complicated.

An object of the present invention is to provide a semiconductor device in which a CMIS transistor and a capacitive acceleration sensor can be loaded on the same semiconductor substrate in simple configuration so that reduction of a package cost and improvement of detection accuracy of the acceleration sensor can be attained and a method for manufacturing the same.

Another object of the present invention is to provide a capacitive gyro sensor easily manufacturable and capable of implementing miniaturization.

Still another object of the present invention is to provide a capacitive gyro sensor miniature and excellent in detection accuracy.

Solutions to Problems

A semiconductor device according to one aspect of the present invention includes a semiconductor substrate having a sensor region and an integrated circuit region, with a cavity formed immediately under a surface layer portion of the sensor region, a capacitive acceleration sensor formed on the sensor region, and a CMIS (Complementary Metal Insulator Semiconductor) transistor formed on the integrated circuit region, while the capacitive acceleration sensor includes an interdigital fixed electrode and an interdigital movable electrode formed by working the surface layer portion opposed to the cavity to mesh with each other at an interval, and the CMIS transistor includes an N-type well region formed on a surface layer portion of the semiconductor substrate in the integrated circuit region and having a P-type source region and a P-type drain region, a P-type well region formed on the surface layer portion of the semiconductor substrate in the integrated circuit region and having an N-type source region and an N-type drain region, and a gate electrode opposed to the respective ones of the N-type well region and the P-type well region through a gate insulating film formed on a surface of the semiconductor substrate.

In the semiconductor device, the sensor region and the integrated circuit region are provided on the same semiconductor substrate, while the capacitive acceleration sensor and the CMIS transistor are formed on these regions respectively. In other words, the capacitive acceleration sensor and the CMIS transistor are loaded on the same semiconductor substrate. Therefore, one-chip implementation of the capacitive acceleration sensor and the CMIS transistor can be achieved. Thus, the package size of the semiconductor device can be reduced, and the package cost can be lowered. Further, all of the fixed electrode and the movable electrode of the acceleration sensor as well as the impurity regions of the CMIS transistor are formed on the surface layer portion of the semiconductor substrate in simple configuration, whereby wires can be easily electrically connected to the electrodes and the impurity regions by forming the wires on the semiconductor substrate.

Further, the capacitive acceleration sensor and the CMIS transistor can be electrically connected with each other by forming the wires on the semiconductor substrate, whereby a bonding wire or the like for connecting the capacitive acceleration sensor and the CMIS transistor with each other can be omitted. Thus, generation of wire noise in detection of acceleration can be prevented. Consequently, acceleration can be precisely detected.

Preferably, the fixed electrode includes a fixed-side electrode portion insulated from the remaining portion of the fixed electrode by an insulating layer embedded in the surface layer portion of the semiconductor substrate, and the movable electrode includes a movable-side electrode portion insulated from the remaining portion of the movable electrode by an insulating layer embedded in the surface layer portion of the semiconductor substrate.

Thus, the surface of the semiconductor substrate can be maintained planar in a case of insulating the electrode portion of the fixed electrode and the electrode portion of the movable electrode from the remaining portions of the respective electrodes. Therefore, the surface (the planar surface) of the semiconductor substrate can be efficiently utilized as a space for drawing the wires or the like for electrically connecting the capacitive acceleration sensor and the CMIS transistor with each other.

The capacitive acceleration sensor may include, assuming that two directions orthogonal to each other along the surface of the semiconductor substrate are an X-axis direction and a Y-axis direction and a direction along the thickness direction of the semiconductor substrate orthogonal to the X-axis and the Y-axis is a Z-axis direction, an X-axis sensor detecting acceleration along the X-axis direction, a Y-axis sensor detecting acceleration along the Y-axis direction and a Z-axis direction detecting acceleration along the Z-axis direction, each of the X-axis sensor, the Y-axis sensor and the Z-axis sensor may include the fixed electrode and the movable electrode, an X fixed electrode as the fixed electrode of the X-axis sensor may be fixed to the semiconductor substrate, an X movable electrode as the movable electrode of the X-axis sensor may be formed to advance to/retreat from the X fixed electrode along the X-axis direction with respect to the semiconductor substrate, a Y fixed electrode as the fixed electrode of the Y-axis sensor may be fixed to the semiconductor substrate, a Y movable electrode as the movable electrode of the Y-axis sensor may be formed to advance to/retreat from the Y fixed electrode along the Y-axis direction with respect to the semiconductor substrate, a Z fixed electrode as the fixed electrode of the Z-axis sensor may be fixed to the semiconductor substrate, and a Z movable electrode as the movable electrode of the Z-axis sensor may be formed to advance to/retreat from the Z fixed electrode along the Z-axis direction with respect to the semiconductor substrate.

Thus, acceleration acting on three axes (the X-axis, the Y-axis and the Z-axis) orthogonal to one another in a three-dimensional space can be measured with one device.

Preferably, the sensor region is arranged on a central portion of the semiconductor substrate, and the integrated circuit region is arranged on a peripheral portion surrounding the sensor region.

The sensor region is arranged on the central portion of the semiconductor substrate, i.e., the cavity of the semiconductor substrate is formed on the central portion of the semiconductor substrate. Therefore, the peripheral portion forming the contour of the semiconductor substrate can be maintained in the original thickness of the semiconductor substrate. Thus, even if stress is applied to the semiconductor substrate, strain resulting therefrom can be reduced.

Preferably, in a case where an interlayer dielectric film is stacked on the surface of the semiconductor substrate, the CMIS transistor has a multilayer interconnection structure having a plurality of layers of transistor wires stacked on the interlayer dielectric film, and the capacitive acceleration sensor further includes a sensor wire formed on the same layer as the transistor wire formed on any layer of the multilayer interconnection structure and made of the same material as the transistor wire.

On the other hand, the capacitive acceleration sensor may further include an insulating film formed on the same layer as the gate insulating film and a sensor wire formed on the insulating film and made of the same material as the gate electrode.

Thus, the wiring structures of the acceleration sensor and the CMIS transistor can be simplified and these can be further formed through the same step by forming the wire of the capacitive acceleration sensor and the wire or the gate electrode of the CMIS transistor on the same layer and preparing the same from common materials.

The semiconductor substrate may be a conductive silicon substrate.

When the semiconductor substrate is a conductive silicon substrate, structures after molding can be utilized as the electrodes as such, without performing specific treatments for providing conductivity to the fixed electrode and the movable electrode molded into prescribed shapes. Further, portions excluding the portions utilized as the electrodes can be utilized as the wires.

A capacitive gyro sensor according to another aspect of the present invention includes a semiconductor substrate having a cavity therein and having a surface portion on one side and a rear surface portion on another side with respect to the cavity, a fixed electrode formed on the surface portion of the semiconductor substrate and including a first base portion and a plurality of first electrode portions extending from the first base portion along a surface of the semiconductor substrate and interdigitally arrayed at intervals from one another, a movable electrode formed on the surface portion of the semiconductor substrate, including a second base portion and a plurality of interdigitally arrayed second electrode portions extending from the second base portion toward spaces between the plurality of first electrode portions and meshing with the first electrode portions at intervals, and vertically movable with respect to the fixed electrode, a first contact portion formed on an opposed portion of the first base portion opposed to the second electrode portions and insulated from the remaining portion of the first base portion, and second contact portions formed on forward end portions of the second electrode portions and insulated from the remaining portions of the second electrode portions.

In the capacitive gyro sensor, the pair of interdigital electrodes (the fixed electrode and the movable electrode) so mesh with each other that the first electrode portions of the fixed electrode and the second electrode portions of the movable electrode are alternately arrayed in a striped manner at intervals. The first electrode portions of the fixed electrode and portions of the second electrode portions of the movable electrode excluding the forward end portions (the second contact portions) constitute electrodes of such a capacitance element (a detection portion) that a constant voltage is applied therebetween so that capacitance changes due to change in the intervals therebetween.

In a direction (a direction along stripes) orthogonal to the array direction of the first and second electrode portions, on the other hand, the second contact portions provided on the forward end portions of the individual second electrode portions are opposed to the first contact portion of the fixed electrode provided between base end portions of the first electrode portions adjacent to one another at intervals. A driving voltage is applied between the first contact portion of the fixed electrode and the second contact portions of the movable electrode, to vibrate the movable electrode by Coulomb force resulting from voltage change of the driving voltage.

In the capacitive gyro sensor, the fixed electrode and the movable electrode are formed on the surface portion of the semiconductor substrate by partially utilizing the semiconductor substrate. Therefore, there is no need to pile up a large number of layers on the semiconductor substrate, in order to form the fixed electrode and the movable electrode. Consequently, the thickness of the overall sensor may simply be about the thickness of the substrate, whereby miniaturization of the sensor can be implemented.

Further, treatments such as epitaxial growth, CMP, sacrificial layer etching and the like may not be repeatedly performed in the formation of the fixed electrode and the movable electrode, but the semiconductor substrate may simply be etched. The cavity for ensuring a movable region of the movable electrode can be formed under the electrodes (on the rear surface side of the semiconductor substrate) while molding the fixed electrode and the movable electrode of the prescribed shapes by etching the semiconductor substrate. Therefore, manufacturing steps for the sensor can be simplified.

A method for detecting an angular velocity acting around an X-axis by driving the aforementioned movable electrode in a Z-axis direction, for example, is now described.

Homopolar and heteropolar driving voltages are alternately supplied between the first contact portion of the fixed electrode and the second contact portions of the movable electrode. Thus, Coulomb repulsion and Coulomb attraction are alternately generated between the first contact portion (the fixed electrode) and the second contact portions (the movable electrode). Consequently, the interdigital movable electrode vertically vibrates (drives) on the identically interdigital fixed electrode serving as the center of the vibration along the Z-axis direction with respect to the fixed electrode, as if the same is a pendulum. When the movable electrode rotates on the X-axis serving as a central axis in this state, it follows that Coriolis force is generated in a Y-axis direction. The distance (inter-electrode distance) between the first electrode portions (the fixed electrode) and the second electrode portions (the movable electrode) changes due to the Coriolis force. The angular velocity around the X-axis can be detected by detecting change in capacitance between the movable electrode and the fixed electrode resulting from change in the inter-electrode distance.

In the capacitive gyro sensor, as hereinabove described, the first contact portion and the second contact portions are opposed to one another in the direction orthogonal to the array direction of the first and second electrode portions, i.e., a direction along surfaces of both electrodes of the capacitance element for detection, and further insulated from the first and second electrode portions. Also when supplying a driving voltage to the first and second contact portions, therefore, both electrodes of the capacitance element can be prevented from attracting or repulsing each other due to the application of the driving voltage. Thus, the distance between both electrodes can be kept constant, except for a case where Coriolis force so acts that the movable electrode vibrates. Consequently, even small change in the capacitance can also be detected, whereby detection accuracy can be improved.

On the other hand, the vector of the Coriolis force acting on the movable electrode varies with the position of the movable electrode upon the action of the Coriolis force. In order to further improve the detection accuracy for the angular velocity, therefore, the vector of the Coriolis force is preferably correctly detected by grasping the position of the vibrating movable electrode in the Z-axis direction.

As hereinabove described, the interdigital movable electrode vertically vibrates (drives) on the identically interdigital fixed electrode serving as the center of the vibration, as if the same is a pendulum. During the vibration, opposed areas of the second electrode portions and the first electrode portions forming the capacitance element for detection changes in the same cycle as the cycle of the vibration to be maximized when the movable electrode passes through the center of the vibration and to be minimized when the movable electrode reaches a vibrating end. When sensing the change in the capacitance between the first and second electrode portions resulting from the change in the opposed areas from the starting of the driving of the movable electrode up to the action of the Coriolis force, therefore, the position of the movable electrode can be grasped by detecting a change history of the capacitance when the Coriolis force acts on the movable electrode.

However, the opposed areas of the second electrode portions and the first electrode portions become identical when the positions of the second electrode portions are at the same distance from the center of the vibration (the fixed electrode), regardless of on which one of a side separating from the cavity and a side approaching the same the movable electrode is displaced with respect to the center of the vibration. Therefore, it is difficult to recognize on which one of the side separating from the cavity and the side approaching the cavity the second electrode portions are displaced with respect to the first electrode portions.

Preferably in the capacitive gyro sensor according to the present invention, therefore, the second electrode portions warp in a direction separating from the cavity to project from a surface of the fixed electrode, or warp in a direction toward a rear surface of the semiconductor substrate to project from a rear surface of the fixed electrode.

If the second electrode portions are displaced in a direction further separating from the cavity in the starting of the driving of the movable electrode when the second electrode portions warp in the direction separating from the cavity, the opposed areas of the second electrode portions and the first electrode portions diminish following the displacement, and the capacitance between the second electrode portions and the first electrode portions decreases. When the second electrode portions are displaced in the direction approaching the cavity, on the other hand, the opposed areas of the second electrode portions and the first electrode portions enlarge following the displacement, and the capacitance between the second electrode portions and the first electrode portions increases. Therefore, it can be easily grasped that the second electrode portions are displaced in the direction separating from the cavity if the capacitance tends to decrease, and that the second electrode portions are displaced in the direction approaching the cavity if the capacitance tends to increase by detecting the change tendency of the capacitance. Consequently, in which one of the direction separating from the cavity and the side approaching the cavity the second electrode portions have been displaced can be reliably grasped in the starting of the driving of the movable electrode. Therefore, the position of the vibrating movable electrode can be correctly grasped by sensing the change in the capacitance between the first and second electrode portions after the driving. Hence, the vector of the Coriolis force can be correctly detected, whereby the detection accuracy can be further improved.

Similarly, also in the case where the second electrode portions warp in the direction toward the rear surface of the semiconductor substrate, the position of the movable electrode can be correctly grasped. In other words, when the second electrode portions are displaced in a direction further separating from the cavity in the starting of the driving of the movable electrode in this case, the opposed areas of the second electrode portions and the first electrode portions enlarge following the displacement, and the capacitance between the second electrode portions and the first electrode portions increases. When the second electrode portions are displaced in the direction approaching the cavity, on the other hand, the opposed areas of the second electrode portions and the first electrode portions diminish following the displacement, and the capacitance between the second electrode portions and the first electrode portions decreases. Therefore, it can be easily grasped that the second electrode portions are displaced in the direction separating from the cavity if the capacitance tends to increase, and that the second electrode portions are displaced in the direction approaching the cavity if the capacitance tends to decrease, by detecting the change tendency of the capacitance.

The capacitive gyro sensor according to the present invention may further include a first isolation layer embedded in the first base portion to surround the periphery of the opposed portion of the first base portion for separating the opposed portion from the remaining portion of the first base portion. Further, the capacitive gyro sensor according to the present invention may further include a second isolation layer embedded in a portion closer to base end portions of the second electrode portions than the forward end portions for isolating the forward end portions from the remaining portions of the second electrode portions.

When the first isolation layer and/or the second isolation layer are embedded in the semiconductor substrate, the surface of the semiconductor substrate can be efficiently utilized as a space for drawing wires connected to the first electrode portions, the first contact portion, the second electrode portions and the second contact portions.

In the capacitive gyro sensor according to the present invention, the semiconductor substrate may be a conductive silicon substrate.

When the semiconductor substrate is a conductive silicon substrate, structures after molding can be utilized as the electrodes as such, without performing specific treatments for providing conductivity to the fixed electrode and the movable electrode molded into prescribed shapes. Further, portions excluding the portions utilized as the electrodes can be utilized as the wires.

A method for manufacturing a semiconductor device according to one aspect of the present invention is a method for manufacturing a semiconductor device by forming a capacitive acceleration sensor on a sensor region of a semiconductor substrate and forming a CMIS (Complementary Metal Insulator Semiconductor) transistor on an integrated circuit region of the semiconductor substrate, and comprises the steps of forming an N-type well region having a P-type source region and a P-type drain region and a P-type well region having an N-type source region and an N-type drain region on a surface layer portion of the integrated circuit region of the semiconductor substrate by selectively implanting an N-type impurity and a P-type impurity into a surface of the semiconductor substrate, forming a recess dug down up to an intermediate portion of the semiconductor substrate in the thickness direction thereby simultaneously forming an interdigital fixed electrode and an interdigital movable electrode meshing with each other through the recess by selectively etching a surface layer portion of the sensor region of the semiconductor substrate, selectively removing the protective film from the bottom surface of the recess, and forming a cavity by removing lower portions of the fixed electrode and the movable electrode by isotropic etching after digging down the recess by anisotropic etching after the removal of the protective film.

According to the method, the fixed electrode and the movable electrode of the capacitive acceleration sensor are formed on the surface layer portion of the sensor region of the semiconductor substrate by selective etching of the semiconductor substrate, by partially utilizing the semiconductor substrate. Therefore, no conductive material may epitaxially grown on the semiconductor substrate in order to form the fixed electrode and the movable electrode. Consequently, the structures of the N-type and P-type well regions of the CMIS transistor formed on the surface layer portion of the integrated circuit region of the semiconductor substrate can be maintained also after the formation thereof. Consequently, the capacitive acceleration sensor and the CMIS transistor can be formed on the same semiconductor substrate.

Preferably, the method further includes the steps of forming a trench on the surface layer portion of the sensor region of the semiconductor substrate by selectively etching the semiconductor substrate in advance of the formation of the recess, and forming an insulating layer in the trench by embedding an insulating material in the trench, and the step of forming the recess includes a step of etching the semiconductor substrate so that the fixed electrode and the movable electrode are partially insulated from the remaining portions of the fixed electrode and the movable electrode by the insulating layer.

Thus, portions of the fixed electrode and the movable electrode of the capacitive acceleration sensor functioning as electrodes can be insulated from the remaining portions of the respective electrodes.

Preferably, the step of forming the trench and the step of forming the insulating layer are carried out in advance of the step of forming the N-type well region and the P-type well region.

In a case of forming the insulating layer in the trench by thermally oxidizing the inner surface of the trench, for example, the semiconductor substrate is heated to about 1100° C. to 1200° C. When the N-type well region and the P-type well region are formed after the heating, the well regions can be prevented from exposure to a high temperature also in this case.

Preferably, the method for manufacturing a semiconductor device according to the present invention further includes the steps of stacking an insulating film on the semiconductor substrate and selectively depositing a metallic material on the insulating film thereby forming a transistor wire for the CMIS transistor and a sensor wire for the capacitive acceleration sensor on the same layer.

Thus, the transistor wire and the sensor wire can be formed through the same step, whereby the manufacturing steps can be simplified.

The step of selectively depositing the metallic material may include a step of depositing the metallic material on regions for forming the fixed electrode and the movable electrode, and the step of forming the recess may include a step of forming the recess by etching employing a layer including the deposited metallic material as a mask and simultaneously forming the fixed electrode and the movable electrode.

Thus, a step of forming a mask for forming the recess can be omitted, whereby the manufacturing steps can be further simplified.

BRIEF DESCRIPTION OF THE DRAWINGS

FIG. 9A is a schematic sectional view showing a manufacturing step for the semiconductor device according to the first embodiment of the present invention, and shows a cutting plane on the same position as FIG. 4.

FIG. 9B is a schematic sectional view showing a manufacturing step for the semiconductor device according to the first embodiment of the present invention, and shows a cutting plane on the same position as FIG. 6.

FIG. 10B is a schematic sectional view showing a step subsequent to FIG. 9B.

FIG. 11A is a schematic sectional view showing a step subsequent to FIG. 10A.

FIG. 12B is a schematic sectional view showing a step subsequent to FIG. 11B.

FIG. 13B is a schematic sectional view showing a step subsequent to FIG. 12B.

FIG. 14A is a schematic sectional view showing a step subsequent to FIG. 13A.

FIG. 14B is a schematic sectional view showing a step subsequent to FIG. 13B.

FIG. 15C is a schematic sectional view showing a step subsequent to FIG. 14C.
FIG. 16B is a schematic sectional view showing a step subsequent to FIG. 15B.
FIG. 16C is a schematic sectional view showing a step subsequent to FIG. 15C.
FIG. 17A is a schematic sectional view showing a step subsequent to FIG. 16A.
FIG. 17B is a schematic sectional view showing a step subsequent to FIG. 16B.
FIG. 18A is a schematic sectional view showing a step subsequent to FIG. 17A.
FIG. 19B is a schematic sectional view showing a step subsequent to FIG. 18B.
FIG. 20A is a schematic sectional view showing a step subsequent to FIG. 19A.
FIG. 20B is a schematic sectional view showing a step subsequent to FIG. 19B.
FIG. 20C is a schematic sectional view showing a step subsequent to FIG. 19C.
FIG. 21B is a schematic sectional view showing a step subsequent to FIG. 20B.
FIG. 21C is a schematic sectional view showing a step subsequent to FIG. 20C.
FIG. 22A is a schematic sectional view showing a step subsequent to FIG. 21A.
FIG. 22B is a schematic sectional view showing a step subsequent to FIG. 21B.
FIG. 23A is a schematic sectional view showing a step subsequent to FIG. 22A.
FIG. 23B is a schematic sectional view showing a step subsequent to FIG. 22B.
FIG. 25A is a schematic sectional view showing a step subsequent to FIG. 24A.
FIG. 25B is a schematic sectional view showing a step subsequent to FIG. 24B.
FIG. 26B is a schematic sectional view showing a step subsequent to FIG. 25B.
FIG. 27B is a schematic sectional view showing a step subsequent to FIG. 26B.
FIG. 28A is a schematic sectional view showing a step subsequent to FIG. 27A.
FIG. 29B is a schematic sectional view showing a step subsequent to FIG. 28B.
FIG. 29C is a schematic sectional view showing a step subsequent to FIG. 28C.
FIG. 30B is a schematic sectional view showing a step subsequent to FIG. 29B.
FIG. 30C is a schematic sectional view showing a step subsequent to FIG. 29C.
FIG. 31A is a schematic sectional view showing a step subsequent to FIG. 30A.
FIG. 32B is a schematic sectional view showing a step subsequent to FIG. 31B.
FIG. 32C is a schematic sectional view showing a step subsequent to FIG. 31C.
FIG. 33C is a schematic sectional view showing a step subsequent to FIG. 32C.
FIG. 34B is a schematic sectional view showing a step subsequent to FIG. 33B.
FIG. 36A is a schematic sectional view showing a step subsequent to FIG. 35A.
FIG. 36B is a schematic sectional view showing a step subsequent to FIG. 35B.
FIG. 36C is a schematic sectional view showing a step subsequent to FIG. 35C.

FIG. 45 is a diagram showing a modification of the X-axis sensor of FIG. 4.

FIG. 46 is a diagram showing a modification of the Z-axis sensor of FIG. 6.

FIG. 47 is a diagram showing a modification of the Z-axis sensor of FIG. 5.

MODES FOR CARRYING OUT THE INVENTION

Embodiments of the present invention are now described in detail with reference to the attached drawings.

(1) First Embodiment

Embodiment of One-Chip Implementation of Acceleration Sensor and Integrated Circuit <Overall Structure of Semiconductor Device>

First, the overall structure of a semiconductor device is described with reference to FIG. 1.

Figure 1:
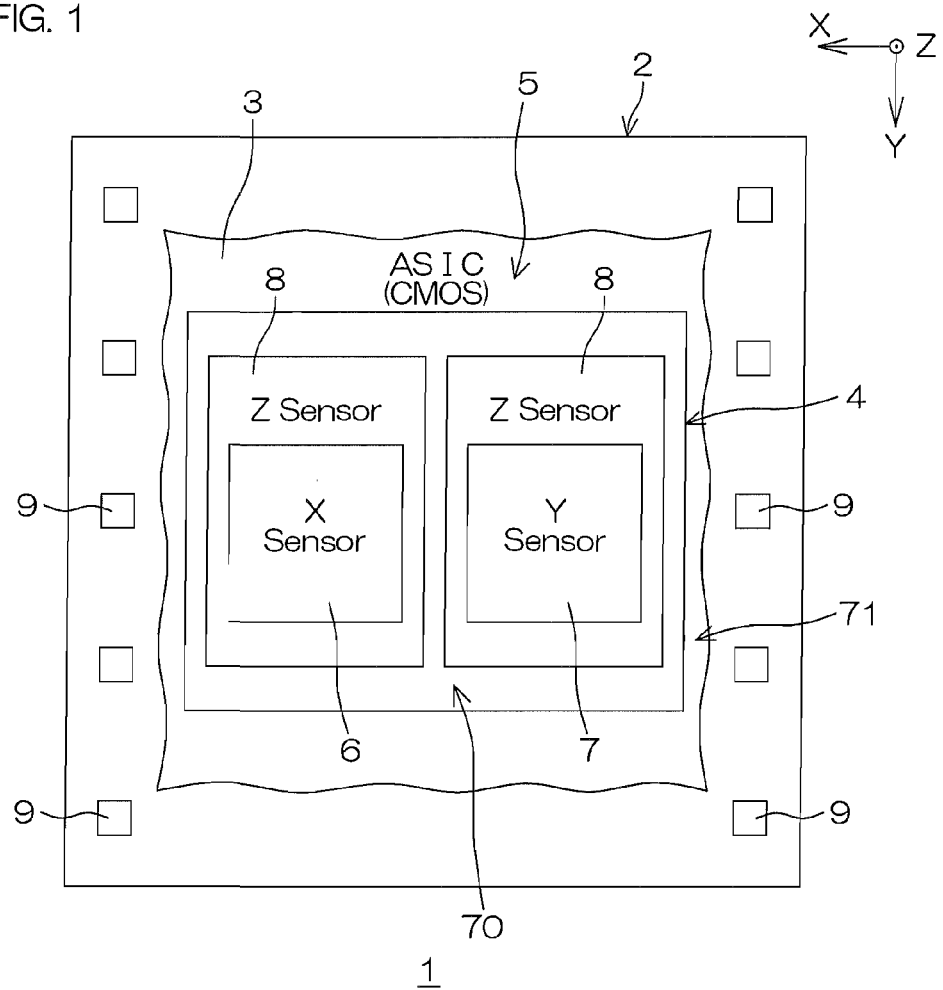
FIG. 1 is a schematic plan view of a semiconductor device according to a first embodiment of the present invention.

FIG. 1 is a schematic plan view of a semiconductor device according to a first embodiment of the present invention. Referring to FIG. 1, part of a portion sealed in a resin package is expressed in a seen-through state.

A semiconductor device 1 is a device detecting acceleration on the basis of change in capacitance of a capacitance element, and has a contour of a package in the form of a rectangular parallelepiped (quadrangular in plan view) defined by a resin package 2.

The semiconductor device 1 includes a semiconductor substrate 3 quadrangular in plan view. The semiconductor substrate 3 has a sensor region 70 where an acceleration sensor 4 is arranged on a central portion thereof, and has an integrated circuit region 71 where an integrated circuit 5 (ASIC: Application Specific Integrated Circuit) is arranged on a peripheral portion of the semiconductor substrate 3 surrounding the sensor region 70.

The acceleration sensor 4 has an X-axis sensor 6, a Y-axis sensor 7 and Z-axis sensors 8 as sensors detecting acceleration around three axes orthogonal to one another in a three-dimensional space respectively. In this embodiment, it is assumed that two directions orthogonal to each other along a surface of the semiconductor substrate 3 are an X-axis direction and a Y-axis direction, and a direction along the thickness direction of the semiconductor substrate 3 orthogonal to the X-axis and Y-axis directions is a Z-axis direction.

The integrated circuit 5 includes a charge amplifier amplifying electric signals output from the respective sensors, a filter circuit (a low-pass filter: LPF or the like) extracting specific frequency components from the electric signals and a logic circuit logically operating the electric signals after filtering, for example, and includes a CMOS transistor.

On the surface of the semiconductor device 1, five electrode pads 9 are provided on each of a pair of edge portions opposed to each other through the acceleration sensor 4 in plan view in this embodiment. The electrode pads 9 are arrayed along each edge portion at regular intervals from one another. The electrode pads 9 include pads for applying voltages to the acceleration sensor 4 and the integrated circuit 5, for example.

<Structures of X-Axis Sensor and Y-Axis Sensor>

The structures of the X-axis sensor and the Y-axis sensor are now described with reference to FIGS. 2 to 4.

Figure 2:
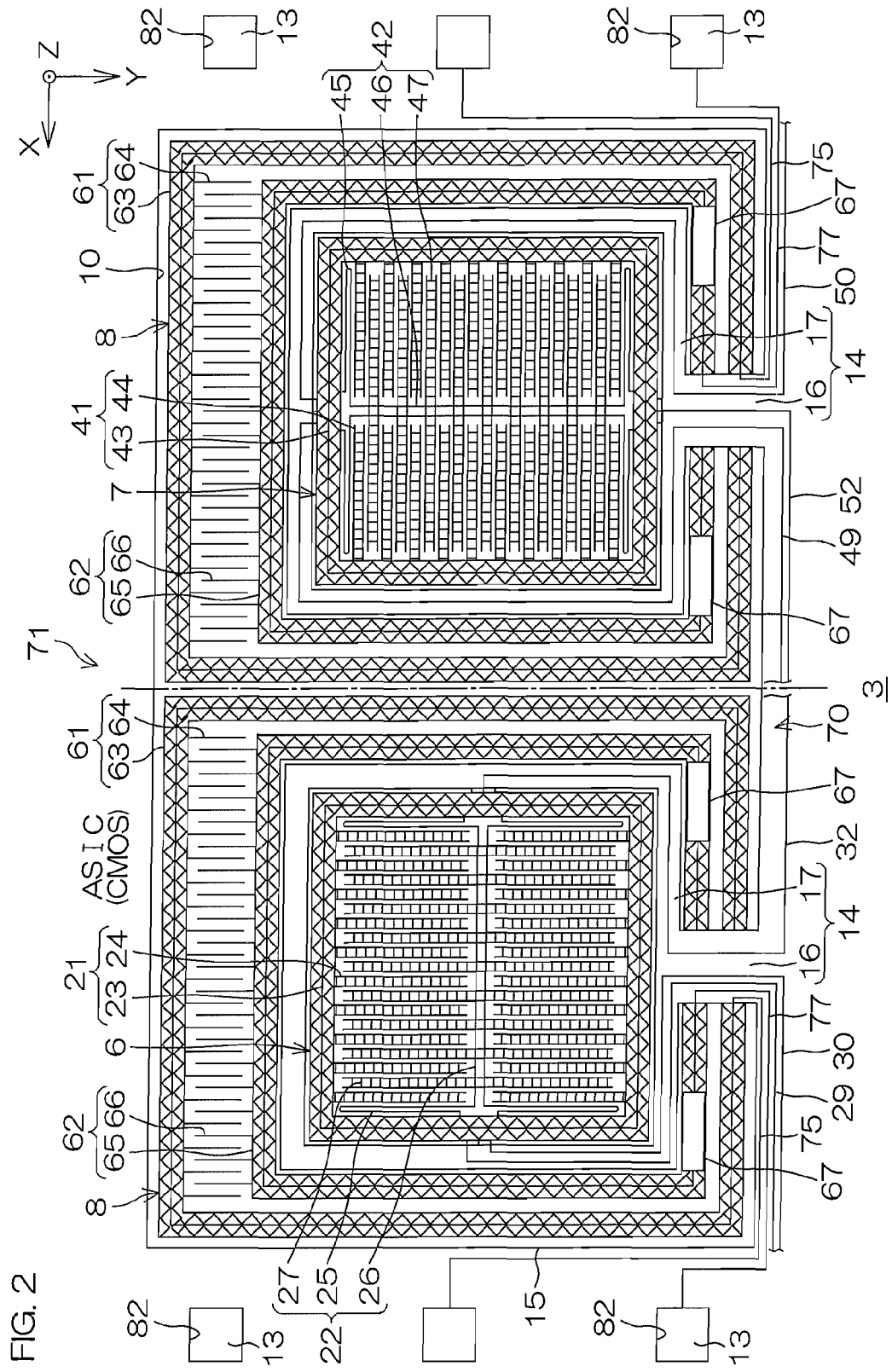
FIG. 2 is a schematic plan view of a capacitive acceleration sensor shown in FIG. 1.
Figure 3:
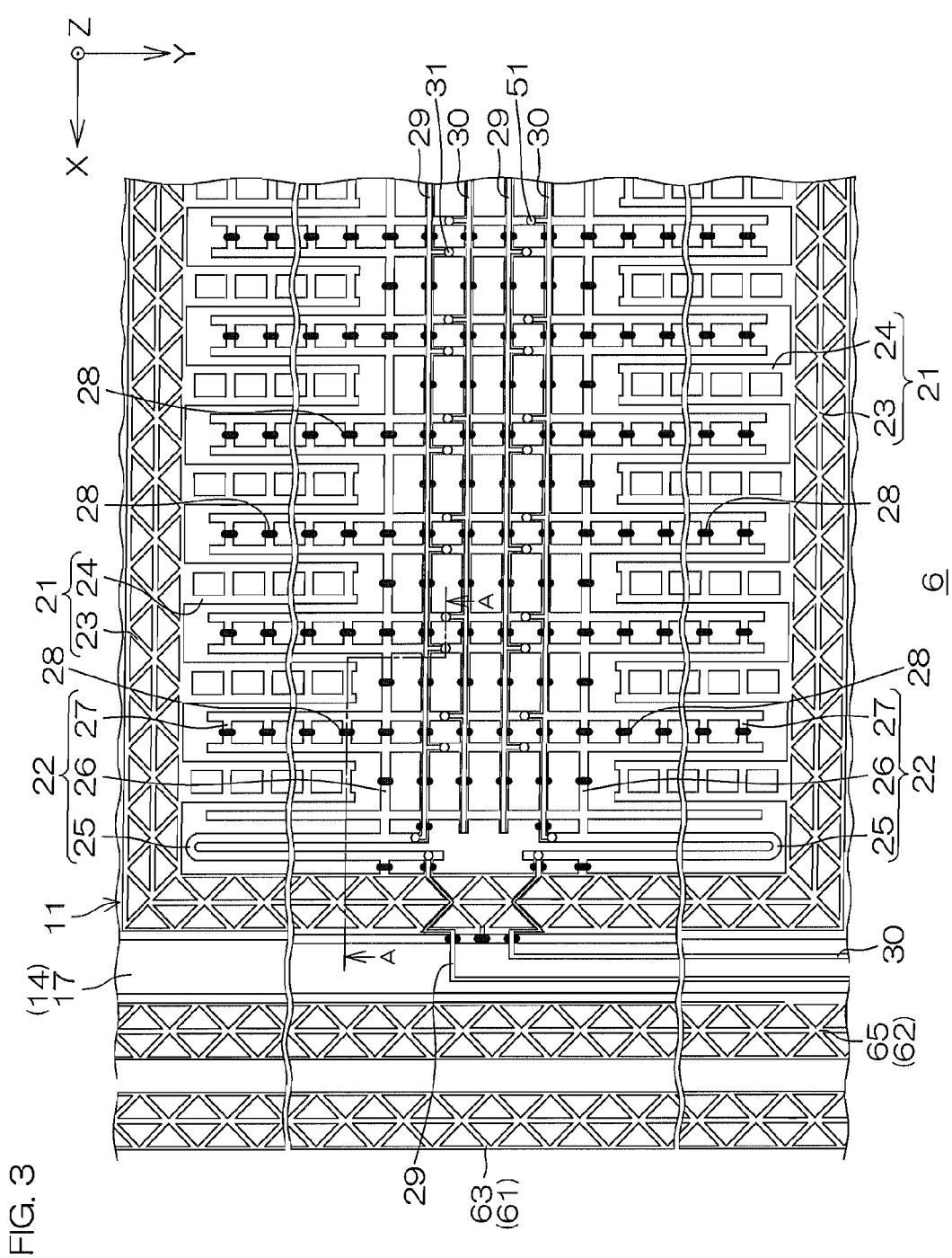
FIG. 3 is a plan view of a principal part of an X-axis sensor shown in FIG. 2.

FIG. 2 is a schematic plan view of a sensor portion shown in FIG. 1. FIG. 3 is a plan view of a principal part of the X-axis sensor shown in FIG. 2. FIG. 4 is a sectional view of the principal part of the X-axis sensor shown in FIG. 2, and a sectional view along a cutting plane line A-A in FIG. 3.

The semiconductor substrate 3 consists of a conductive silicon substrate (a low-resistance substrate having resistivity of 5 mΩ·m to 25 Ω·m, for example). The semiconductor substrate 3 has a cavity 10 quadrangular in plan view immediately under a surface layer portion of the sensor region 70, and the X-axis sensor 6, the Y-axis sensor 7 and the Z-axis sensors 8 are formed on an upper wall 11 of the semiconductor substrate 3 (the surface layer portion of the semiconductor substrate) having a top surface partitioning the cavity 10 from the surface side. In other words, the X-axis sensor 6, the Y-axis sensor 7 and the Z-axis sensors 8 consist of parts of the semiconductor substrate 3, and are supported in a floating state with respect to a bottom wall 12 of the semiconductor substrate 3 having a bottom surface partitioning the cavity 10 from a rear surface side. The thickness of the semiconductor substrate 3 provided with the cavity 10 is 60 μm to 685 μm on the central portion where the cavity 10 is formed, and 100 μm to 725 μm on a peripheral portion surrounding the cavity 10, for example.

On the surface of the semiconductor substrate 3, wires included in the sensors 6, 7 and 8 are partially exposed as pads 13 on both sides opposed to each other through the cavity 10. The pads 13 are electrically connected with the electrode pads 9 by bonding wires (not shown) or the like, for example, in a state packaged by the resin package 2.

The X-axis sensor 6 and the Y-axis sensor 7 are arranged adjacently to each other at an interval, and the Z-axis sensors 8 are arranged to surround the respective ones of the X-axis sensor 6 and the Y-axis sensor 7. According to this embodiment, the Y-axis sensor 7 has a structure generally similar to a substance obtained by rotating the X-axis sensor 6 by 90° in plan view. As to the structure of the Y-axis sensor 7, therefore, portions corresponding to respective portions of the X-axis sensor 6 are also put down in parentheses in description of the respective portions in the following, to substitute for specific description.

Between the X-axis sensor 6 and the Z-axis sensor 8 and between the Y-axis sensor 7 and the Z-axis sensor 8, support portions 14 for supporting these in the floating state are formed. The support portions 14 integrally include linear portions 16 extending from one sidewall 15 having a side surface partitioning the cavity 10 of the semiconductor substrate 3 from a lateral side toward the X-axis sensor 6 and the Y-axis sensor 7 across the Z-axis sensors 8 and annular portions 17 surrounding the X-axis sensor 6 and the Y-axis sensor 7.

The X-axis sensor 6 and the Y-axis sensor 7 are arranged on the inner sides of the individual annular portions 17, and double-supported on opposed pairs of portions of inner sidewalls of the annular portions 17. The Z-axis sensors 8 are double-supported on both sidewalls of the linear portions 16.

The X-axis sensor 6 (the Y-axis sensor 7) has an X fixed electrode 21 (a Y fixed electrode 41) fixed to the support portion 14 provided in the cavity 10 and an X movable electrode 22 (a Y movable electrode 42) held to be vibratile with respect to the X fixed electrode 21. The X fixed electrode 21 and the X movable electrode 22 are formed with identical thicknesses.

The X fixed electrode 21 (the Y fixed electrode 41) includes a base portion 23 (a base portion 43 of the Y fixed electrode 41) in the form of a quadrangular ring in plan view fixed to the support portion 14 and electrode portions 24 (electrode portions 44 of the Y fixed electrode 41) as a plurality of sets of fixed-side electrode portions interdigitally arrayed along inner walls of the base portion 23 at regular intervals.

On the other hand, the X movable electrode 22 (the Y movable electrode 42) includes a base portion 26 (a base portion 46 of the Y movable electrode 42) extending in a direction traversing the electrode portions 24 of the X fixed electrode 21 so that both ends thereof are connected to the base portion 23 of the X fixed electrode 21 through beam portions 25 (beam portions 45 of the Y-axis sensor 7) expandable/contractable along the direction, and electrode portions 27 (electrode portions 47 of the Y movable electrode 42) as interdigitally arrayed movable-side electrode portions extending from the base portion 26 on both sides toward spaces between the electrode portions 24 of the X fixed electrode 21 adjacent to one another and meshing with the electrode portions 24 of the X fixed electrode 21 not to come into contact therewith.

When acceleration in the X-axis direction acts on the X movable electrode 22 in the X-axis sensor 6, the beam portions 25 so expand/contract that the base portion 26 of the X movable electrode 22 vibrates along the surface of the semiconductor substrate 3, whereby the individual electrode portions 27 of the X movable electrode 22 interdigitally meshing with the electrode portions 24 of the X fixed electrode 21 vibrate alternately in a direction approaching the electrode portions 24 of the X fixed electrode 21 and a direction separating therefrom.

The base portion 23 of the X fixed electrode 21 has linear main frames extending parallelly to each other, and has such a trussed framework structure that reinforcing frames are combined with the main frames so that triangular spaces are repeated along the main frames.

As to the electrode portions 24 of the X fixed electrode 21, a plurality of pairs of electrode portions linear in plan view, whose individual base end portions are connected to the base portion 23 and forward end portions are opposed to one another, are provided at regular intervals. Each electrode portion 24 has a framework structure, laddery in plan view, including linear main frames extending parallelly to each other and a plurality of lateral frames extended between the main frames.

On the other hand, the base portion 26 of the X movable electrode 22 consists of a plurality of (in this embodiment, six) linear frames extending parallelly to one another, and both ends thereof are connected to the beam portions 25. The beam portions 25 are provided in pairs on both ends of the base portion 26 of the X movable electrode 22.

Each electrode portion 27 of the X movable electrode 22 has a framework structure, laddery in plan view, including linear main frames extending parallelly to each other across each frame of the base portion 26 and a plurality of lateral frames extended between the main frames.

In the X movable electrode 22, insulating layers 28 (in this embodiment, silicon oxide) traversing the lateral frames are embedded in lines bisecting the individual electrode portions 27 along the Y-axis direction (the direction orthogonal to the X-axis direction) from surfaces thereof up to the cavity 10. The individual electrode portions 27 are isolated by the insulating layers 28 into pairs of portions of first sides and second sides along the X-axis direction. Thus, the electrode portions 27 of the X movable electrode 22 are insulated from the remaining portions in the X movable electrode 22, to function as independent electrodes respectively.

A first insulating film 33 and a second insulating film 34 made of silicon oxide ($SiO_2$) are successively stacked on the surface of the semiconductor substrate 3 including the X fixed electrode 21 and the X movable electrode 22, and X first sensor wires 29 (Y first sensor wires 49) and X second sensor wires 30 (Y second sensor wires 50) are formed on the second insulating film 34.

The X first sensor wires 29 detect change in voltages following change in capacitance from the first sides (in this embodiment, the left side of the plane of FIG. 3) of the individual electrode portions 27 isolated into pairs. On the other hand, the X second sensor wires 30 detect change in voltages following the change in the capacitance from the second sides (in this embodiment, the right side of the plane of FIG. 3) of the individual electrode portions 27 isolated into pairs.

The X first sensor wires 29 and the X second sensor wires 30 are made of aluminum (Al) in this embodiment. The X first sensor wires 29 and the X second sensor wires 30 are electrically connected to the individual electrode portions 27 through contact plugs 31 and 51 passing through the first and second insulating films 33 and 34.

The X first sensor wires 29 and the X second sensor wires 30 are drawn onto the support portion 14 through the beam portions 25 of the X movable electrode 22 and the base portion 23 of the X fixed electrode 21, to be partially exposed as the pads 13. The X first sensor wires 29 and the X second sensor wires 30 utilize the beam portions 25 partially formed by the conductive semiconductor substrate 3 themselves as current paths in sections passing through the beam portions 25 of the X movable electrode 22 respectively. No aluminum wires are provided on the beam portions 25, whereby stretchability of the beam portions 25 can be held.

X third sensor wires 32 (Y third sensor wires 52) detecting change in voltages following the change in the capacitance from the electrode portions 24 of the X fixed electrode 21 are drawn on the support portion 14, and the X third sensor wires 32 are also partially exposed as the pads 13, similarly to the other wires 29 and 30.

In other words, the electrode portions 27 to which the X first sensor wires 29 and the X second sensor wires 30 are connected and the electrode portions 24 to which the X third sensor wires 32 are connected are opposed to one another at an inter-electrode distance dx in the X-axis sensor 6, to constitute such electrodes of the capacitance element (a detection portion) that a constant voltage is applied therebetween and the capacitance varies with change in the distance dx or opposed areas.

In the semiconductor substrate 3, upper surfaces and side surfaces of the X fixed electrode 21 and the X movable electrode 22 are covered with a protective thin film 35 made of silicon oxide ($SiO_2$), along with the first insulating film 33 and the second insulating film 34.

On portions of the surface of the semiconductor substrate 3 other than the cavity 10, a third insulating film 36, a fourth insulating film 37, a fifth insulating film 38 and a surface protective film 39 are successively stacked on the second insulating film 34. In other words, the number of the insulating films stacked on the sensor is rendered smaller than the number of the insulating films included in the integrated circuit 5 in the semiconductor device 1, while the insulating films of the sensor are in a two-layer structure of the first insulating film 33 and the second insulating film 34 and the insulating films of the integrated circuit 5 are in a six-layer structure of the first to fifth insulating films 33, 34 and 36 to 38 and the surface protective film 39 in this embodiment.

When acceleration in the X-axis direction acts on the X movable electrode 22 in the X-axis sensor 6 of the aforementioned structure, the beam portions 25 so expand/contract that the base portion 26 of the X movable electrode 22 vibrates along the surface of the semiconductor substrate 3, whereby the individual electrode portions 27 of the X movable electrode 22 interdigitally meshing with the electrode portions 24 of the X fixed electrode 21 vibrate alternately in the direction approaching the electrode portions 24 of the X fixed electrode 21 and the direction separating therefrom. Thus, the opposed distance dx between the electrode portions 24 of the X fixed electrode 21 and the electrode portions 27 of the X movable electrode 22 adjacent to one another changes. Acceleration ax in the X-axis direction is detected by detecting change in the capacitance between the X movable electrode 22 and the X fixed electrode 21 resulting from the change in the opposed distance dx.

According to this embodiment, the acceleration ax in the X-axis direction is obtained by calculating the difference between detected values of the isolated respective electrode portions on one side and another side of the X movable electrode 22.

When acceleration in the Y-axis direction acts on the Y movable electrode 42 in the Y-axis sensor 7, the beam portions 45 so expand/contract that the base portion 46 of the Y movable electrode 42 vibrates along the surface of the semiconductor substrate 3, whereby the individual electrode portions 47 of the Y movable electrode 42 interdigitally meshing with the electrode portions 44 of the Y fixed electrode 41 vibrate alternately in a direction approaching the electrode portions 44 of the Y fixed electrode 41 and a direction separating therefrom. Thus, an opposed distance between the electrode portions 44 of the Y fixed electrode 41 and the electrode portions 47 of the Y movable electrode 42 adjacent to one another changes. Acceleration ay in the Y-axis direction is detected by detecting change in capacitance between the Y movable electrode 42 and the Y fixed electrode 41 resulting from the change in the opposed distance.

<Structure of Z-Axis Sensor>

The structure of each Z-axis sensor is now described with reference to FIGS. 2 and 5 to 7.

Figure 5:
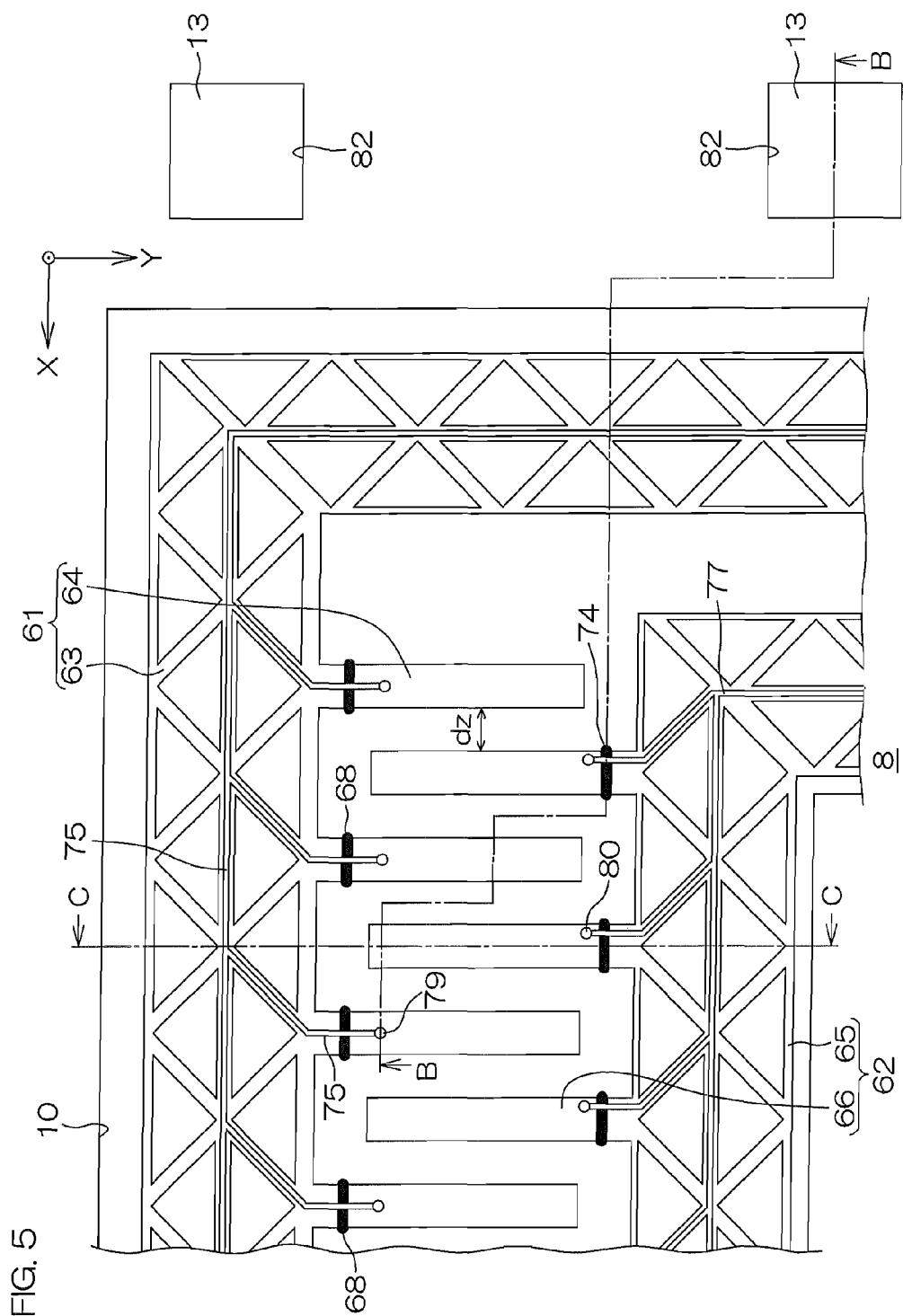
FIG. 5 is a plan view of a principal part of a Z-axis sensor shown in FIG. 2.
Figure 6:
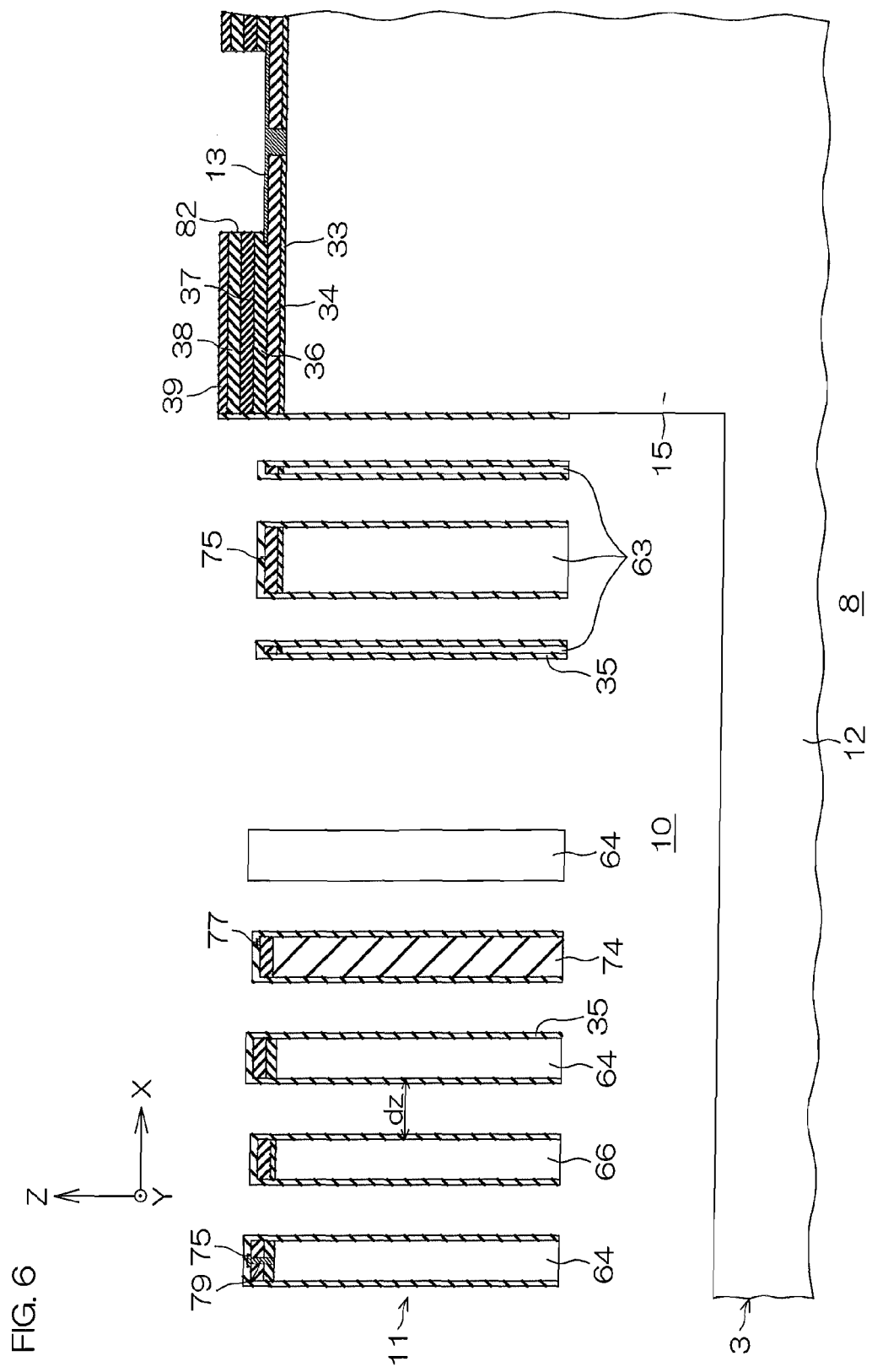
FIG. 6 is a sectional view of the principal part of the Z-axis sensor shown in FIG. 2, and a sectional view along a cutting plane line B-B in FIG. 5.
Figure 7:
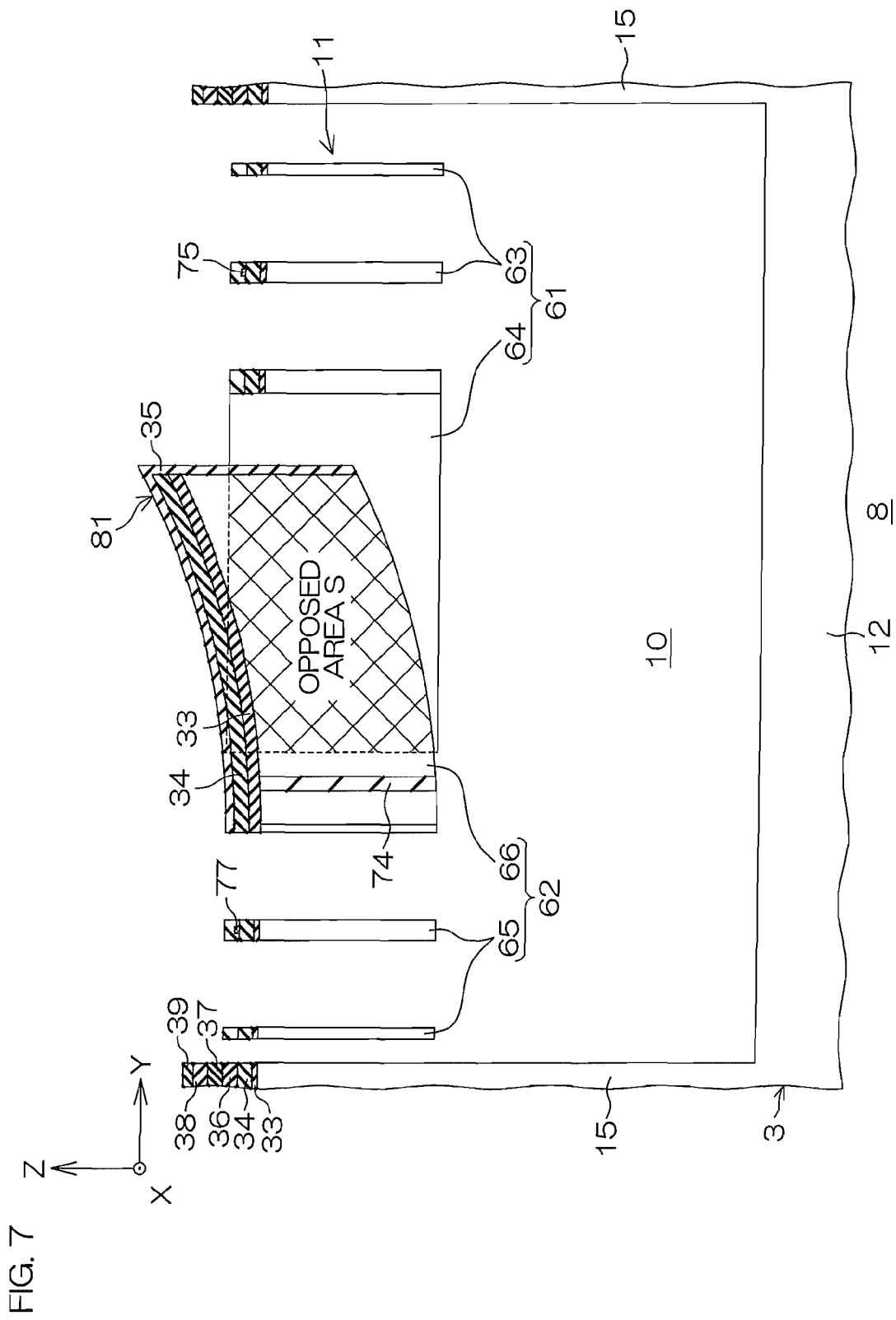
FIG. 7 is a sectional view of the principal part of the Z-axis sensor shown in FIG. 2, and a sectional view along a cutting plane line C-C in FIG. 5.

FIG. 5 is a plan view of a principal part of each Z-axis sensor shown in FIG. 2. FIG. 6 is a sectional view of the principal part of the Z-axis sensor shown in FIG. 2, and a sectional view along a cutting plane line B-B in FIG. 5. FIG. 7 is a sectional view of the principal part of the Z-axis sensor shown in FIG. 2, and a sectional view along a cutting plane line C-C in FIG. 5.

Referring to FIG. 2, the semiconductor substrate 3 made of conductive silicon has the cavity 10 therein, as hereinabove described. The Z-axis sensors 8 supported by the support portions 14 in the floating state with respect to the bottom wall 12 of the semiconductor substrate 3 are arranged on the upper wall 11 of the semiconductor substrate 3 (the surface layer portion of the semiconductor substrate), to surround the respective ones of the X-axis sensor 6 and the Y-axis sensor 7.

Each Z-axis sensor 8 has a Z fixed electrode 61 fixed to the support portion 14 (the linear portion 16) provided in the cavity 10 and a Z movable electrode 62 held to be vibratile with respect to the Z fixed electrode 61. The Z fixed electrode 61 and the Z movable electrode 62 are formed with identical thicknesses.

In the Z-axis sensor 8, the Z movable electrode 62 is arranged to surround the annular portion 17 of the support portion 14, and the Z fixed electrode 61 is arranged to further surround the Z movable electrode 62. The Z fixed electrode 61 and the Z movable electrode 62 are integrally connected to both sidewalls of the linear portion 16 of the support portion 14.

The Z fixed electrode 61 has a base portion 63 in the form of a quadrangular ring fixed to the support portion 14 and electrode portions 64 as a plurality of interdigital fixed-side electrodes provided on portions of the base portion 63 opposite to the linear portion 16 with respect to the X-axis sensor 6 (the Y-axis sensor 7).

On the other hand, the Z movable electrode 62 includes a base portion 65 in the form of a quadrangular ring in plan view and electrode portions 66 as interdigital movable-side electrode portions extending from the base portion 65 toward spaces between the interdigital electrode portions 64 of the Z fixed electrode 61 adjacent to one another and meshing with the electrode portions 64 of the Z fixed electrode 61 not to come into contact therewith. The base portion 65 of the Z movable electrode 62 has linear main frames extending parallelly to each other, and has such a trussed framework structure that reinforcing frames are combined with the main frames so that triangular spaces are repeated along the main frames. The base portion 65 of the Z movable electrode 62 of such a structure has sections where the reinforcing frames are omitted on portions opposite to the side where the electrode portions 66 are arranged, and the main frames in the sections function as beam portions 67 for rendering the Z movable electrode 62 vertically movable.

In other words, when acceleration in the Z-axis direction acts on the Z movable electrode 62 in the Z-axis sensor 8, the beam portions 67 so warp that the base portion 65 of the Z movable electrode 62 pivots (vibrates) on the beam portion 67 serving as a fulcrum in a direction approaching the cavity 10 and a direction separating therefrom as if the same is a pendulum, whereby the electrode portions 66 of the Z movable electrode 62 interdigitally meshing with the electrode portions 64 of the Z fixed electrode 61 vertically vibrate.

The base portion 63 of the Z fixed electrode 61 has linear main frames extending parallelly to each other, and has such a trussed framework structure that reinforcing frames are combined with the main frames so that triangular spaces are repeated along the main frames.

The individual electrode portions 64 of the Z fixed electrode 61 have base end portions connected to the base portion 63 of the Z fixed electrode 61 and forward end portions extending toward the Z movable electrode 62, and are interdigitally arrayed along inner walls of the base portion at regular intervals. Insulating layers 68 (in this embodiment, silicon oxide) are embedded in portions closer to the base end portions of the individual electrode portions 64 from surfaces thereof up to the cavity 10, to traverse the electrode portions 64 in the width direction. The individual electrode portions 64 of the Z fixed electrode 61 are insulated from the remaining portions of the Z fixed electrode 61 by the insulating layers 68.

On the other hand, the individual electrode portions 66 of the Z movable electrode 62 have base end portions connected to the base portion 65 of the Z movable electrode 62 and forward end portions extending toward the spaces between the electrode portions 64 of the Z fixed electrode 61, and are interdigitally arrayed to mesh with the electrode portions 64 of the Z fixed electrode 61 not to come into contact therewith. Insulating layers 74 (in this embodiment, silicon oxide) are embedded in portions closer to the base end portions of the individual electrode portions 66 of the Z movable electrode 62 from the surface of the semiconductor substrate 3 up to the cavity 10, to traverse the electrode portions 66 in the width direction. The individual electrode portions 66 of the Z movable electrode 62 are insulated from the remaining portions of the Z movable electrode 62 by the insulating layer 74.

Further, the individual electrode portions 66 of the Z movable electrode 62 warp arcuately in sectional view in the direction separating from the cavity 10 of the semiconductor substrate 3 to project from surfaces of the electrode portions 64 of the Z fixed electrode 61, and have portions 81 protruding upward from the surface of the semiconductor substrate 3.

The first insulating film 33 and the second insulating film 34 made of silicon oxide ($SiO_2$) are successively stacked on the surface of the semiconductor substrate 3 including the Z fixed electrode 61 and the Z movable electrode 62, as hereinabove described. On a surface of the Z movable electrode 62, the first insulating film 33 is rendered thicker than the remaining portions. Thus, relatively large stress can be applied to the Z movable electrode 62, and the electrode portions 66 of the Z movable electrode 62 can be warped. Z first sensor wires 75 and Z second sensor wires 77 are formed on the second insulating film 34.

The Z first sensor wires 75 and the Z second sensor wires 77 are connected to the electrode portions 64 of the Z fixed electrode 61 and the electrode portions 66 of the Z movable electrode 62 adjacent to one another. In other words, the electrode portions 64 to which the Z first sensor wires 75 are connected and the electrode portions 66 to which the Z second sensor wires 77 are connected are opposed to one another at an inter-electrode distance dZ in the Z-axis sensor 8, to constitute such electrodes of the capacitance element (the detection portion) that a constant voltage is applied therebetween and the capacitance varies with change in the distance dz or opposed areas S.

More specifically, the Z first sensor wires 75 include aluminum wires formed along the base portion 63 of the Z fixed electrode 61 and branched toward the forward end portions of the electrode portions 64 over the insulating layers 68 of the individual electrode portions 64 of the Z fixed electrode 61. The branched aluminum wires are formed with a width smaller than the width of the electrode portions 64, and electrically connected to portions of the individual electrode portions 64 closer to the forward ends than the insulating layers 68 through contact plugs 79 passing through the first insulating film 33 and the second insulating film 34. As shown in FIG. 2, the Z first sensor wires 75 are drawn on the support portion 14 through the base portion 63 of the Z fixed electrode 61, and partially exposed as the pads 13.

On the other hand, the Z second sensor wires 77 detect change in voltages following change in capacitance from the electrode portions 66 of the Z movable electrode 62. The Z second sensor wires 77 include aluminum wires formed along the base portion 65 of the Z movable electrode 62 and branched toward the electrode portions 66 over the insulating layers 74 closer to the base end portions of the individual electrode portions 66 of the Z movable electrode 62. The branched aluminum wires are formed with a width smaller than the width of the electrode portions 66, and electrically connected to the individual electrode portions 66 through contact plugs 80 passing through the first insulating film 33 and the second insulating film 34. As shown in FIG. 2, the Z second sensor wires 77 are drawn on the support portion 14 through the base portion 65 of the Z movable electrode 62, and partially exposed as the pads 13.

In the semiconductor substrate 3, upper surfaces and side surfaces of the Z fixed electrode 61 and the Z movable electrode 62 are covered with the protective thin film 35 made of silicon oxide ($SiO_2$), along with the first insulating film 33 and the second insulating film 34.

On the portions of the surface of the semiconductor substrate 3 other than the cavity 10, the third insulating film 36, the fourth insulating film 37, the fifth insulating film 38 and the surface protective film 39 are successively stacked on the second insulating film 34. In the portions, openings 82 exposing the Z first sensor wires 75 and the Z second sensor wires 77 as the pads 13 are formed in portions opposed to the Z first sensor wires 75 and the Z second sensor wires 77, to pass through the fifth insulating film 38, the fourth insulating film 37 and the third insulating film 36 from the surface protective film 39.

When acceleration in the Z-axis direction acts on the Z movable electrode 62 in the Z-axis sensor 8, the interdigital Z movable electrode 62 vertically vibrates on the identically interdigital Z fixed electrode 61 serving as the center of the vibration along the Z-axis direction with respect to the Z fixed electrode 61, as if the same is a pendulum. Thus, the opposed areas S of the electrode portions 64 of the Z fixed electrode 61 and the electrode portions 66 of the Z movable electrode 62 adjacent to one another change. Acceleration az in the Z-axis direction is detected by detecting change in the capacitance between the Z movable electrode 62 and the Z fixed electrode 61 resulting from the change in the opposed areas S. According to the embodiment, the acceleration az in the Z-axis direction is obtained by calculating the difference between a detected value of the Z-axis sensor 8 surrounding the X-axis sensor 6 and a detected value of the Z-axis sensor 8 surrounding the Y-axis sensor 7.

The difference can be obtained by reversing the positional relations between the fixed electrode and the movable electrode of the Z-axis sensor 8 surrounding the X-axis sensor 6 and the fixed electrode and the movable electrode of the Z-axis sensor 8 surrounding the Y-axis sensor 7, for example. In other words, the Z movable electrode 62 is arranged to surround the annular portion 17 of the support portion 14 and the Z fixed electrode 61 is arranged to further surround the Z movable electrode in one of the Z-axis sensors 8, as hereinabove described. In the other Z-axis sensor 8, on the other hand, the Z fixed electrode 61 is arranged to surround the annular portion 17 of the support portion 14, and the Z movable electrode 62 is arranged to further surround the Z fixed electrode 61. Thus, the ways of vibration of the Z movable electrodes 62 differ from each other between the pair of Z-axis sensors 8, whereby it follows that the difference arises.

Also in a case where the positional relations between the fixed electrodes and the movable electrodes of one and the other Z-axis sensors 8 are identical to each other, the difference can be obtained by reversing the warp directions of the movable electrodes. In other words, after arranging the Z movable electrodes 62 to surround the annular portions 17 of the support portions 14 and arranging the Z fixed electrodes 61 to further surround the Z movable electrodes 62 as hereinabove described in one and the other Z-axis sensors 8, the warp direction of the other Z movable electrode 62 is set not to the direction separating from the cavity 10 but to a direction toward the rear surface of the semiconductor substrate 3, so that the Z movable electrode 62 projects from the rear surface of the Z fixed electrode 61. Thus, capacitance difference arises between the pair of Z-axis sensors 8 when the Z movable electrodes 62 vibrate, whereby it follows that the difference arises.

<Structure of Integrated Circuit>

Figure 8:
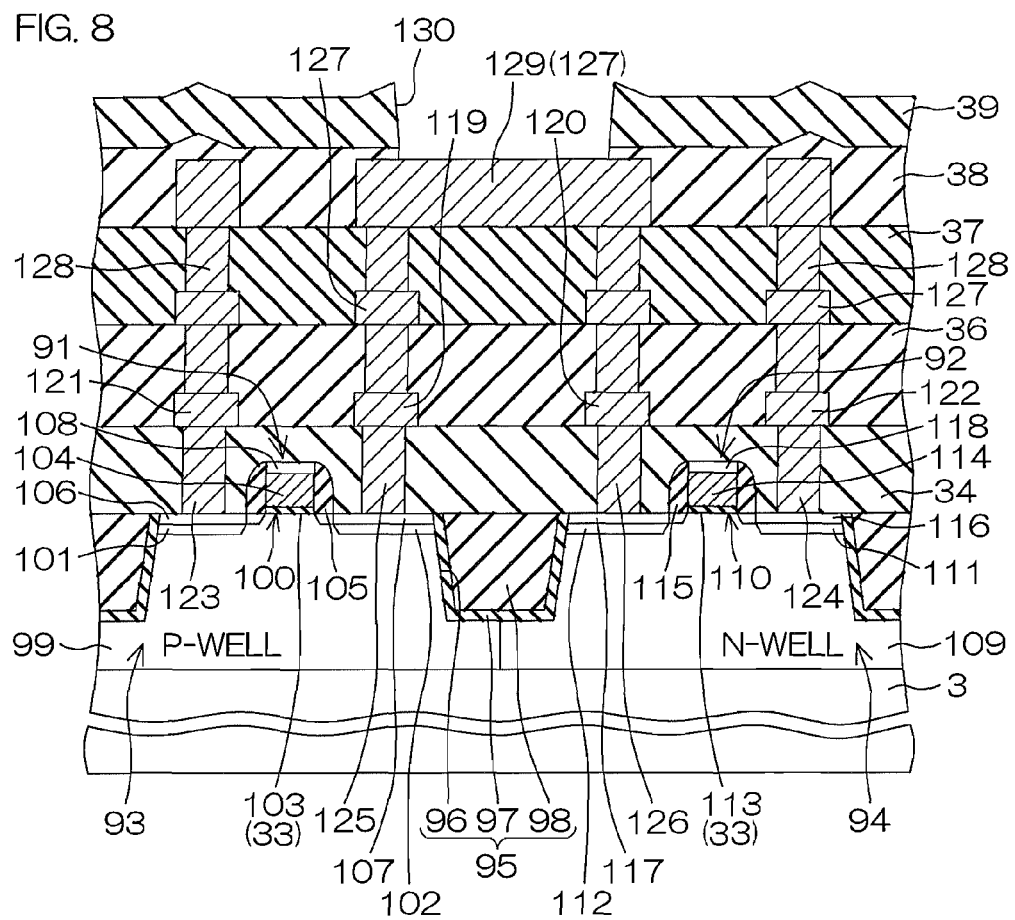
FIG. 8 is a schematic sectional view of an integrated circuit shown in FIG. 1.

The structure of the integrated circuit is now described with reference to FIG. 8. FIG. 8 is a schematic sectional view of the integrated circuit shown in FIG. 1. FIG. 8 is different in contraction scale from the aforementioned other sectional views (FIGS. 4, 6 and 8), and hence portions to which identical reference signs are assigned have different magnitudes in expression.

As hereinabove described, the integrated circuit region 71 is formed on the semiconductor substrate 3 to surround the sensor region 70 where the X-axis sensor 6, the Y-axis sensor 7 and the Z-axis sensors 8 are formed, and the integrated circuit 5 is formed on the integrated circuit region 71.

The integrated circuit 5 includes CMOS devices. More specifically, the integrated circuit 5 includes an N-channel MOSFET 91 and a P-cannel MOSFET 92 formed on the semiconductor substrate 3.

An NMOS region 93 where the N-channel MOSFET 91 is formed and a PMOS region 94 where the P-channel MOSFET 92 is formed are isolated from peripheries respectively by an element isolation portion 95.

The element isolation portion 95 is formed by forming a trench (a shallow trench 96) in the semiconductor substrate 3 to be relatively shallowly dug down from the surface thereof, forming a thermal oxide film 97 on the inner surface of the shallow trench 96 by thermal oxidation, and thereafter depositing an insulator 98 (for example, silicon oxide ($SiO_2$)) in the shallow trench 96 by CVD (Chemical Vapor Deposition).

A P-type well 99 is formed on the NMOS region 93. The depth of the P-type well 99 is larger than the depth of the shallow trench 96. On a surface layer portion of the P-type well 99, an N-type source region 101 and an N-type drain region 102 are formed through a channel region 100. Depths of and impurity concentrations in end portions of the source region 101 and the drain region 102 closer to the channel region 100 are reduced. In other words, an LDD (Lightly Doped Drain) structure is applied to the N-channel MOSFET 91.

A gate insulating film 103 is provided on the channel region 100. The gate insulating film 103 is formed on the same layer as the aforementioned first insulating film 33 (i.e., in contact with the surface of the semiconductor substrate 3).

A gate electrode 104 is provided on the gate insulating film 103. The gate electrode 104 is made of N-type polycrystalline silicon (Poly-Si).

A sidewall 105 is formed on peripheries of the gate insulating film 103 and the gate electrode 104. The sidewall 105 is made of silicon nitride (SiN).

Silicides 106 to 108 are formed on surfaces of the source region 101, the drain region 102 and the gate electrode 104 respectively.

An N-type well 109 is formed on the PMOS region 94. The depth of the N-type well 109 is larger than the depth of the shallow trench 96. On a surface layer portion of the N-type well 109, a P-type source region 111 and a P-type drain region 112 are formed through a channel region 110. Depths of and impurity concentrations in end portions of the source region 111 and the drain region 112 closer to the channel region 110 are reduced. In other words, an LDD structure is applied to the P-channel MOSFET 92.

A gate insulating film 113 is formed on the channel region 110. The gate insulating film 113 is made of silicon oxide.

A gate electrode 114 is formed on the gate insulating film 113. The gate electrode 114 is made of P-type polycrystalline silicon.

A sidewall 115 is formed on peripheries of the gate insulating film 113 and the gate electrode 114. The sidewall 115 is made of SiN.

Silicides 116 to 118 are formed on surfaces of the source region 111, the drain region 112 and the gate electrode 114 respectively.

The second to fifth insulating films 34 and 36 to 38 as interlayer dielectric films are successively stacked on the semiconductor substrate 3, and such a multilayer interconnection structure is formed that wires 119 to 112 and 127 as transistor wires described later are formed on the individual insulating films 34, 36 and 37. The insulating films are identical to the second to fifth insulating films 34 and 36 to 38 and the surface protective film 39 shown in FIGS. 4, 6 and 7.

Drain wires 119 and 120 and source wires 121 and 122 are formed on the second insulating film 34 of the lowermost layer. The wires are made of aluminum (Al), and formed on the same layer as the wires (the X first sensor wires 29, the Z first sensor wires 75 and the like) of the aforementioned X-axis sensor 6, the Y-axis sensor 7 and the Z-axis sensors 8.

The source wires 121 and 122 are formed above the source region 101 and the source region 111 respectively. Between the source wire 121 and the source region 101 and between the source wire 122 and the source region 111, contact plugs 123 and 124 for electrically connecting the same with one another are penetratingly provided in the second insulating film 34.

The drain wires 119 and 120 are formed above the drain region 102 and the drain region 112 respectively. Between the drain wire 119 and the drain region 102 and between the drain wire 120 and the drain region 112, contact plugs 125 and 126 for electrically connecting the same with one another are penetratingly provided in the second insulating film 34.

Wires 127 are similarly formed also on the third to fifth insulating films 36 to 38, and the wires 127 of the insulating films of the respective layers are electrically connected with one another through contact plugs 128. In the fifth insulating film 38 of the uppermost layer, a drain wire 129 is formed over the drain region 102 and the drain region 112, and the drain wire 129 is connected to both of the drain wire 119 of the N-channel MOSFET 91 and the drain wire 120 of the P-channel MOSFET 92. The contact plugs 123 to 126 and 128 are made of tungsten (W).

An opening 130 partially exposing the drain wire 129 formed on the fifth insulating film 38 of the uppermost layer as a pad is formed in the surface protective film 39. The drain wire 129 exposed as the pad is electrically connected with the electrode pads 9 by bonding wires (not shown) or the like, for example, in a state packaged by the resin package 2.

<Method for Manufacturing Semiconductor Device 1>

Manufacturing steps for the aforementioned semiconductor device are now described in step order with reference to FIGS. 9A to 36A, FIGS. 9B to 36B and FIGS. 9C and 36C.

Figure 4:
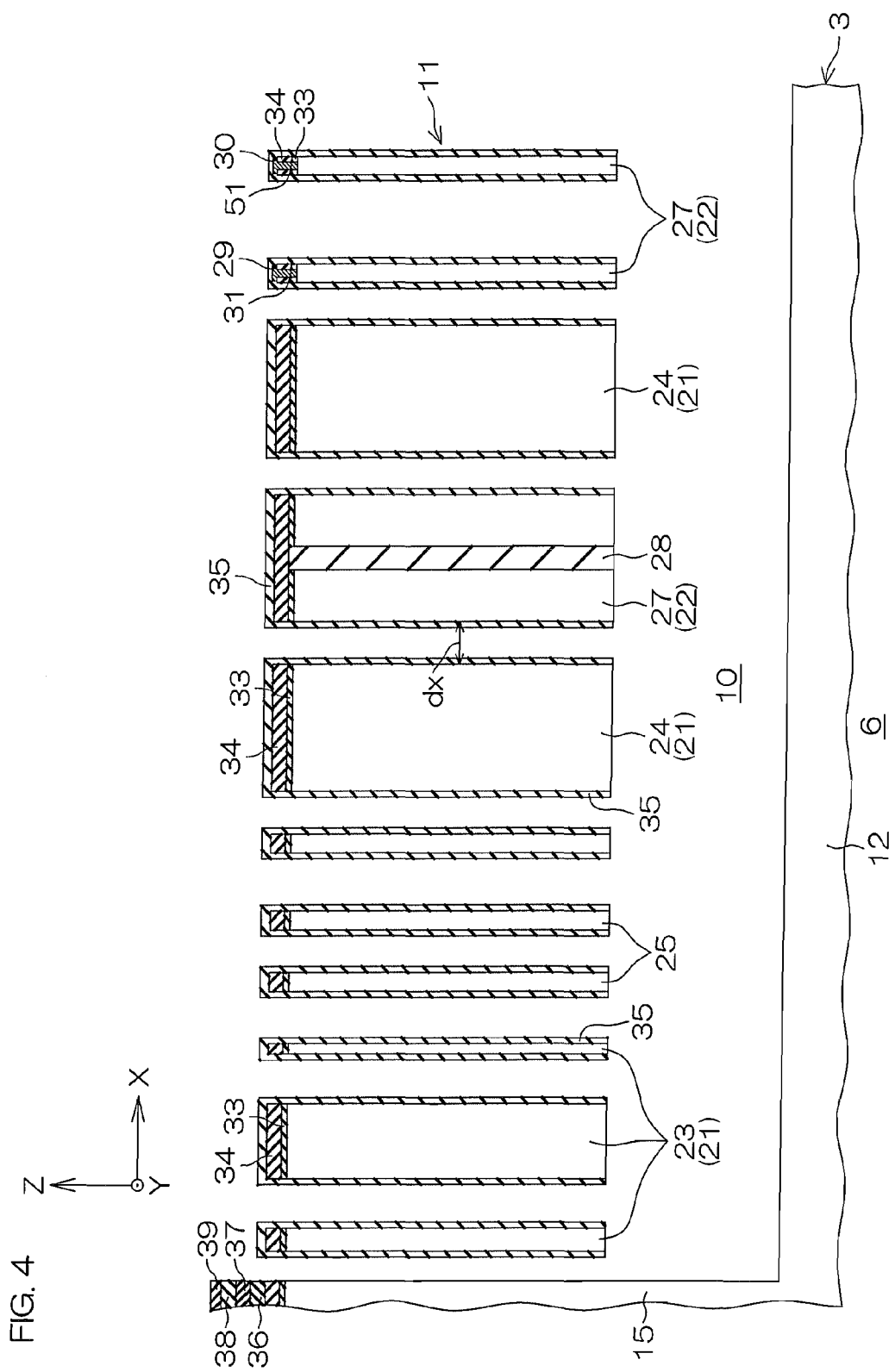
FIG. 4 is a sectional view of the principal part of the X-axis sensor shown in FIG. 2, and a sectional view along a cutting plane line A-A in FIG. 3.

FIGS. 9A to 36A are schematic sectional views showing the manufacturing steps for the semiconductor device according to the first embodiment of the present invention in step order, and show cutting planes on the same position as FIG. 4. FIGS. 9B to 36B are schematic sectional views showing the manufacturing steps in step order, and show cutting planes on the same position as FIG. 6. FIGS. 9C to 36C are schematic sectional views showing the manufacturing steps in step order, and show cutting planes on the same position as FIG. 8.

Figure 9C:
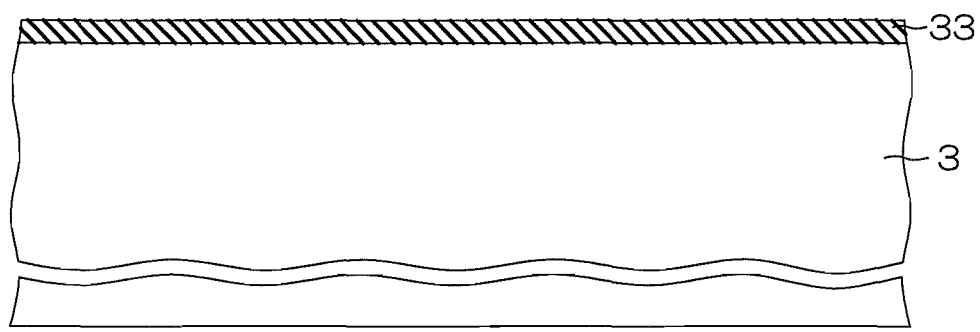
FIG. 9C is a schematic sectional view showing a manufacturing step for the semiconductor device according to the first embodiment of the present invention, and shows a cutting plane on the same position as FIG. 8.

In order to manufacture the semiconductor device 1, the surface of the semiconductor substrate 3 made of conductive silicon is first thermally oxidized (for example, at a temperature of 1100 to 1200° C. to a thickness of 5000 Å), as shown in FIGS. 9A to 9C. Thus, the first insulating film 33 is formed on the surface of the semiconductor substrate 3. At this time, an oxidation time for regions for forming the Z movable electrodes 62 is rendered longer than an oxidation time for the remaining portions, to increase the thickness of the regions.

Figure 10A:
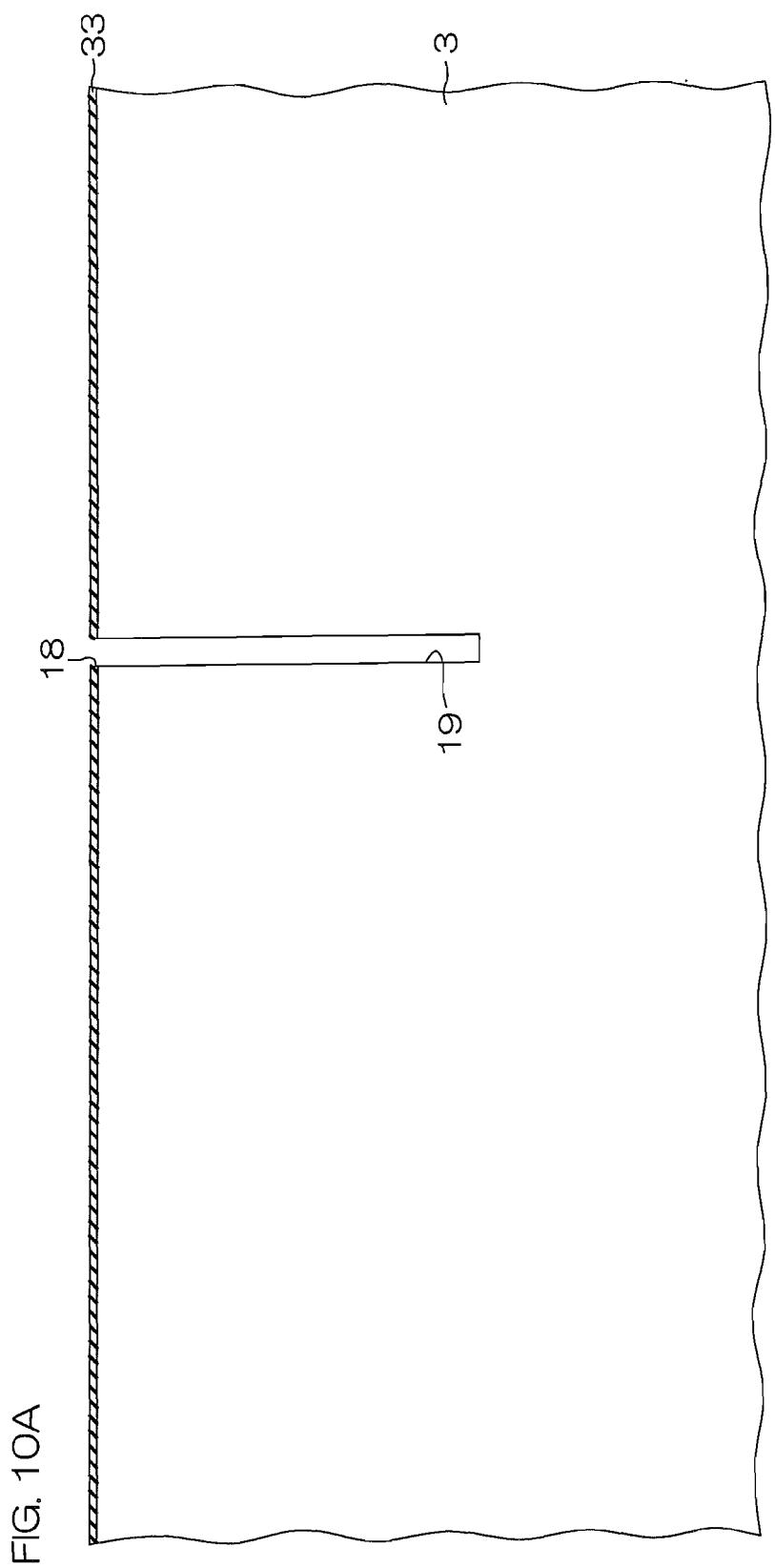
FIG. 10A is a schematic sectional view showing a step subsequent to FIG. 9A.
Figure 10C:
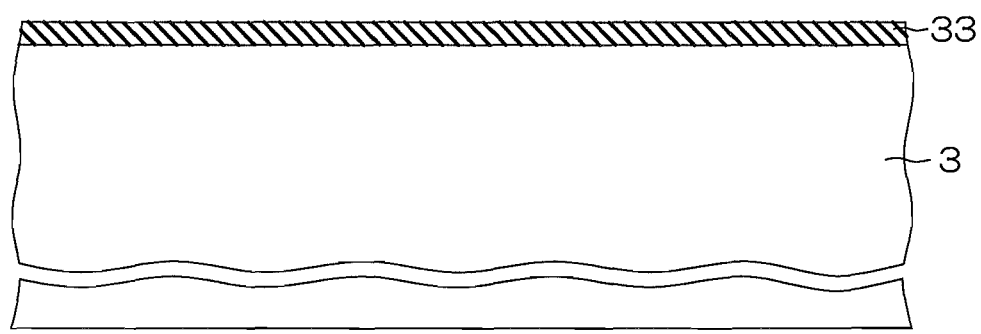
FIG. 10C is a schematic sectional view showing a step subsequent to FIG. 9C.

Then, the first insulating film 33 is patterned by a well-known patterning technique, and an opening 18 is formed in a region for embedding the insulating layers 28, 68 and 74 in the X-axis sensor 6 and the Z-axis sensors 8, as shown in FIGS. 10A and 10B. Then, the semiconductor substrate 3 is dug down by anisotropic deep RIE (Reactive Ion Etching) employing the first insulating film 33 as a hard mask, more specifically by a Bosch process. Thus, a trench 19 is formed in the semiconductor substrate 3. In the Bosch process, a step of etching the semiconductor substrate 3 by using $SF_6$ (sulfur hexafluoride) and a step of forming a protective film on an etched surface by using $C_4F_8$ (perfluorocyclobutane) are alternately repeated. Thus, the semiconductor substrate 3 can be etched at a high aspect ratio, while wavy irregularities referred to as scallops are formed on the etched surface (the inner peripheral surface of the trench). At this time, a state after termination of the precedent step is maintained in a region for forming the integrated circuit 5, as shown in FIG. 10C.

Figure 11B:
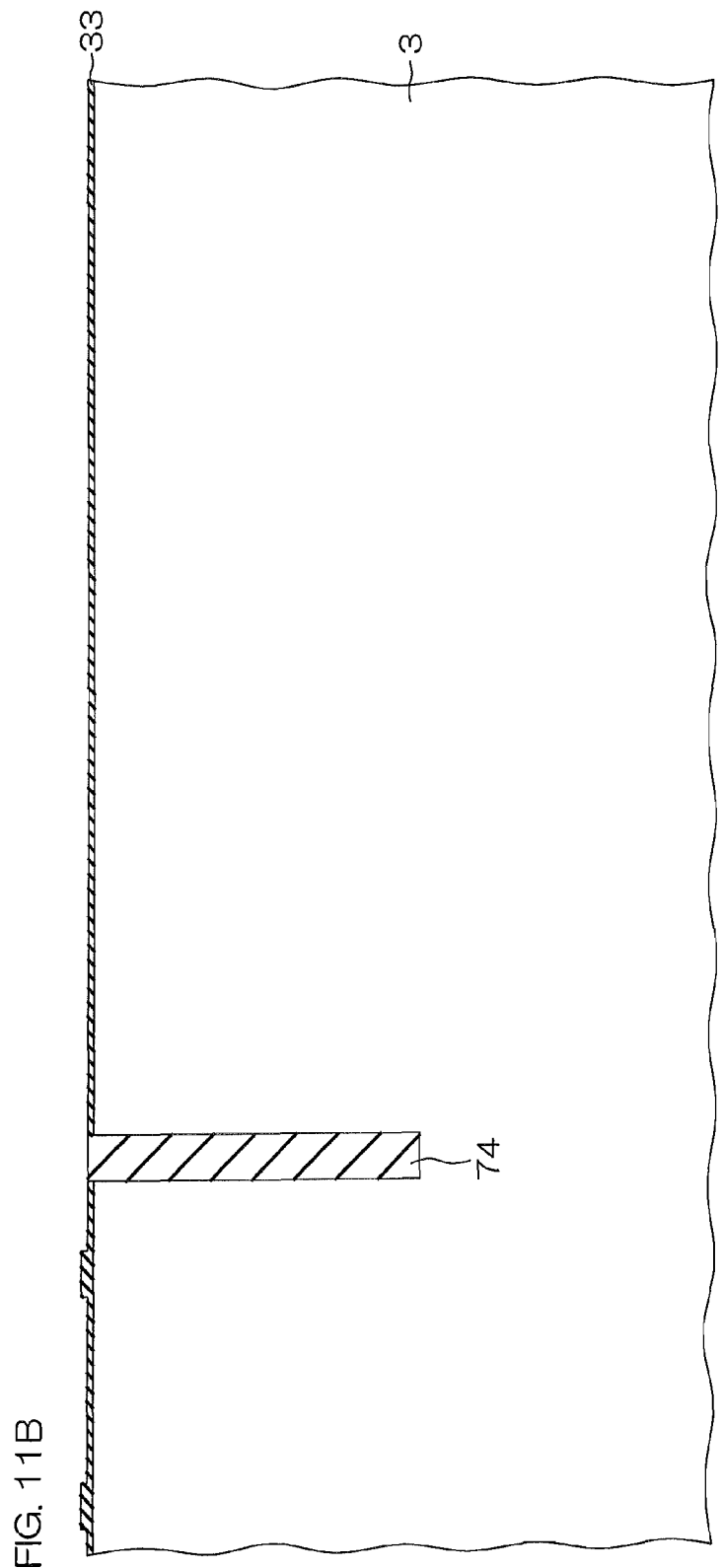
FIG. 11B is a schematic sectional view showing a step subsequent to FIG. 10B.
Figure 11C:
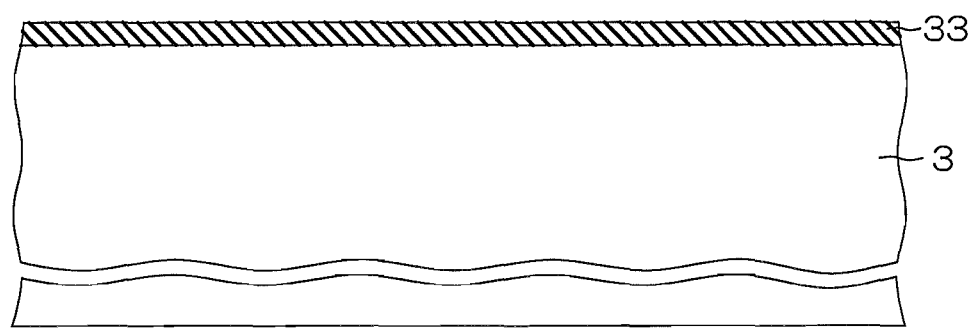
FIG. 11C is a schematic sectional view showing a step subsequent to FIG. 10C.

Then, the inner portion of the trench 19 and the surface of the semiconductor substrate 3 are thermally oxidized (for example, at a temperature of 1100 to 1200° C.), and a surface of an oxide film is thereafter etched back (for example, the thickness after the etchback is 21800 Å), as shown in FIGS. 11A and 11B. Thus, the insulating layers 28, 68 and 74 filling up the trench 19 are formed. At this time, a state after termination of the precedent step is maintained in the region for forming the integrated circuit 5, as shown in FIG. 11C.

Figure 16A:
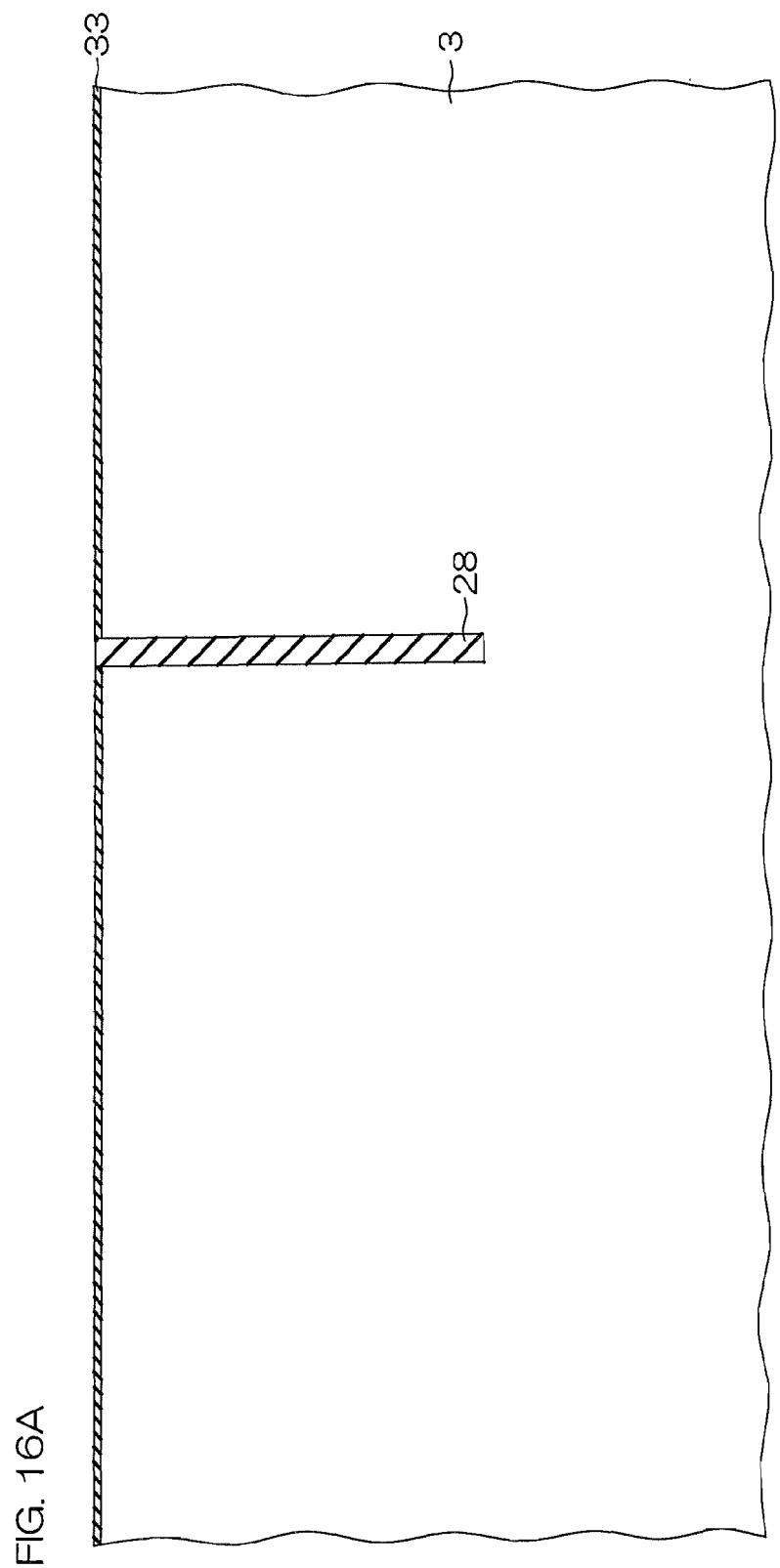
FIG. 16A is a schematic sectional view showing a step subsequent to FIG. 15A.
Figure 17C:
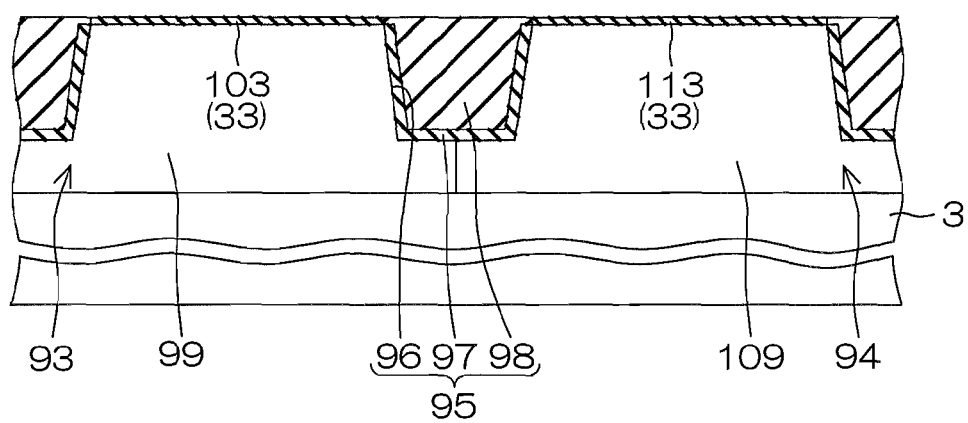
FIG. 17C is a schematic sectional view showing a step subsequent to FIG. 16C.

Then, a state after termination of precedent steps is maintained in a region for forming the acceleration sensor 4 as shown in FIGS. 12A to 23A and FIGS. 12B to 23B, until the N-channel MOSFET 91 and the P-channel MOSFET 92 are formed on the region for forming the integrated circuit 5 through steps shown in FIGS. 12C to 23C (excluding a time of etchback in FIG. 17C).

Figure 12A:
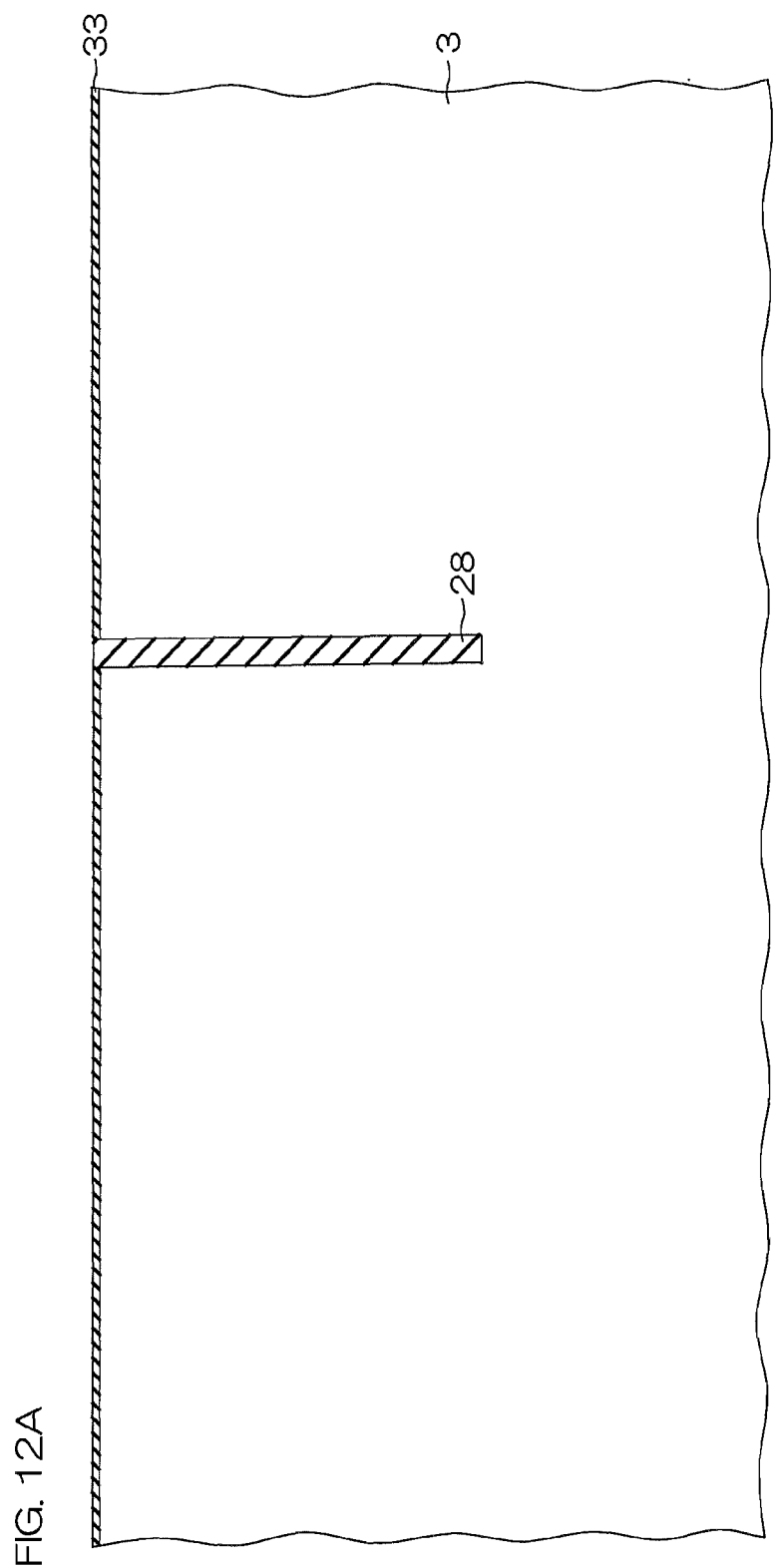
FIG. 12A is a schematic sectional view showing a step subsequent to FIG. 11A.
Figure 12C:
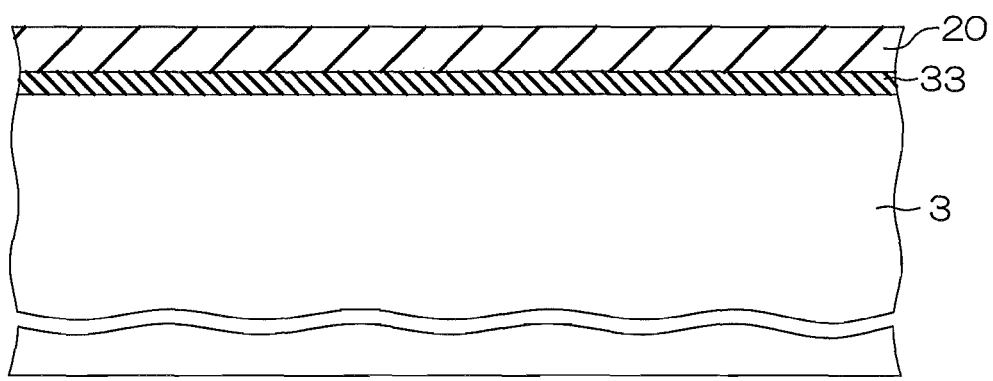
FIG. 12C is a schematic sectional view showing a step subsequent to FIG. 11C.

In the region for forming the integrated circuit 5, a silicon nitride film 20 is formed on the first insulating film 33 by CVD as shown in FIG. 12C, after the insulating layers 68 and 74 are formed on the region for forming the acceleration sensor 4.

Figure 13A:
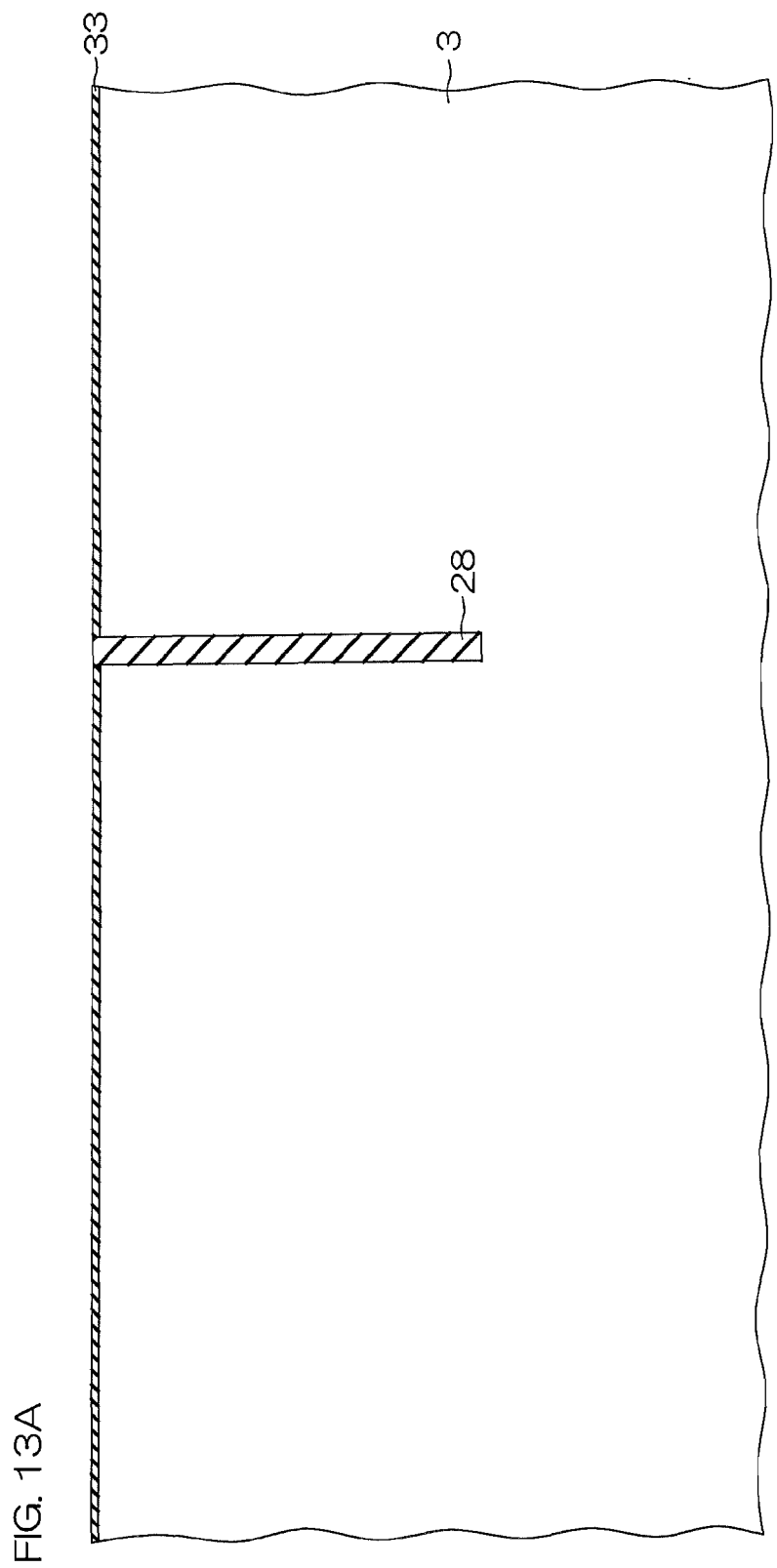
FIG. 13A is a schematic sectional view showing a step subsequent to FIG. 12A.
Figure 13C:
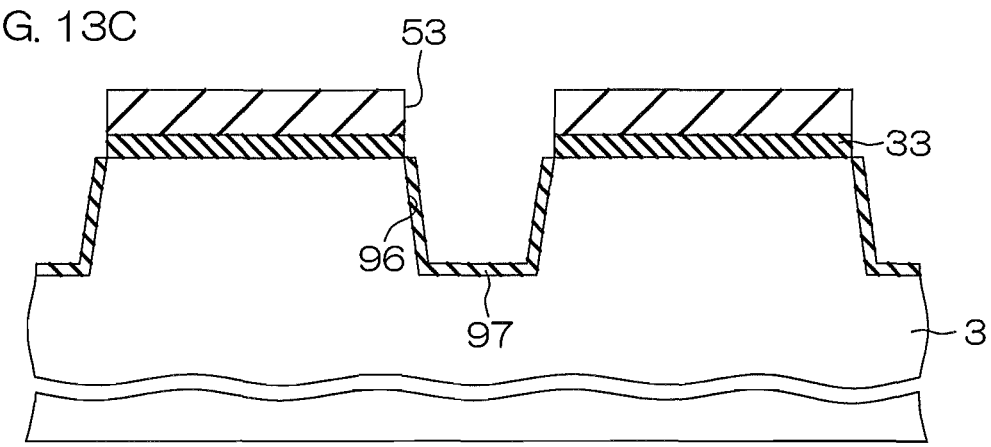
FIG. 13C is a schematic sectional view showing a step subsequent to FIG. 12C.

Then, the silicon nitride film 20 and the first insulating film 33 are patterned by a well-known patterning technique, and an opening 53 is formed in a region for forming the shallow trench 96, as shown in FIG. 13C. Then, the semiconductor substrate 3 is dug down by dry etching employing the silicon nitride film 20 and the first insulating film 33 as hard masks. Thus, the shallow trench 96 is formed in the semiconductor substrate 3. Then, the inner surface of the shallow trench 96 is oxidized by performing thermal oxidation in a state leaving the silicon nitride film 20 and the first insulating film 33. Thus, the thermal oxide film 97 is formed on the inner surface of the shallow trench 96.

Figure 14C:
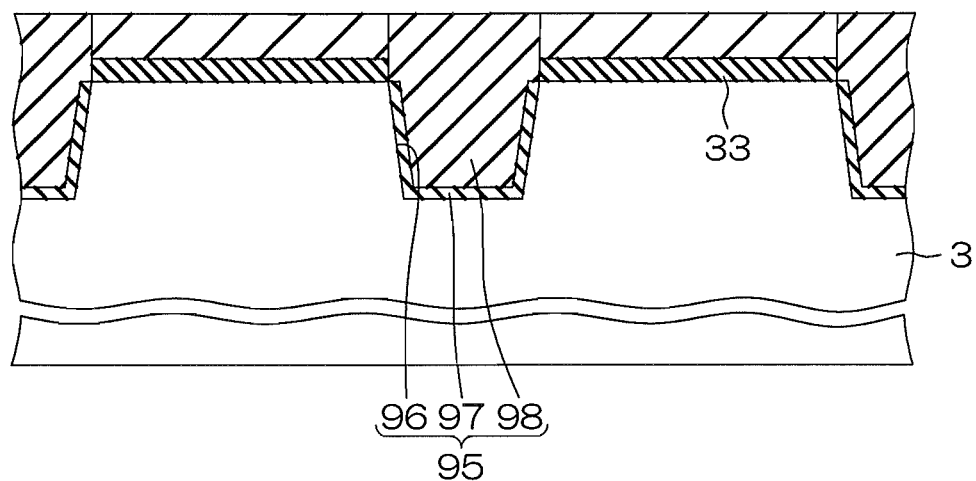
FIG. 14C is a schematic sectional view showing a step subsequent to FIG. 13C.

Then, silicon oxide ($SiO_2$) is deposited on the semiconductor substrate 3 by CVD and thereafter etched back, as shown in FIG. 14C. Thus, the insulator 98 filling up the shallow trench 96 is formed. After the formation of the insulator 98, the silicon nitride film 20 is removed.

Figure 15A:
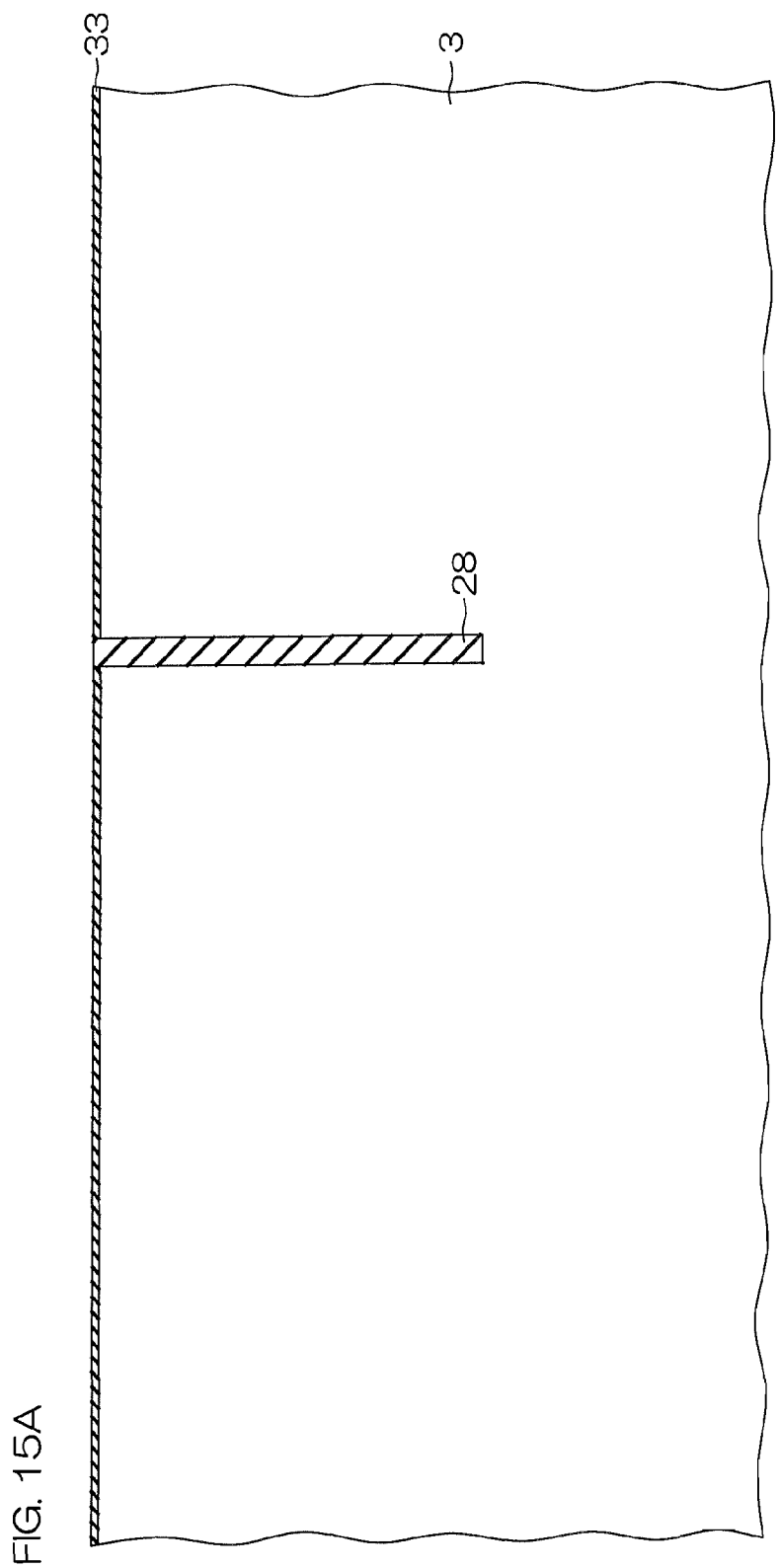
FIG. 15A is a schematic sectional view showing a step subsequent to FIG. 14A.
Figure 15B:
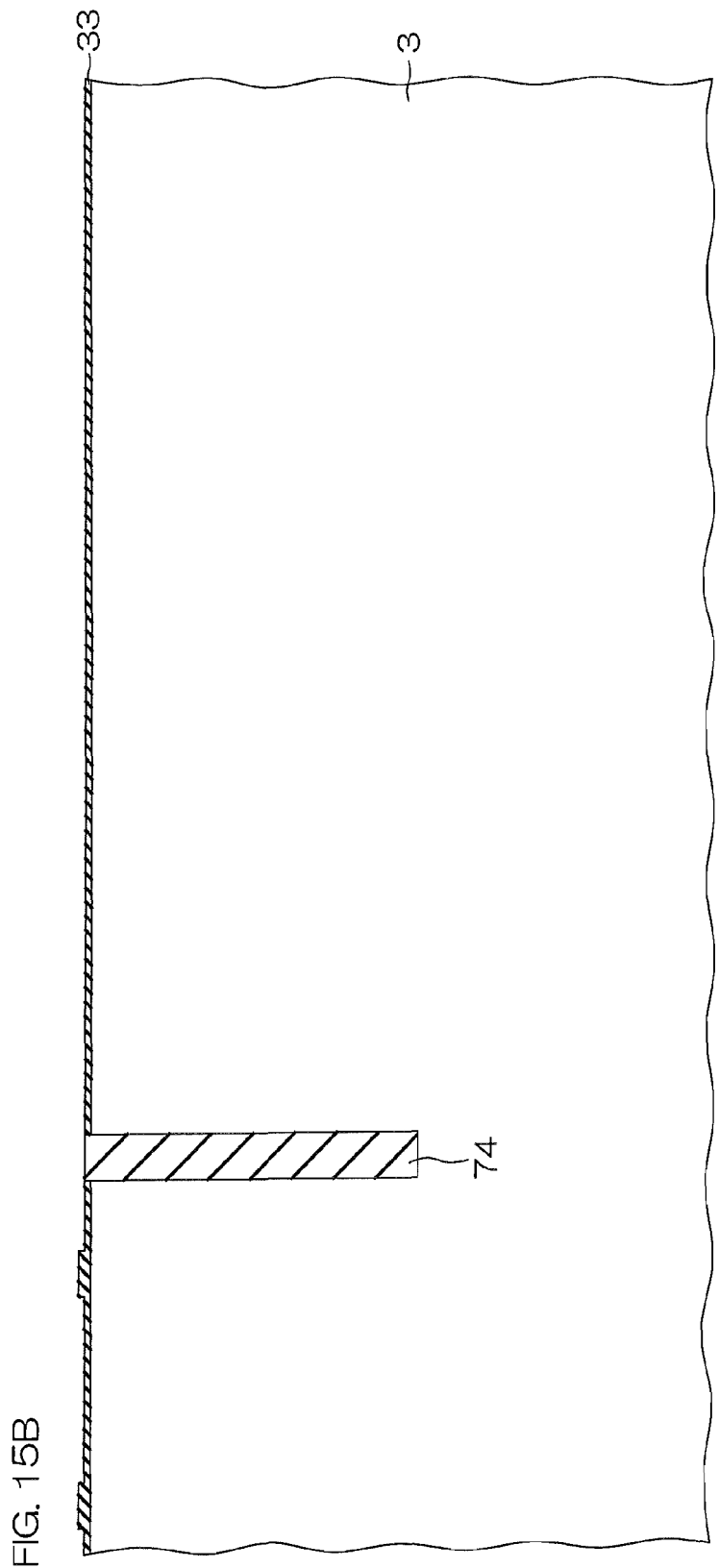
FIG. 15B is a schematic sectional view showing a step subsequent to FIG. 14B.

Then, a resist 54 having an opening selectively exposing the PMOS region 94 is formed, and an N-type impurity (for example, phosphorus (P) ions) is implanted (implantation) by employing the resist 54 as a mask, as shown in FIG. 15C.

Then, a resist 55 having an opening selectively exposing the NMOS region 93 is formed, and a P-type impurity (for example, boron (B) ions) is implanted (implantation) by employing the resist 55 as a mask, as shown in FIG. 16C.

Thereafter the semiconductor substrate 3 is so heat-treated that the implanted ions are activated, and the N-type well 109 and the P-type well 99 are formed in the semiconductor substrate 3.

Then, the first insulating film 33 is thinned by etchback, and the gate insulating films 103 and 113 are formed, as shown in FIG. 17C.

Figure 18B:
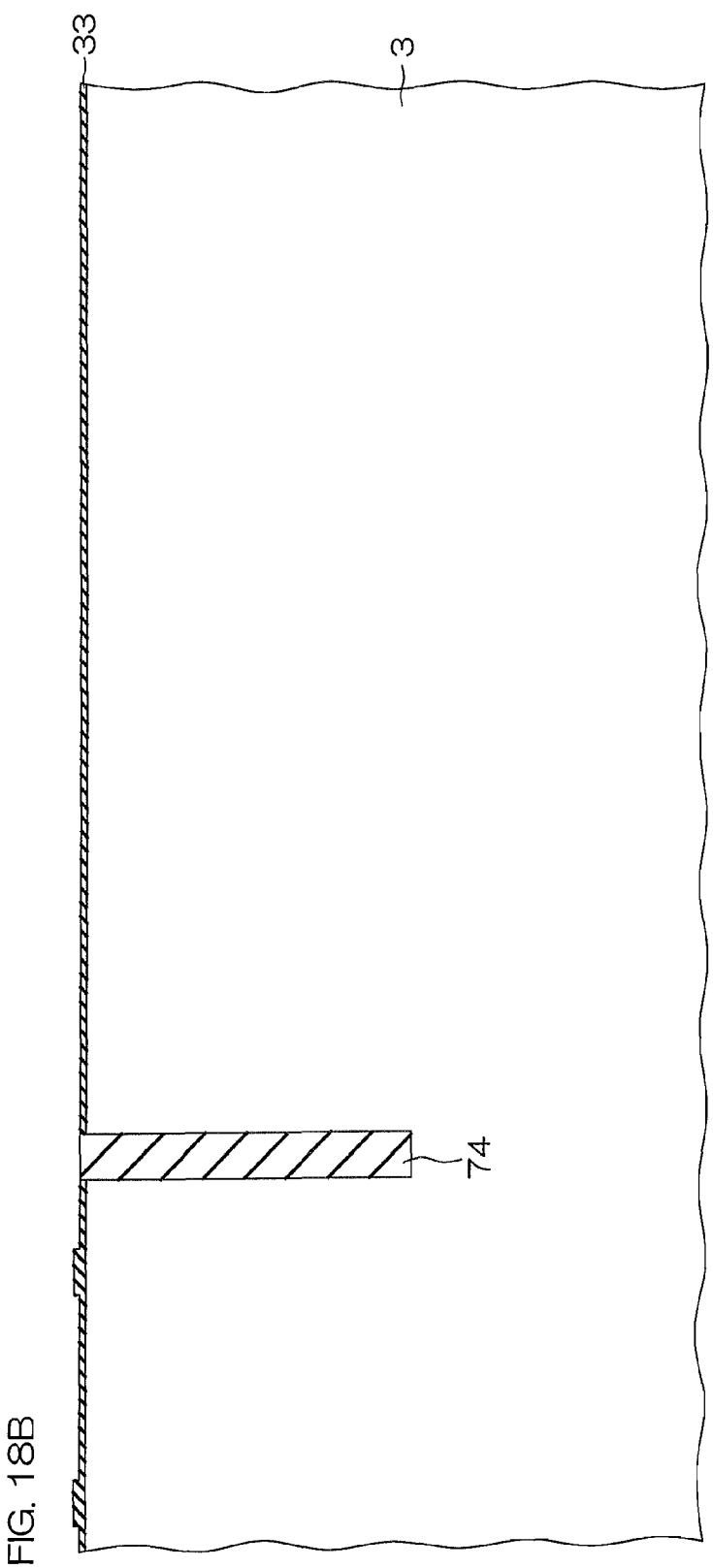
FIG. 18B is a schematic sectional view showing a step subsequent to FIG. 17B.
Figure 18C:
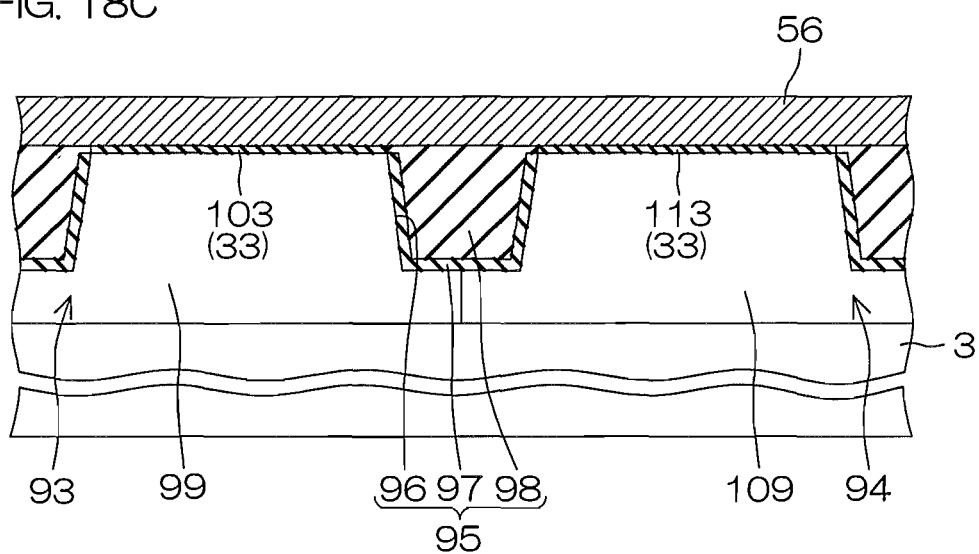
FIG. 18C is a schematic sectional view showing a step subsequent to FIG. 17C.

Then, a polycrystalline silicon layer 56 is formed on the gate insulating films 103 and 113 by CVD, as shown in FIG. 18C.

Figure 19A:
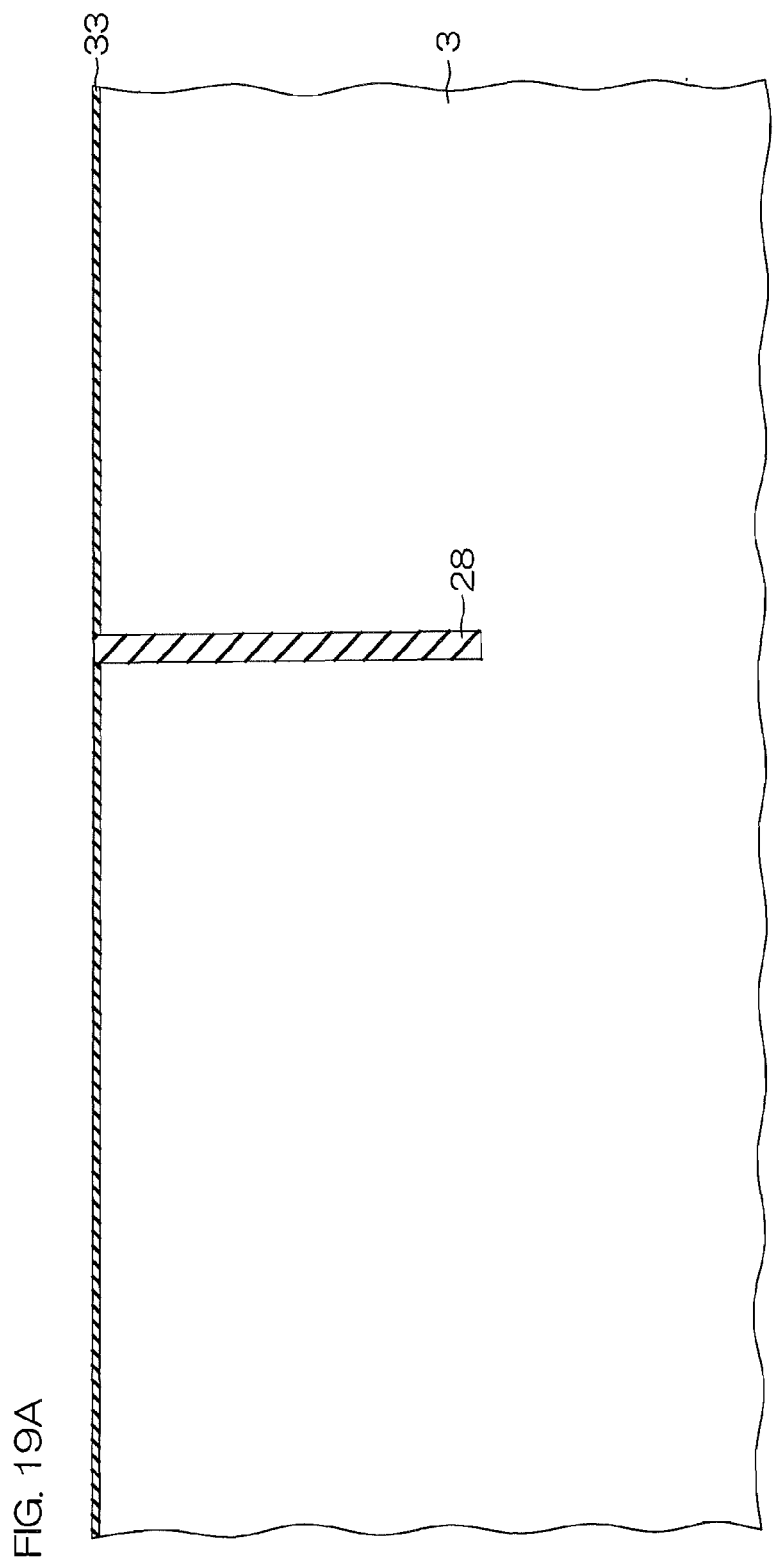
FIG. 19A is a schematic sectional view showing a step subsequent to FIG. 18A.
Figure 19C:
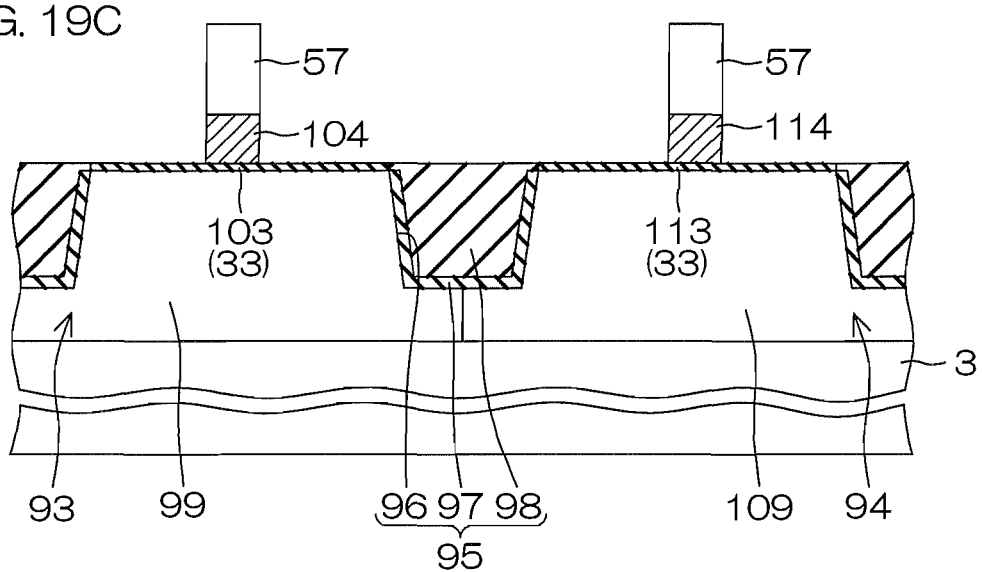
FIG. 19C is a schematic sectional view showing a step subsequent to FIG. 18C.

Then, a resist 57 having openings in regions other than regions for forming the gate electrodes 104 and 114 is formed, and the polycrystalline silicon layer 56 is etched by employing the resist 57 as a mask, as shown in FIG. 19C. Thus, the gate electrodes 104 and 114 are formed. After the formation of the gate electrodes 104 and 114, the resist 57 is removed. Then, an N-type impurity is implanted into the gate electrode 104 and a P-type impurity is implanted into the gate electrode 114 by a well-known ion implantation technique. At this time, impurity ions are implanted into respective surface layer portions of the NMOS region 93 and the PMOS region 94 in thin concentrations.

After the ion implantation into the gate electrodes 104 and 114, a silicon nitride film 58 is formed on the semiconductor substrate 3 by CVD, as shown in FIG. 20C.

Figure 21A:
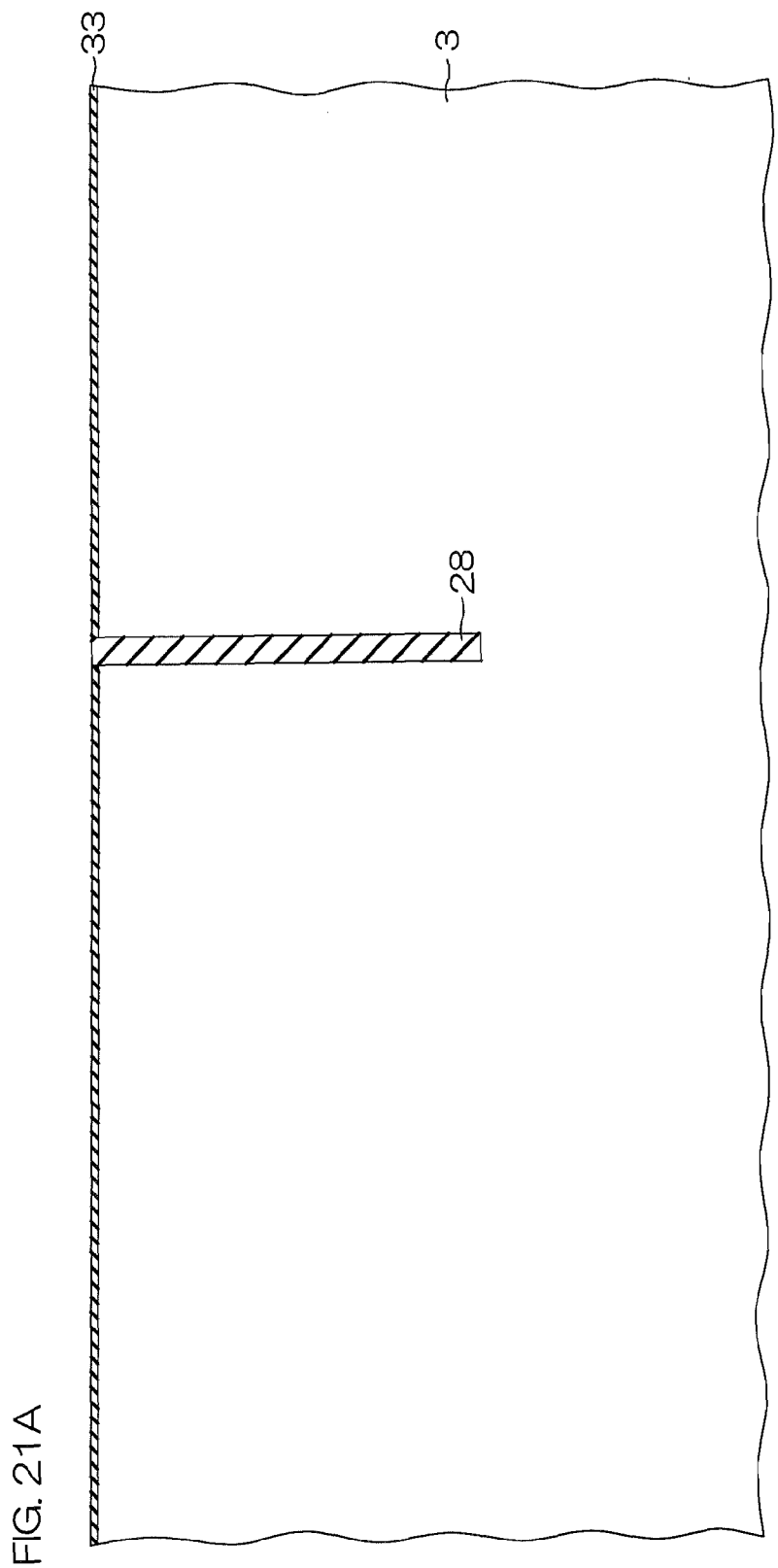
FIG. 21A is a schematic sectional view showing a step subsequent to FIG. 20A.

Then, the silicon nitride film 58 is so etched back that the sidewalls 105 and 115 are simultaneously formed, as shown in FIG. 21C.

Figure 22C:
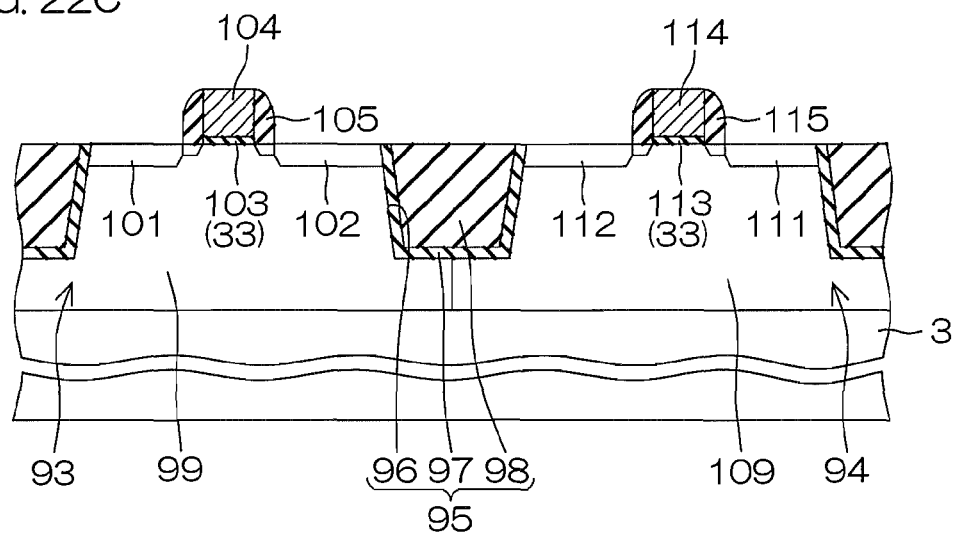
FIG. 22C is a schematic sectional view showing a step subsequent to FIG. 21C.

Then, a resist (not shown) having an opening selectively exposing the NMOS region 93 is formed on the semiconductor substrate 3 and an N-type impurity is implanted into the semiconductor substrate 3 through the opening of the resist, as shown in FIG. 22C. Thus, the N-type source region 101 and the drain region 102 are formed. Further, a resist (not shown) having an opening selectively exposing the PMOS region 94 is formed on the semiconductor substrate 3, and a P-type impurity is implanted into the semiconductor substrate 3 through the opening of the resist. Thus, the P-type source region 111 and the drain region 112 are formed.

Figure 23C:
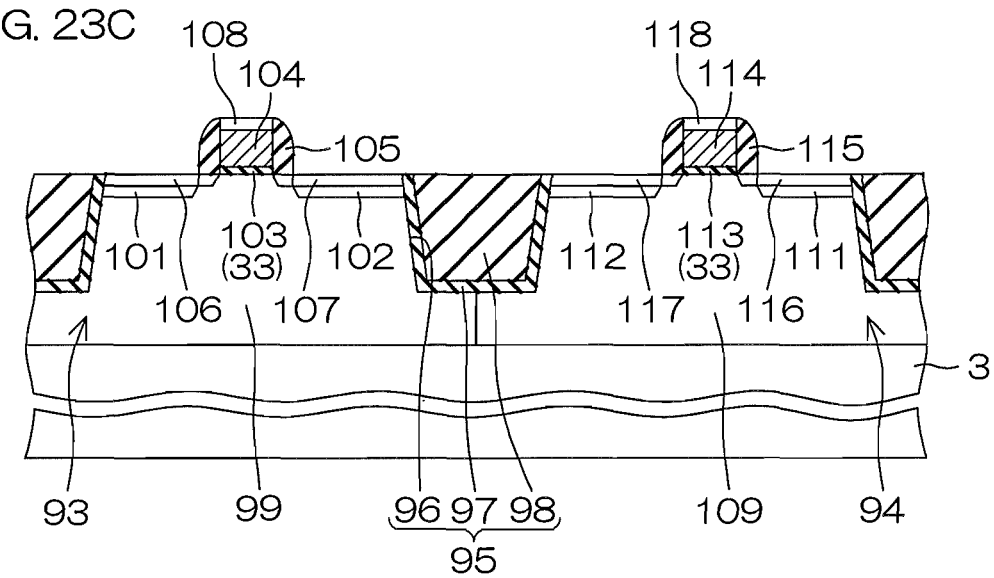
FIG. 23C is a schematic sectional view showing a step subsequent to FIG. 22C.

Then, surface layer portions of the source regions 101 and 111, the drain regions 102 and 112 and the gate electrodes 104 and 114 are silicified, whereby the silicides 106 to 108 and 116 to 118 are formed, as shown in FIG. 23C.

Figure 24A:
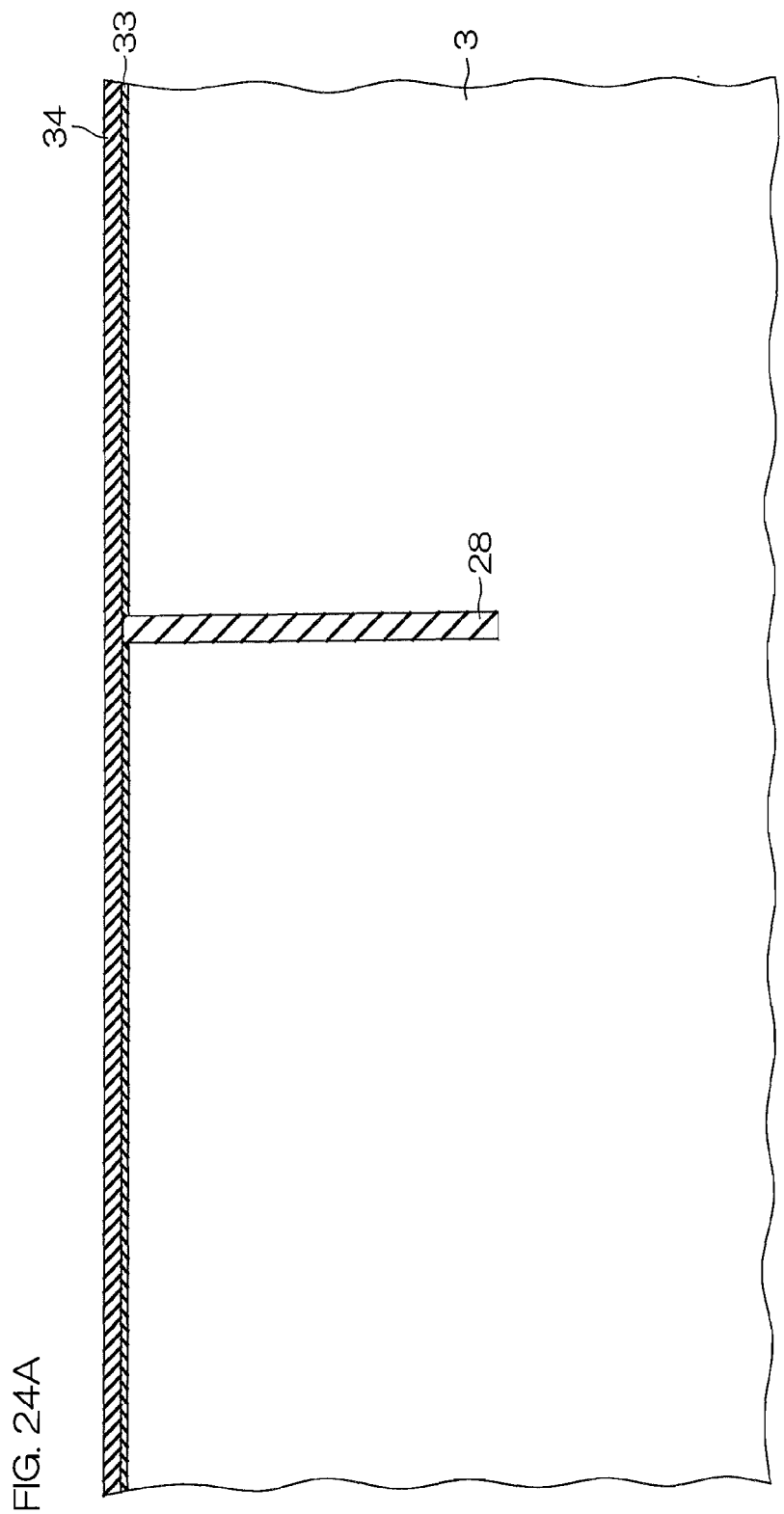
FIG. 24A is a schematic sectional view showing a step subsequent to FIG. 23A.
Figure 24B:
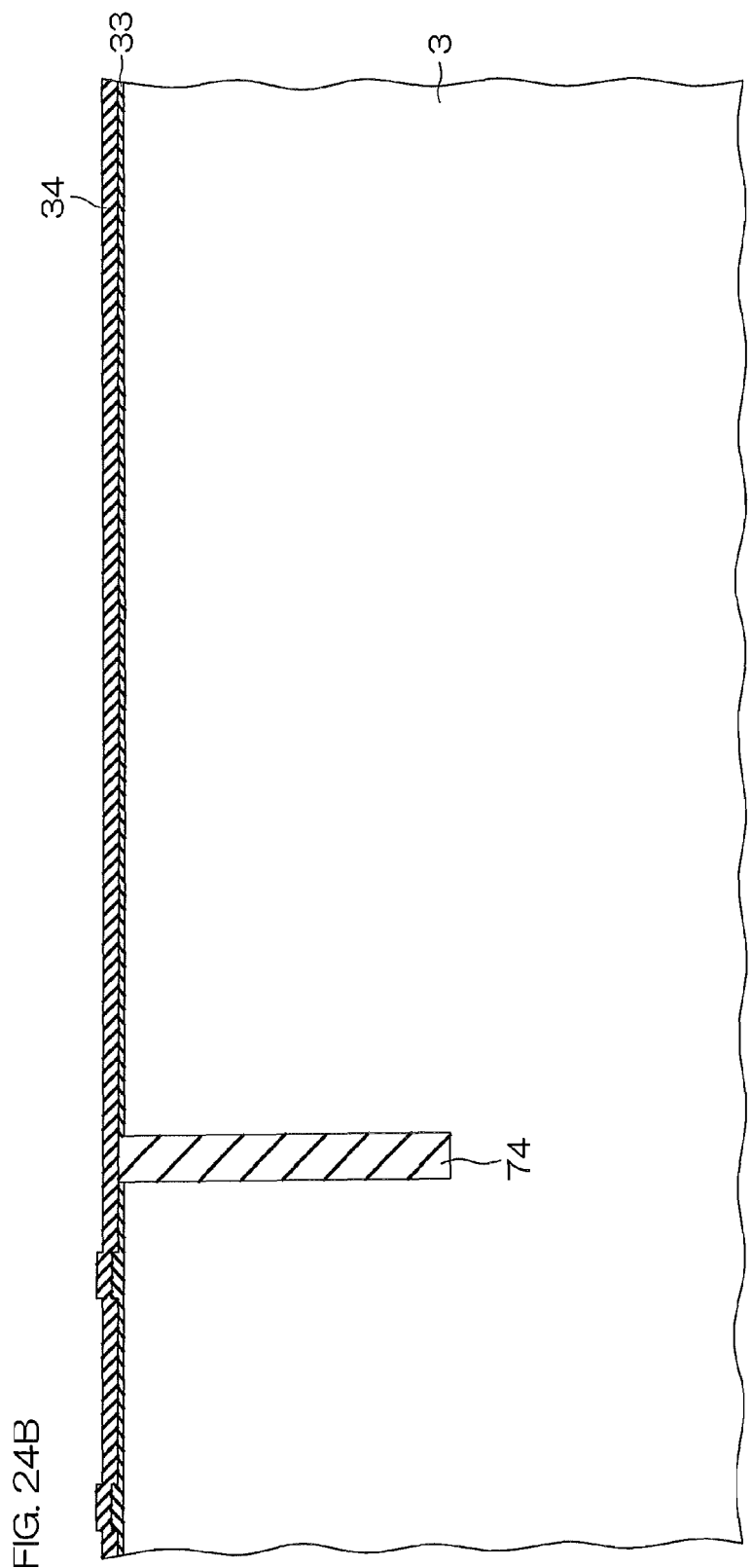
FIG. 24B is a schematic sectional view showing a step subsequent to FIG. 23B.
Figure 24C:
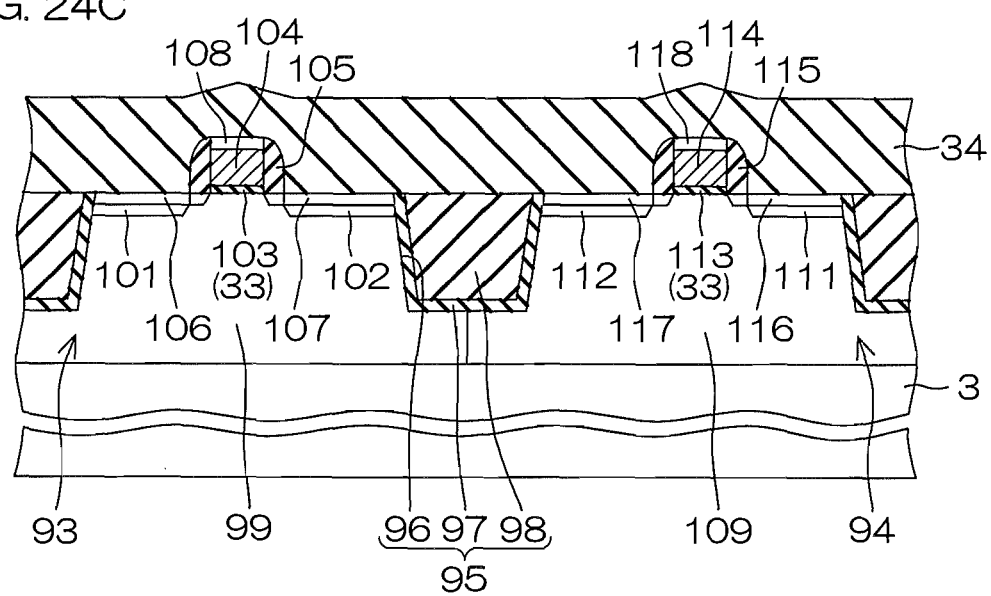
FIG. 24C is a schematic sectional view showing a step subsequent to FIG. 23C.

Then, the second insulating film 34 made of silicon oxide is stacked on the semiconductor substrate 3 by CVD, as shown in FIGS. 24A to 24C.

Figure 25C:
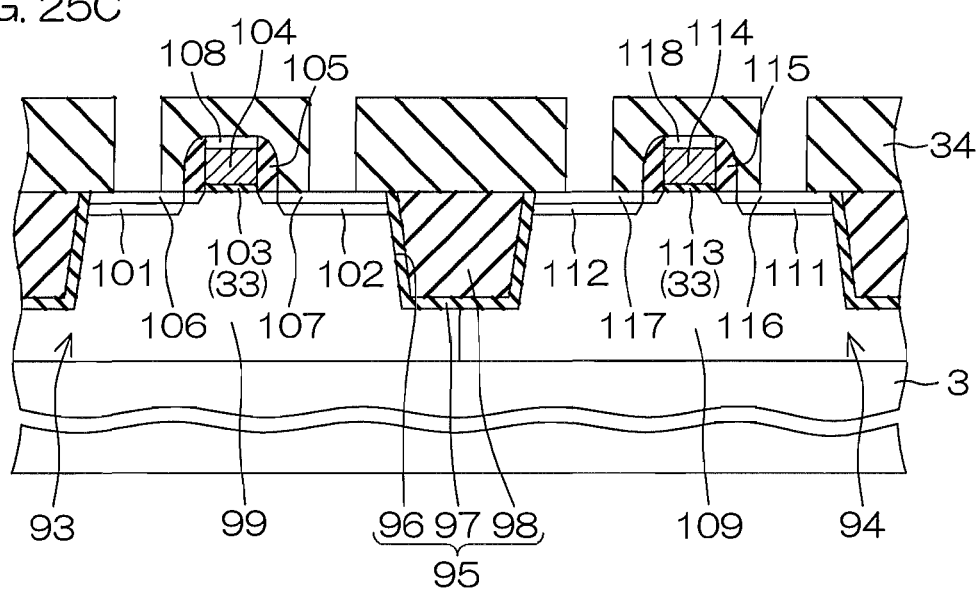
FIG. 25C is a schematic sectional view showing a step subsequent to FIG. 24C.

Then, a resist (not shown) having openings in regions for forming the contact plugs 31, 51, 79 and 80 of the acceleration sensor 4 and the contact plugs 123 to 126 an 128 of the integrated circuit 5 is formed, and the second insulating film 34 and the first insulating film 33 are continuously etched through the openings of the resist, as shown in FIGS. 25A to 25C. Thus, contact holes for embedding the contact plugs are formed at the same time.

Figure 26A:
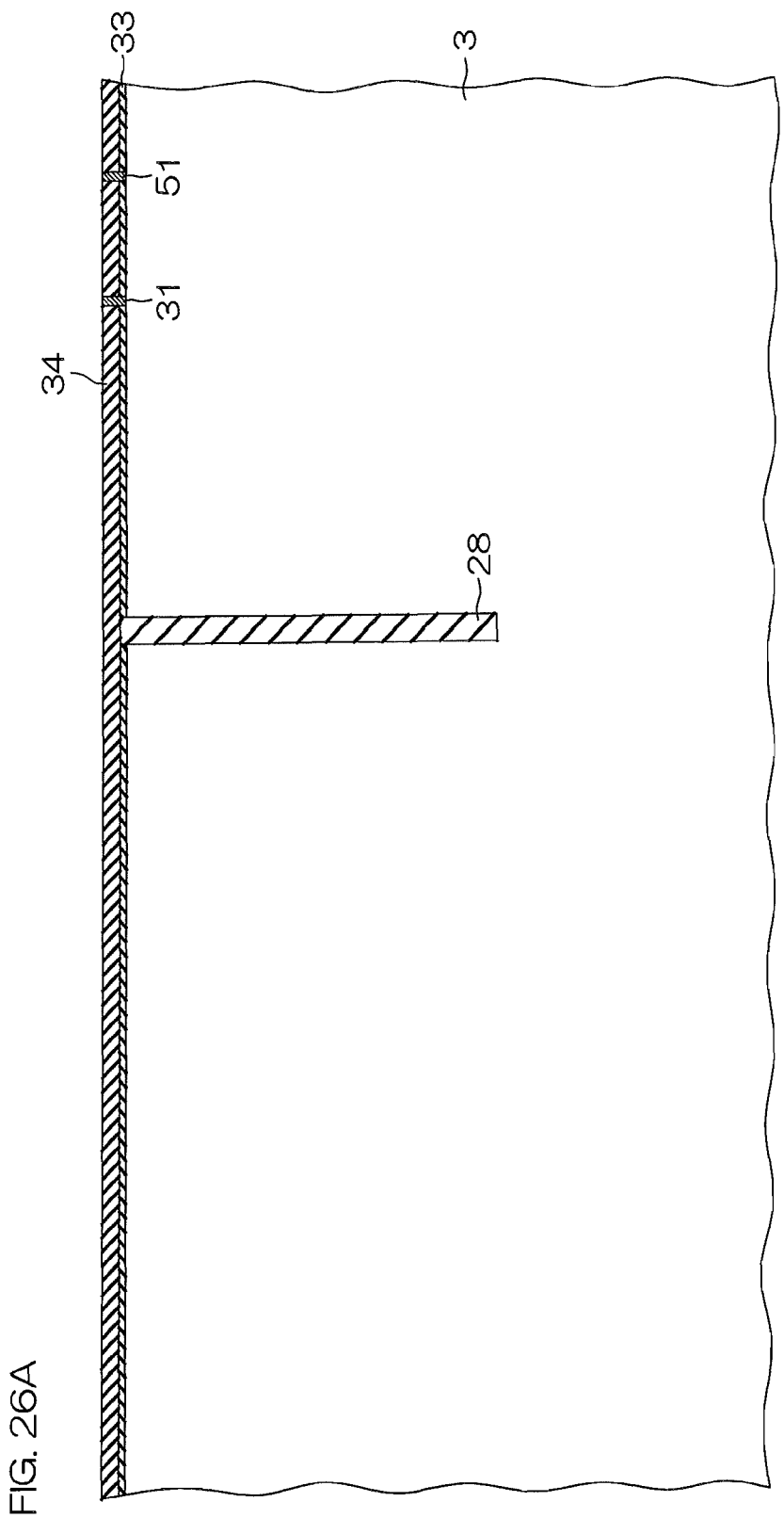
FIG. 26A is a schematic sectional view showing a step subsequent to FIG. 25A.
Figure 26C:
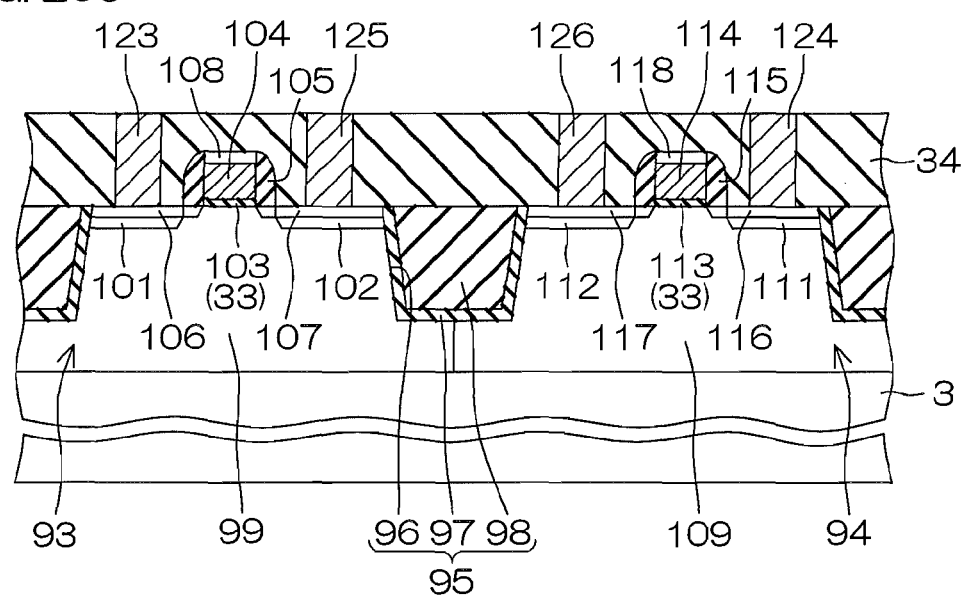
FIG. 26C is a schematic sectional view showing a step subsequent to FIG. 25C.

Then, a tungsten film filling up the contact holes is deposited by CVD, and the deposited tungsten film is polished by CMP, as shown in FIGS. 26A to 26C. Thus, the contact plugs 31, 51, 79 and 80 of the acceleration sensor 4 and the contact plugs 123 to 126 and 128 of the integrated circuit 5 made of tungsten are formed at the same time.

Figure 27A:
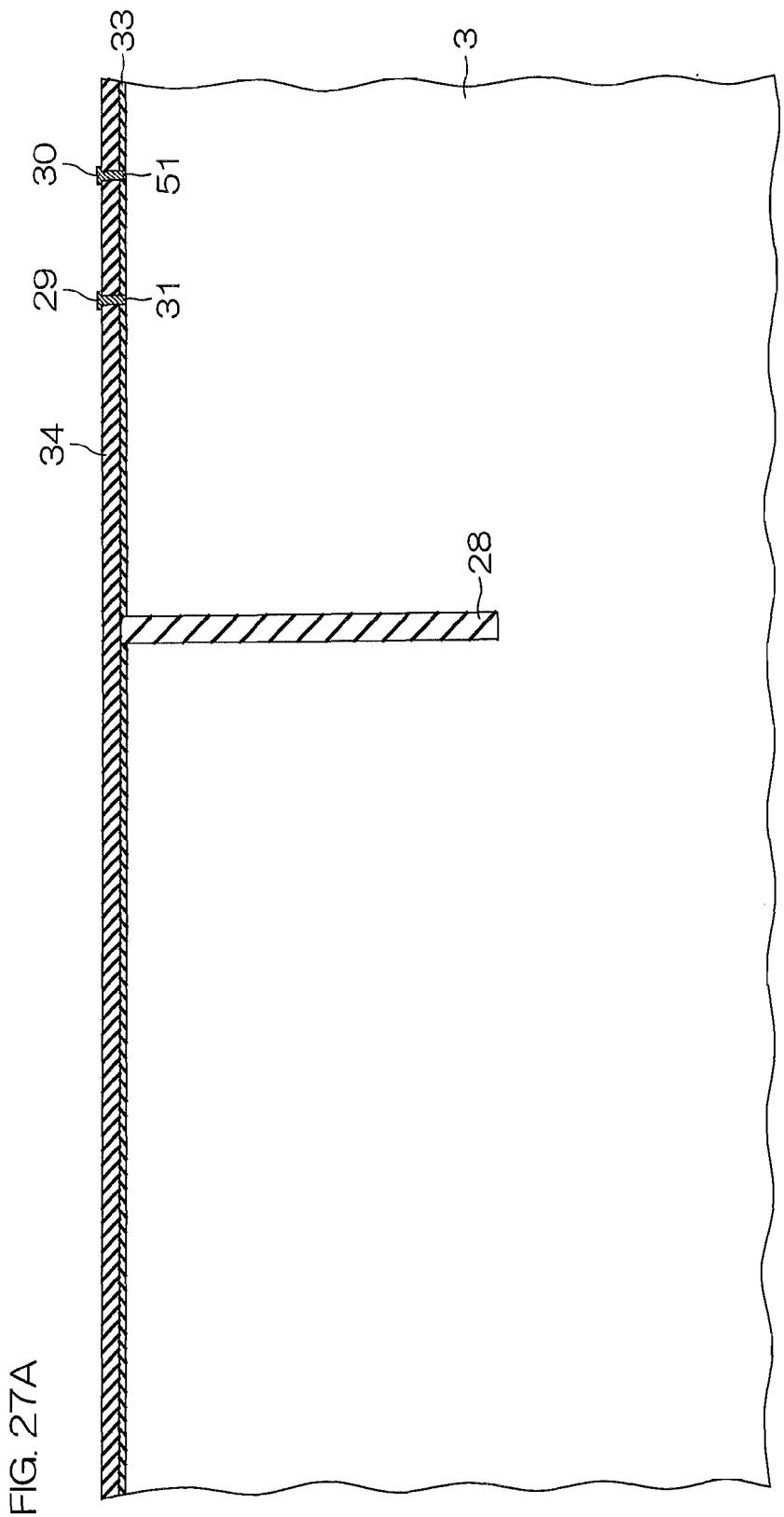
FIG. 27A is a schematic sectional view showing a step subsequent to FIG. 26A.
Figure 27C:
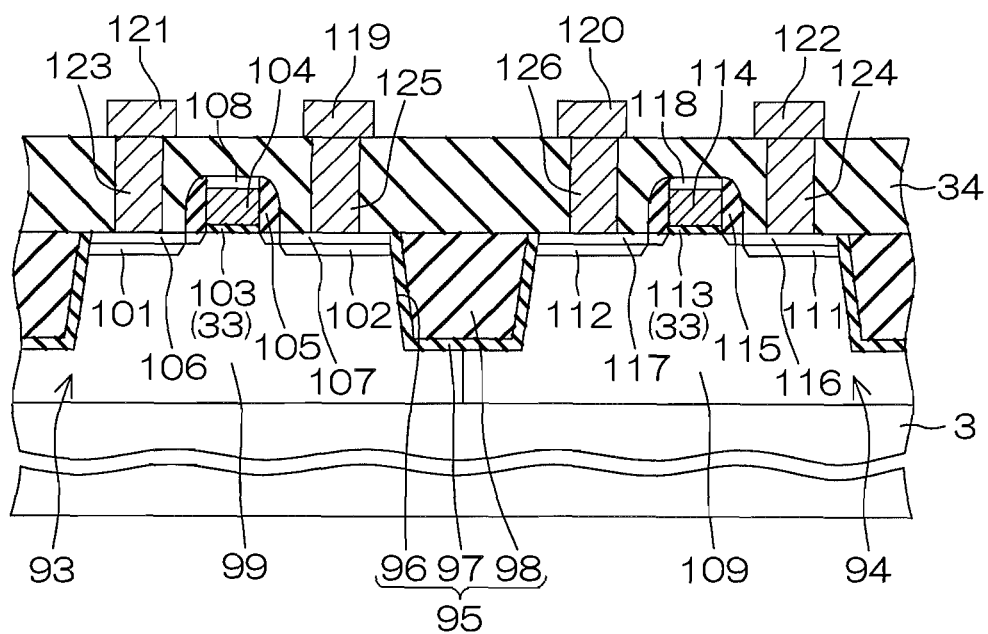
FIG. 27C is a schematic sectional view showing a step subsequent to FIG. 26C.

Then, aluminum as a metallic material is selectively deposited (for example, 700 Å) on the second insulating film 34 by sputtering, and the aluminum deposition layer is patterned, as shown in FIGS. 27A to 27C. Thus, the sensor wires (the X first sensor wires 29, the Z first sensor wires 75 and the like) of the acceleration sensor 4 and the transistor wires (the drain wires 119 and 120 and the source wires 121 and 122) of the integrated circuit 5 are simultaneously formed on the same layer (the layer related to the second insulating film 34).

Figure 28B:
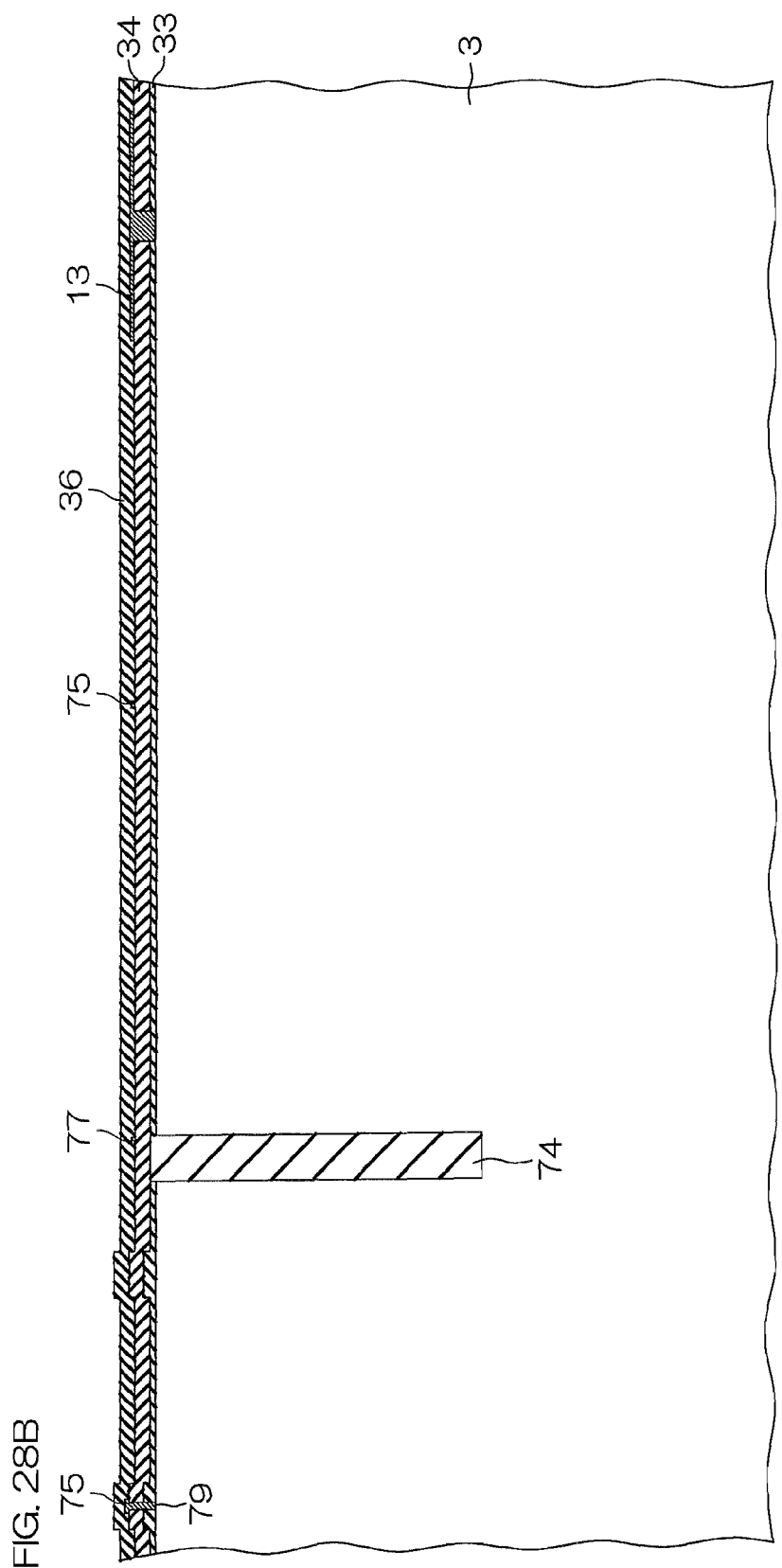
FIG. 28B is a schematic sectional view showing a step subsequent to FIG. 27B.
Figure 28C:
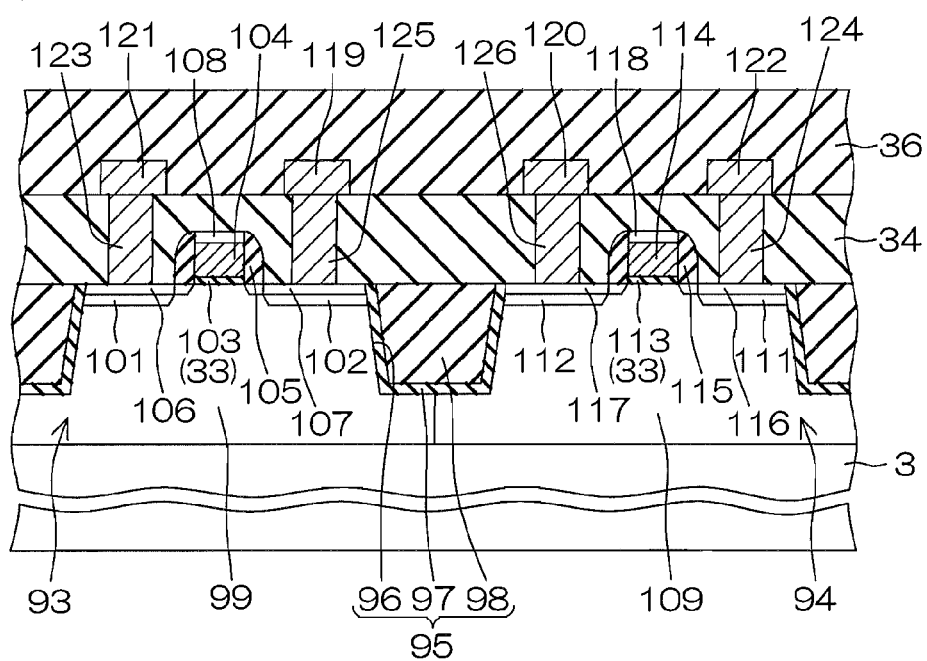
FIG. 28C is a schematic sectional view showing a step subsequent to FIG. 27C.

Then, the third insulating film 36 is stacked on the second insulating film 34 by CVD, as shown in FIGS. 28A to 28C.

Figure 29A:
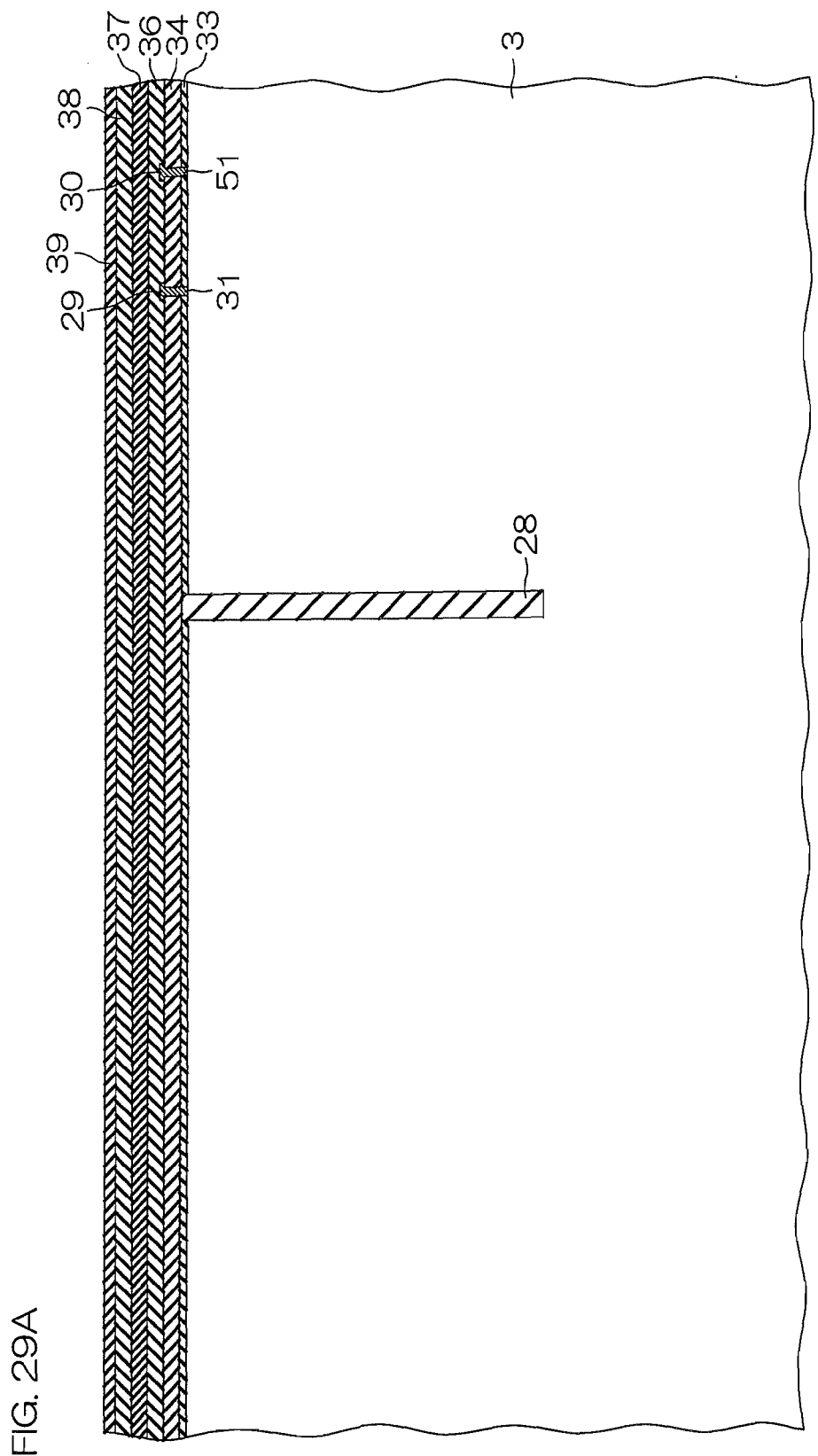
FIG. 29A is a schematic sectional view showing a step subsequent to FIG. 28A.

Thereafter deposition of insulating films by CVD, formation of contact plugs and formation of aluminum wires are successively repeatedly performed, and such a multilayer interconnection structure that the wires 127 are formed on the respective ones of the fourth insulating film 37 and the fifth insulating film 38 is formed, as shown in FIGS. 29A to 29C. After the formation of the multilayer interconnection structure, the surface protective film 39 is formed.

Figure 30A:
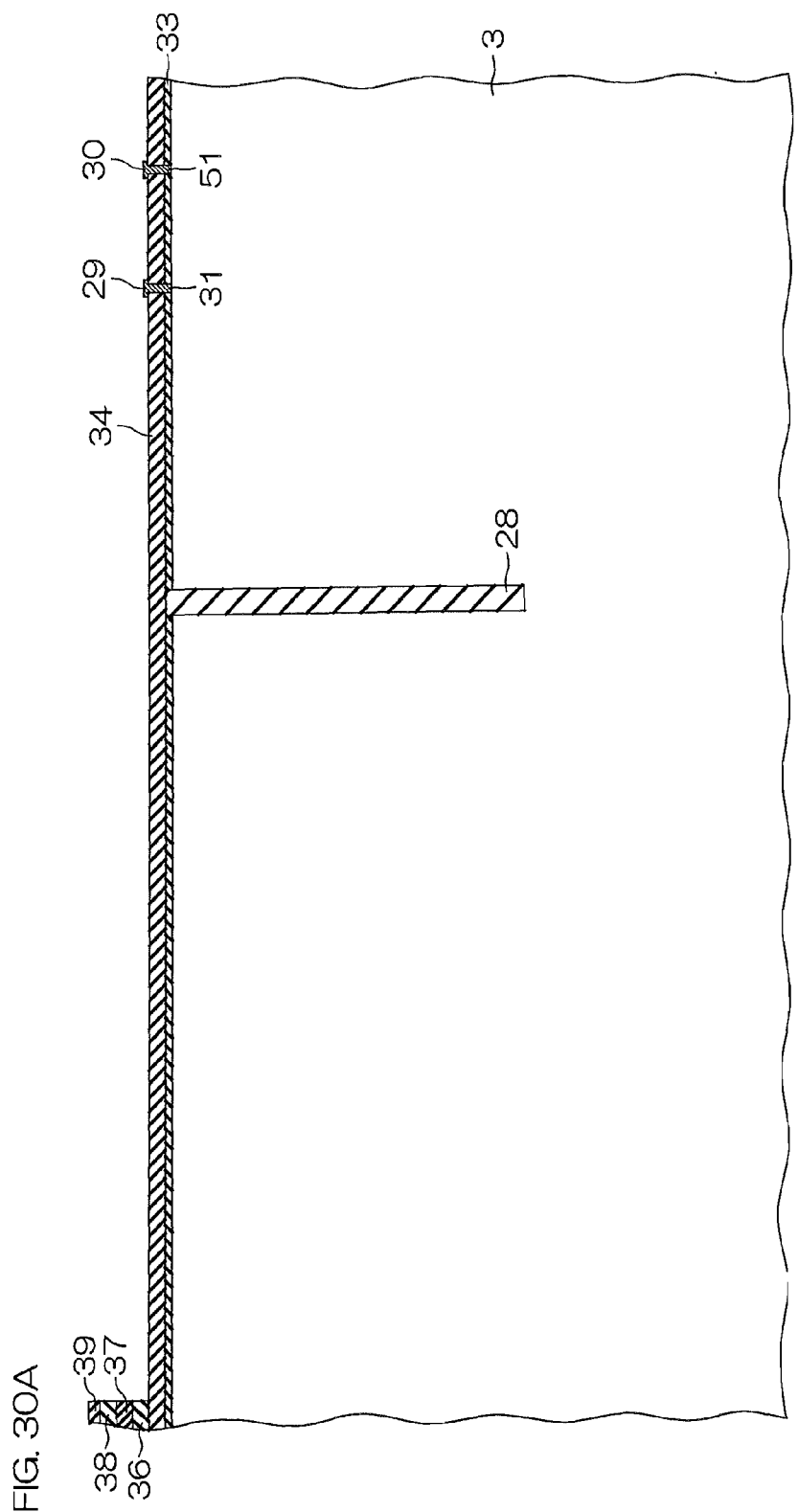
FIG. 30A is a schematic sectional view showing a step subsequent to FIG. 29A.

Then, the third to fifth insulating films 36 to 38 and the surface protective film 39 on a region of the semiconductor substrate 3 for forming the cavity 10 are removed by etching, as shown in FIGS. 30A and 30B. At the same time, the openings 82 for exposing the wires (the X first sensor wires 29, the Z first sensor wires 75 and the like) of the acceleration sensor 4 as the pads 13 and the opening 130 exposing the drain wire 129 of the uppermost layer as the pad in the integrated circuit 5 are formed, as shown in FIG. 30C. Thus, the integrated circuit 5 made of a CMOS is obtained. In the region for forming the integrated circuit 5, therefore, the state where the integrated circuit 5 is prepared is maintained until the cavity 10 is formed in the region for forming the acceleration sensor 4 and the X-axis sensor 6, the Y-axis sensor 7 and the Z-axis sensors 8 are formed through the steps shown in FIGS. 31A to 36A and FIGS. 31B to 36B, as shown in FIGS. 31C to 36C.

Figure 31B:
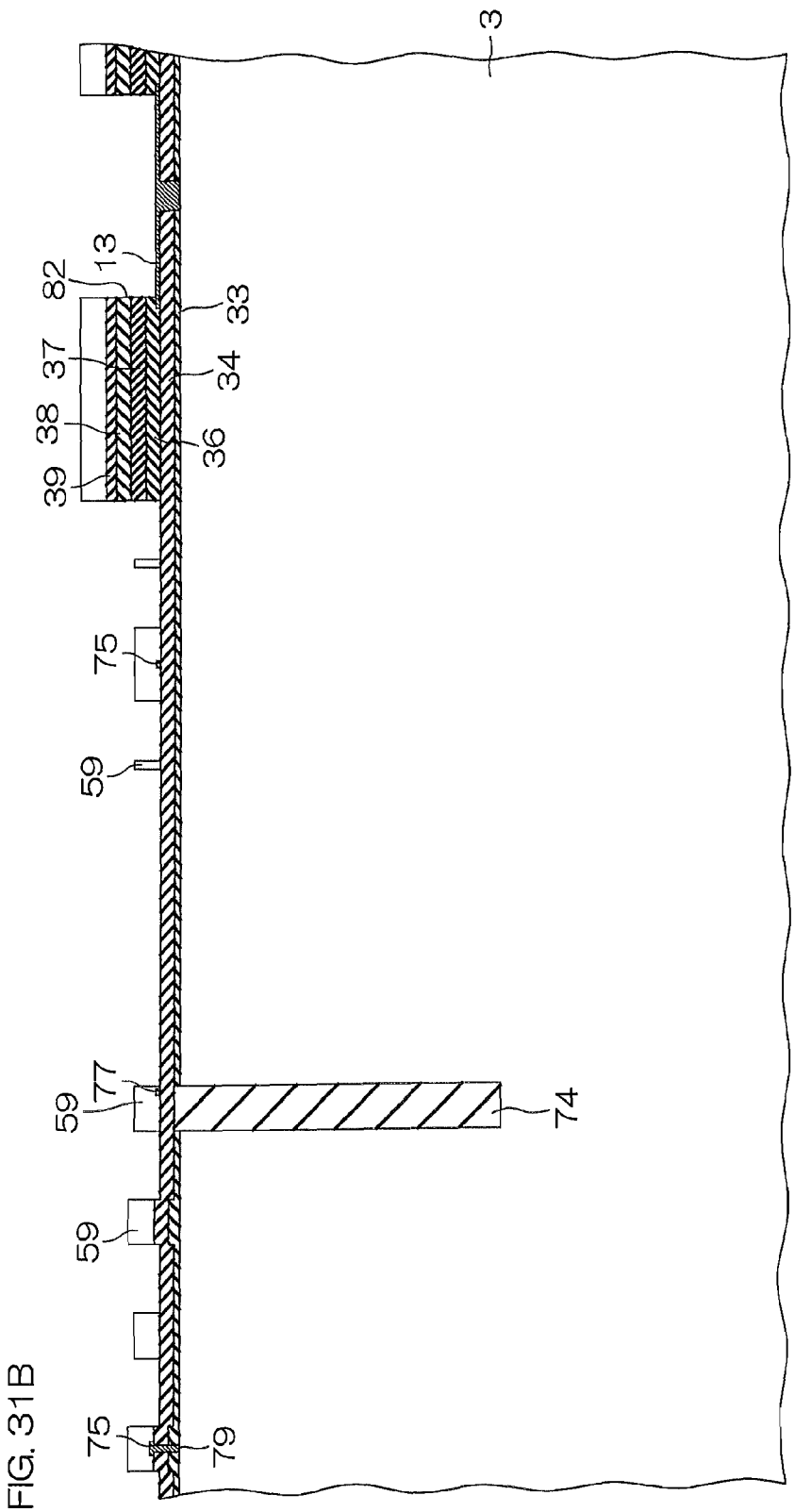
FIG. 31B is a schematic sectional view showing a step subsequent to FIG. 30B.
Figure 31C:
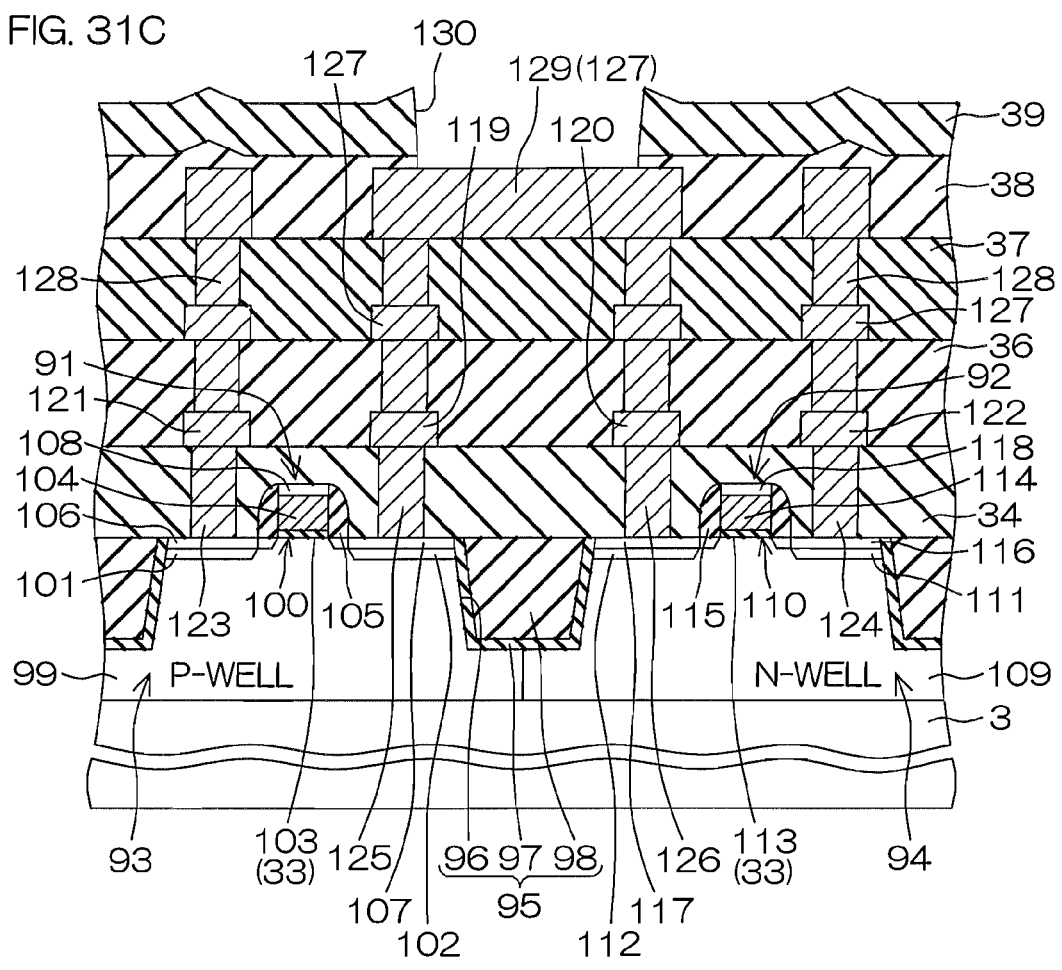
FIG. 31C is a schematic sectional view showing a step subsequent to FIG. 30C.

In the region for forming the acceleration sensor 4, a resist 59 having openings in regions other than regions for forming the X fixed electrode 21, the Y fixed electrode 41 and the Z fixed electrodes 61 as well as the X movable electrode 22, the Y movable electrode 42 and the Z movable electrodes 62 is formed on the second insulating film 34 as shown in FIGS. 31A and 31B, after the third to fifth insulating films 36 to 38 and the surface protective film 39 on the region for forming the cavity 10 are removed.

Figure 32A:
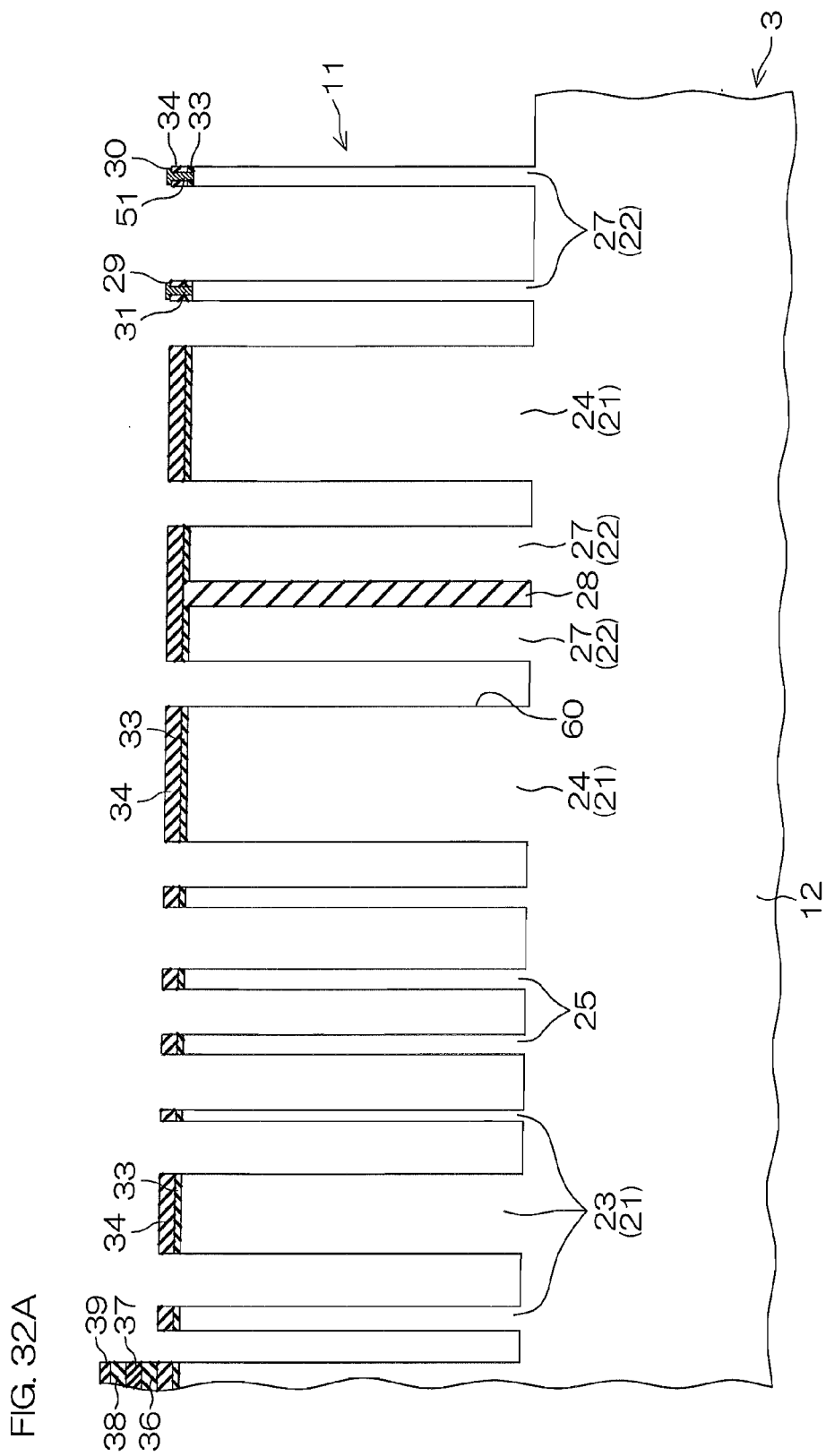
FIG. 32A is a schematic sectional view showing a step subsequent to FIG. 31A.

Then, the semiconductor substrate 3 is dug down up to an intermediate portion in the thickness direction by anisotropic deep RIE employing the resist 59 as a mask, more specifically by a Bosch process, as shown in FIGS. 32A and 32B. Thus, a surface portion of the semiconductor substrate 3 is molded into the shapes of the X fixed electrode 21, the Y fixed electrode 41 and the Z fixed electrodes 61 respectively and into the shapes of the X movable electrode 22, the Y movable electrode 42 and the Z movable electrodes 62 respectively, and a plurality of trenches 60 as recesses are formed therebetween at the same time. In the Bosch process, a step of etching the semiconductor substrate 3 by using $SF_6$ (sulfur hexafluoride) and a step of forming a protective film on an etched surface by using $C_4F_8$ (perfluorocyclobutane) are alternately repeated. After the deep RIE, the resist is separated.

Figure 33A:
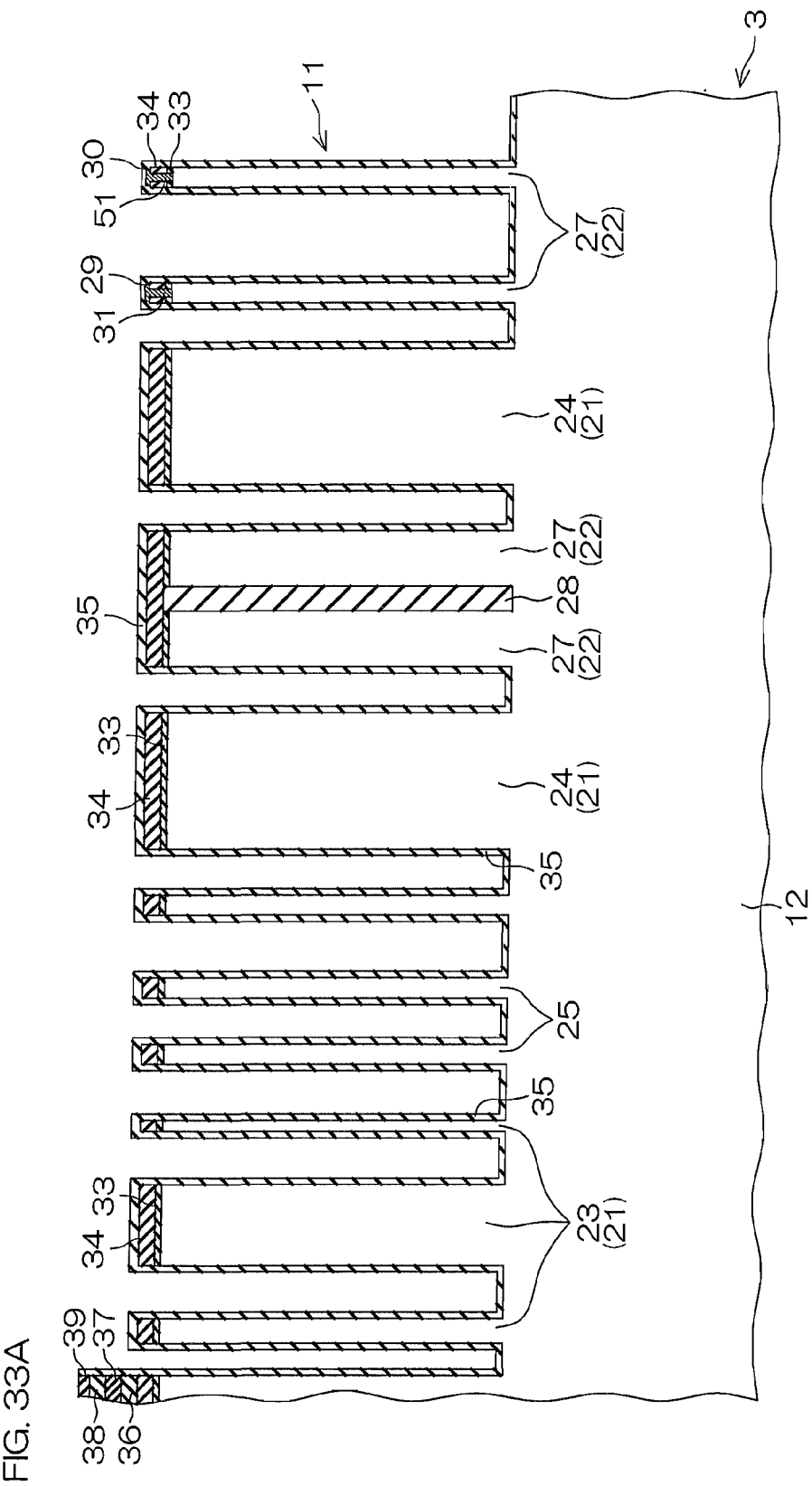
FIG. 33A is a schematic sectional view showing a step subsequent to FIG. 32A.
Figure 33B:
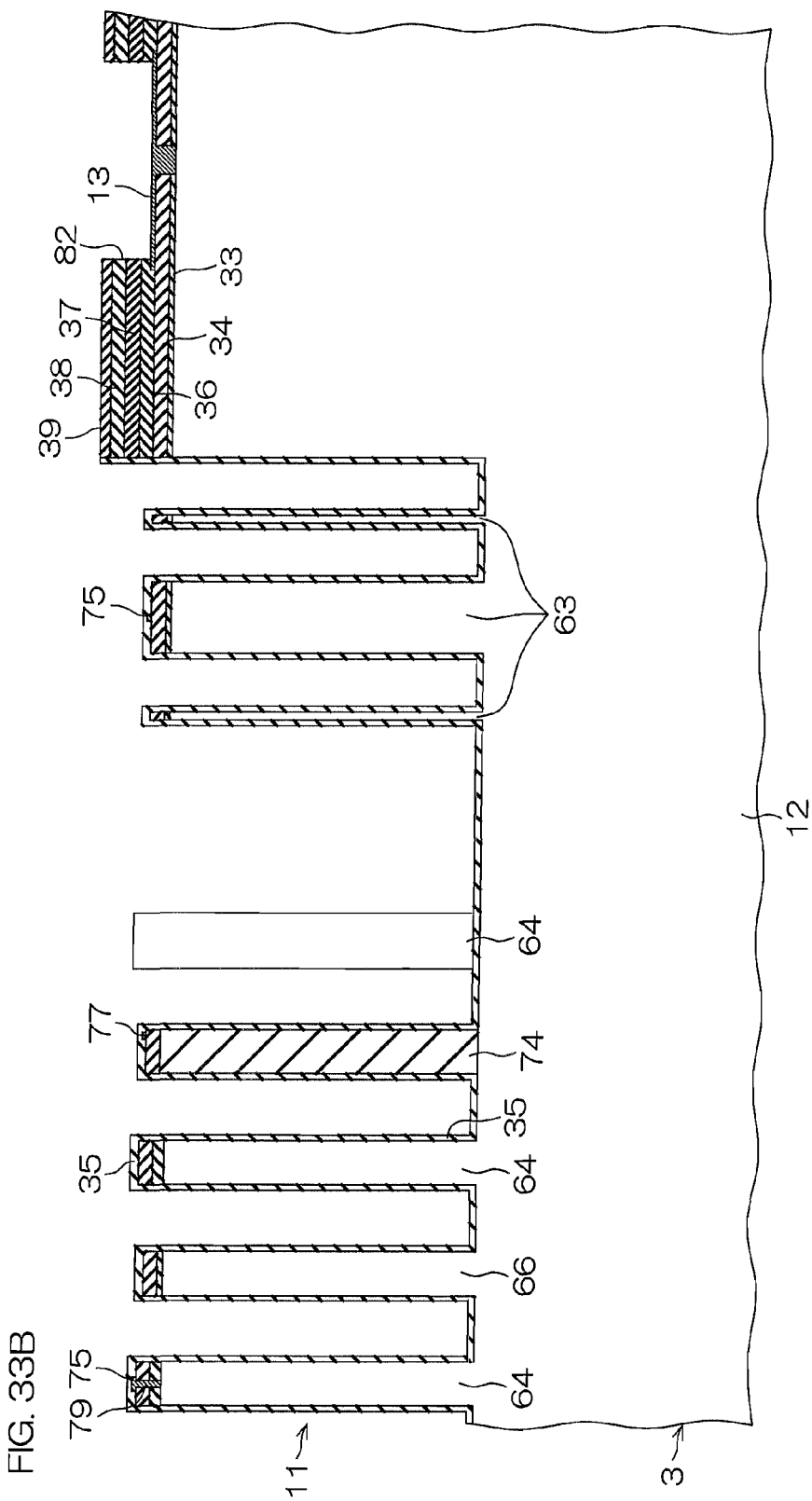
FIG. 33B is a schematic sectional view showing a step subsequent to FIG. 32B.

Then, the protective thin film 35 made of silicon oxide ($SiO_2$) is formed on the whole areas of the surfaces of the X fixed electrode 21, the Y fixed electrode 41 and the Z fixed electrodes 61 as well as the X movable electrode 22, the Y movable electrode 42 and the Z movable electrodes 62 and the whole areas of inner surfaces of the trenches 60 (i.e., side surfaces partitioning the trenches 60 and bottom surfaces) by thermal oxidation or PECVD (plasma-enhanced chemical vapor deposition), as shown in FIGS. 33A and 33B.

Figure 34A:
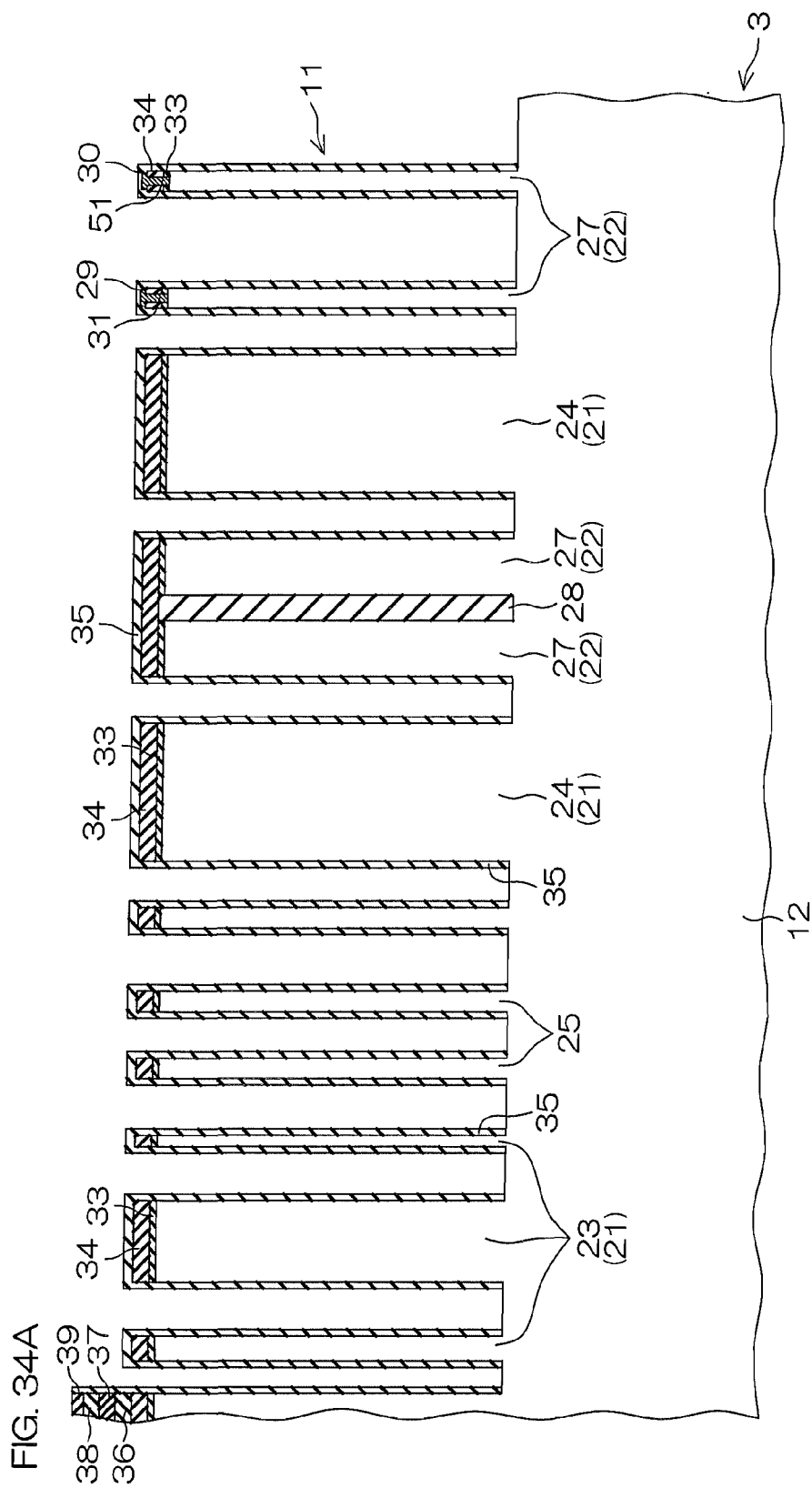
FIG. 34A is a schematic sectional view showing a step subsequent to FIG. 33A.
Figure 34C:
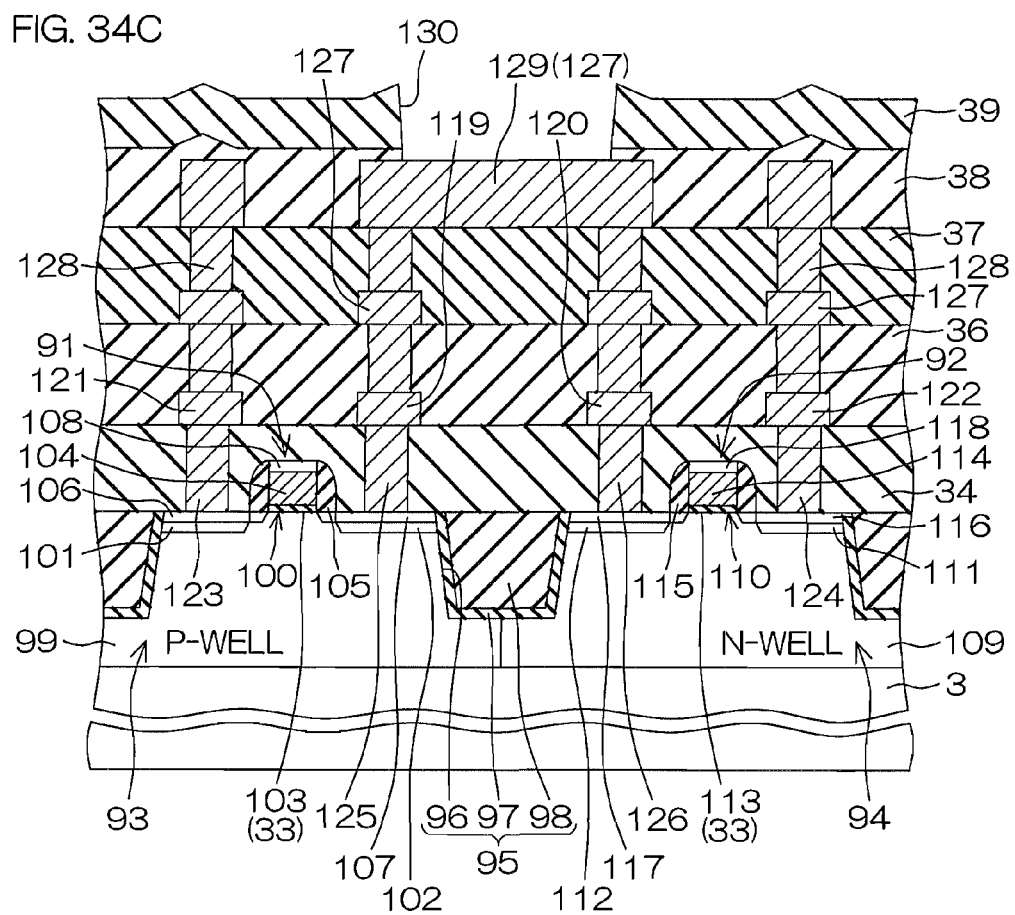
FIG. 34C is a schematic sectional view showing a step subsequent to FIG. 33C.

Then, portions of the protective thin film 35 on the bottom surfaces of the trenches 60 are removed by etchback, as shown in FIGS. 34A and 34B. Thus, the bottom surfaces of the trenches 60 enter exposed states.

Figure 35A:
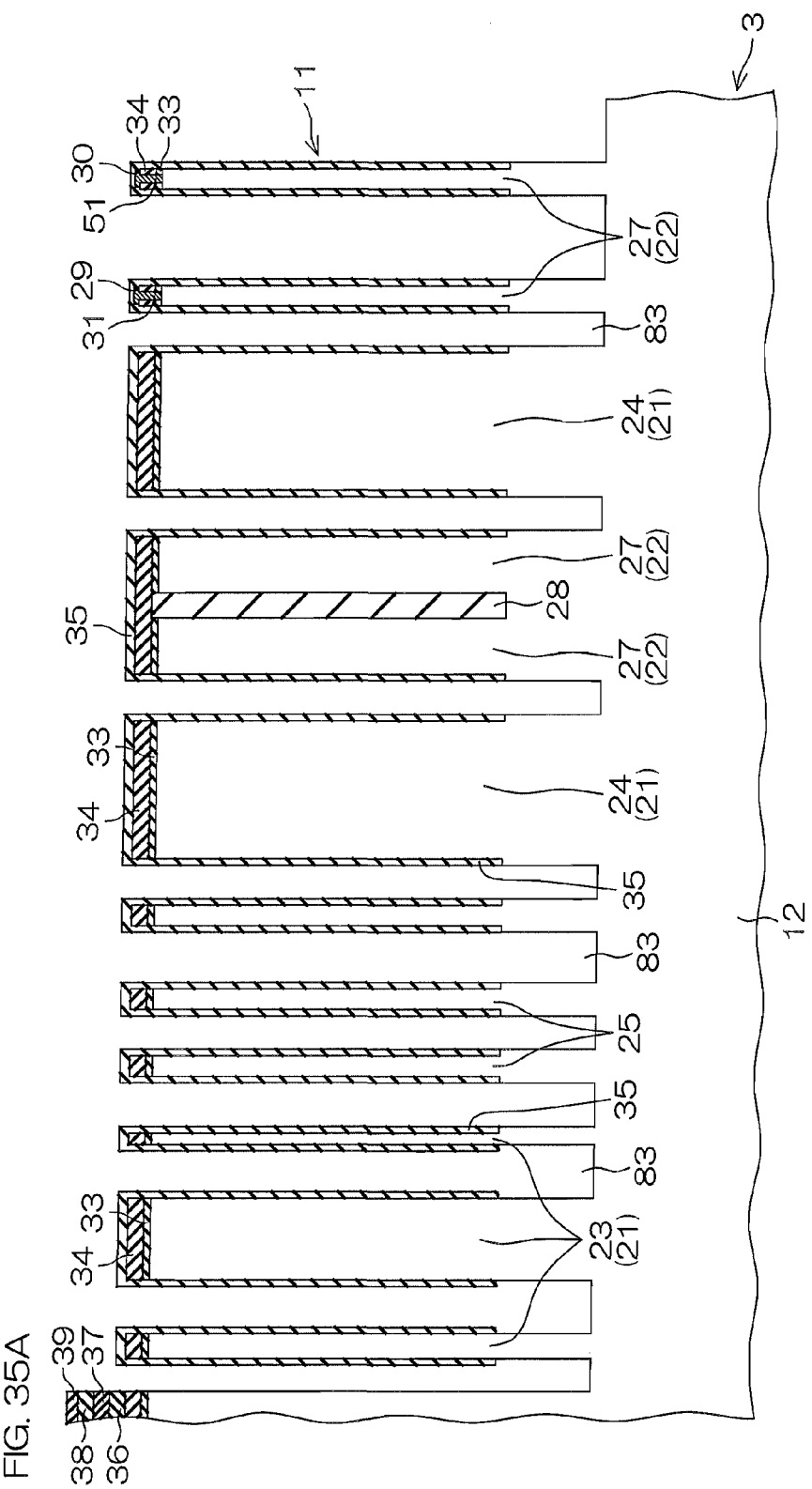
FIG. 35A is a schematic sectional view showing a step subsequent to FIG. 34A.
Figure 35B:
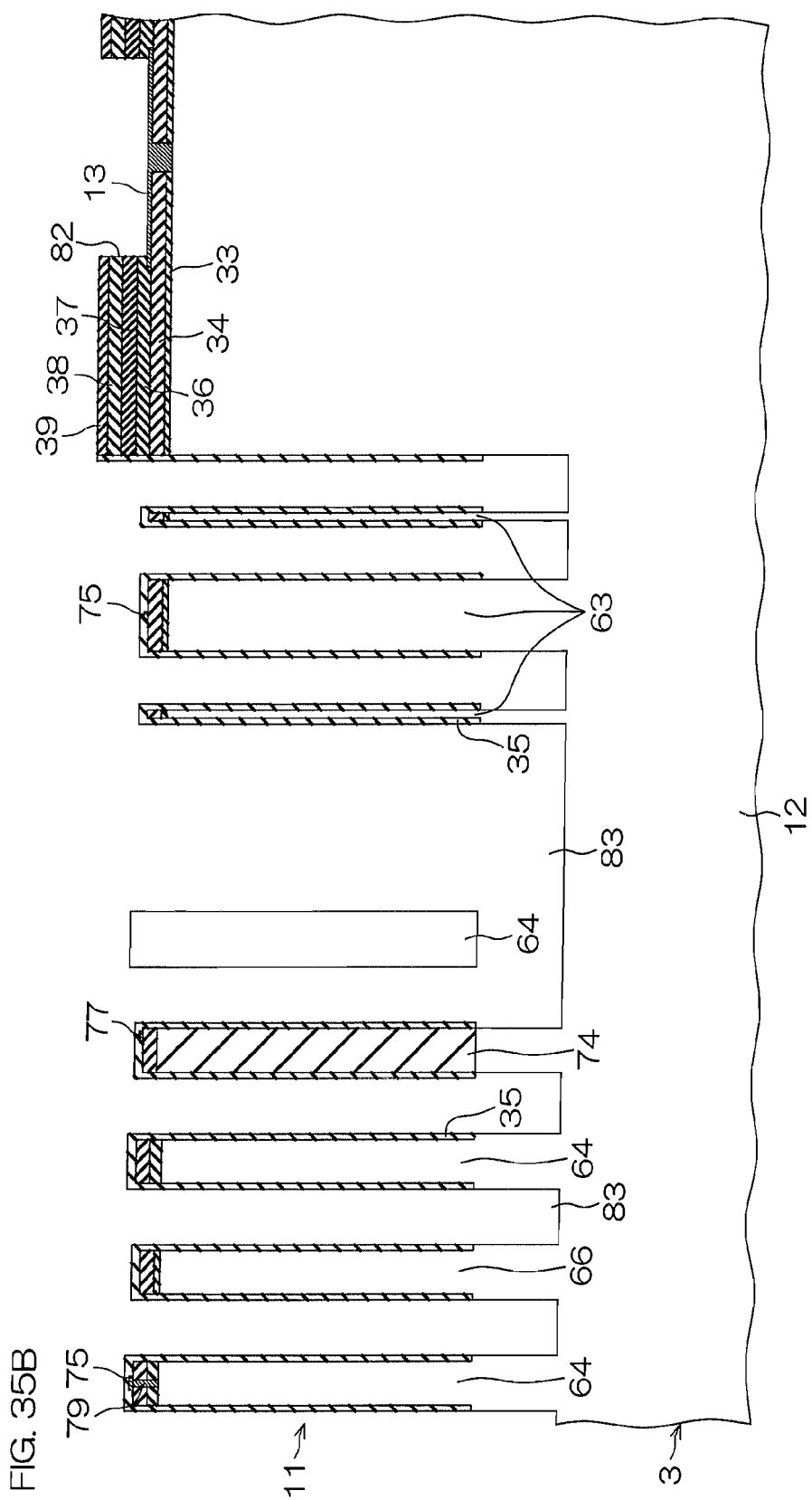
FIG. 35B is a schematic sectional view showing a step subsequent to FIG. 34B.
Figure 35C:
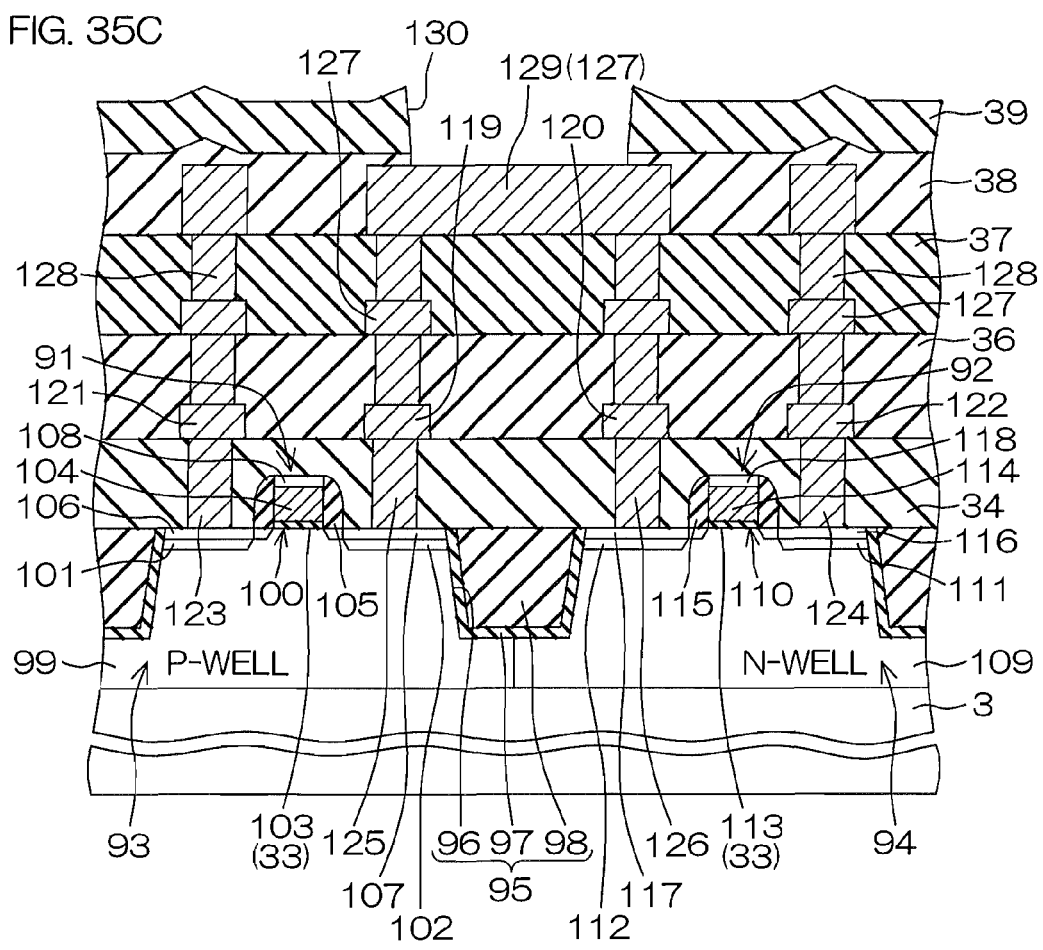
FIG. 35C is a schematic sectional view showing a step subsequent to FIG. 34C.

After the removal of the protective thin film 35, the bottom surfaces of the plurality of trenches 60 are further dug down respectively by anisotropic deep RIE employing the surface protective film 39 as a mask, as shown in FIGS. 35A and 35B. Thus, exposed spaces 83 as lower portions of a plurality of recesses where a crystal plane of the semiconductor substrate 3 is exposed are formed on bottom portions of the trenches 60.

Subsequently to the anisotropic deep RIE, reactive ions and etching gas are supplied to the exposed spaces 83 of the trenches 60 by isotropic RIE, as shown in FIGS. 36A and 36B. Due to action of the reactive ions and the like, the semiconductor substrate 3 is etched in a direction parallel to the surface of the semiconductor substrate 3 while being etched in the thickness direction of the semiconductor substrate 3 from the respective exposed spaces 83 serving as starting points. Thus, all exposed spaces 83 adjacent to one another are so integrated with one another that the cavity 10 is formed in the semiconductor substrate 3, while the X fixed electrode 21, the Y fixed electrode 41 and the Z fixed electrodes 61 as well as the X movable electrode 22, the Y movable electrode 42 and the Z movable electrodes 62 enter the floating states in the cavity 10.

The semiconductor device 1 shown in FIG. 1 is obtained through the aforementioned steps.

<Functions/Effects of Semiconductor Device 1>

In the semiconductor device 1, the sensor region 70 and the integrated circuit region 71 are provided on the same semiconductor substrate 3, and the capacitive acceleration sensor 4 and the integrated circuit 5 (the CMOS transistor) are formed on the regions 70 and 71 respectively. In other words, the acceleration sensor 4 and the integrated circuit 5 are loaded on the same semiconductor substrate 3. Therefore, one-chip implementation of the acceleration sensor 4 and the integrated circuit 5 can be achieved. Thus, the package size of the semiconductor device 1 can be reduced, and the package cost can be lowered. Further, the semiconductor device 1 has such a simple configuration that the respective fixed electrodes (the X fixed electrode 21, the Y fixed electrode 41 and the Z fixed electrodes 61) and the respective movable electrodes (the X movable electrode 22, the Y movable electrode 42 and the Z movable electrodes 62) of the acceleration sensor 4 as well as the respective impurity regions (the P-type well 99, the N-type well 109 and the like) of the integrated circuit 5 are formed on the upper wall 11 of the semiconductor substrate 3 (the surface layer portion of the semiconductor substrate 3), as shown in FIGS. 4, 6 and 8. Therefore, the wires (the X first sensor wires 29, the Y first sensor wires 49, the Z first sensor wires 75, the drain wire 119 and the like) are so formed on the semiconductor substrate 3 that the same can be easily electrically connected to the individual electrodes and the impurity regions.

Further, the wires (the X first sensor wires 29, the Z first sensor wires 75 and the like) of the acceleration sensor 4 and parts (the drain wire 119, the source wire 121 and the like) of multilayer wires of the integrated circuit 5 are formed on the second insulating film 34, to be drawn on the same layer. Therefore, the wires can be electrically connected with one another on the second insulating film 34. Consequently, the wires can be prepared from common materials and can be formed through the same steps, whereby wiring structures of the acceleration sensor 4 and the integrated circuit 5 can be simplified. Thus, bonding wires or the like for connecting the acceleration sensor 4 and the integrated circuit 5 with each other can be omitted. Consequently, generation of wire noise in detection of acceleration can be prevented. Therefore, acceleration can be precisely detected.

Further, the acceleration sensor 4 includes the X-axis sensor 6, the Y-axis sensor 7 and the Z-axis sensors 8 on one semiconductor substrate 3, whereby acceleration acting on the three axes (the X-axis, the Y-axis and the Z-axis) orthogonal to one another in the three-dimensional space can be detected with one device.

Further, the insulating layers 28, 68 and 74 are embedded in the surface layer portion of the semiconductor substrate 3, in order to insulate the electrode portions 27, 47, 64 and 66 from the remaining portions of the semiconductor substrate in the individual electrodes formed by parts of the semiconductor substrate 3. Thus, the surface of the semiconductor substrate 3 can be maintained planar in the case of insulating the respective electrode portions 27, 47, 64 and 66 from the remaining portions of the individual electrodes. Therefore, the surface (the planar surface) of the semiconductor substrate 3 can be efficiently utilized as a space for drawing the wires for electrically connecting the acceleration sensor 4 and the integrated circuit 5 with each other.

Further, the semiconductor substrate 3 is a conductive silicon substrate, whereby structures after molding can be utilized as the electrodes as such, without performing specific treatments for providing conductivity to the X fixed electrode 21, the Y fixed electrode 41 and the Z fixed electrodes 61 as well as the X movable electrode 22, the Y movable electrode 42 and the Z movable electrodes 62 molded into prescribed shapes. In addition, portions excluding the portions utilized as the electrodes can be utilized as the wires (the X first sensor wires 29, the Z first sensor wires 75 and the like).

Further, the acceleration sensor 4 is arranged on the central portion of the semiconductor substrate 3. In other words, the cavity 10 of the semiconductor substrate 3 is formed in the central portion of the substrate. Therefore, the peripheral portion forming the contour of the semiconductor substrate 3 can be maintained in the original thickness of the semiconductor substrate 3. Thus, even if stress is applied to the semiconductor substrate 3, strain resulting therefrom can be reduced.

As shown in FIGS. 30A to 36A and FIGS. 30B to 36B, further, the respective fixed electrodes (the X fixed electrode 21, the Y fixed electrode 41 and the Z fixed electrodes 61) and the respective movable electrodes (the X movable electrode 22, the Y movable electrode 42 and the Z movable electrodes 62) of the acceleration sensor 4 are formed by utilizing parts of the semiconductor substrate 3, by anisotropic deep RIE and isotropic RIE of the semiconductor substrate 3.

Therefore, no conductive material may be epitaxially grown on the semiconductor substrate 3, in order to form the respective fixed electrodes and the respective movable electrodes. Consequently, the structures of the P-type well 99 and the N-type well 109 of the integrated circuit 5 formed on the surface layer portion of the semiconductor substrate 3 in the step shown in FIG. 16C can be maintained also after the formation thereof. Consequently, the acceleration sensor 4 and the integrated circuit 5 can be formed on the same semiconductor substrate 3.

As shown in FIGS. 10A to 11A and FIGS. 10B to 11B, the step of forming the trench 19 for forming the insulating layers 28, 68 and 74 and the step of thermally oxidizing the inner surface of the trench 19 are executed in advance of the step (FIG. 16C) of forming the P-type well 99 and the N-type well 109. When thermally oxidizing the inner surface of the trench 19, for example, the semiconductor substrate 3 is heated to about 1100° C. to 1200° C. When the P-type well 99 and the N-type well 109 are formed after the heating also in this case, the wells can be prevented from exposure to a high temperature.

In the semiconductor device 1, the electrode portions 66 of the Z movable electrodes 62 warp arcuately in plan view in the direction separating from the cavity 10 of the semiconductor substrate 3, to project from the surfaces of the electrode portions 64 of the Z fixed electrodes 61. If the electrode portions 66 of the Z movable electrodes 62 are displaced in a direction further separating from the cavity 10, for example, when acceleration in the Z-axis direction acts on the Z movable electrodes 62 in this structure, the opposed areas S (see FIG. 7) reduce following the displacement, and the capacitance decreases. If the electrode portions 66 of the Z movable electrodes 62 are displaced in the direction approaching the cavity 10, on the other hand, the opposed areas S (see FIG. 7) enlarge following the displacement, and the capacitance increases.

Therefore, it can be easily grasped that the electrode portions 66 of the Z movable electrodes 62 are displaced in the direction separating from the cavity 10 if the capacitance tends to decrease, and that the electrode portions 66 of the Z movable electrodes 62 are displaced in the direction approaching the cavity 10 if the capacitance tends to increase. Consequently, whether acceleration has acted in the direction separating from the cavity 10 or the direction approaching the cavity 10 with respect to the Z movable electrodes 62 can be correctly detected. Consequently, detection accuracy can be further improved.

(2) Second Embodiment

Example of One-Chip Implementation of Gyro Sensor and Integrated Circuit

<Overall Structure of Semiconductor Device>

First, the overall structure of a semiconductor device is described with reference to FIG. 37.

Figure 37:
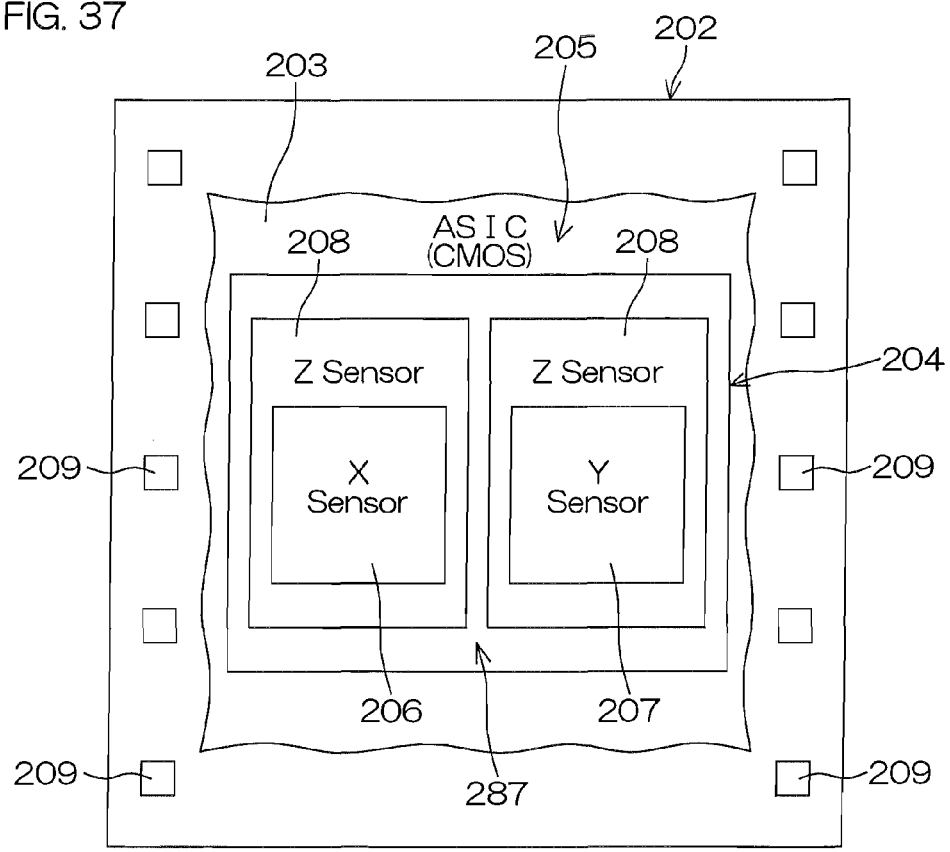
FIG. 37 is a schematic plan view of a semiconductor device according to a second embodiment of the present invention.

FIG. 37 is a schematic plan view of a semiconductor device according to a second embodiment of the present invention. Referring to FIG. 37, portions sealed in a resin package are partially expressed in a seen-through state.

A semiconductor device 201 is of a capacitance type performing detection on the basis of change in capacitance of a capacitance element, and employed for applications such as image stabilization in a video camera or a still camera, position detection in a car navigation system, motion detection in a robot or a gaming machine and the like, for example. The semiconductor device 201 has a contour of a package in the form of a rectangular parallelepiped (quadrangular in plan view) defined by a resin package 202.

The semiconductor device 201 includes a semiconductor substrate 203 quadrangular in plan view. The semiconductor substrate 203 has a sensor region 287 where a gyro sensor 204 is arranged on a central portion thereof, and has an integrated circuit 205 (ASIC: Application Specific Integrated Circuit) on a peripheral portion of the semiconductor substrate 203 surrounding the sensor region 287.

The gyro sensor 204 has an X-axis sensor 206, a Y-axis sensor 207 and Z-axis sensors 208 as sensors detecting angular velocities around three axes orthogonal to one another in a three-dimensional space respectively.

The X-axis sensor 206 generates Coriolis force Fz in a Z-axis direction when the semiconductor device 201 inclines 'by utilizing vibration Ux in an X-axis direction, and detects change in the capacitance resulting from the Coriolis force thereby detecting an angular velocity ωy acting around the Y-axis. The Y-axis sensor 207 generates Coriolis force Fx in the X-axis direction when the semiconductor device 201 inclines by utilizing vibration Uy in a Y-axis direction, and detects change in the capacitance resulting from the Coriolis force thereby detecting an angular velocity ωz acting around the Z-axis. The Z-axis sensors 208 generate Coriolis force Fy in the Y-axis direction when the semiconductor device 201 inclines by utilizing vibration Uz in the Z-axis direction, and detect change in the capacitance resulting from the Coriolis force thereby detecting an angular velocity ωx acting around the X-axis.

The integrated circuit 205 includes a charge amplifier amplifying electric signals output from the respective sensors, a filter circuit (a low-pass filter: LPF or the like) extracting specific frequency components from the electric signals and a logic circuit logically operating the electric signals after filtering, and is constituted of CMOS devices, for example.

On a surface of the semiconductor device 201, five electrode pads 209 are provided on each of a pair of edge portions opposed to each other through the gyro sensor 204 in plan view in this embodiment. The electrode pads 209 are arrayed along each edge portion at regular intervals from one another. The electrode pads 209 include pads for applying voltages to the gyro sensor 204 and the integrated circuit 205, for example.

<Structures of X-Axis Sensor and Y-Axis Sensor>

Figure 39:
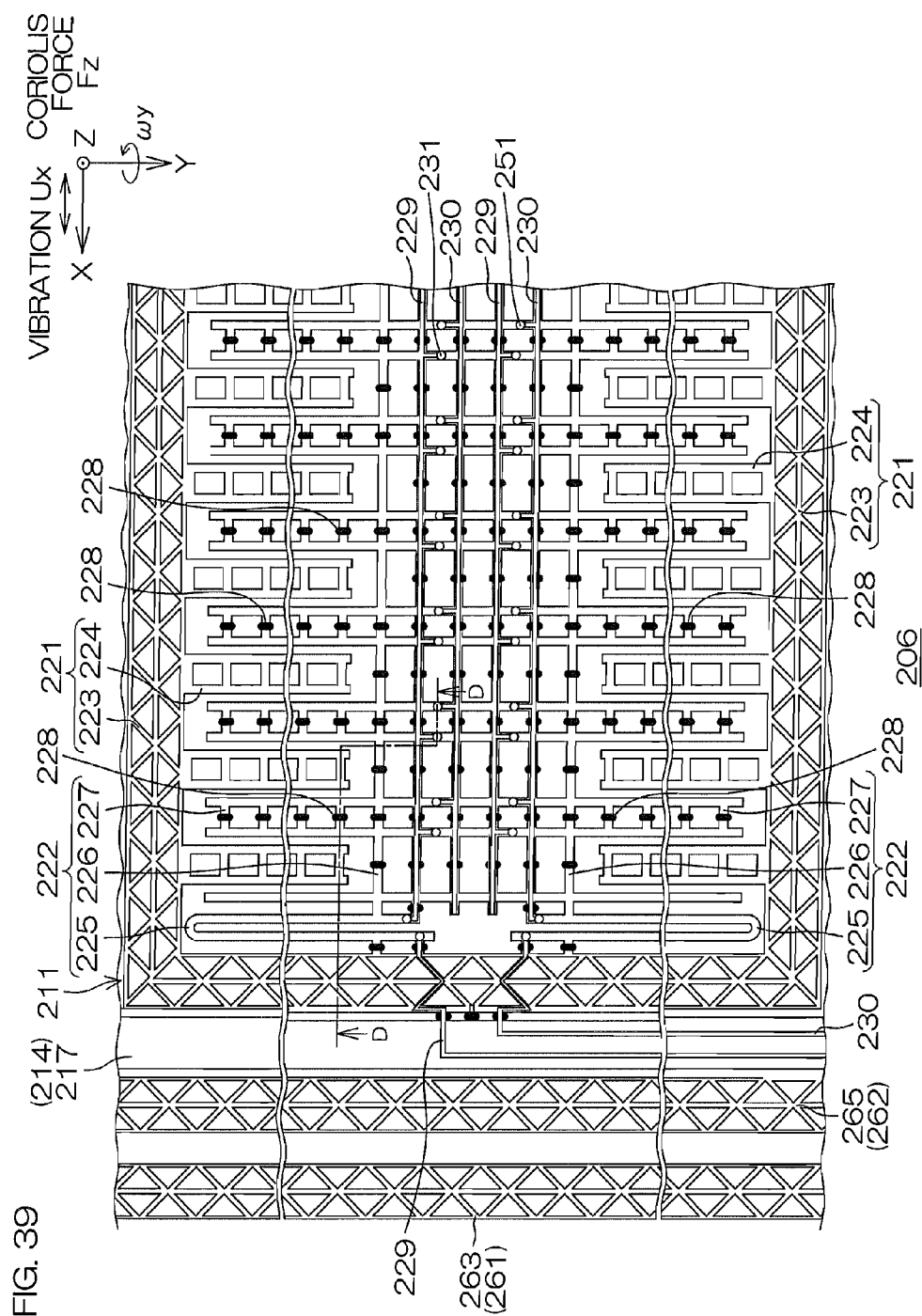
FIG. 39 is a plan view of a principal part of an X-axis sensor shown in FIG. 38.
Figure 40:
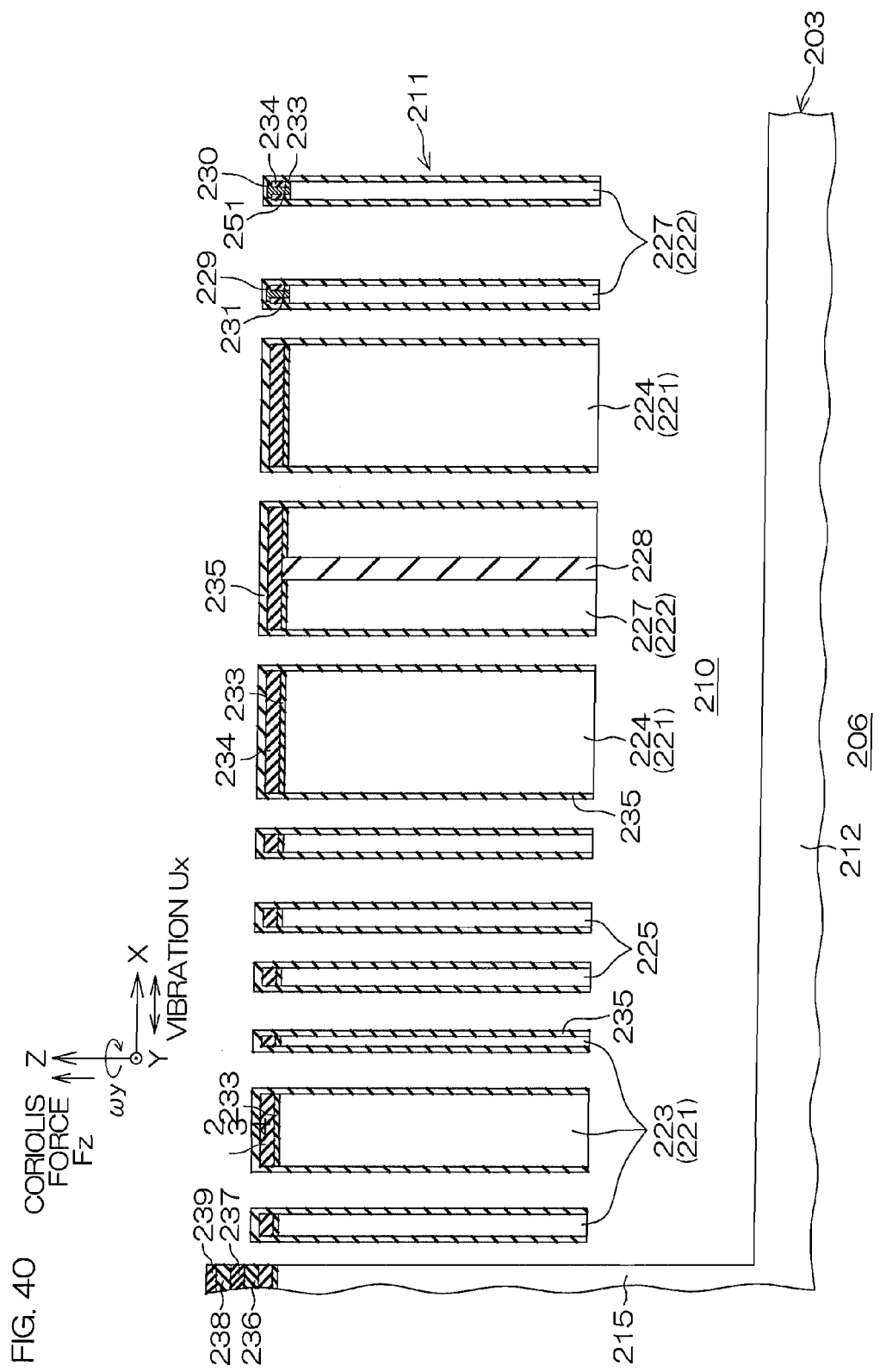
FIG. 40 is a sectional view of the principal part of the X-axis sensor shown in FIG. 38, and a sectional view along a cutting plane line D-D in FIG. 39.

The structures of the X-axis sensor and the Y-axis sensor are now described with reference to FIGS. 38 to 40.

Figure 38:
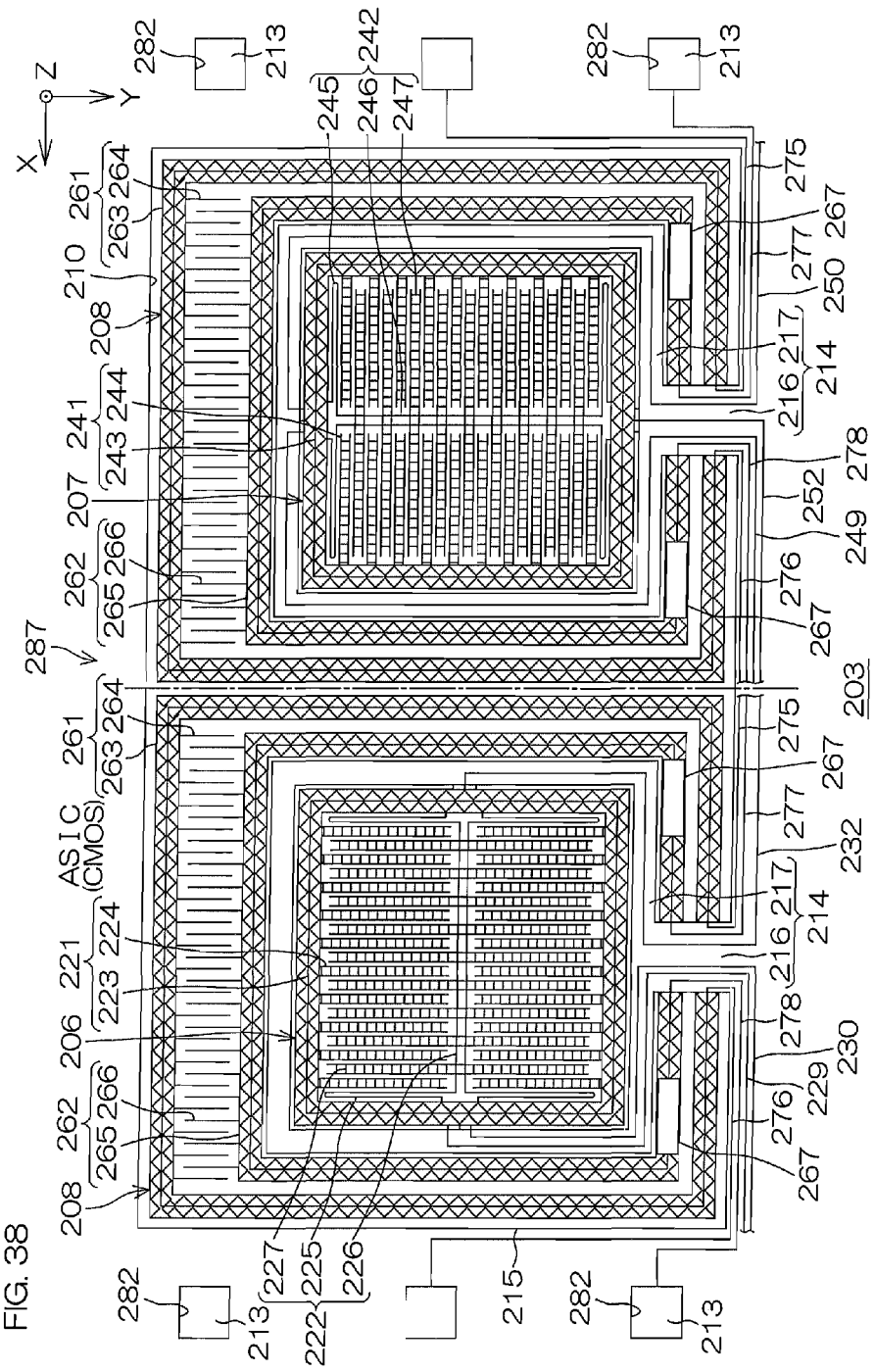
FIG. 38 is a schematic plan view of a gyro sensor shown in FIG. 37.

FIG. 38 is a schematic plan view of the gyro sensor shown in FIG. 37. FIG. 39 is a plan view of a principal part of the X-axis sensor shown in FIG. 38. FIG. 40 is a sectional view of the principal part of the X-axis sensor shown in FIG. 38, and a sectional view along a cutting plane line D-D in FIG. 39.

The semiconductor substrate 203 consists of a conductive silicon substrate (a low-resistance substrate having resistivity of 5 Ω·m to 500 Ω·m, for example). The semiconductor substrate 203 has a cavity 210 quadrangular in plan view immediately under a surface layer portion of the sensor region 287, and the X-axis sensor 206, the Y-axis sensor 207 and the Z-axis sensors 208 are formed on an upper wall 211 (a surface portion) of the semiconductor substrate 203 having a top surface partitioning the cavity 210 from the surface side. In other words, the X-axis sensor 206, the Y-axis sensor 207 and the Z-axis sensors 208 consist of parts of the semiconductor substrate 203, and are supported in a floating state with respect to a bottom wall 212 of the semiconductor substrate 203 having a bottom surface partitioning the cavity 210 from a rear surface side.

On the surface of the semiconductor substrate 203, wires included in the sensors are partially exposed as pads 213 on both sides opposed to each other through the cavity 210. The pads 213 are electrically connected with the electrode pads 209 by bonding wires (not shown) or the like, for example, in a state packaged by the resin package 202.

The X-axis sensor 206 and the Y-axis sensor 207 are arranged adjacently to each other at an interval, and the Z-axis sensors 208 are arranged to surround the respective ones of the X-axis sensor 206 and the Y-axis sensor 207. According to this embodiment, the Y-axis sensor 207 has a structure generally similar to a substance obtained by rotating the X-axis sensor 206 by 90° in plan view. As to the structure of the Y-axis sensor 207, therefore, portions corresponding to respective portions of the X-axis sensor 206 are also put down in parentheses in description of the respective portions in the following, to substitute for specific description.

Between the X-axis sensor 206 and the Z-axis sensor 208 and between the Y-axis sensor 207 and the Z-axis sensor 208, support portions 214 for supporting these in the floating state are formed. The support portions 214 integrally include linear portions 216 extending from one sidewall 215 having a side surface partitioning the cavity 210 of the semiconductor substrate 3 from a lateral side toward the X-axis sensor 206 and the Y-axis sensor 207 across the Z-axis sensors 208 and annular portions 217 surrounding the X-axis sensor 6 and the Y-axis sensor 207.

The X-axis sensor 206 and the Y-axis sensor 207 are arranged on the inner sides of the individual annular portions 217, and double-supported on opposed pairs of portions of inner sidewalls of the annular portions 217. The Z-axis sensors 208 are double-supported on both sidewalls of the linear portions 216.

The X-axis sensor 206 (the Y-axis sensor 207) has an X fixed electrode 221 (a Y fixed electrode 241) fixed to the support portion 214 provided in the cavity 210 and an X movable electrode 222 (a Y movable electrode 242) held to be vibratile with respect to the X fixed electrode 221. The X fixed electrode 221 and the X movable electrode 222 are formed with identical thicknesses.

The X fixed electrode 221 (the Y fixed electrode 241) includes a base portion 223 (a base portion 243 of the Y fixed electrode 241) in the form of a quadrangular ring in plan view fixed to the support portion 214 and a plurality of sets of electrode portions 224 (electrode portions 244 of the Y fixed electrode 241) interdigitally arrayed along inner walls of the base portion 223 at regular intervals.

On the other hand, the X movable electrode 222 (the Y movable electrode 242) includes a base portion 226 (a base portion 246 of the Y movable electrode 242) extending in a direction traversing the electrode portions 224 of the X fixed electrode 221 so that both ends thereof are connected to the base portion 223 of the X fixed electrode 221 through beam portions 225 (beam portions 245 of the Y-axis sensor 207) expandable/contractable along the direction, and interdigitally arrayed electrode portions 227 (electrode portions 247 of the Y movable electrode 242) extending from the base portion 226 on both sides toward spaces between the electrode portions 224 of the X fixed electrode 221 adjacent to one another and meshing with the electrode portions 224 of the X fixed electrode 221 not to come into contact therewith.

In the X-axis sensor 206, the beam portions 225 so expand/contract that the base portion 226 of the X movable electrode 222 vibrates (vibration Ux) along the surface of the semiconductor substrate 203, whereby the individual electrode portions 227 of the X movable electrode 222 interdigitally meshing with the electrode portions 224 of the X fixed electrode 221 vibrate alternately in a direction approaching the electrode portions 224 of the X fixed electrode 221 and a direction separating therefrom.

The base portion 223 of the X fixed electrode 221 has linear main frames extending parallelly to each other, and has such a trussed framework structure that reinforcing frames are combined with the main frames so that triangular spaces are repeated along the main frames.

As to the electrode portions 224 of the X fixed electrode 221, a plurality of pairs of electrode portions linear in plan view, whose individual base end portions are connected to the base portion 223 and forward end portions are opposed to one another, are provided at regular intervals. Each electrode portion 224 has a framework structure, laddery in plan view, including linear main frames extending parallelly to each other and a plurality of lateral frames extended between the main frames.

On the other hand, the base portion 226 of the X movable electrode 222 consists of a plurality of (in this embodiment, six) linear frames extending parallelly to one another, and both ends thereof are connected to the beam portions 225. The beam portions 225 are provided in pairs on both ends of the base portion 226 of the X movable electrode 222.

Each electrode portion 227 of the X movable electrode 222 has a framework structure, laddery in plan view, including linear main frames extending parallelly to each other across each frame of the base portion 226 and a plurality of lateral frames extended between the main frames.

In the X movable electrode 222, insulating layers 228 (in this embodiment, silicon oxide) traversing the lateral frames are embedded in lines bisecting the individual electrode portions 227 along a direction orthogonal to a vibrational direction Ux from surfaces thereof up to the cavity 210. The individual electrode portions 227 are isolated by the insulating layers 228 into pairs of portions of first sides and second sides along the vibrational direction Ux. Thus, the isolated electrode portions 227 of the X movable electrode 222 function as independent electrodes respectively in the X movable electrode 22.

A first insulating film 233 and a second insulating film 234 made of silicon oxide ($SiO_2$) are successively stacked on the surface of the semiconductor substrate 203 including the X fixed electrode 221 and the X movable electrode 222, and X first driving/detection wires 229 (Y first driving/detection wires 249) and X second driving/detection wires 230 (Y second driving/detection wires 250) are formed on the second insulating film 234.

The X first driving/detection wires 229 supply driving voltages to the first sides (in this embodiment, the left side of the plane of FIG. 39) of the individual electrode portions 227 isolated into pairs, and detect change in voltages following change in capacitance from the electrode portions 227. On the other hand, the X second driving/detection wires 230 supply driving voltages to the second sides (in this embodiment, the right side of the plane of FIG. 39) of the individual electrode portions 227 isolated into pairs and detect change in voltages following the change in the capacitance from the electrode portions 227.

The X first and second driving/detection wires 229 and 230 are made of aluminum (Al) in this embodiment. The X first and second driving/detection wires 229 and 230 are electrically connected to the individual electrode portions 227 through contact plugs 231 and 251 passing through the first and second insulating films 233 and 234.

The X first and second driving/detection wires 229 and 230 are drawn onto the support portions 214 through the beam portions 225 of the X movable electrode 222 and the base portion 223 of the X fixed electrode 221, to be partially exposed as the pads 213. The X first and second driving/detection wires 229 and 230 utilize the beam portions 225 partially formed by the conductive semiconductor substrate 203 themselves as current paths in sections passing through the beam portions 225 of the X movable electrode 222 respectively. No aluminum wires are provided on the beam portions 225, whereby stretchability of the beam portions 225 can be held.

X third driving/detection wires 232 detecting change in voltages following the change in the capacitance from the electrode portions 224 of the X fixed electrode 221 are drawn on the support portions 214, and the X third driving/detection wires 232 are also partially exposed as the pads 213, similarly to the other wires 229 and 230.

In the semiconductor substrate 203, upper surfaces and side surfaces of the X fixed electrode 221 and the X movable electrode 222 are covered with a protective thin film 235 made of silicon oxide ($SiO_2$), along with the first insulating film 233 and the second insulating film 234.

On portions of the surface of the semiconductor substrate 203 other than the cavity 210, a third insulating film 236, a fourth insulating film 237, a fifth insulating film 238 and a surface protective film 239 are successively stacked on the second insulating film 234. In other words, the number of the insulating films stacked on the sensor is rendered smaller than the number of the insulating films included in the integrated circuit 205 in the semiconductor device 201, while the insulating films of the sensor are in a two-layer structure of the first insulating film 233 and the second insulating film 234 and the insulating films of the integrated circuit 205 are in a six-layer structure of the first to fifth insulating films 233, 234 and 236 to 238 and the surface protective film 239 in this embodiment.

In the X-axis sensor 206 of the aforementioned structure, homopolar and heteropolar driving voltages are alternately supplied between the X fixed electrode 221 and the X movable electrode 222 through the X first to X third driving/detection wires 229, 230 and 232. Thus, Coulomb repulsion and Coulomb attraction are alternately generated between the electrode portions 224 of the X fixed electrode 221 and the electrode portions 227 of the X movable electrode 222. Consequently, the interdigital X movable electrode 222 horizontally vibrates (vibration Ux) along the X-axis direction with respect to the identically interdigital X fixed electrode 221. When the X movable electrode 222 rotates on the Y-axis serving as a central axis in this state, it follows that Coriolis force Fz is generated in the Z-axis direction. Due to the Coriolis force Fz, opposed areas of the electrode portions 224 of the X fixed electrode 221 and the electrode portions 227 of the X movable electrode 222 adjacent to one another change. An angular velocity $\omega y$ around the Y-axis is detected by detecting change in the capacitance between the X movable electrode 222 and the X fixed electrode 221 resulting from the change in the opposed areas.

According to this embodiment, the angular velocity $\omega y$ around the Y-axis is obtained by calculating the difference between detected values of the isolated respective electrode portions on one side and another side of the X movable electrode 222.

In the Y-axis sensor 207, homopolar and heteropolar driving voltages are alternately applied between the Y fixed electrode 241 and the Y movable electrode 242 through the Y first to Y third driving/detection wires 249, 250 and 252. Thus, Coulomb repulsion and Coulomb attraction are alternately generated between the electrode portions 244 of the Y fixed electrode 241 and the electrode portions 247 of the Y movable electrode 242. Consequently, the interdigital Y movable electrode 242 horizontally vibrates (vibration Uy) along the Y-axis direction with respect to the identically interdigital Y fixed electrode 241. When the Y movable electrode 242 rotates on the Y-axis serving as a central axis in this state, it follows that Coriolis force Fx is generated in the X-axis direction. Due to the Coriolis force Fx, opposed areas of the electrode portions 224 of the Y fixed electrode 241 and the electrode portions 247 of the Y movable electrode 242 adjacent to one another change. An angular velocity $\omega z$ around the Z-axis is detected by detecting change in the capacitance between the Y movable electrode 242 and the Y fixed electrode 241 resulting from the change in the opposed areas.

<Structure of Z-Axis Sensor>

The structure of each Z-axis sensor is now described with reference to FIGS. 38 and 41 to 43.

Figure 41:
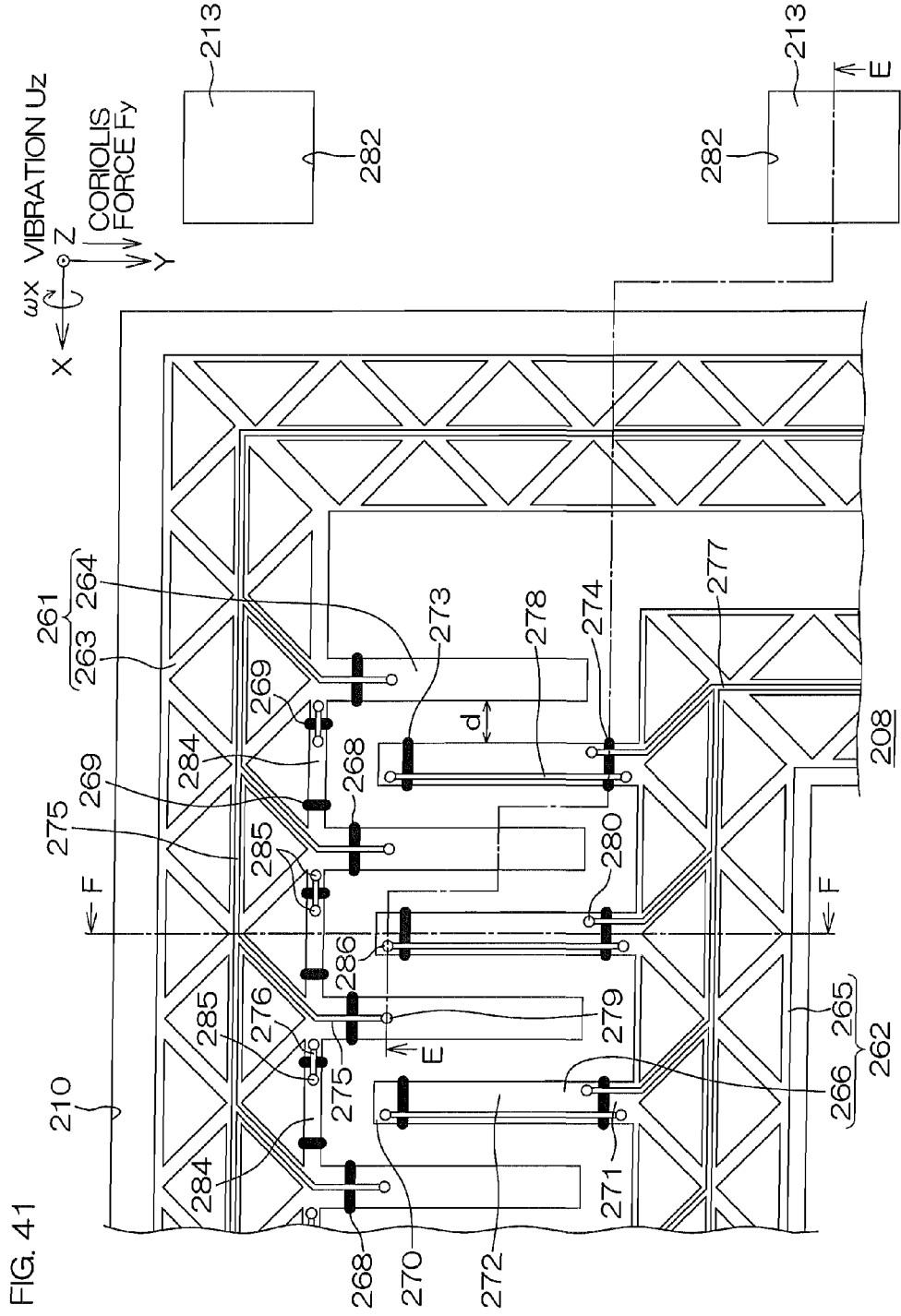
FIG. 41 is a plan view of a principal part of a Z-axis sensor shown in FIG. 38.
Figure 42:
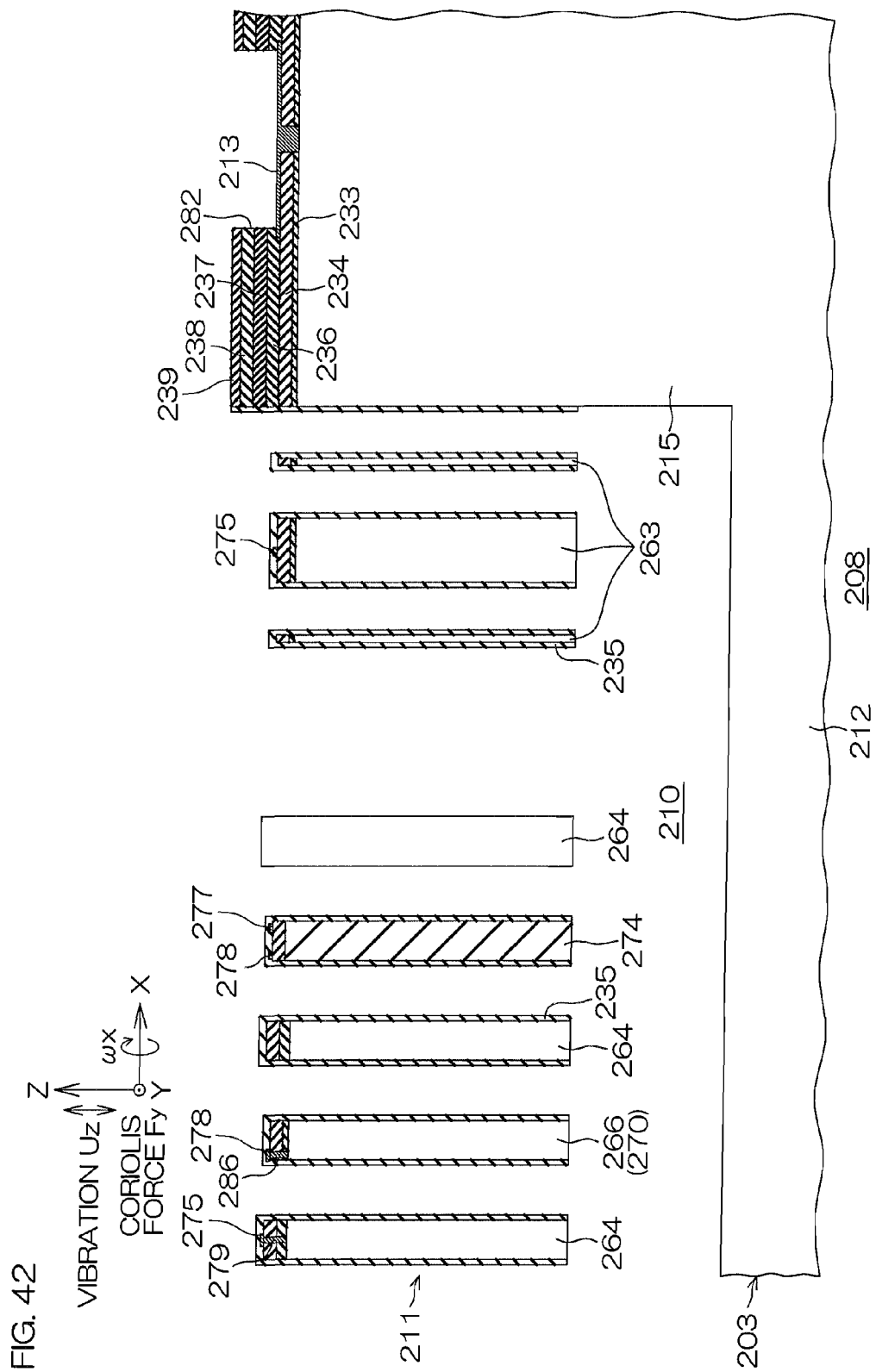
FIG. 42 is a sectional view of the principal part of the Z-axis sensor shown in FIG. 38, and a sectional view along a cutting plane line E-E in FIG. 41.
Figure 43:
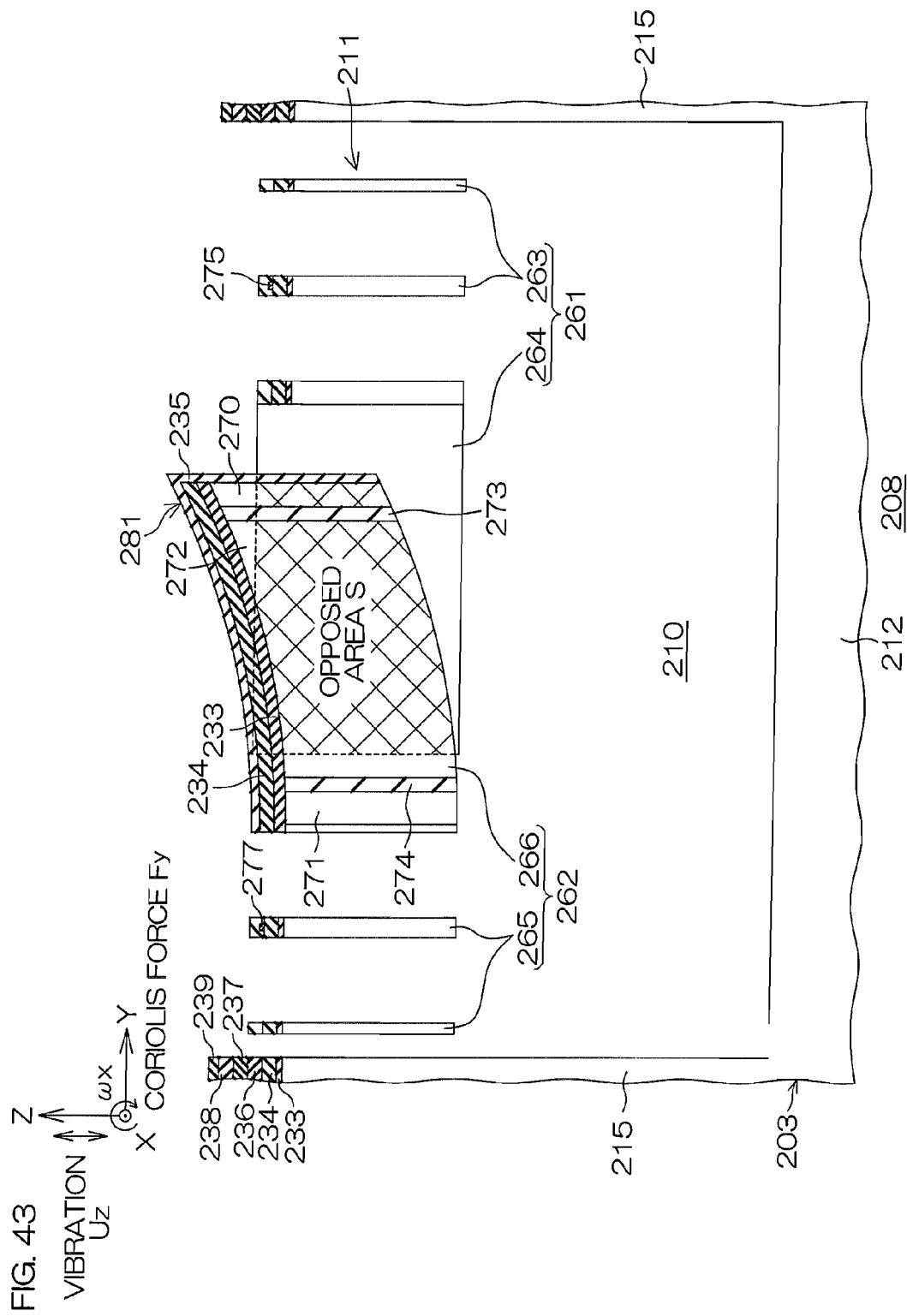
FIG. 43 is a sectional view of the principal part of the Z-axis sensor shown in FIG. 38, and a sectional view along a cutting plane line F-F in FIG. 41.

FIG. 41 is a plan view of a principal part of each Z-axis sensor shown in FIG. 38. FIG. 42 is a sectional view of the principal part of the Z-axis sensor shown in FIG. 38, and a sectional view along a cutting plane line E-E in FIG. 41. FIG. 43 is a sectional view of the principal part of the Z-axis sensor shown in FIG. 38, and a sectional view along a cutting plane line F-F in FIG. 41.

Referring to FIG. 38, the semiconductor substrate 203 made of conductive silicon has the cavity 210 therein, as hereinabove described. The Z-axis sensors 208 supported by the support portions 214 in the state floating with respect to the bottom wall 212 of the semiconductor substrate 203 are arranged on the upper wall 211 (the surface portion) of the semiconductor substrate 203, to surround the respective ones of the X-axis sensor 206 and the Y-axis sensor 207.

Each Z-axis sensor 208 has a Z fixed electrode 261 fixed to the support portion 214 (the linear portion 216) provided in the cavity 210 and a Z movable electrode 262 held to be vibratile with respect to the Z fixed electrode 261. The Z fixed electrode 261 and the Z movable electrode 262 are formed with identical thicknesses.

In the Z-axis sensor 208, the Z movable electrode 262 is arranged to surround the annular portion 217 of the support portion 214, and the Z fixed electrode 261 is arranged to further surround the Z movable electrode 262. The Z fixed electrode 261 and the Z movable electrode 262 are integrally connected to both sidewalls of the linear portion 216 of the support portion 214.

The Z fixed electrode 261 includes a base portion 263 as a first base portion in the form of a quadrangular ring fixed to the support portion 214 and a plurality of interdigital electrode portions 264 as first electrode portions provided on portions of the base portion 263 opposite to the linear portion 216 with respect to the X-axis sensor 206 (the Y-axis sensor 207).

On the other hand, the Z movable electrode 262 includes a base portion 265 as a second base portion in the form of a quadrangular ring in plan view and electrode portions 266 as interdigital second electrode portions extending from the base portion 265 toward spaces between the interdigital electrode portions 264 of the Z fixed electrode 261 adjacent to one another and meshing with the electrode portions 264 of the Z fixed electrode 261 not to come into contact therewith. The base portion 265 of the Z movable electrode 262 has linear main frames extending parallelly to each other, and has such a trussed framework structure that reinforcing frames are combined with the main frames so that triangular spaces are repeated along the main frames. The base portion 265 of the Z movable electrode 262 of such a structure has sections where the reinforcing frames are omitted on portions opposite to the side where the electrode portions 266 are arranged, and the main frames in the sections function as beam portions 267 for rendering the Z movable electrode 262 vertically movable.

In other words, the beam portions 267 so warp that the base portion 265 of the Z movable electrode 262 pivots (vibration Uz) on the beam portion 267 serving as a fulcrum in a direction approaching the cavity 210 and a direction separating therefrom as if the same is a pendulum, whereby the electrode portions 266 of the Z movable electrode 262 interdigitally meshing with the electrode portions 264 of the Z fixed electrode 261 vertically vibrate.

The base portion 263 of the Z fixed electrode 261 has linear main frames extending parallelly to each other, and has such a trussed framework structure that reinforcing frames are combined with the main frames so that triangular spaces are repeated along the main frames.

The individual electrode portions 264 of the Z fixed electrode 261 have base end portions connected to the base portion 263 of the Z fixed electrode 261 and forward end portions extending toward the Z movable electrode 262, and are interdigitally arrayed along inner walls of the base portion at regular intervals. Insulating layers 268 (in this embodiment, silicon oxide) are embedded in portions closer to the base end portions of the individual electrode portions 264 from surfaces thereof up to the cavity 210, to traverse the electrode portions 264 in the width direction. The individual electrode portions 264 of the Z fixed electrode 261 are insulated from the remaining portions of the Z fixed electrode 261 by the insulating layers 268.

On both sides of portions (opposed portions 284) of the base portion 263 of the Z fixed electrode 261 opposed to forward end portions 270 (described later) of the electrode portions 266 of the Z movable electrode 262, insulating layers 269 as first isolation layers are embedded from the surface of the semiconductor substrate 203 up to the cavity 210, to traverse the main frames of the truss structures in the width direction. Thus, the opposed portions 284 surrounded by the insulating layers 269 and the triangular spaces of the truss structures are insulated from the remaining portions of the base portion 263 of the Z fixed electrode 261.

On the other hand, the individual electrode portions 266 of the Z movable electrode 262 have base end portions 271 connected to the base portion 265 of the Z movable electrode 262 and the forward end portions 270 extending toward the spaces between the electrode portions 264 of the Z fixed electrode 261, and are interdigitally arrayed to mesh with the electrode portions 264 of the Z fixed electrode 261 not to come into contact therewith. Insulating layers 273 (in this embodiment, silicon oxide) as second isolation layers are embedded in portions closer to the forward end portions 270 of the individual electrode portions 266 of the Z movable electrode 262 from the surface of the semiconductor substrate 203 up to the cavity 210, to traverse the electrode portions 266 in the width direction. Due to the insulating layers 273 and 274, each electrode portion 266 has three portions (the forward end portion 270, the base end portion 271 and an intermediate portion 272 between the forward end portion 270 and the base end portion 271) insulated from the remaining portions.

Further, the individual electrode portions 266 of the Z movable electrode 262 warp arcuately in sectional view in the direction separating from the cavity 210 of the semiconductor substrate 203 to project from surfaces of the electrode portions 264 of the Z fixed electrode 261, and have portions 281 protruding upward from the surface of the semiconductor substrate 203.

The first insulating film 233 and the second insulating film 234 made of silicon oxide ($SiO_2$) are successively stacked on the surface of the semiconductor substrate 203 including the Z fixed electrode 261 and the Z movable electrode 262, as hereinabove described. On a surface of the Z movable electrode 262, the first insulating film 233 is rendered thicker than the remaining portions. Thus, relatively large stress can be applied to the Z movable electrode 262, and the electrode portions 266 of the Z movable electrode 262 can be warped. Z first detection wires 275, Z first driving wires 276, Z second detection wires 277 and Z second driving wires 278 are formed on the second insulating film 234.

The Z first detection wires 275 and the Z second detection wires 277 are connected to the electrode portions 264 of the Z fixed electrode 261 adjacent to one another and the intermediate portions 272 of the Z movable electrode 262 respectively. In other words, the electrode portions 227 of the Z fixed electrode 261 and the intermediate portions 272 of the Z movable electrode 262 to which the Z first detection wires 275 and the Z second detection wires 277 are connected are opposed to one another at an inter-electrode distance d in the Z-axis sensor 208, to constitute such electrodes of the capacitance element (a detection portion) that a constant voltage is applied therebetween and the capacitance varies with change in the distance d.

More specifically, the Z first detection wires 275 include aluminum wires formed along the base portion 263 of the Z fixed electrode 261 and branched toward forward end portions of the electrode portions 264 over the insulating layers 268 of the individual electrode portions 264 of the Z fixed electrode 261. The branched aluminum wires are electrically connected to portions of the individual electrode portions 264 closer to the forward ends than the insulating layers 268 through contact plugs 279 passing through the first insulating film 233 and the second insulating film 234. As shown in FIG. 38, the Z first detection wires 275 are drawn on the support portion 214 through the base portion 263 of the Z fixed electrode 261, and partially exposed as the pads 213.

On the other hand, the Z second detection wires 277 detect change in voltages following change in capacitance from the electrode portions 266 of the Z movable electrode 262. The Z second detection wires 277 include aluminum wires formed along the base portion 265 of the Z movable electrode 262 and branched toward the intermediate portions 272 over the insulating layers 274 of the individual electrode portions 266 of the Z movable electrode 262 closer to the base end portions 271. The branched aluminum wires are electrically connected to the intermediate portions 272 of the individual electrode portions 266 through contact plugs 280 passing through the first insulating film 233 and the second insulating film 234. As shown in FIG. 38, the Z second detection wires 277 are drawn on the support portion 214 through the base portion 265 of the Z movable electrode 262, and partially exposed as the pads 213.

The Z first driving wires 276 and the Z second driving wires 278 are connected to the opposed portions 284 (first contact portions) of the Z fixed electrode 261 and the forward end portions 270 (second contact portions) of the Z movable electrode 262 facing one another in the direction orthogonal to the opposed direction of the electrodes constituting the capacitance element. In other words, the opposed portions 284 of the Z fixed electrode 284 and the forward end portions 270 of the Z movable electrode 262 constitute such a driving portion that a driving voltage is applied therebetween to vibrate the Z movable electrode 262 by Coulomb force resulting from voltage change in the driving voltage in the Z-axis sensor 208.

More specifically, the Z first driving wires 276 supply driving voltages to the opposed portions 284 of the Z fixed electrode 261. The Z first driving wires 276 include aluminum wires extending over both sides of the insulating layers 269 through the surface of the second insulating film 234 to be electrically connected to the opposed portions 284 and portions of the base portion 263 excluding the opposed portions 284 through contact plugs 285 passing through the first insulating film 233 and the second insulating film 234, and the remaining portions are constituted through the base portion 263 of the Z fixed electrode 261 made of conductive silicon. As shown in FIG. 38, the Z first driving wires 276 are drawn on the support portion 214, and partially exposed as the pads 213.

On the other hand, the Z second driving wires 278 supply driving voltages to the forward end portions 270 of the Z movable electrode 262. The Z second driving wires 278 include aluminum wires extending between the forward end portions 270 and the base portions 271 of the electrode portions 266 through the surface of the second insulating film 234 to be electrically connected to the forward end portions 270 and the base portions 271 through contact plugs 286 passing through the first insulating film 233 and the second insulating film 234, and the remaining portions are constituted through the base portion 265 of the Z movable electrode 262 made of conductive silicon. As shown in FIG. 38, the Z second driving wires 278 are drawn on the support portion 214, and partially exposed as the pads 213.

In the semiconductor substrate 203, upper surfaces and side surfaces of the Z fixed electrode 261 and the Z movable electrode 262 are covered with the protective thin film 235 made of silicon oxide ($SiO_2$), along with the first insulating film 233 and the second insulating film 234.

On the portions of the surface of the semiconductor substrate 203 other than the cavity 210, the third insulating film 236, the fourth insulating film 237, the fifth insulating film 238 and the surface protective film 239 are successively stacked on the second insulating film 234. In the portions, openings 282 exposing the Z first detection wires 275, the Z first driving wires 276, the Z second detection wires 277 and the Z second driving wires 278 as the pads 213 are formed in portions opposed to the Z first detection wires 275, the Z first driving wires 276, the Z second detection wires 277 and the Z second driving wires 278, to pass through the fifth, fourth and third insulating films 238, 237, 236 from the surface protective film 239.

In the Z-axis sensor 208, homopolar and heteropolar driving voltages are alternately supplied between the opposed portions 284 of the Z fixed electrode 261 and the forward end portions 270 of the Z movable electrode 262 through the Z first driving wires 276 and the Z second driving wires 278. Thus, Coulomb repulsion and Coulomb attraction are alternately generated between the opposed portions 284 of the Z fixed electrode 261 and the forward end portions 270 of the Z movable electrode 262. Consequently, the interdigital Z movable electrode 262 vertically vibrates (vibration Uz) on the identically interdigital Z fixed electrode 261 serving as the center of vibration along the Z-axis direction with respect to the Z fixed electrode 261, as if the same is a pendulum. When the Z movable electrode 262 rotates on the X-axis serving as a central axis in this state, it follows that Coriolis force Fy is generated in the Y-axis direction. Due to the Coriolis force Fy, opposed areas S of the electrode portions 264 of the Z fixed electrode 261 and the intermediate portions 272 of the electrode portions 266 of the Z movable electrode 262 adjacent to one another change. An angular velocity $\omega x$ acting around the X-axis is detected by detecting change in capacitance C between the Z movable electrode 262 and the Z fixed electrode 261 resulting from change in the inter-electrode distance d through the Z first detection wires 275 and the Z second detection wires 277. According to this embodiment, the angular velocity $\omega x$ acting around the X-axis is obtained by calculating the difference between a detected value of the Z-axis sensor 208 surrounding the X-axis sensor 206 and a detected value of the Z-axis sensor 208 surrounding the Y-axis sensor 207.

The difference can be obtained by reversing the positional relations between the fixed electrode and the movable electrode of the Z-axis sensor 208 surrounding the X-axis sensor 206 and the fixed electrode and the movable electrode of the Z-axis sensor 208 surrounding the Y-axis sensor 207, for example. In other words, the Z movable electrode 262 is arranged to surround the annular portion 217 of the support portion 214 and the Z fixed electrode 261 is arranged to further surround the Z movable electrode 262 in one of the Z-axis sensors 208, as hereinabove described. In the other Z-axis sensor 208, on the other hand, the Z fixed electrode 261 is arranged to surround the annular portion 217 of the support portion 214, and the Z movable electrode 262 is arranged to further surround the Z fixed electrode 261. Thus, the ways of vibration of the Z movable electrodes 262 differ from each other between the pair of Z-axis sensors 208, whereby it follows that the difference arises.

Also in a case where the positional relations between the fixed electrodes and the movable electrodes of one and the other Z-axis sensors 208 are identical to each other, the difference can be obtained by reversing the warp directions of the movable electrodes. In other words, after arranging the Z movable electrodes 262 to surround the annular portions 217 of the support portions 214 and arranging the Z fixed electrodes 261 to further surround the Z movable electrodes 262 as hereinabove described in one and the other Z-axis sensors 208, the warp direction of the other Z movable electrode 262 is set not to the direction separating from the cavity 210 but to a direction toward the rear surface of the semiconductor substrate 203, so that the Z movable electrode 262 projects from the rear surface of the Z fixed electrode 261. Thus, capacitance difference arises between the pair of Z-axis sensors 208 when the Z movable electrodes 262 vibrate, whereby it follows that the difference arises.

<Structure of Integrated Circuit>

Figure 44:
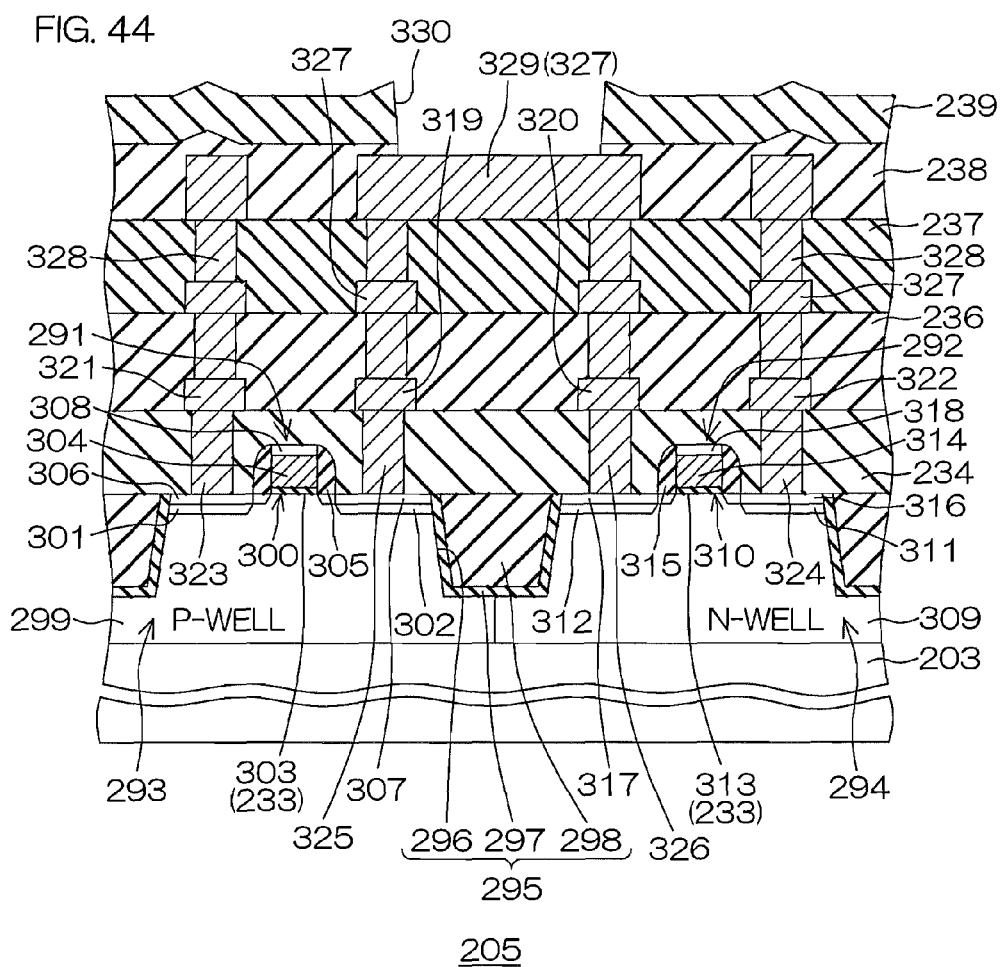
FIG. 44 is a schematic sectional view of an integrated circuit shown in FIG. 37.

The structure of the integrated circuit is now described with reference to FIG. 44. FIG. 44 is a schematic sectional view of the integrated circuit shown in FIG. 37. FIG. 44 is different in contraction scale from the aforementioned other sectional views (FIGS. 40, 42 and 43), and hence portions to which identical reference signs are assigned have different magnitudes in expression.

As hereinabove described, the integrated circuit 205 is formed on the semiconductor substrate 203 on which the X-axis sensor 206, the Y-axis sensor 207 and the Z-axis sensors 208 are formed, to surround these.

The integrated circuit 205 is constituted of the CMOS devices, and includes an N-channel MOSFET 291 and a P-channel MOSFET 292 formed on the semiconductor substrate 203.

An NMOS region 293 where the N-channel MOSFET 291 is formed and a PMOS region 294 where the P-channel MOSFET 292 is formed are isolated from peripheries respectively by an element isolation portion 295.

The element isolation portion 295 is formed by forming a trench (a shallow trench 296) in the semiconductor substrate 203 to be relatively shallowly dug down from the surface thereof, forming a thermal oxide film 297 on the inner surface of the shallow trench 296 by thermal oxidation and thereafter depositing an insulator 298 (for example, silicon oxide ($SiO_2$)) in the shallow trench 296 by CVD (Chemical Vapor Deposition).

A P-type well 299 is formed on the NMOS region 293. The depth of the P-type well 299 is larger than the depth of the shallow trench 296. On a surface layer portion of the P-type well 299, an N-type source region 301 and a drain region 302 are formed through a channel region 300. Depths of and impurity concentrations in end portions of the source region 301 and the drain region 203 closer to the channel region 300 are reduced. In other words, an LDD (Lightly Doped Drain) structure is applied to the N-channel MOSFET 291.

A gate insulating film 303 is provided on the channel region 300. The gate insulating film 303 is formed on the same layer as the aforementioned first insulating film 233 (i.e., in contact with the surface of the semiconductor substrate 203).

A gate electrode 304 is provided on the gate insulating film 303. The gate insulating film 304 is made of N-type polycrystalline silicon (Poly-Si).

A sidewall 305 is formed on peripheries of the gate insulating film 303 and the gate electrode 304. The sidewall 305 is made of silicon nitride (SiN).

Silicides 306 to 308 are formed on surfaces of the source region 301, the drain region 304 and the gate electrode 304 respectively.

An N-type well 309 is formed on the PMOS region 294. The depth of the N-type well 309 is larger than the depth of the shallow trench 296. On a surface layer portion of the N-type well 309, a P-type source region 311 and a drain region 312 are formed through a channel region 310. Depths of and impurity concentrations in end portions of the source region 311 and the drain region 312 closer to the channel region 310 are reduced. In other words, an LDD structure is applied to the P-channel MOSFET 292.

A gate insulating film 313 is formed on the channel region 310. The gate insulating film 313 is made of silicon oxide.

A gate electrode 314 is formed on the gate insulating film 313. The gate electrode 314 is made of P-type polycrystalline silicon.

A sidewall 315 is formed on peripheries of the gate insulating film 313 and the gate electrode 314. The sidewall 315 is made of SiN.

Silicides 316 to 318 are formed on surfaces of the source region 311, the drain region 312 and the gate electrode 314 respectively.

The second to fifth insulating films 234 and 236 to 238 and the surface protective film 239 are successively stacked on the semiconductor substrate 203. The insulating films are identical to the second to fifth insulating films 234 and 236 to 238 and the surface protective film 239 shown in FIGS. 42 and 43.

Drain wires 319 and 320 and source wires 321 and 322 are formed on the second insulating film 234 of the lowermost layer. The wires are made of aluminum (Al), and formed on the same layer as the wires (the X first driving/detection wires 229, the Z first detection wires 275 and the like) of the aforementioned X-axis sensor 206, the Y-axis sensor 207 and the Z-axis sensors 208.

The source wires 321 and 322 are formed above the source region 301 and the source region 311 respectively. Between the source wire 321 and the source region 301 and between the source wire 322 and the source region 311, contact plugs 323 and 324 for electrically connecting the same with one another are penetratingly provided in the second insulating film 234.

The drain wires 319 and 320 are formed above the drain region 302 and the drain region 312 respectively. Between the drain wire 319 and the drain region 302 and between the drain wire 320 and the drain region 312, contact plugs 325 and 326 for electrically connecting the same with one another are penetratingly provided in the second insulating film 234.

Wires 327 are similarly formed also on the third to fifth insulating films 236 to 238 respectively, and the wires 327 of the insulating films of the respective layers are electrically connected with one another through contact plugs 328. In the fifth insulating film 238 of the uppermost layer, the drain wire 329 is formed over the drain region 302 and the drain region 312, and the drain wire 329 is connected to both of the drain wire 319 of the N-channel MOSFET 291 and the drain wire 320 of the P-channel MOSFET 292. The contact plugs 323 to 326 and 328 are made of tungsten (W).

An opening 330 partially exposing the drain wire 329 formed on the fifth insulating film 238 of the uppermost layer as a pad is formed in the surface protective film 239. The drain wire 329 exposed as the pad is electrically connected with the electrode pads 209 by bonding wires (not shown) or the like, for example, in a state packaged with the resin package 202.

Also in the aforementioned semiconductor device 201, the integrated circuit 205 and the gyro sensor 204 can be parallelly manufactured by a method similar to the manufacturing steps for the semiconductor device 1 described with reference to FIGS. 9A to 36A, FIGS. 9B to 36B and FIGS. 9C to 36C.

<Functions/Effects of Semiconductor Device 201>

In the semiconductor device 201 according to this embodiment, the Z fixed electrodes 261 and the Z movable electrodes 262 are formed on the surface portion of the semiconductor substrate 203 through the upper wall 211 of the semiconductor substrate 203 having the cavity 210. Therefore, there is no need to pile up a large number of layers such as an epitaxial layer on the semiconductor substrate 203, in order to form the Z fixed electrodes 261 an the Z movable electrodes 262. Consequently, the thickness of the overall sensor may simply be about the thickness of the semiconductor substrate 203, whereby miniaturization of the sensor can be implemented.

Further, treatments such as epitaxial growth, CMP, sacrificial layer etching and the like may not be repeatedly performed in the formation of the Z fixed electrodes 261 and the Z movable electrodes 262, but the cavity 210 may simply be formed by forming a plurality of trenches in the semiconductor substrate 203 by anisotropic deep RIE (see the trenches 60 of FIGS. 32A and 32B) and thereafter entirely integrating the plurality of trenches 60 with one another by isotropic deep RIE (see FIGS. 36A and 36B). The cavity 210 for ensuring movable regions of the Z movable electrodes 262 can be formed under the electrodes (on the rear surface side of the semiconductor substrate 203) while molding the Z fixed electrodes 261 and the Z movable electrodes 262 of prescribed shapes by etching the semiconductor substrate 203. Therefore, manufacturing steps for the sensor can be simplified.

In the semiconductor device 201, further, the opposed portions 264 of the Z fixed electrodes 261 and the forward end portions 270 of the Z movable electrodes 262 are opposed to one another in the direction orthogonal to the array direction of the electrode portions 264 of the Z fixed electrodes 261 and the Z movable electrodes 262, i.e., a direction along surfaces of both electrodes of a capacitance element for detection. In addition, the opposed portions 264 of the Z fixed electrodes 261 are insulated from the remaining portions of the base portions 263 of the Z fixed electrodes 261 by the insulating layers 268, and the forward end portions 270 of the Z movable electrodes 262 are insulated from the remaining portions of the electrode portions 266 of the Z movable electrodes 262 by the insulating layers 273. Also when supplying the driving voltages to the opposed portions 284 of the Z fixed electrodes 261 and the forward end portions 270 of the Z movable electrodes 262, therefore, both electrodes of the capacitance element (the electrode portions 264 of the Z fixed electrodes 261 and the intermediate portions 272 of the movable electrodes 262) can be prevented from attracting and repulsing one another. Thus, the distance d between the electrodes can be held constant, except for a case where the Coriolis force Fy acts and the Z movable electrodes 262 vibrate. Consequently, even small change in the capacitance C can also be detected, whereby detection accuracy can be improved.

On the other hand, the vector of the Coriolis force Fy acting on the Z movable electrodes 262 varies with the positions of the Z movable electrodes 262 upon the action of the Coriolis force Fy. In order to further increase the detection accuracy for the angular velocity ωx, therefore, the vector of the Coriolis force Fy is preferably correctly detected by grasping the positions of the vibrating Z movable electrodes 262 in the Z-axis direction.

As hereinabove described, the interdigital Z movable electrodes 262 vertically vibrate (drive) on the identically interdigital Z fixed electrodes 261 serving as the centers of vibration, as if the same are pendulums. During the vibration, the opposed areas S of the electrode portions 264 of the Z fixed electrodes 261 and the intermediate portions 272 of the Z movable electrodes 262 forming the capacitance element for detection change in the same cycle as the cycle of the vibration to be maximized when the Z movable electrodes 262 pass through the centers of vibration and to be minimized when the Z movable electrodes 262 reach vibrating ends. From the starting of the driving of the Z movable electrodes 262 up to the action of the Coriolis force Fy, therefore, change in the capacitance C between the electrode portions 264 of the Z fixed electrodes 261 and the intermediate portions 272 of the Z movable electrodes 262 resulting from the change in the opposed areas S is sensed. Then, the positions of the Z movable electrodes 262 in the Z-axis direction can be grasped by detecting a change history of the capacitance C when the Coriolis force Fy acts on the Z movable electrodes 262.

However, the opposed areas S become identical when the positions of the intermediate portions 272 in the Z-axis direction are at the same distance from the centers of vibration (the Z fixed electrodes 261), regardless of on which one of the side separating from the cavity 210 and the side approaching the same with respect to the centers of the vibration the Z movable electrodes 262 are displaced. Therefore, it is difficult to recognize on which one of the side separating from the cavity 210 and the side approaching the cavity 210 the intermediate portions 272 of the Z movable electrodes 262 are displaced with respect to the electrode portions 264 of the Z fixed electrodes 261.

In the semiconductor device 201, therefore, the electrode portions 266 of the Z movable electrodes 262 are warped arcuately in sectional view in the direction separating from the cavity 210 of the semiconductor substrate 203, to project from the surfaces of the electrode portions 264 of the Z fixed electrodes 261. When the electrode portions 266 of the Z movable electrodes 262 are displaced in a direction further separating from the cavity 210, for example, in the starting of the driving of the Z movable electrodes 262 in this structure, the opposed areas S (see FIG. 43) diminish and the capacitance C decreases following the displacement. When the electrode portions 266 of the Z movable electrodes 262 are displaced in the direction approaching the cavity 210, on the other hand, the opposed areas S (see FIG. 43) enlarge and the capacitance C increases following the displacement.

Therefore, it can be easily grasped that the electrode portions 26 of the Z movable electrodes 262 are displaced in the direction separating from the cavity 210 if the capacitance C tends to decrease, and that the electrode portions 26 of the Z movable electrodes 262 are displaced in the direction approaching the cavity 210 if the capacitance C tends to increase, by detecting the change tendency of the capacitance C. Consequently, in which one of the direction separating from the cavity 210 and the direction approaching the cavity 210 the electrode portions 266 of the Z movable electrodes 262 have been displaced in the starting of the driving of the Z movable electrodes 262 can be reliably grasped. Therefore, the positions of the vibrating Z movable electrodes 262 in the Z-axis direction can be correctly grasped by sensing the change in the capacitance C after the driving. Hence, the vector of the Coriolis force Fy can be correctly detected, whereby the detection accuracy can be further improved.

Further, the insulating layers 268, 269, 273 and 274 for isolating the opposed portions 284 of the Z fixed electrodes 261 and the base end portions 271, the intermediate portions 272 and the forward end portions 272 of the Z movable electrodes 262 are embedded in the semiconductor substrate 203, whereby the surface of the semiconductor substrate 203 can be efficiently utilized as a space for drawing the aluminum wires of the X first driving/detection wires 229, the Z first detection wires 275 and the like.

In addition, the semiconductor substrate 203 is a conductive silicon substrate, whereby structures after molding can be utilized as the electrodes as such, without performing specific treatments for providing conductivity to the Y fixed electrode 221, the Y fixed electrode 241 and the Z fixed electrodes 261 as well as the X movable electrode 222, the Y movable electrode 242 and the Z movable electrodes 262 molded into prescribed shapes. Further, portions excluding the portions utilized as the electrodes can be utilized as the wires (the X first driving/detection wires 229, the Z first detection wires 275 and the like).

In the semiconductor device 201, the sensor region 287 and the integrated circuit region 288 are provided on the same semiconductor substrate 203, and the capacitive gyro sensor 204 and the integrated circuit 205 (the CMOS transistor) are formed on the regions 287 and 288 respectively. In other words, the gyro sensor 204 and the integrated circuit 205 are loaded on the same semiconductor substrate 203. Therefore, one-chip implementation of the gyro sensor 204 and the integrated circuit 205 can be achieved. Thus, the package size of the semiconductor substrate 201 can be reduced, and the package cost can be lowered.

While the embodiments of the present invention have been described, the present invention may be embodied in other ways.

For example, the wires (the X first sensor wires 29, the Z first sensor wires 75 and the like) of the acceleration sensor 4 may be formed on the third insulating film 36 or the fourth insulating film 37. In this case, the wires can be formed on the same layer as parts (the wires 127) of multilayer wires of the integrated circuit 5.

Further, the wires (the X first sensor wires 29, the Z first sensor wires 75 and the like) of the acceleration sensor 4 may be formed on the first insulating film 33, as shown in FIGS. 45 and 46. As to the wires 29 and 75 in this case, the polycrystalline silicon layer 56 may be partially left as the wires 29 and 75 when etching the polycrystalline silicon layer 56 in the step shown in FIG. 19C. Thus, the wires (the X first sensor wires 29, the Z first sensor wires 75 and the like) of the acceleration sensor 4 and the gate electrodes 104 and 114 of the integrated circuit 5 can be formed by the same material in the same step.

In each Z-axis sensor 8, the Z first sensor wires 75 may be formed in the same width as the Z fixed electrode 61, and the Z second sensor wires 77 may be formed in the same width as the Z movable electrode 62, as shown in FIG. 47. As to such a structure, the deposited aluminum deposition layer may be patterned to remain in regions for forming the Z fixed electrode 61 and the Z movable electrode 62 in the step shown in FIGS. 27A to 27C. Thus, the remaining aluminum deposition layer can be utilized as a mask at the time of molding the Z fixed electrode 61 and the Z movable electrode 62. Hence, the manufacturing steps can be further simplified.

The gate insulating films 103 and 113 of the transistor constituting the integrated circuit 5 are not restricted to silicon oxide, but may be silicon nitride, for example.

The embodiments of the present invention are merely specific examples employed for clarifying the technical principles of the present invention, the present invention is not to be interpreted restrictively to the specific examples, but the spirit and scope of the present invention are to be limited only by the appended claims.

The components shown in the respective embodiments of the present invention can be combined with one another in the scope of the present invention.

This application corresponds to Japanese Patent Application No. 2010-151147 filed with the Japan Patent Office on Jul. 1, 2010 and Japanese Patent Application No. 2010-155185 filed with the Japan Patent Office on Jul. 7, 2010, the disclosures of which are incorporated herein by reference.

DESCRIPTION OF THE REFERENCE NUMERALS 1 semiconductor device, 3 semiconductor substrate, 4 . . . acceleration sensor, 5 . . . integrated circuit, 6 . . . X-axis sensor, 7 . . . Y-axis sensor, 8 . . . Z-axis sensor, 10 . . . cavity, 11 . . . upper wall, 12 . . . bottom wall, 19 . . . trench, 21 . . . X fixed electrode, 22 . . . X movable electrode, 28 . . . insulating layer, 29 . . . X first sensor wire, 30 . . . X second sensor wire, 33 . . . first insulating film, 34 . . . second insulating film, 35 . . . protective thin film, 36 . . . third insulating film, 37 . . . fourth insulating film, 38 fifth insulating film, 41 . . . Y fixed electrode, 42 . . . Y movable electrode, 49 . . . Y first sensor wire, 50 . . . Y second sensor wire, 60 . . . trench, 61 . . . Z fixed electrode, 62 . . . Z movable electrode, 68 . . . insulating layer, 70 . . . sensor region, 71 . . . integrated circuit region, 74 . . . insulating layer, 75 . . . Z first sensor wire, 77 . . . Z second sensor wire, 83 . . . exposed space, 99 . . . P-type well, 101 . . . N-type source region, 102 . . . N-type drain region, 103 . . . gate insulating film, 104 . . . gate electrode, 109 . . . N-type well, 111 . . . P-type source region, 112 . . . P-type drain region, 119 . . . drain wire, 120 . . . drain wire, 121 . . . source wire, 122 . . . source wire, 127 . . . wire, 129 . . . drain wire, 201 . . . gyro sensor, 203 . . . semiconductor substrate, 210 . . . cavity, 211 . . . upper wall, 212 . . . bottom wall, 261 . . . Z fixed electrode, 262 . . . Z movable electrode, 263 . . . base portion (of Z fixed electrode), 264 . . . electrode portion (of Z fixed electrode), 265 . . . base portion (of Z movable electrode), 266 . . . electrode portion (of Z movable electrode), 269 . . . insulating layer, 270 . . . forward end portion (of Z movable electrode), 273 . . . insulating layer, 284 . . . opposed portion (of Z fixed electrode)

The invention claimed is:

1. A semiconductor device comprising:
a semiconductor substrate having a sensor region and an integrated circuit region, with a cavity formed immediately under a surface layer portion of the sensor region;
at least two capacitive acceleration sensors formed on the sensor region,
the capacitive acceleration sensors each detecting accelerations acting in different axial directions from each other;
support portions disposed in the sensor region, the support portions independently supporting each of the capacitive acceleration sensors in floating states; and
a transistor formed on the integrated circuit region, wherein
each of the capacitive acceleration sensors includes an interdigital fixed electrode and an interdigital movable electrode formed on the surface layer portion opposed to the cavity, the fixed electrode and the movable electrode meshing with each other so as to be spaced from each other, the transistor includes an N-type well region formed on a surface layer portion of the semiconductor substrate in the integrated circuit region and having a P-type source region and a P-type drain region, a P-type well region formed on the surface layer portion of the semiconductor substrate in the integrated circuit region and having an N-type source region and an N-type drain region, and a gate electrode opposed to the respective ones of the N-type well region and the P-type well region through a gate insulating film formed on a surface of the semiconductor substrate, and a detected signal from each of the capacitive acceleration sensors is transmitted to the transistor via a signal line formed on the support portion.

2. The semiconductor device according to claim 1, wherein the fixed electrode includes a fixed-side electrode portion insulated from the remaining portion of the fixed electrode by an insulating layer embedded in the surface layer portion of the semiconductor substrate, and the movable electrode includes a movable-side electrode portion insulated from the remaining portion of the movable electrode by an insulating layer embedded in the surface layer portion of the semiconductor substrate.

3. The semiconductor device according to claim 1, wherein the capacitive acceleration sensors includes, assuming that two directions orthogonal to each other along the surface of the semiconductor substrate are an X-axis direction and a Y-axis direction and a direction along the thickness direction of the semiconductor substrate orthogonal to the X-axis and the Y-axis is a Z-axis direction, an X-axis sensor detecting acceleration along the X-axis direction, a Y-axis sensor detecting acceleration along the Y-axis direction and a Z-axis sensor detecting acceleration along the Z-axis direction, each of the X-axis sensor, the Y-axis sensor and the Z-axis sensor includes the fixed electrode and the movable electrode, an X fixed electrode as the fixed electrode of the X-axis sensor is fixed to the semiconductor substrate, and an X movable electrode as the movable electrode of the X-axis sensor is formed to advance to/retreat from the X fixed electrode along the X-axis direction with respect to the semiconductor substrate, a Y fixed electrode as the fixed electrode of the Y-axis sensor is fixed to the semiconductor substrate, and a Y movable electrode as the movable electrode of the Y-axis sensor is formed to advance to/retreat from the Y fixed electrode along the Y-axis direction with respect to the semiconductor substrate, and a Z fixed electrode as the fixed electrode of the Z-axis sensor is fixed to the semiconductor substrate, and a Z movable electrode as the movable electrode of the Z-axis sensor is formed to advance to/retreat from the Z fixed electrode along the Z-axis direction with respect to the semiconductor substrate.

4. The semiconductor device according to claim 1, wherein the sensor region is arranged on a central portion of the semiconductor substrate, and the integrated circuit region is arranged on a peripheral portion surrounding the sensor region.

5. The semiconductor device according to claim 1, further comprising an interlayer dielectric film stacked on the surface of the semiconductor substrate, wherein the transistor has a multilayer interconnection structure having a plurality of layers of transistor wires stacked on the interlayer dielectric film, and at least one of the capacitive acceleration sensors further includes a sensor wire formed on the same layer as the transistor wire formed on any layer of the multilayer interconnection structure and made of the same material as the transistor wire.

6. The semiconductor device according to claim 1, wherein at least one of the capacitive acceleration sensors further includes an insulating film formed on the same layer as the gate insulating film and a sensor wire formed on the insulating film and made of the same material as the gate electrode.

7. The semiconductor device according to claim 1, wherein the semiconductor substrate is a conductive silicon substrate.

8. The semiconductor device according to claim 1, wherein the transistor is a CMIS (Complementary Metal Insulator Semiconductor) transistor.

* * * * *

UNITED STATES PATENT AND TRADEMARK OFFICE
CERTIFICATE OF CORRECTION

| | |
|---|---|
| PATENT NO. | : 8,946,786 B2 |
| APPLICATION NO. | : 13/807555 |
| DATED | : February 3, 2015 |
| INVENTOR(S) | : Nakatani |

It is certified that error appears in the above-identified patent and that said Letters Patent is hereby corrected as shown below:

In the Claims,

Column 43, line 29, delete "sensors includes, assuming" and insert --sensors include, assuming--.

Column 44, lines 28-29, delete "sensors further includes a sensor wire" and insert --sensors further include a sensor wire--.

Column 44, lines 34-35, delete "sensors further includes an insulating film" and insert --sensors further include an insulating film--.

Signed and Sealed this
Eighth Day of September, 2015

Michelle K. Lee
*Director of the United States Patent and Trademark Office*